United States Patent
Chang et al.

(10) Patent No.: US 10,872,805 B2
(45) Date of Patent: Dec. 22, 2020

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Kuei-Ming Chang, New Taipei (TW); Chi-Wei Wu, Hsinchu (TW); Yi-Chieh Hsieh, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/208,333

(22) Filed: Dec. 3, 2018

(65) Prior Publication Data
US 2020/0105581 A1 Apr. 2, 2020

Related U.S. Application Data

(60) Provisional application No. 62/737,927, filed on Sep. 28, 2018.

(51) Int. Cl.
*H01L 29/66* (2006.01)
*H01L 21/762* (2006.01)
*H01L 27/088* (2006.01)

(52) U.S. Cl.
CPC .. *H01L 21/76224* (2013.01); *H01L 21/76232* (2013.01); *H01L 27/0886* (2013.01); *H01L 29/66545* (2013.01)

(58) Field of Classification Search
CPC ......... H01L 21/76224; H01L 21/76232; H01L 27/0886; H01L 29/66545
See application file for complete search history.

(56) References Cited

U.S. PATENT DOCUMENTS

| | | | |
|---|---|---|---|
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,418,897 B1 | 8/2016 | Ching et al. | |
| 9,520,482 B1 | 12/2016 | Chang et al. | |
| 9,576,814 B2 | 2/2017 | Wu et al. | |
| 9,608,116 B2 | 3/2017 | Ching et al. | |
| 9,812,363 B1 | 11/2017 | Liao et al. | |
| 9,859,380 B2 | 1/2018 | Lee et al. | |
| 2015/0243552 A1* | 8/2015 | Lu | H01L 21/823431 257/368 |
| 2017/0125411 A1* | 5/2017 | Yu | H01L 29/66545 |
| 2019/0006486 A1* | 1/2019 | Ching | H01L 29/0653 |
| 2019/0035912 A1* | 1/2019 | Ching | H01L 21/76224 |
| 2020/0091142 A1* | 3/2020 | Ching | H01L 29/0649 |
| 2020/0105919 A1* | 4/2020 | Yoo | H01L 29/66795 |

* cited by examiner

*Primary Examiner* — Mark W Tornow
(74) *Attorney, Agent, or Firm* — Maschoff Brennan

(57) ABSTRACT

A semiconductor device includes a substrate, a shallow trench isolation (STI) structure, a first source/drain, a second source/drain, and an isolation dielectric. The substrate has a semiconductor fin. The STI structure surrounds the semiconductor fin. The first source/drain is embedded in the semiconductor fin. The second source/drain is embedded in the semiconductor fin. The isolation dielectric is between the first and second source/drains and extending into the semiconductor fin. An upper surface of the STI structure is free from coverage of the isolation dielectric.

20 Claims, 112 Drawing Sheets

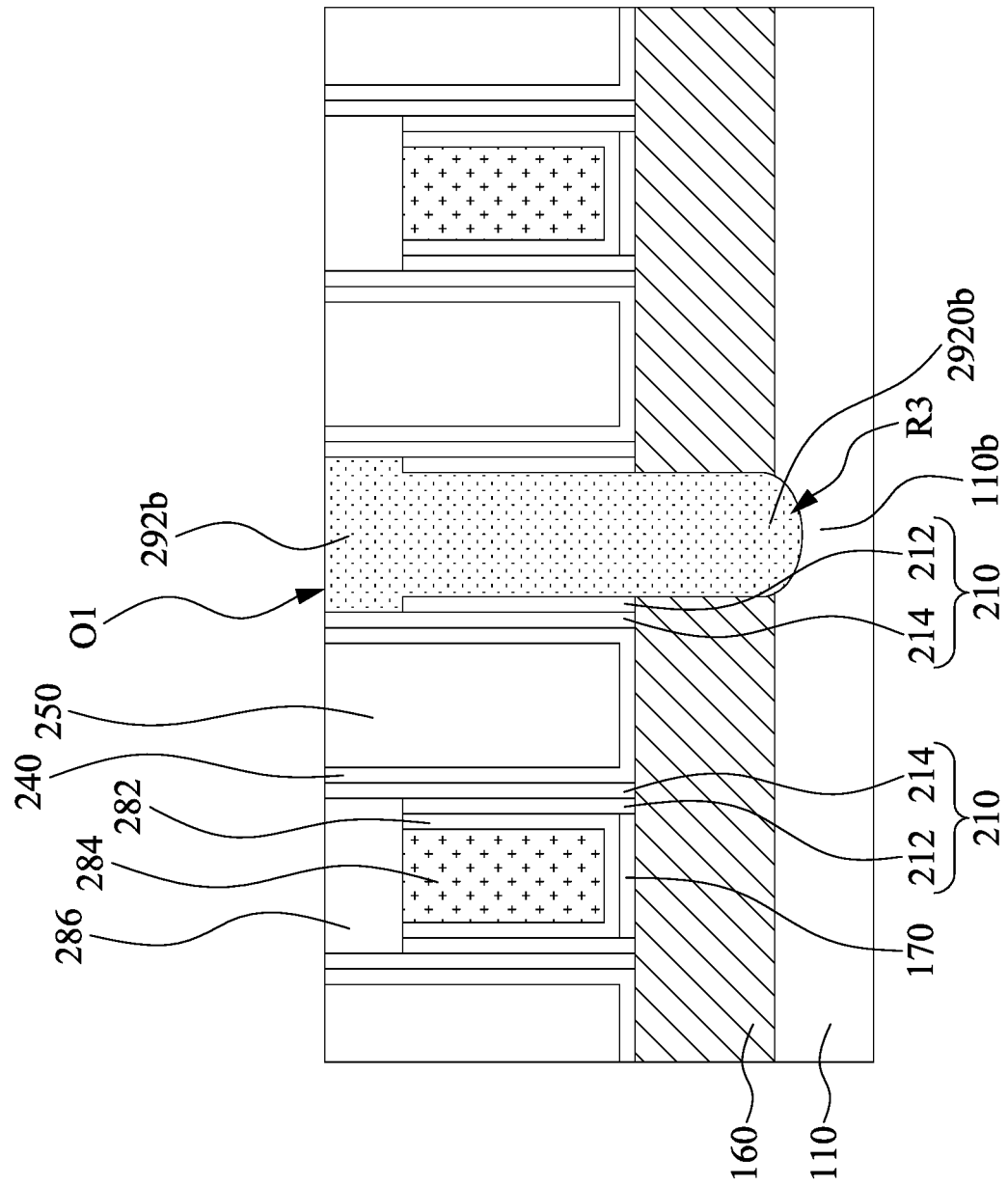

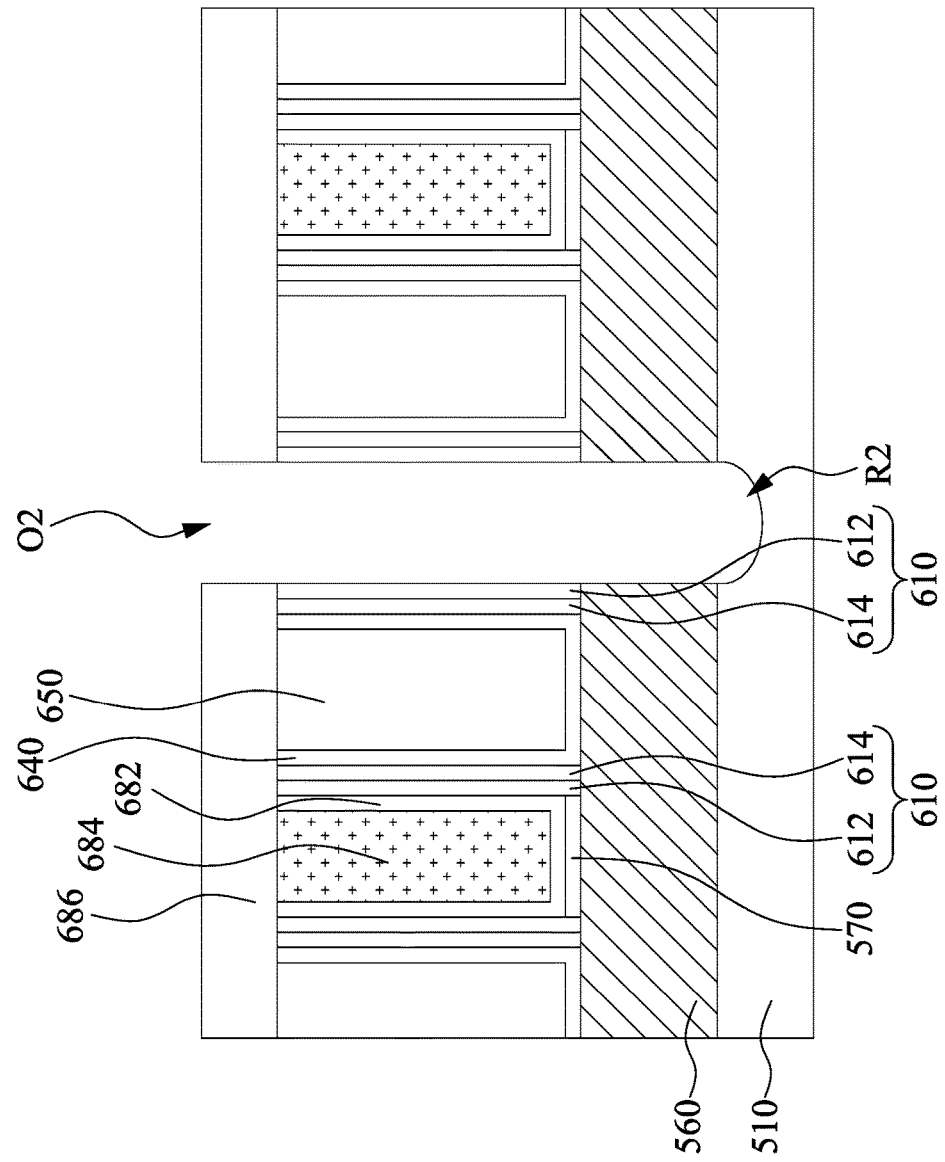

US 10,872,805 B2

SEMICONDUCTOR DEVICE AND MANUFACTURING METHOD THEREOF

PRIORITY CLAIM AND CROSS-REFERENCE

This application claims priority to U.S. Provisional Application Ser. No. 62/737,927, filed Sep. 28, 2018, which is herein incorporated by reference.

BACKGROUND

As the semiconductor industry has strived for higher device density, higher performance, and lower costs, problems involving both fabrication and design have been encountered. One solution to these problems has been the development of a fin-like field effect transistor (FinFET). A FinFET includes a thin vertical 'fin' formed in a free standing manner over a major surface of a substrate. The source, drain, and channel regions are defined within this fin. The transistor's gate wraps around the channel region of the fin. This configuration allows the gate to induce current flow in the channel from three sides. Thus, FinFET devices have the benefit of higher current flow and reduced short-channel effects.

The dimensions of FinFETs and other metal oxide semiconductor field effect transistors (MOSFETs) have been progressively reduced as technological advances have been made in integrated circuit materials. For example, high-k metal gate (HKMG) processes have been applied to FinFETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 27A to FIG. 27C are cross-sectional views of a semiconductor device in accordance with some embodiments of the present disclosure.

DETAILED DESCRIPTION

Figure 1:
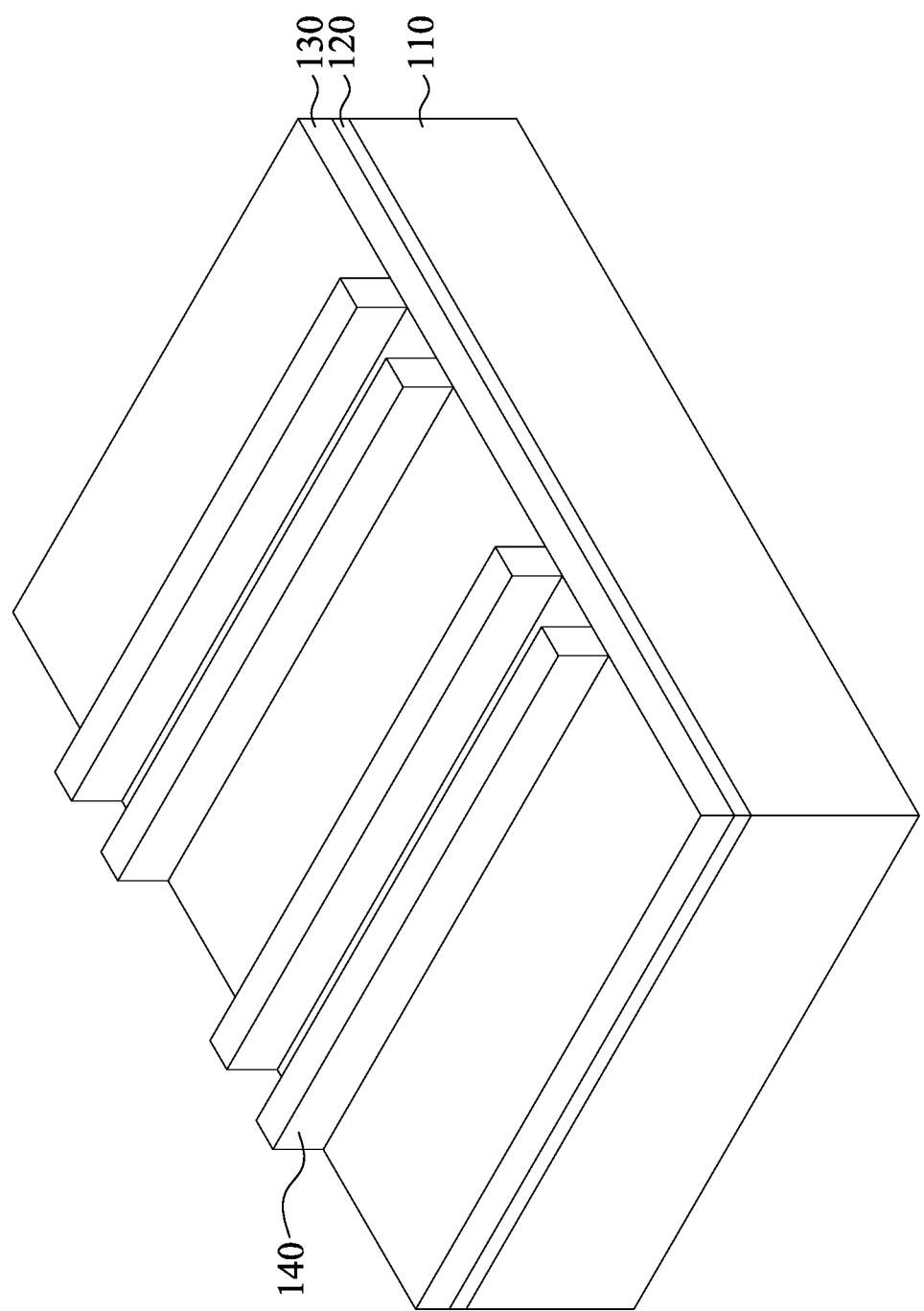
FIG. 1 to FIG. 25D illustrate a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure.

These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1 to FIG. 24D illustrate a method for manufacturing a semiconductor device at various stages in accordance with some embodiments of the present disclosure. Reference is made to FIG. 1. A substrate 110 is illustrated, and it may be a semiconductor substrate, such as a bulk semiconductor, a semiconductor-on-insulator (SOI) substrate, or the like. The substrate 110 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

A pad layer 120 and a mask layer 130 are formed on the substrate 110. The pad layer 120 may be a thin film comprising silicon oxide formed using, for example, a thermal oxidation process. The pad layer 120 may act as an adhesion layer between the substrate 110 and mask layer 130. The pad layer 120 may also act as an etch stop layer for etching the mask layer 130. In some embodiments, the mask layer 130 is formed of silicon nitride, for example, using low-pressure chemical vapor deposition (LPCVD) or plasma enhanced chemical vapor deposition (PECVD). The mask layer 130 is used as a hard mask during subsequent photolithography processes. A photo-sensitive layer 140 is formed on the mask layer 130 and is then patterned, forming openings in the photo-sensitive layer 140, so that some regions of the mask layer 130 are exposed.

Figure 2:
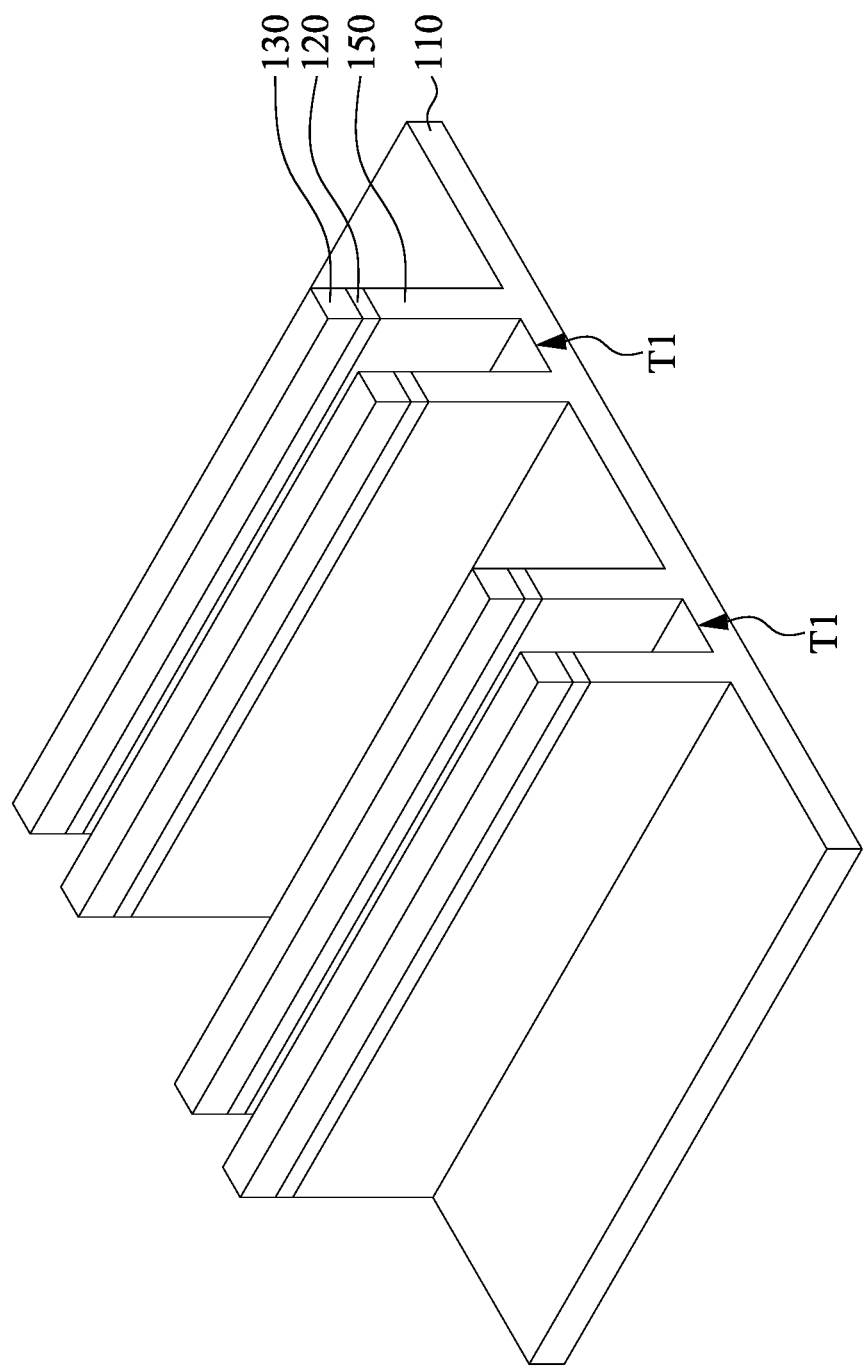

Reference is made to FIG. 2. The mask layer 130 and pad layer 120 are etched through the photo-sensitive layer 140, exposing underlying substrate 110. The exposed substrate 110 is then etched, forming trenches T1. A portion of the substrate 110 between neighboring trenches T1 can be referred to as a semiconductor fin 150 but, the numbers of the semiconductor fins 150 are not limited thereto. In some embodiments, any suitable number can be used in the layout. Trenches T1 may be trench strips that are substantially parallel to each other. Similarly, the semiconductor fins are substantially parallel to each other. After etching the substrate 110, the photo-sensitive layer 140 is removed. Next, a cleaning step may be performed to remove a native oxide of the semiconductor substrate 110. The cleaning may be performed using diluted hydrofluoric (HF) acid, for example.

Figure 3:
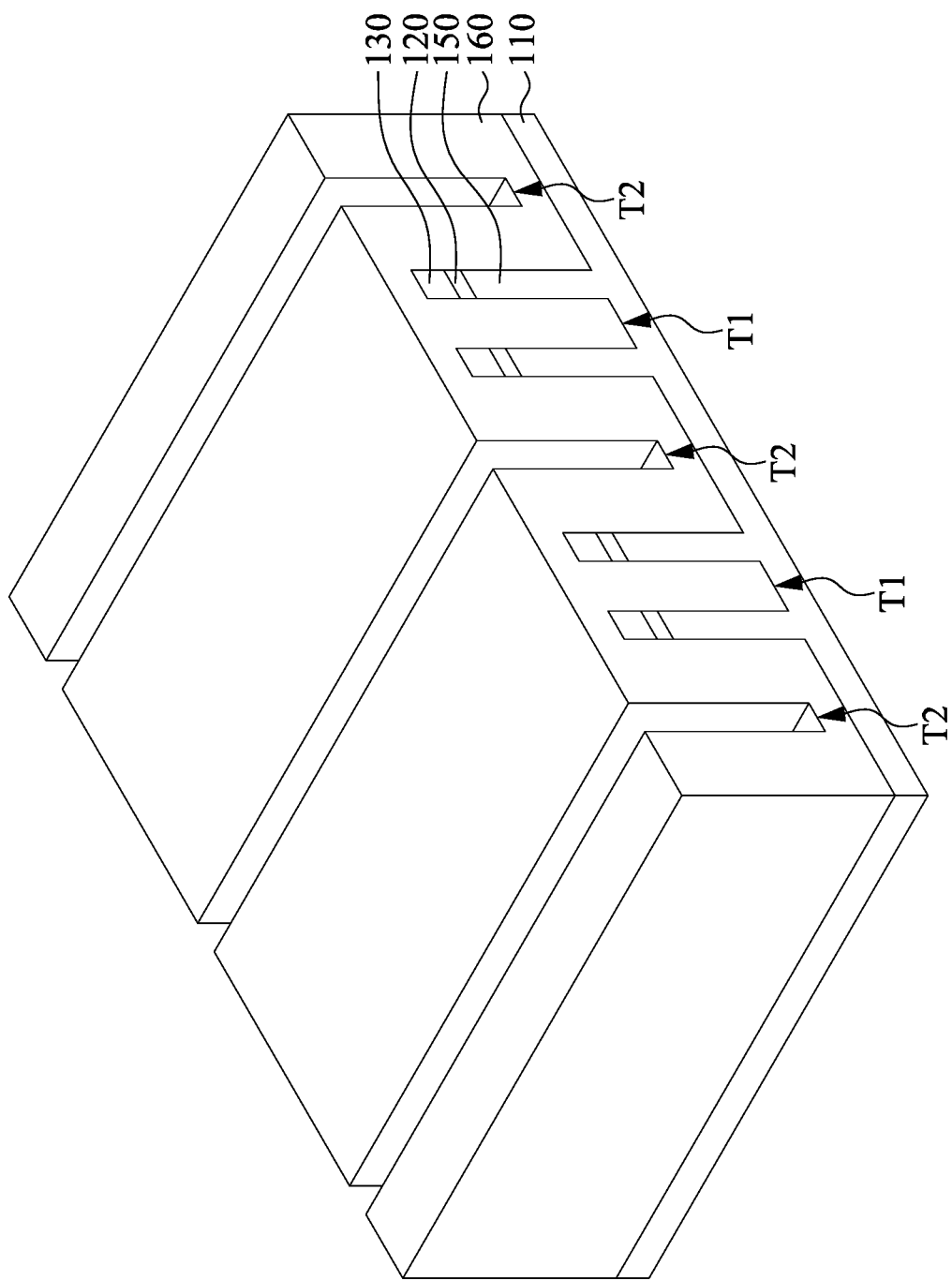

Reference is made to FIG. 3. After photo-sensitive layer 140 is removed, an isolation layer 160 is formed over the substrate 110. In some embodiments, the isolation layer 160 is formed to conformally cover the semiconductor fins 150 by suitable deposition process, such as atomic layer deposition (ALD). Thus, plural trenches T2 are formed in the isolation layer 160 and between the semiconductor fins 150. For example, some trenches T2 are formed between the fins 150.

In some embodiments, if two adjacent fins are too close, the isolation layer 160 may be filled in the space between the fins. For example, in FIG. 3, since the semiconductor fins 150 are close enough, the isolation layer 160 is filled in the space between the adjacent semiconductor fins 150. That is, no trench is formed between the semiconductor fins 150.

In some embodiments, the isolation layer 160 in the trenches T1 can be referred to as a shallow trench isolation (STI) structure. In some embodiments, the isolation layer 160 is made of silicon oxide, silicon nitride, silicon oxynitride, fluoride-doped silicate glass (FSG), or other low-K dielectric materials. In some embodiments, the isolation layer 160 may be formed using a high-density-plasma (HDP) chemical vapor deposition (CVD) process, using silane ($SiH_4$) and oxygen ($O_2$) as reacting precursors. In some other embodiments, the isolation layer 160 may be formed using a sub-atmospheric CVD (SACVD) process or high aspect-ratio process (HARP), wherein process gases may comprise tetraethylorthosilicate (TEOS) and ozone ($O_3$). In yet other embodiments, the isolation layer 160 may be formed using a spin-on-dielectric (SOD) process, such as hydrogen silsesquioxane (HSQ) or methyl silsesquioxane (MSQ). Other processes and materials may be used. In some embodiments, the isolation layer 160 can have a multi-layer structure, for example, a thermal oxide liner layer with silicon nitride formed over the liner. Thereafter, a thermal annealing may be optionally performed to the isolation layer 160.

Figure 4:
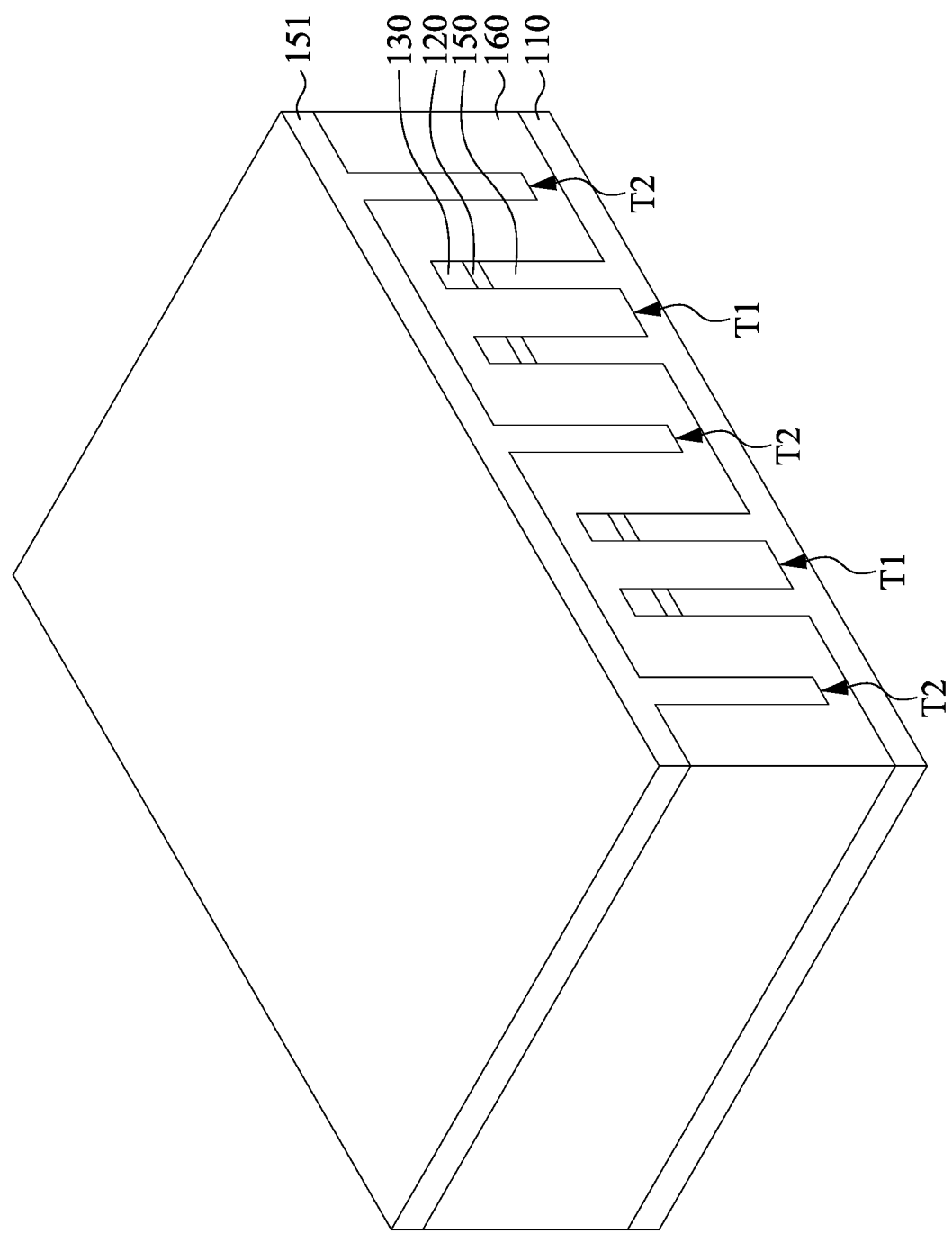

Reference is made to FIG. 4. A dielectric fin layer 151 is formed over the substrate 110 and covers the isolation layer 160. The dielectric fin layer 151 is filled in the trenches T2 in the isolation layer 160. In some embodiments, the dielectric fin layer 151 may include metal oxides, such as $HfO_2$, $ZrO_2$, $HfAlO_x$, $HfSiO_x$ and the like and may be formed by methods utilized to form such a layer, such as CVD, plasma enhanced CVD, sputter, and other methods known in the art. In some embodiments, the dielectric fin layer 151 may be made from other high-k materials other than metal dielectric materials.

Figure 5:
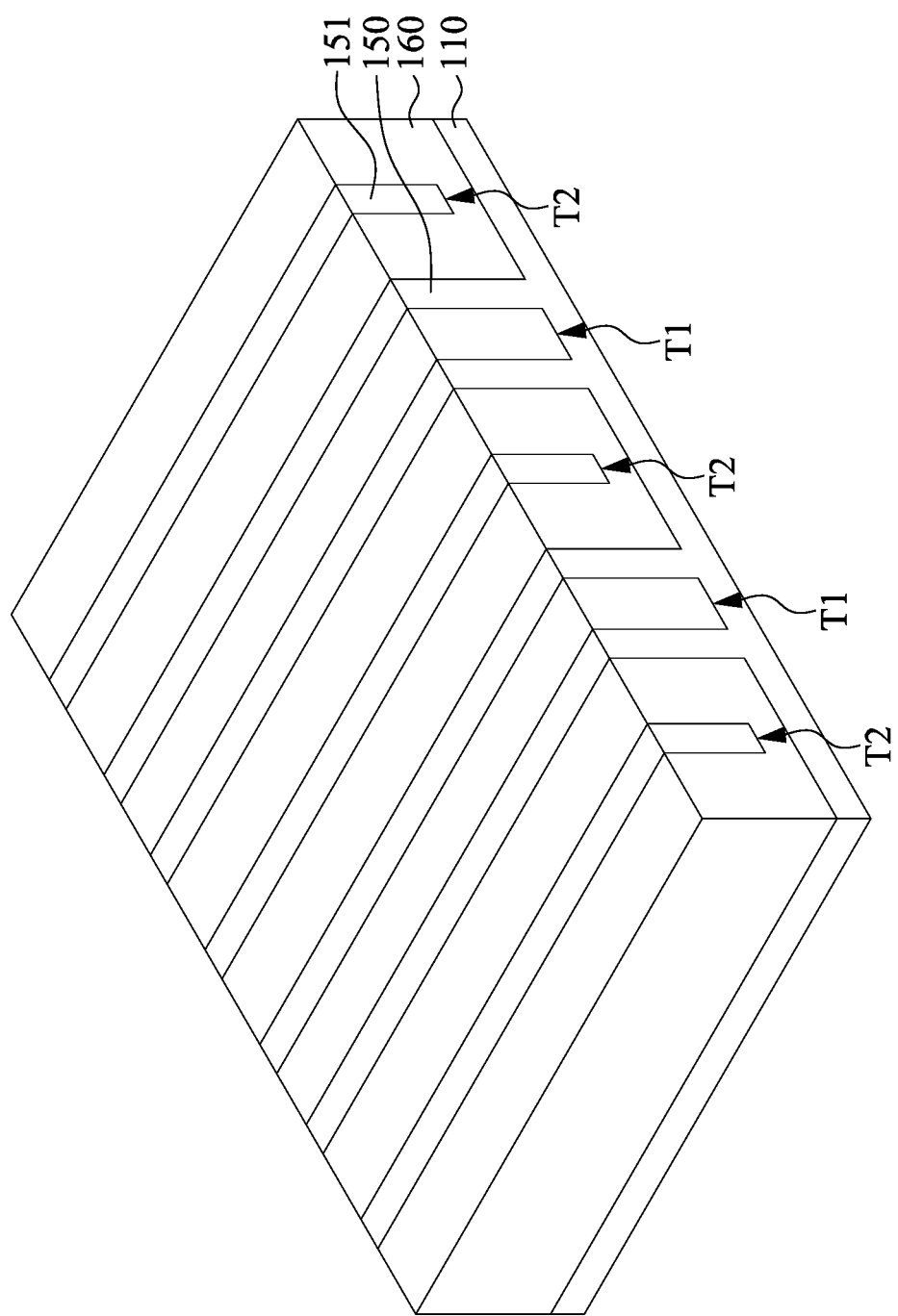

Reference is made to FIG. 5. A planarization process such as chemical mechanical polish (CMP) is performed to remove the excessive isolation layer 160 and dielectric fin layer 151 until the semiconductor fins 150 are exposed. The remained dielectric fin layer 151 covers the isolation layer 160 underneath, and may also refer to as an insulating fin. In some embodiments, the insulating fin is on the substrate 110 and parallel to the semiconductor fin 150.

Specifically, the CMP process is then performed to remove the excess isolation layer 160 outside the trenches T1, and the resulting structure is shown in FIG. 5. In some embodiments, the planarization process may also remove the mask layer 130 and the pad layer 120 such that top surfaces of the semiconductor fins 150 are exposed. In some other embodiments, the planarization process stops when the mask layer 130 is exposed. In such embodiments, the mask layer 130 may act as the CMP stop layer in the planarization. If the mask layer 130 and the pad layer 120 are not removed by the planarization process, the mask layer 130, if formed of silicon nitride, may be remove by a wet process using hot $H_3PO_4$, and the pad layer 120, if formed of silicon oxide, may be removed using diluted HF.

Figure 6:
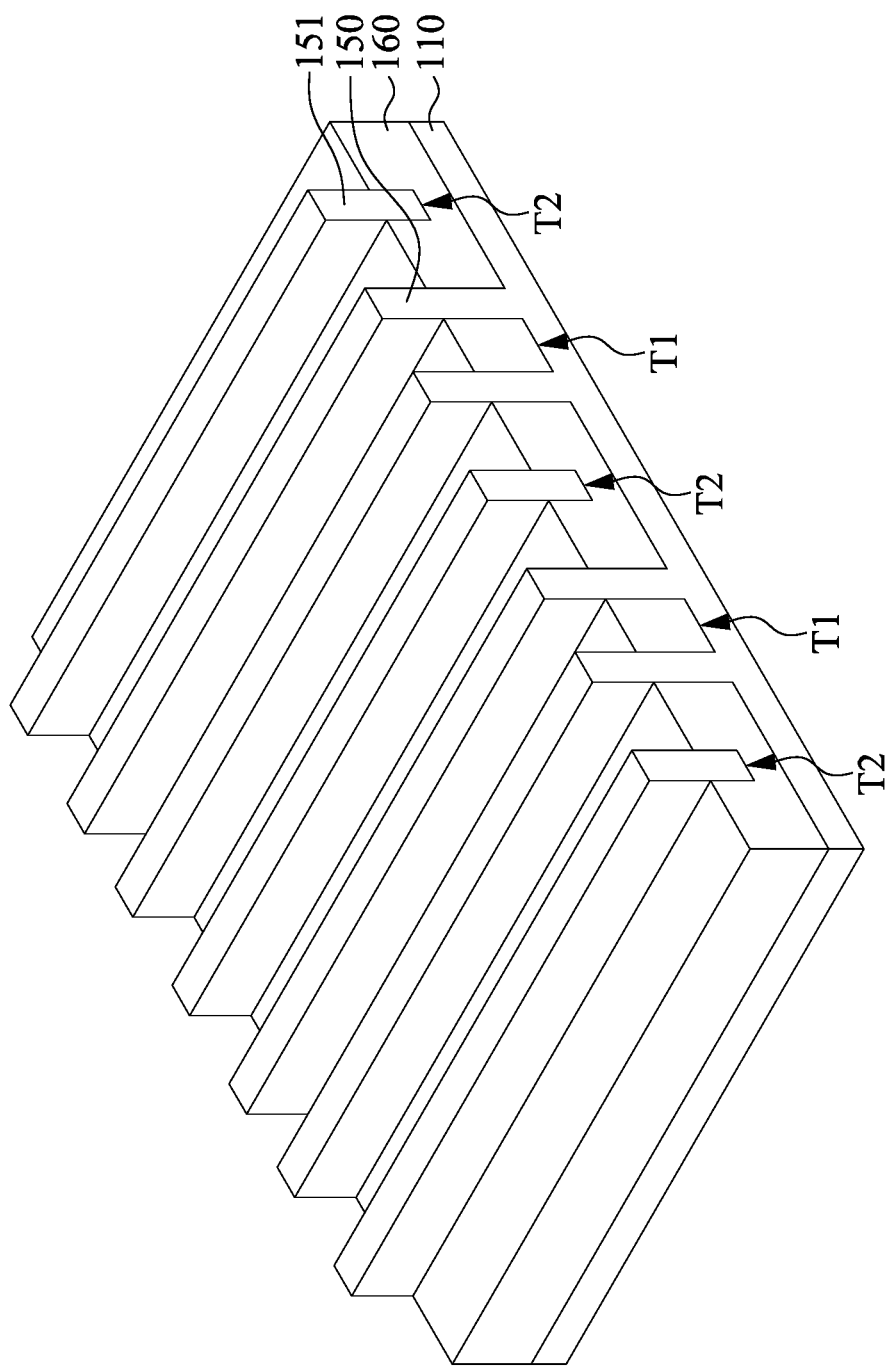

Next, as shown in FIG. 6, the isolation layer 160 is recessed, for example, through an etching operation, wherein diluted HF, SiCoNi (including HF and $NH_3$), or the like, may be used as the etchant. After recessing the isolation layer 160, a portion of the semiconductor fin 150 is higher than a top surface of the isolation layer 160, and hence this portion of the semiconductor fin 150 protrudes above the isolation layer 160.

It is understood that the processes described above are some examples of how semiconductor fins 150 and the STI structure are formed. In other embodiments, an isolation layer 160 can be formed over a top surface of the substrate 110; trenches can be etched through the dielectric layer; homoepitaxial structures can be epitaxially grown in the trenches; and the isolation layer can be recessed such that the homoepitaxial structures protrude from the dielectric layer to form fins. In still other embodiments, heteroepitaxial structures can be used for the fins. For example, at least one of the semiconductor fins 150 can be recessed, and a material different from the recessed semiconductor fin 150 may be epitaxially grown in its place. In even further embodiments, a dielectric layer can be formed over a top surface of the substrate 110; trenches can be etched through the dielectric layer; heteroepitaxial structures can be epitaxially grown in the trenches using a material different from the substrate 110; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior implanting of the fins although in situ and implantation doping may be used together. In some embodiments, at least one of the semiconductor fins 150 may include silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 7:
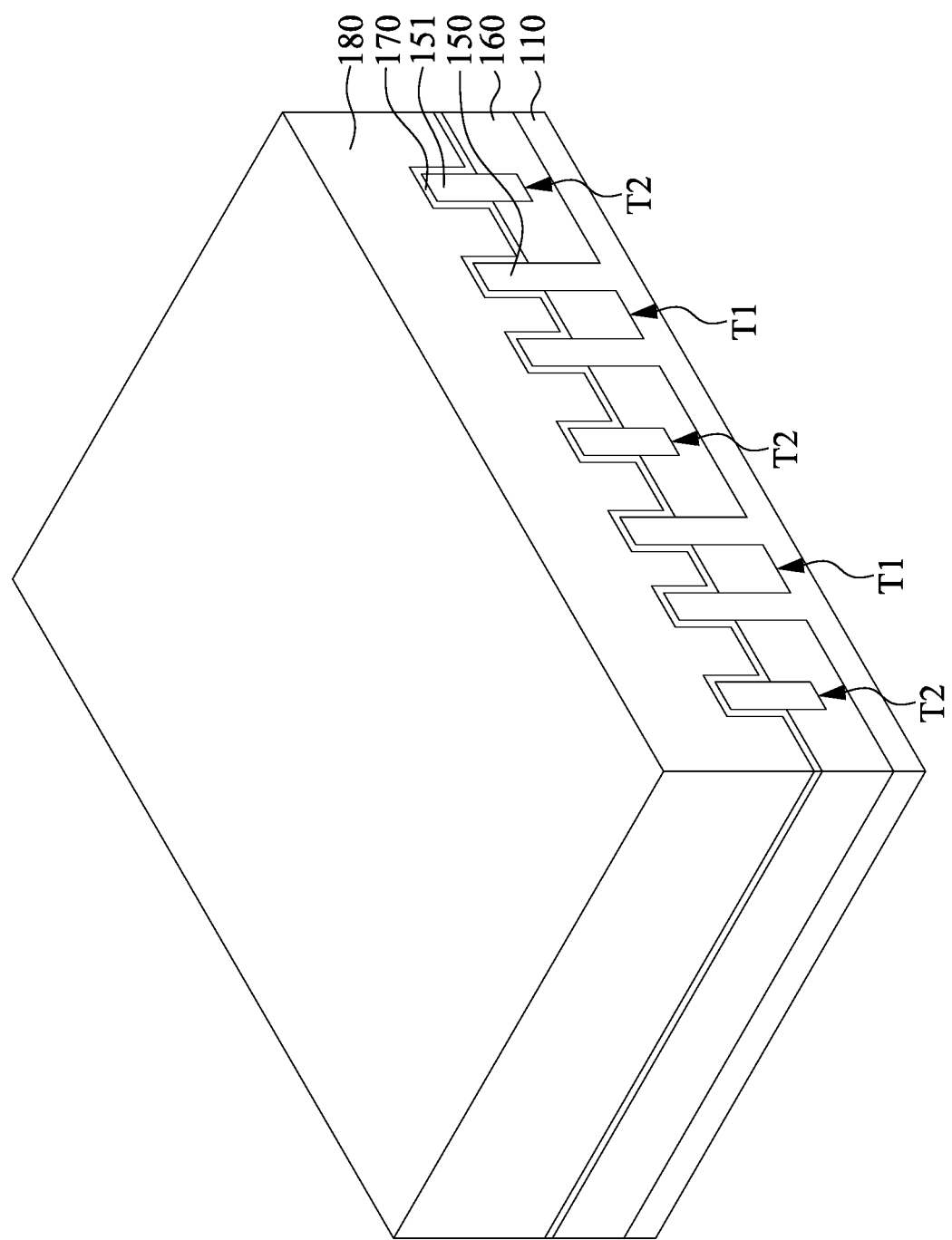

Reference is made to FIG. 7. A gate dielectric layer 170 is blanket formed over the substrate 110 to cover the semiconductor fins 150 and the isolation layer 160. In some embodiments, the gate dielectric layer 170 is made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layer 170 is an oxide layer. The gate dielectric layer 170 may be formed by a deposition processes, such as chemical vapor deposition (CVD), physical vapor deposition (PVD), atomic layer deposition (ALD), plasma enhanced CVD (PECVD) or other suitable techniques.

After the gate dielectric layer 170 is formed, a dummy gate electrode layer 180 is formed over the gate dielectric layer 170. In some embodiments, the dummy gate electrode layer 180 may include polycrystalline-silicon (poly-Si), poly-crystalline silicon-germanium (poly-SiGe), metallic nitrides, metallic silicides, metallic oxides, or metals. In some embodiments, the dummy gate electrode layer 180 includes a metal-containing material such as TiN, TaN, TaC, Co, Ru, Al, combinations thereof, or multi-layers thereof. The dummy gate electrode layer 180 may be deposited by CVD, physical vapor deposition (PVD), sputter deposition, or other techniques suitable for depositing conductive materials.

Figure 8:
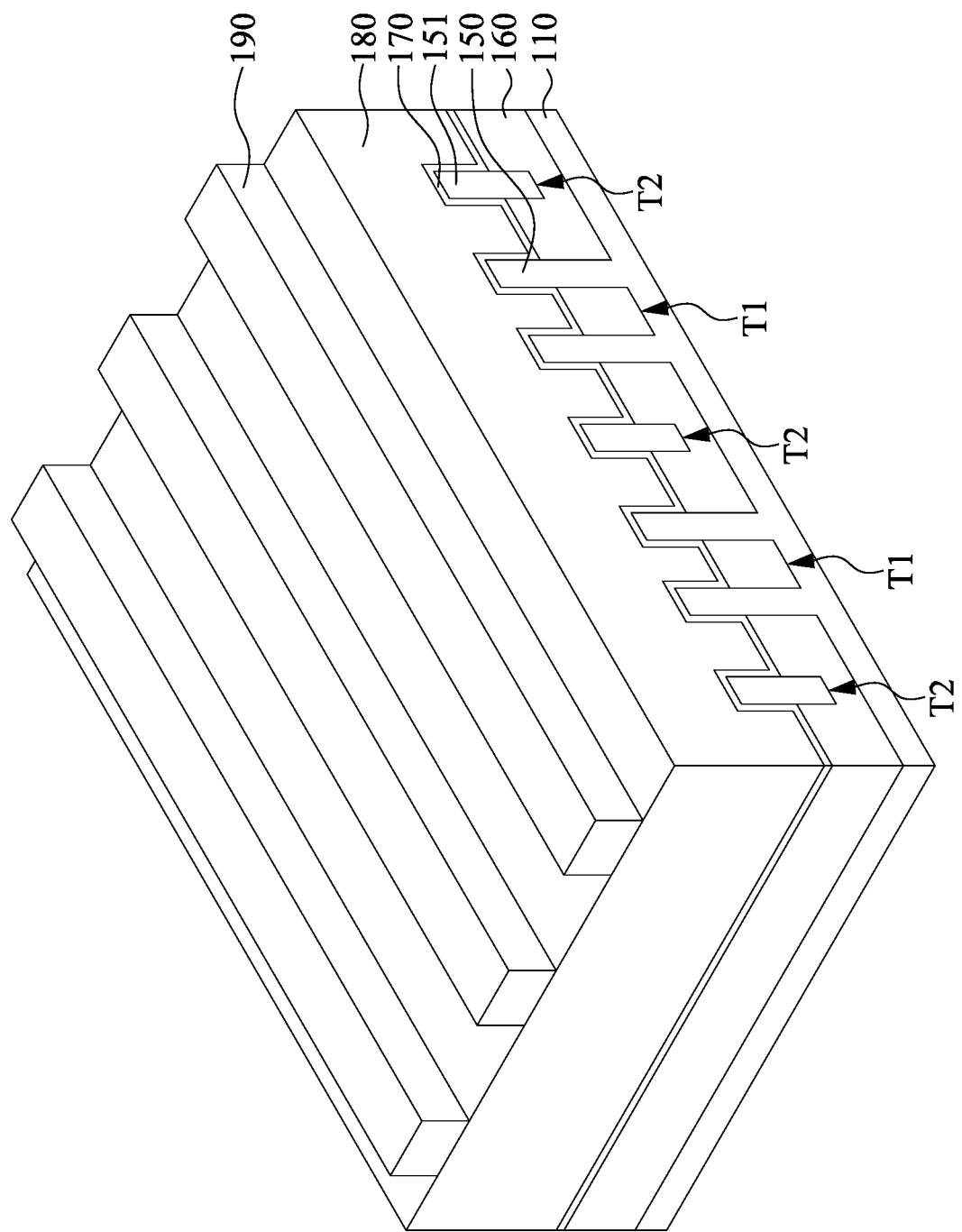

Next, the dummy gate electrode layer 180 and the gate dielectric layer 170 are patterned to form dummy gate structures in accordance with some embodiments. For example, a patterned mask 190 is formed over a portion of the dummy gate electrode layer 180, as shown in FIG. 8. The mask 190 may be a hard mask for protecting the underlying dummy gate electrode layer 180 and the gate dielectric layer 170 against subsequent etching process. The patterned mask 190 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 9:
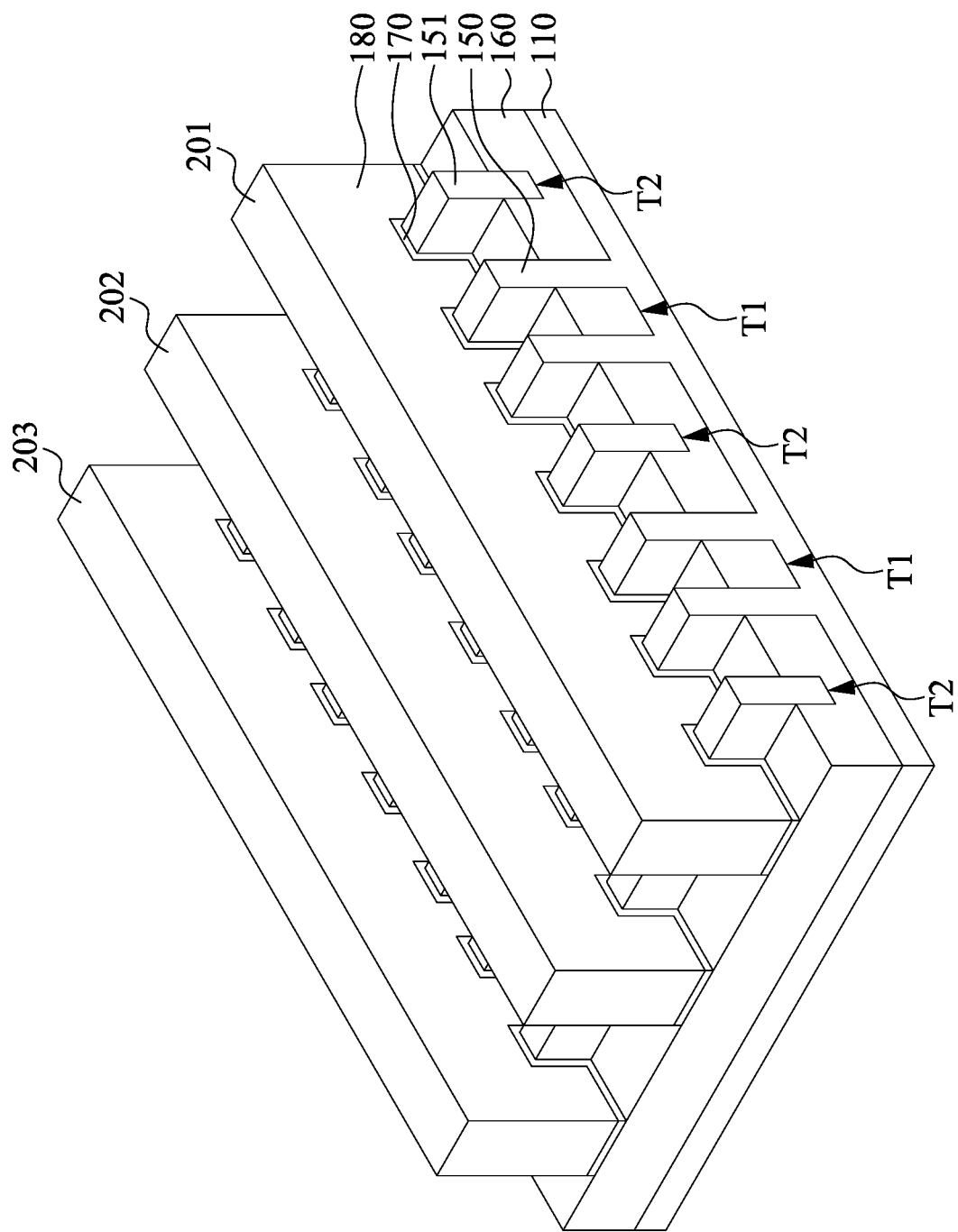

An etching process is performed to form dummy gate structures 201, 202, and 203 wrapping the semiconductor fins 150 using the patterned mask 190 as an etching mask, and the patterned mask 190 is removed after the etching. The resulting structure is shown in FIG. 9. Each dummy gate structure includes a gate dielectric layer 170 and a dummy gate electrode layer 180 over the gate dielectric layer 170. The dummy gate structures 201-203 have substantially parallel longitudinal axes that are substantially perpendicular to longitudinal axes of the semiconductor fins 150, as illustrated in FIG. 9. The dummy gate structures 201-203 will be replaced with a replacement gate structure using a "gate-last" or replacement-gate process.

Figure 10:
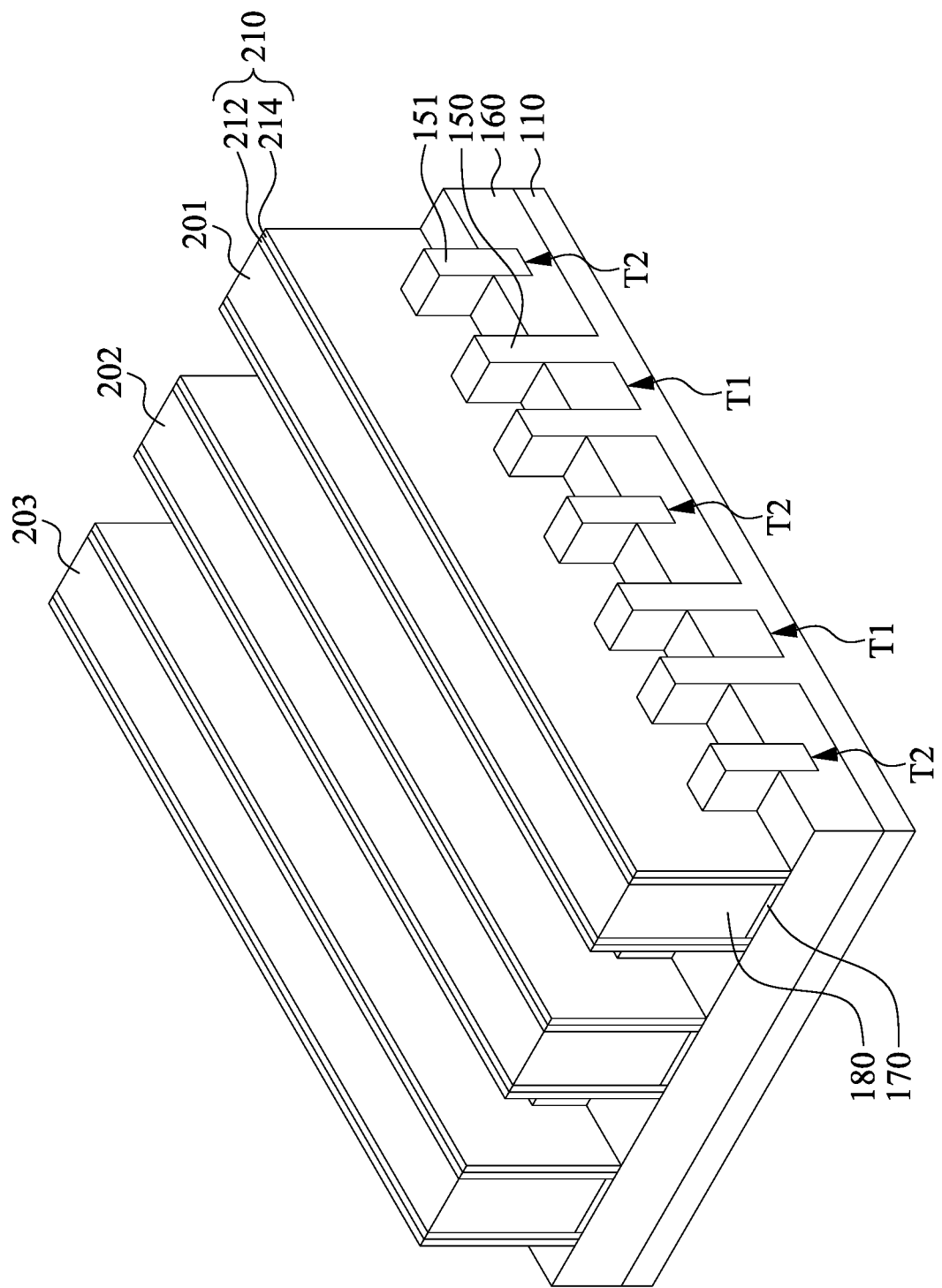

Reference is made to FIG. 10. Gate spacers 210 are formed on opposite sidewalls of the dummy gate structures 201-203. In some embodiments, the gate spacers 210 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials or other suitable dielectric material. The gate spacers 210 may include a single layer or multilayer structure made of different dielectric materials, such as gate spacers 212 and 214. The method of forming the gate spacers 212 and 214 includes blanket forming dielectric layers on the structure shown in FIG. 9 using, for example, CVD, PVD or ALD, and then performing an etching process such as anisotropic etching to remove horizontal portions of the dielectric layer. The remaining portions of the dielectric layer on sidewalls of the dummy gate structures 201-203 can serve as the gate spacers 210. In some embodiments, the gate spacers 210 may be used to offset subsequently formed doped regions, such as source/drain regions. The gate spacers 210 may further be used for designing or modifying the source/drain region profile.

Figure 11:
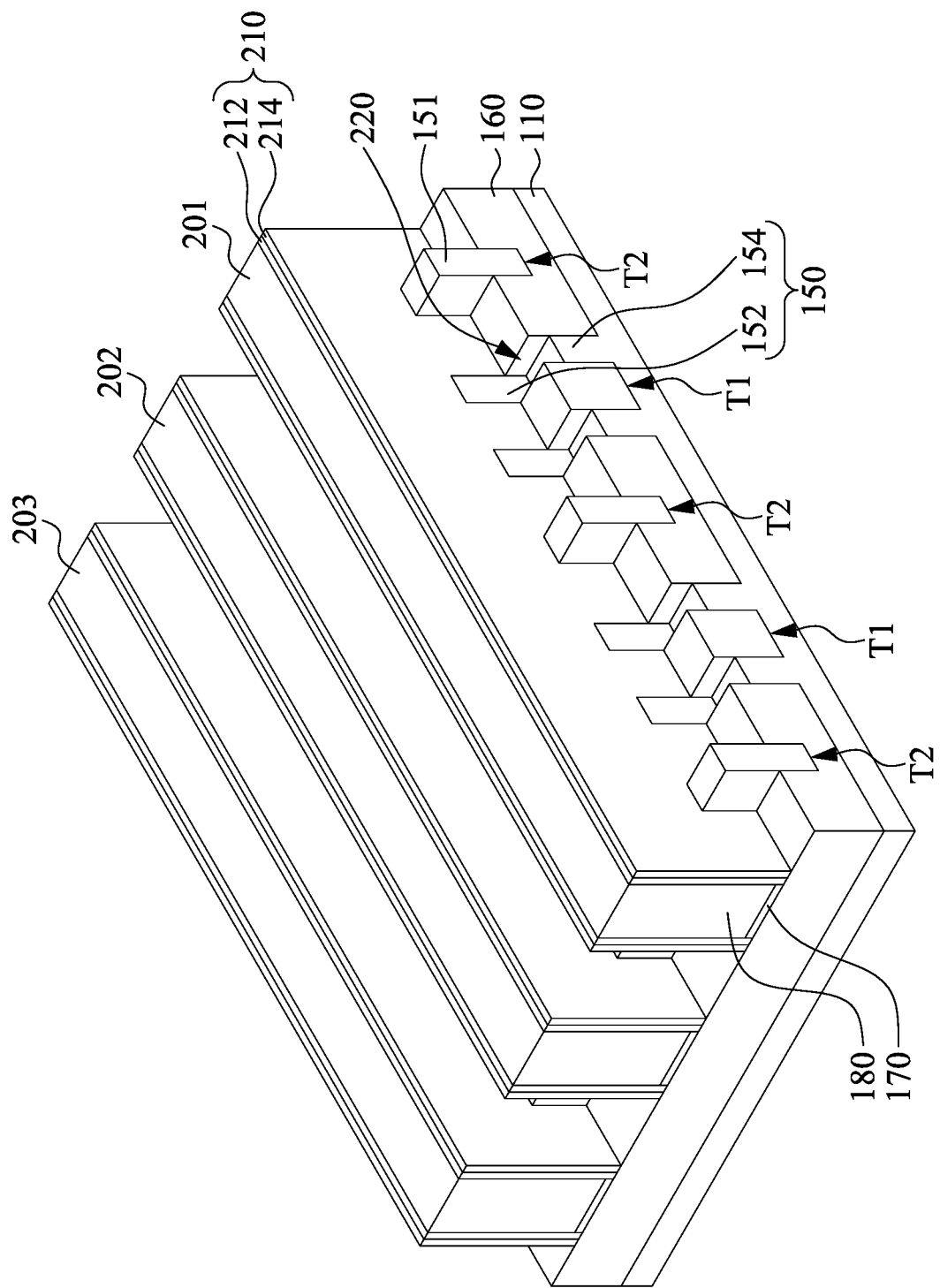

Reference is made to FIG. 11. Portions of the semiconductor fins 150 not covered by the dummy gate structures 201-203 and the gate spacers 210 are respectively partially removed (or partially recessed) to form recesses 220. The remaining semiconductor fin 150 may have a protruding portion 152 and embedded portions 154 after this removal. The embedded portions 154 are embedded in the isolation layer 160, and the embedded portions 154 are exposed by the recesses 220. The protruding portion 152 protrudes from the embedded portions 154 and is located between the recesses 220. The dummy gate structures 201-203 wrap the protruding portions 152, and hence the protruding portions 152 can act as channel regions of transistors. The embedded portions 154 spaced apart from the dummy gate structures 201-203 can act as source/drain regions of transistors.

Formation of the recesses 220 may include a dry etching process, a wet etching process, or combination dry and wet etching processes. This etching process may include reactive ion etch (RIE) using the dummy gate structures 201-203 and gate spacers 210 as masks, or by any other suitable removal process. In some embodiments, the etching process may be performed, for example, under a pressure of about 1 mTorr to 1000 mTorr, a power of about 10 W to 1000 W, a bias voltage of about 20 V to 500 V, at a temperature of about 40° C. to 60° C., using a HBr and/or $Cl_2$ as etch gases. After the etching process, a pre-cleaning process may be performed to clean the recesses 220 with hydrofluoric acid (HF) or other suitable solution in some embodiments.

Figure 12:
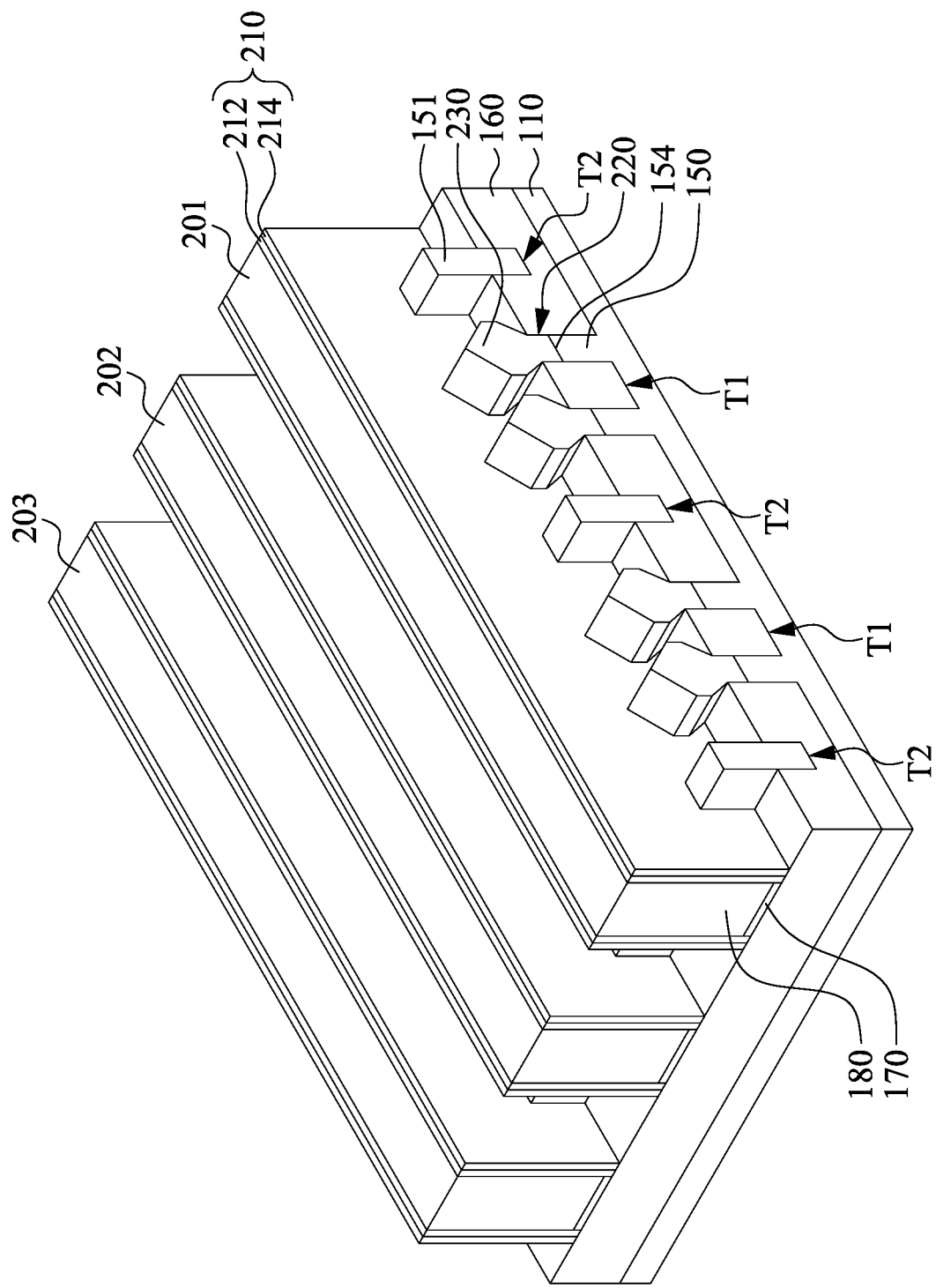

Reference is made to FIG. 12. Epitaxial source/drain structures 230 are respectively formed in the recesses 220. The epitaxial source/drain structures 230 may be formed using one or more epitaxy or epitaxial (epi) processes, such that Si features, SiGe features, silicon phosphate (SiP) features, silicon carbide (SiC) features and/or other suitable features can be formed in a crystalline state on the embedded portions 154 of the semiconductor fins 150. In some embodiments, lattice constants of the epitaxial source/drain structures 230 are different from that of the semiconductor fins 150, so that the channel region between the epitaxial source/drain structures 230 can be strained or stressed by the epitaxial source/drain structures 230 to improve carrier mobility of the semiconductor device and enhance the device performance.

Specifically, the electron mobility increases and the hole mobility decreases when the tensile strain is applied in the channel region, and the electron mobility decreases and the hole mobility increases when the compressive strain is applied in the channel region. Therefore, an n-type transistor with a stressor configured to provide tensile strain in the channel region would be beneficial, and a p-type transistor with a stressor configured to provide compressive strain in the channel region would be beneficial as well. For example, in some embodiments where two source/drain structures 230 are used to form an n-type transistor, the source/drain structures 230 can act as stressors including, for example, SiP, SiC or SiCP, which is able to induce tensile strain to an n-type channel; in some embodiments where two source/drain structures 230 are used to form a p-type transistor, the source/drain structures 230 may include stressors including SiGe, which is able to induce compressive strain to a p-type channel.

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 150 (e.g., silicon, silicon germanium, silicon phosphate, or the like). The epitaxial source/drain structures 230 may be in-situ doped. The doping species include p-type dopants, such as boron or $BF_2$; n-type dopants, such as phosphorus or arsenic; and/or other suitable dopants including combinations thereof. If the epitaxial source/drain structures 230 are not in-situ doped, a second implantation process (i.e., a junction implant process) is performed to dope the epitaxial source/drain structures 230. One or more annealing processes may be performed to activate the epitaxial source/drain structures 230. The annealing processes include rapid thermal annealing (RTA) and/or laser annealing processes.

Figure 13:
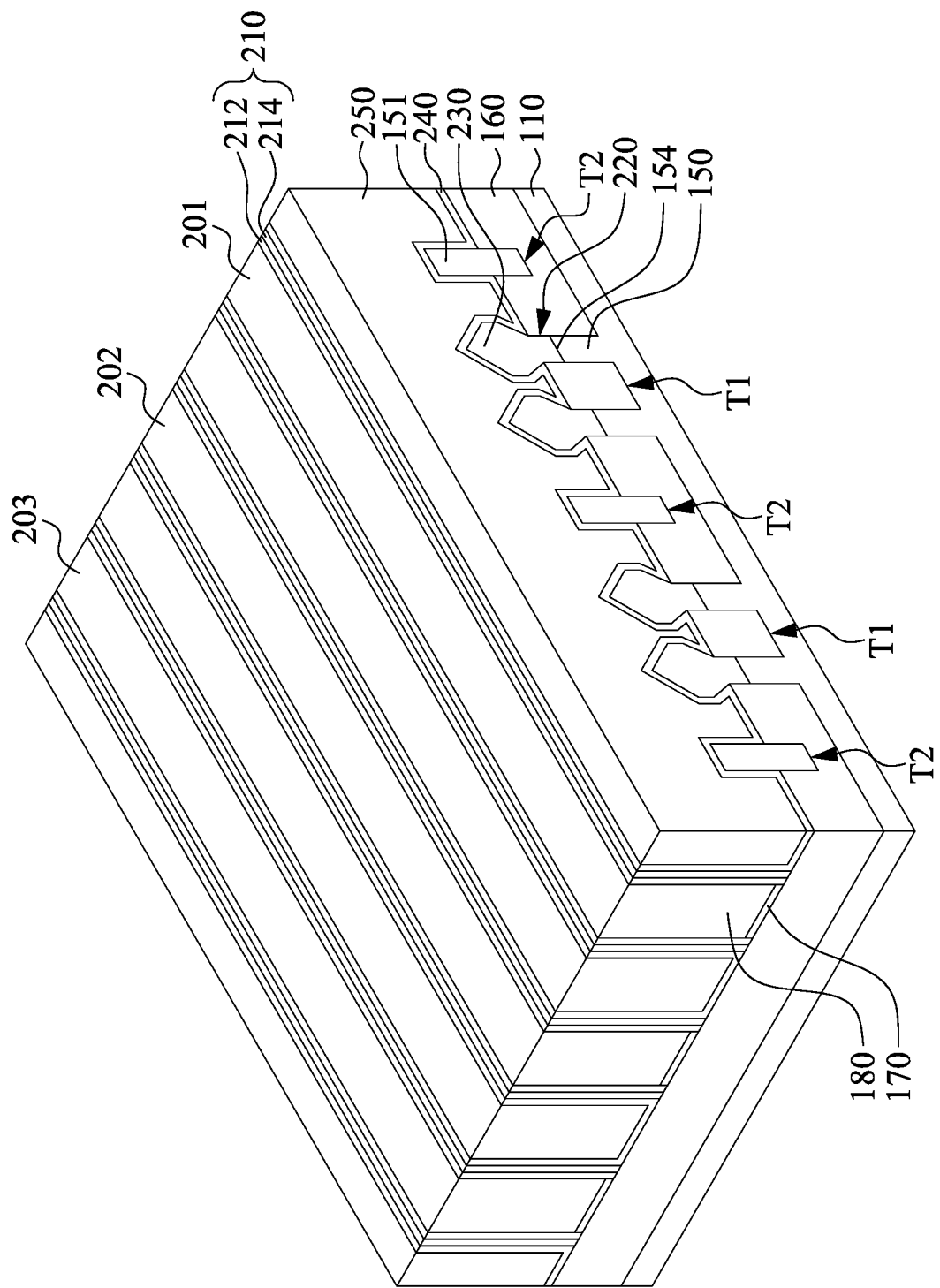

Reference is made to FIG. 13. A contact etch stop layer (CESL) 240 is blanket formed on the structure shown in FIG. 12, and then, an interlayer dielectric (ILD) layer 250 is formed on the CESL 240. Afterwards, a CMP process may be optionally performed to remove excessive material of the ILD layer 250 and the CESL 240 to expose the dummy gate structures 201-203. The CMP process may planarize a top surface of the ILD layer 250 with top surfaces of the dummy gate structures 201-203, gate spacers 210 and the CESL 240 in some embodiments. The CESL 240 includes silicon nitride, silicon oxynitride or other suitable materials. The CESL 240 can be formed using, for example, plasma enhanced CVD, low pressure CVD, ALD or other suitable techniques. The ILD layer 250 may include a material different from the CESL 240. In some embodiments, the ILD layer 250 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 250 may be formed using, for example, CVD, ALD, spin-on-glass (SOG) or other suitable techniques.

Figure 14:
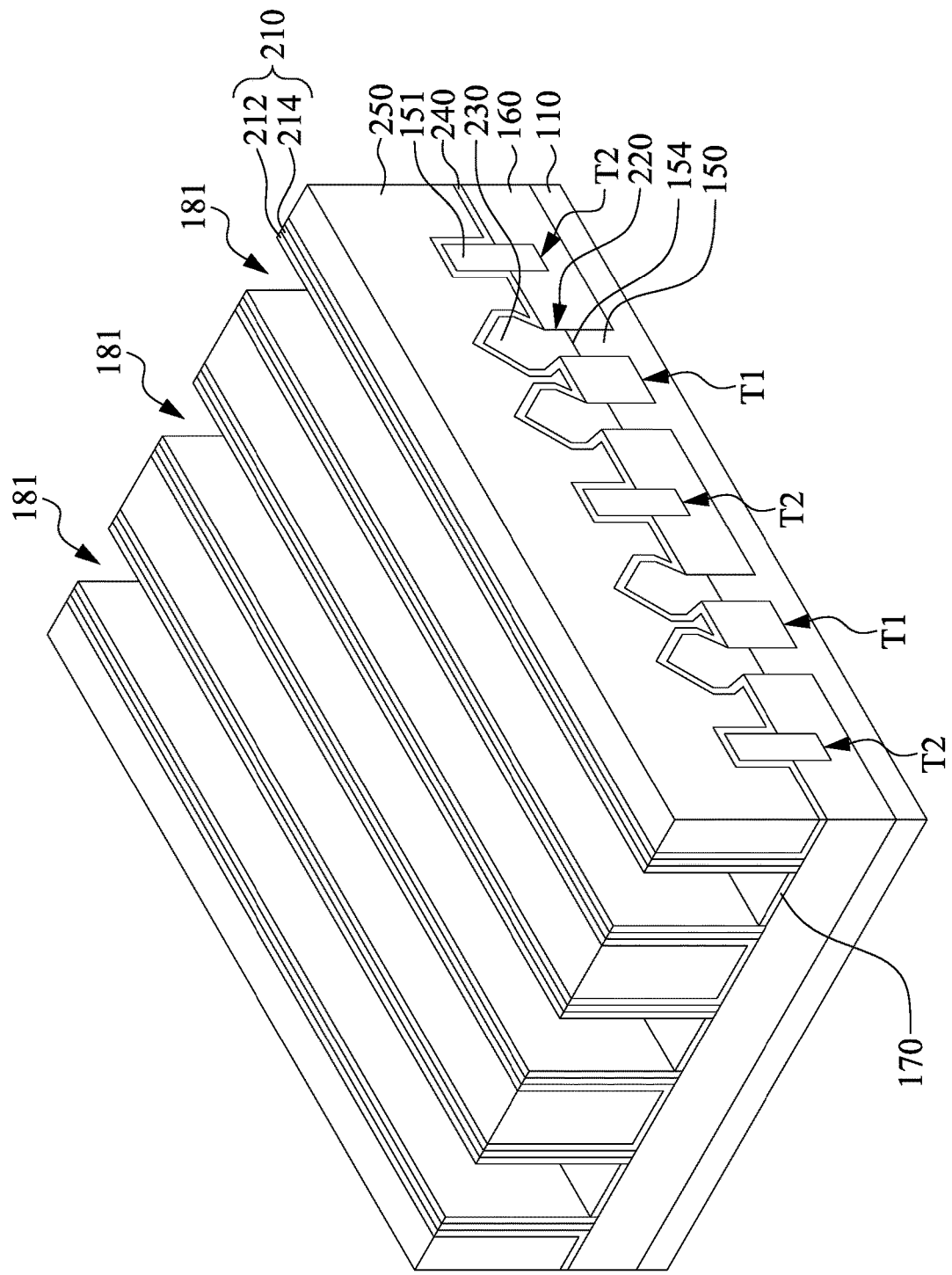

Reference is made to FIG. 14. The dummy gate electrode layers 180 are removed to form recesses 181. In some embodiments, the recess 181 may also refer to as a gate trench. The dummy gate electrode layers 180 are removed in one or many etch operations including wet etch and dry etch. According to various embodiments, a hard mask is patterned over the semiconductor fins 150 to protect the ILD layer 250, the gate spacers 210, and the CESL 240. The dummy gate layer etch may stop at the gate dielectric layer 170. In some embodiments, the gate dielectric layer 170 may be removed along with the dummy gate electrode layer 180. The recess 181 is formed between the gate spacers 210 respectively.

Figure 15:
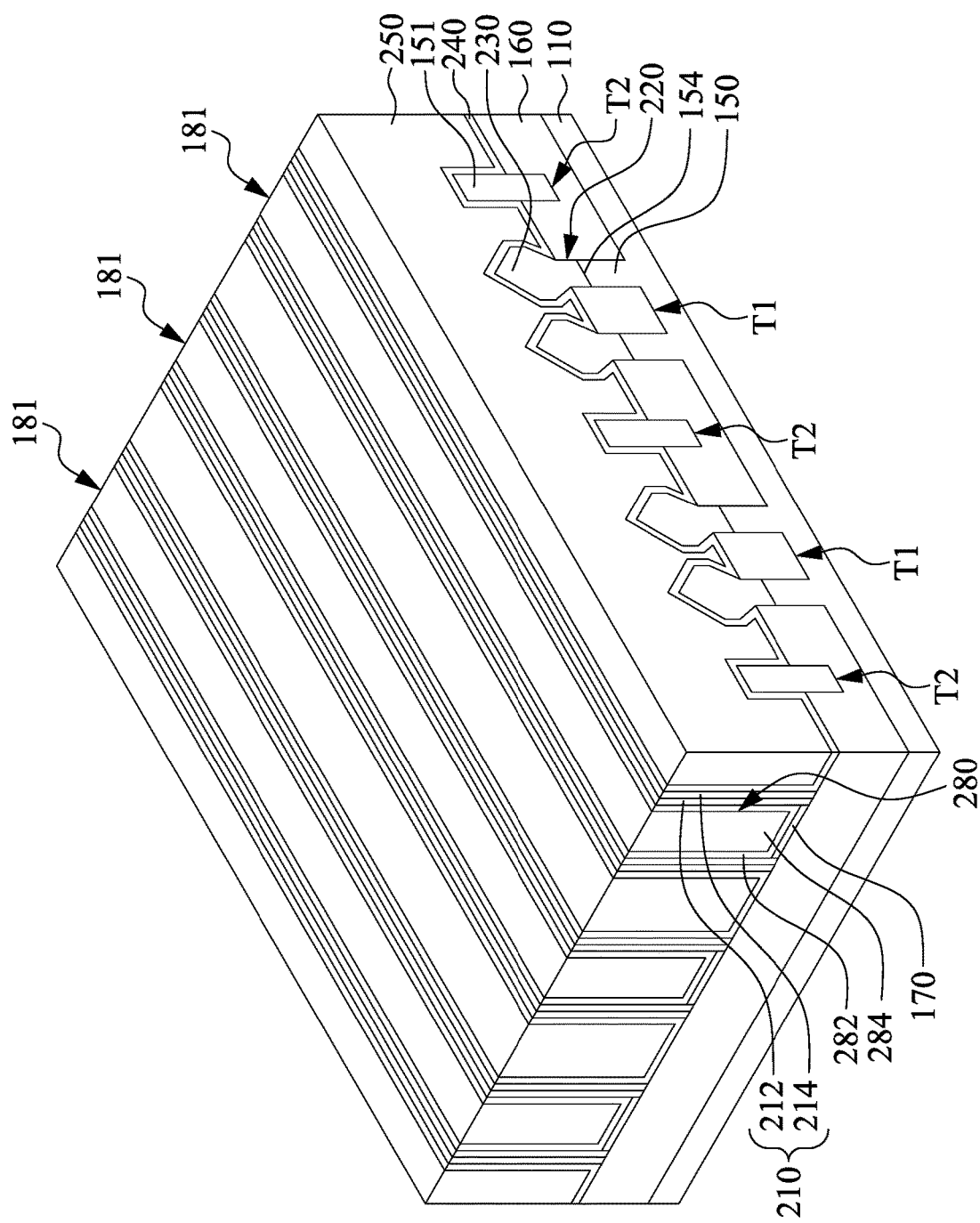

Reference is made to FIG. 15. A metal layer may be formed to fill in the recesses 181. The metal layer overfills the recesses 181, and next a planarization process is performed. As shown in FIG. 15, work function metal layer 282 is formed in the recess 181 and cover the gate dielectric layer 170 and sidewalls of the gate spacers 210. Subsequently, the metal gate electrode layer 284 is formed in the recesses 181. The work function metal layer 282 may be formed by conformally deposited a work function material layer on the semiconductor substrate. The overfilled work function metal material layer and the metal gate electrode material layer are pulled back by, for example, etching, to form the gate stack 280 in the recesses 181 respectively. The top surface of the metal gate electrode layer 284 is level with the top surface of the ILD layer 250. The gate stack 280 is high-k metal gates. The metal layer may include any metal material suitable for forming metal gate electrode layer 284 or portions thereof, including liner layers, interface layers, seed layers, adhesion layers, barrier layers, etc. In some embodiments, the metal layer may include suitable metals, such as TiN, WN, TaN, or Ru that properly perform in the PMOSFET. In some alternative embodiments, the metal layer may include suitable metals, such as T1, Ag, Al, TiAl, TiAlN, TiAlC, TiAlCN, TaC, TaCN, TaSiN, Mn, or Zr that properly perform in the NMOSFET.

Figure 16:
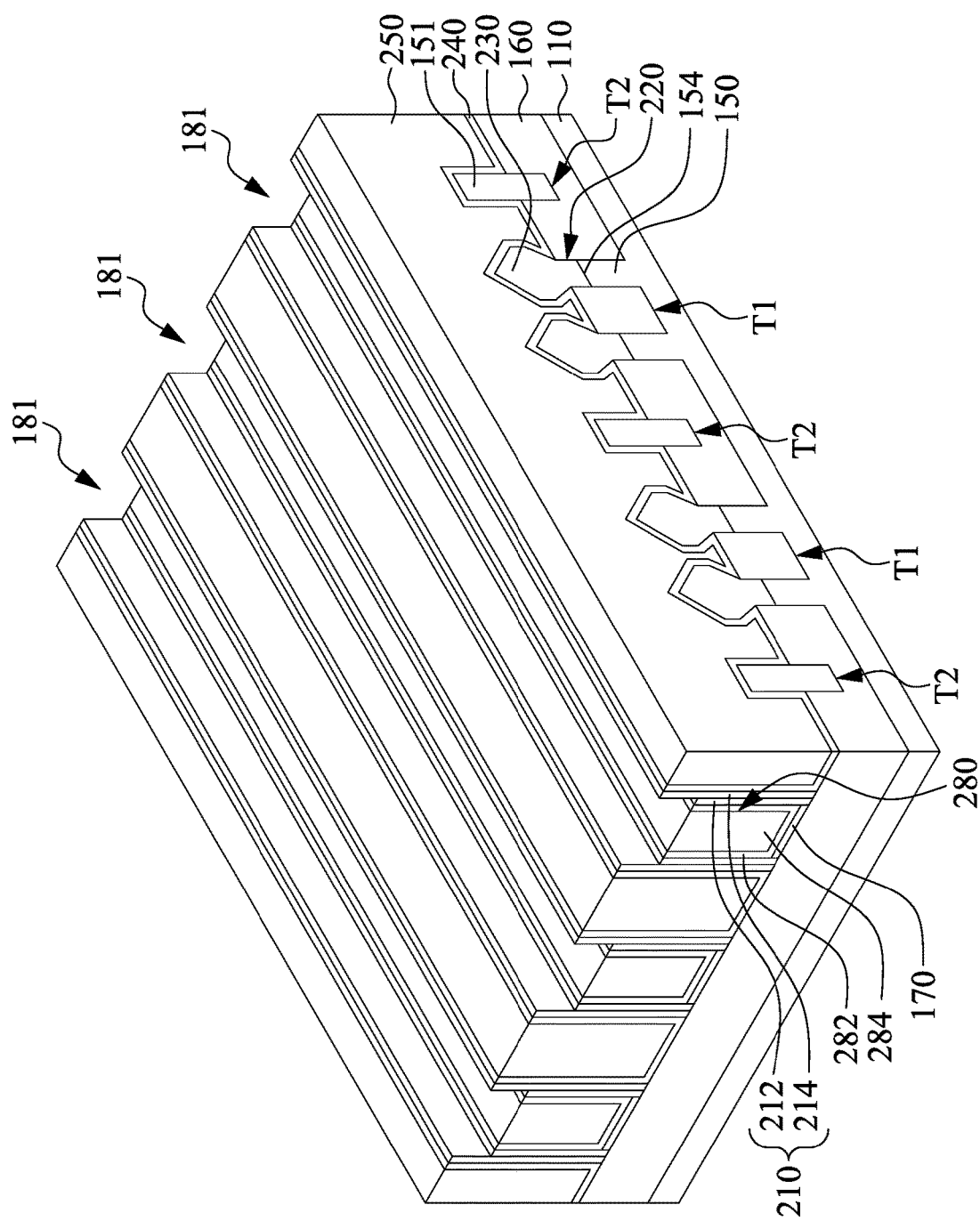

Reference is made to FIG. 16. An etching back is performed to remove a portion of the metal gate electrode layer 284, the work function metal layer 282, and the gate spacer 212. A mask layer may be used in the etching process. The metal gate electrode layer 284 and work function metal layer 282 are brought down to a level approximately half the height of the gate spacers 210, but the present disclosure is not limited thereto. The recesses 181 reappear with shallower depth. The top surface of the metal gate electrode layer 284 is no longer level with the ILD layer 250. An upper portion of the gate spacers 214 is then exposed from the gate spacers 214, the work function metal layer 282, and the metal gate electrode layer 284.

Figure 17:
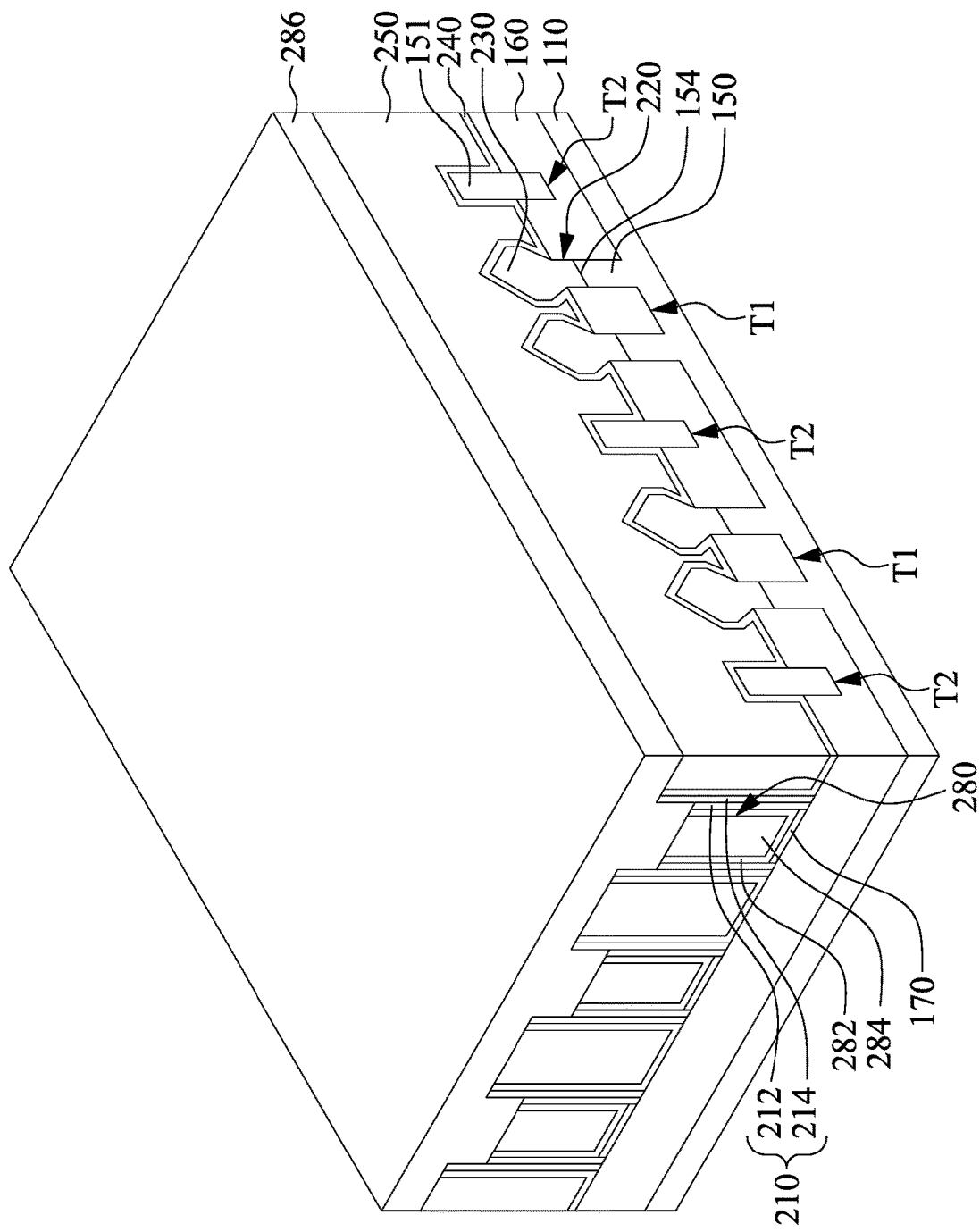

Reference is made to FIG. 17. A hard mask 286 fills in the remaining of the recesses 181 and over the gate stack 280. A material of the hard mask 286 includes, for example, SiO, SiN, SiOC, and SiOCN. An etching selectivity between the gate spacers 214 and the hard mask 286 is larger than approximately 10. For example, the hard mask 286 may include SiO, and the gate spacers 214 may include ZrO. The gate spacers 214 and the hard mask 286 serve as a protection layer to its underlying components, for example, metal gate electrode layer 284, the work function metal layer 282, and the gate spacer 212.

Figure 18A:
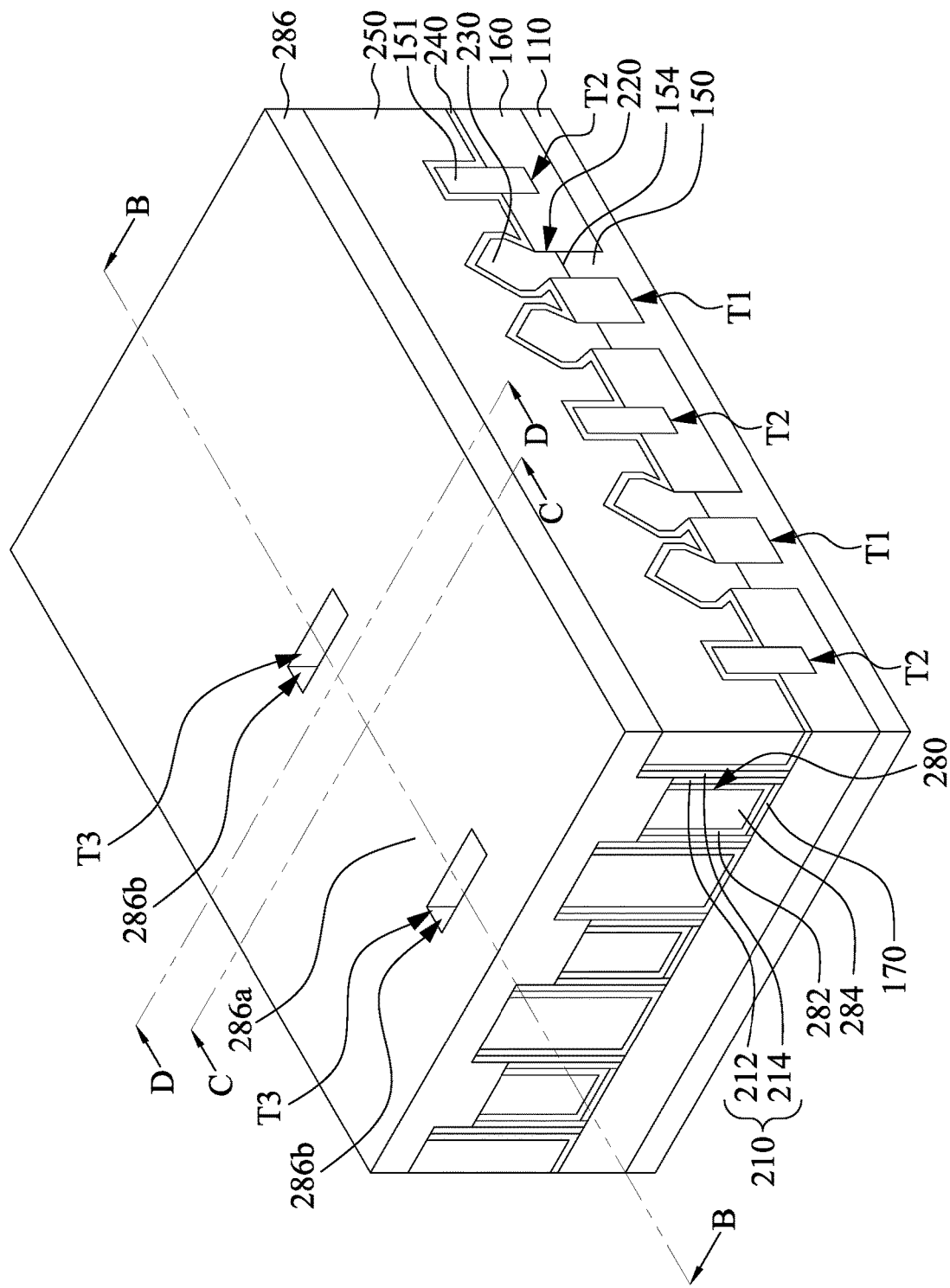
Figure 18B:
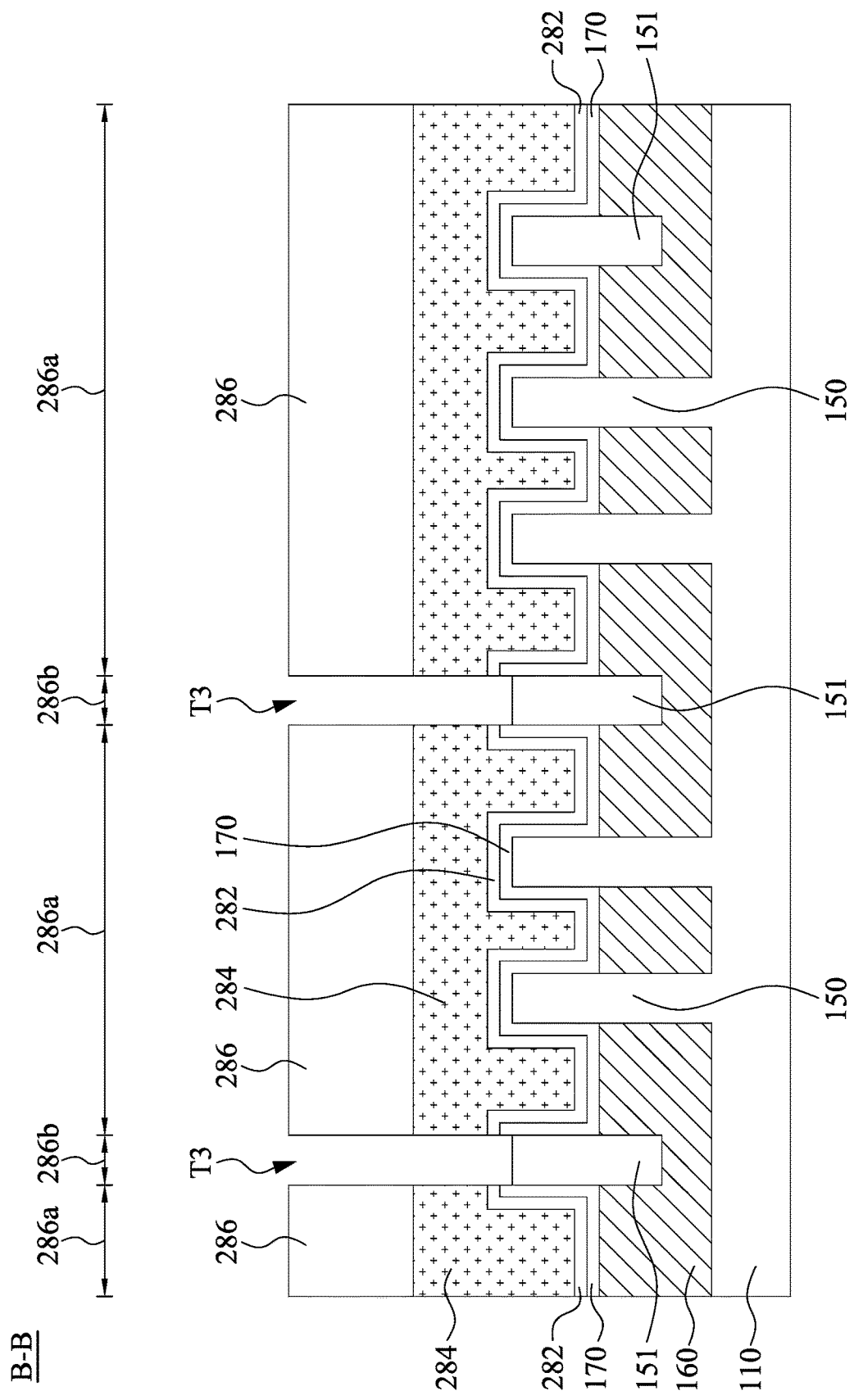
Figure 18C:
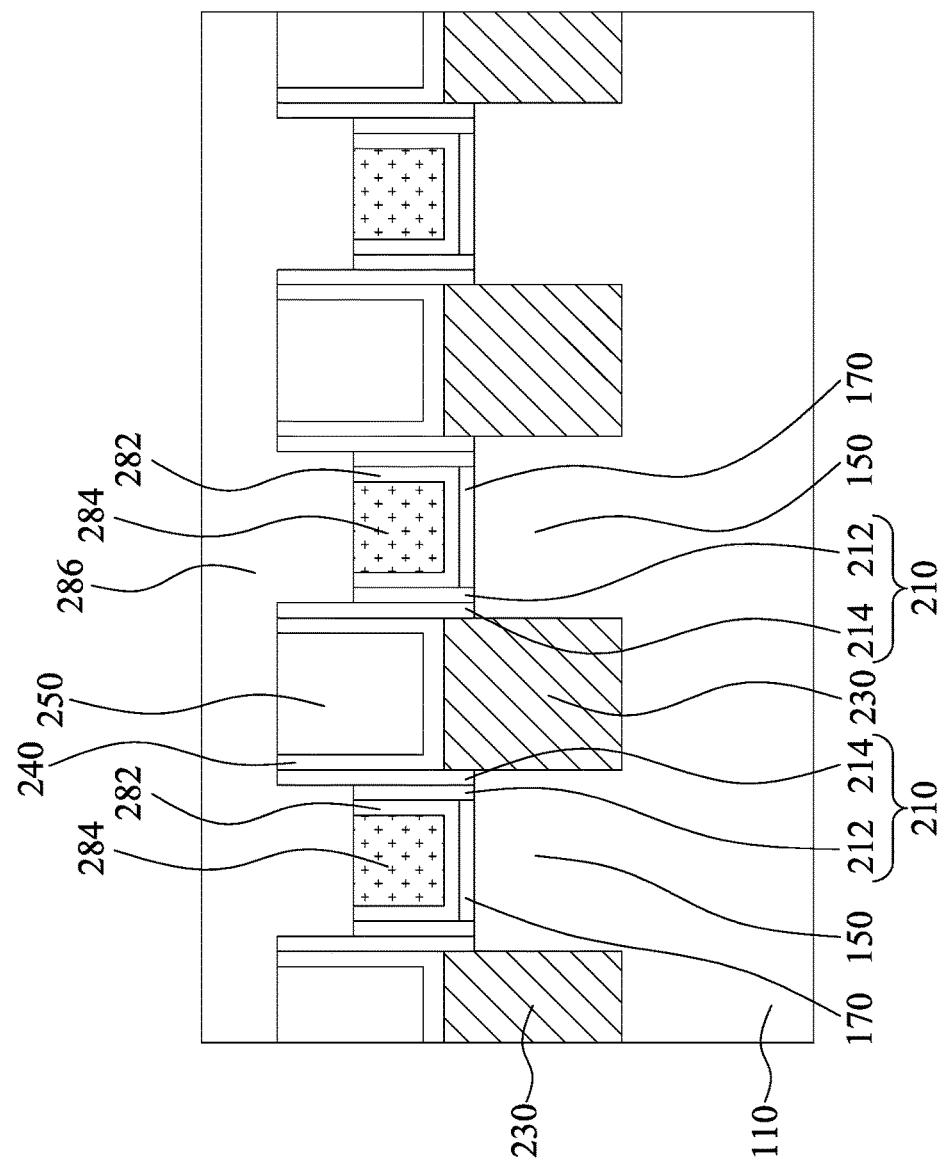
Figure 18D:
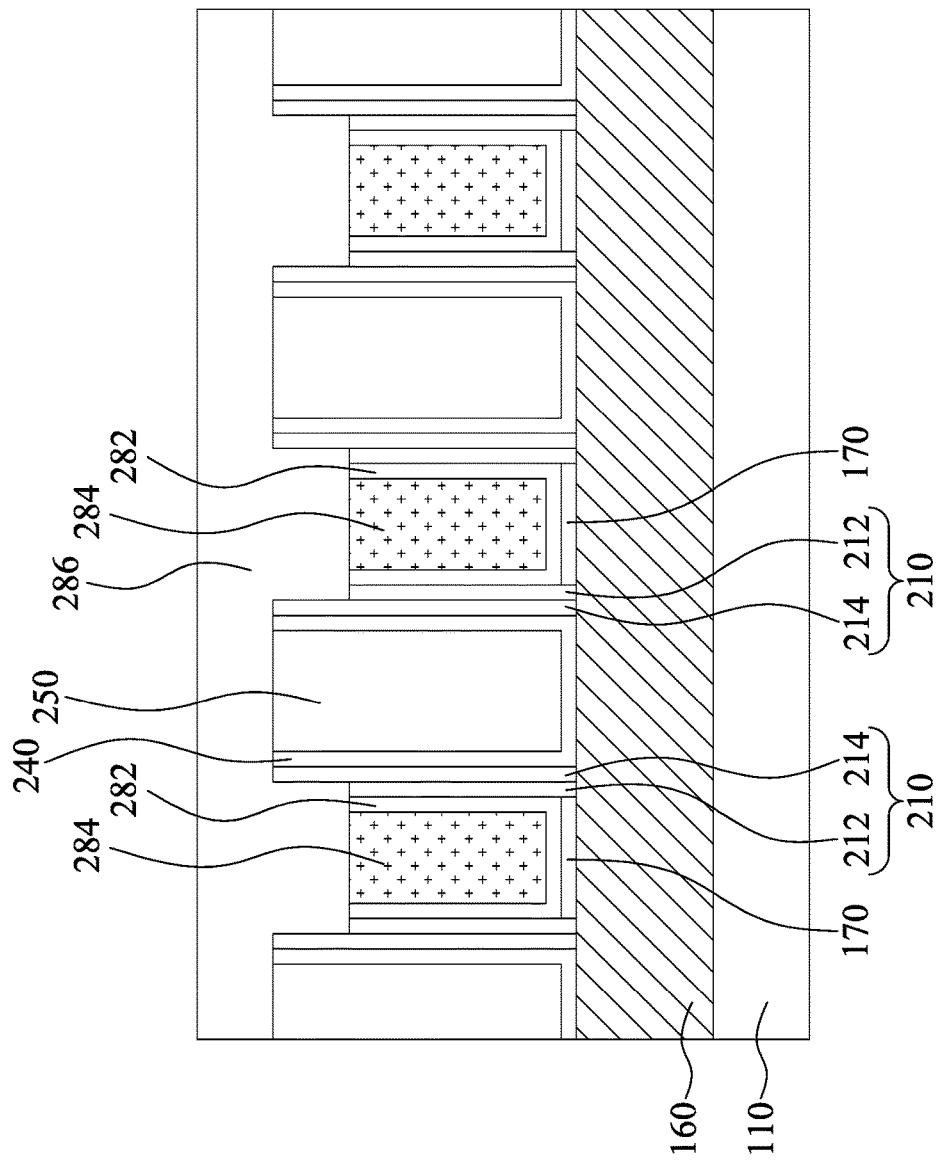

Reference is made to FIG. 18A to FIG. 18D. FIG. 18B is a cross-sectional view along section B-B in FIG. 18A. FIG. 18C is a cross-sectional view along section C-C in FIG. 18A. FIG. 18D is a cross-sectional view along section D-D in FIG. 18A. A patterned mask is formed over the hard mask 286 to define a masked region 286a and an unmasked region 286b on the hard mask 286. In other words, the patterned mask exposes the unmasked region 286b on the hard mask 286, and the masked region 286a on the hard mask 286 may be protected by the patterned mask during processes performed later.

Then, one or more etching processes are performed using the patterned mask as an etching mask. In some embodiments, for example, one or more etching processes are performed to remove the unmasked region 286b of the hard mask 286, the metal gate electrode layer 284, the work function metal layer 282, and the interlayer dielectric 170 that are vertically above the dielectric fin layer 151 and the gate spacer 214. After the unmasked region 286b, the metal gate electrode layer 284, the work function metal layer 282, and the interlayer dielectric 170 vertically above the dielectric fin layer 151 is removed. Then, at least one trench T3 is formed, and the dielectric fin layer 151 is exposed and at a bottom of the trench T3.

Figure 19A:
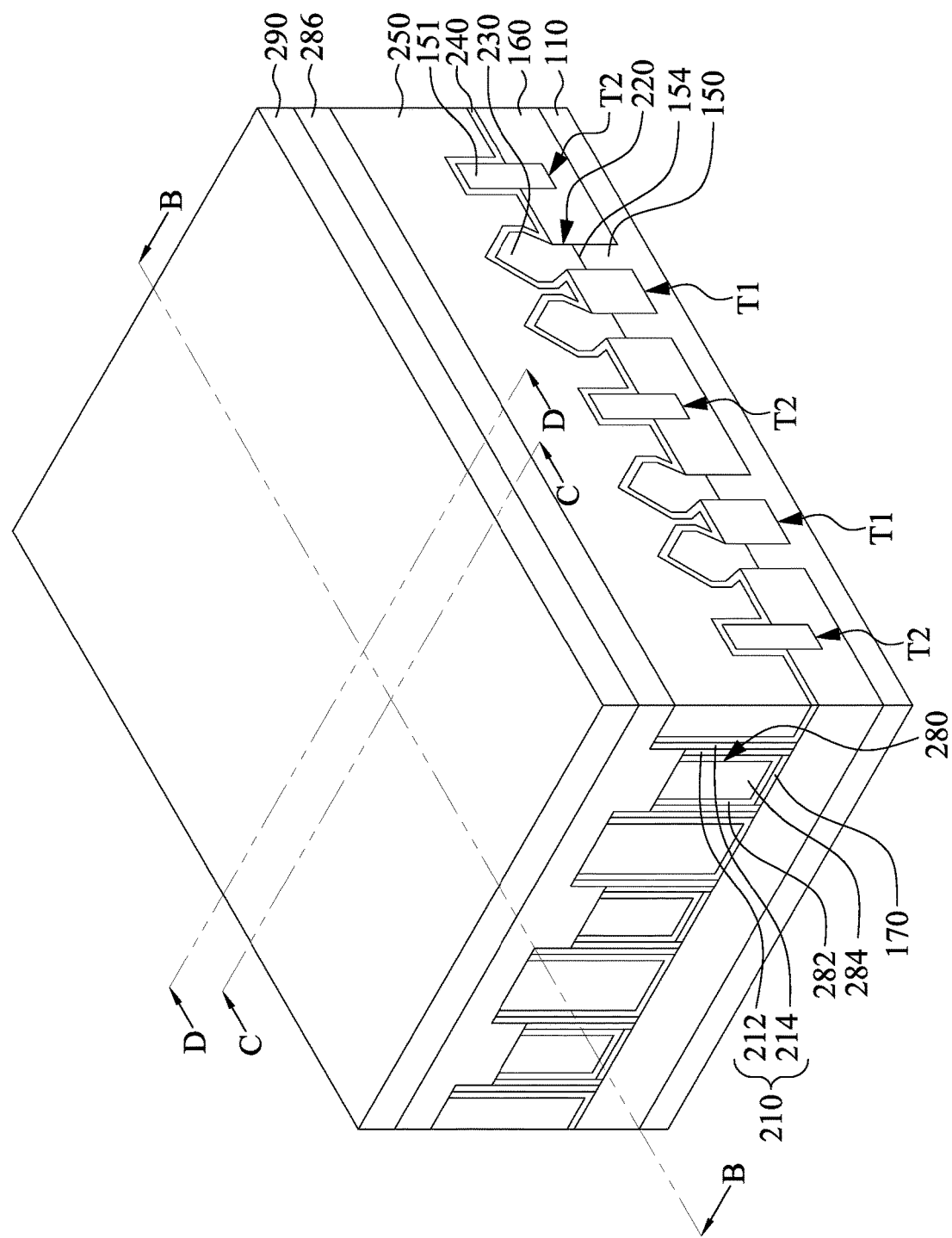
Figure 19B:
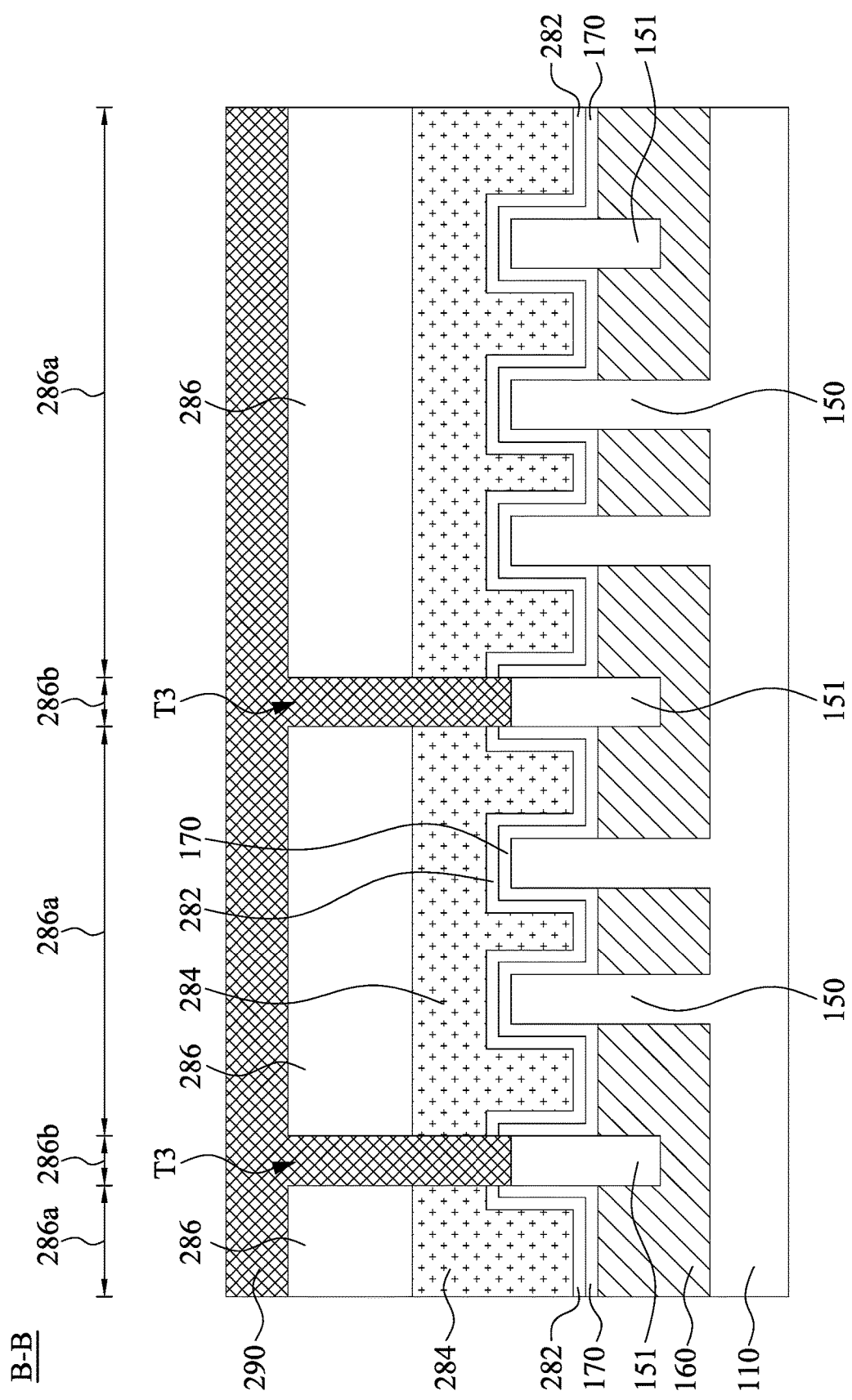
Figure 19C:
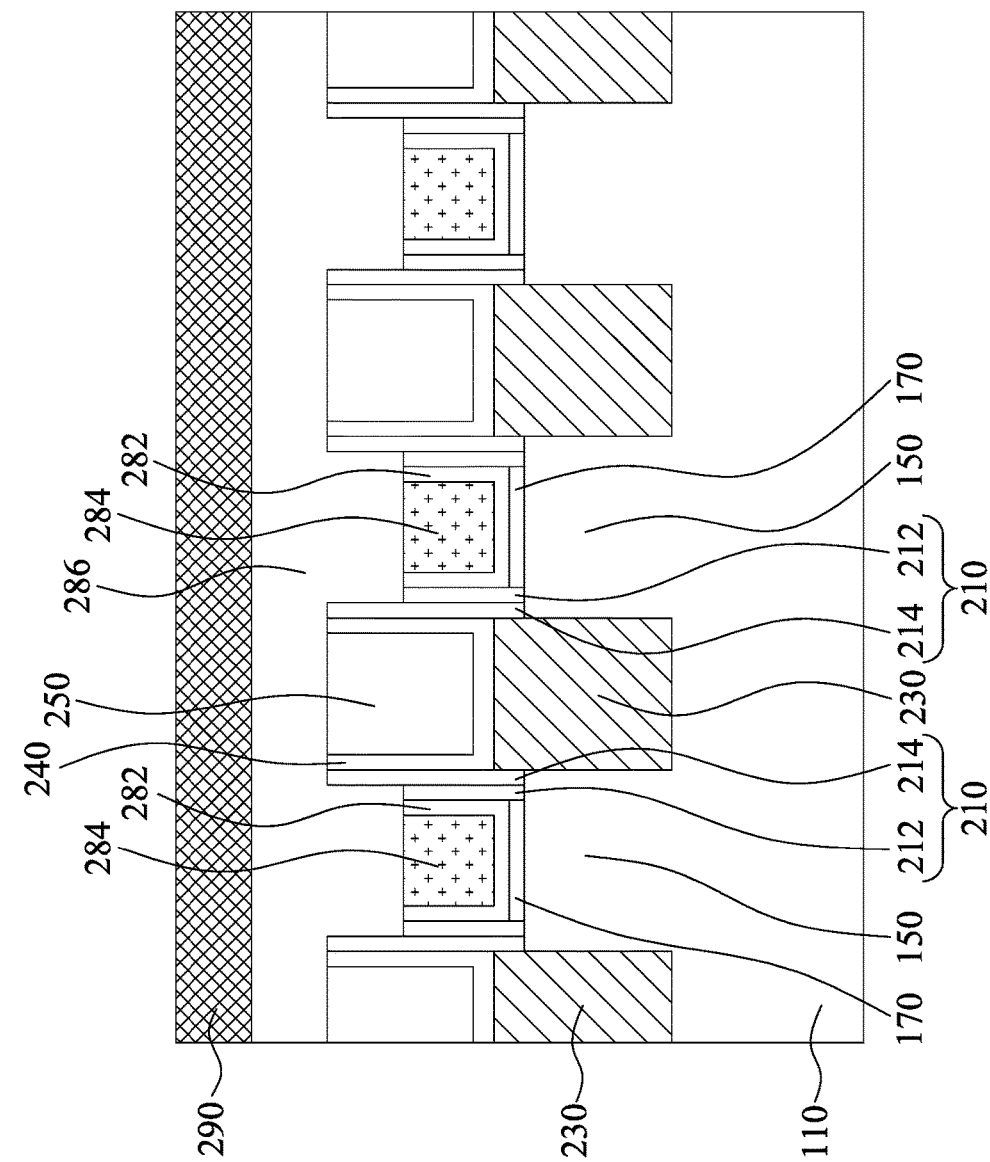
Figure 19D:
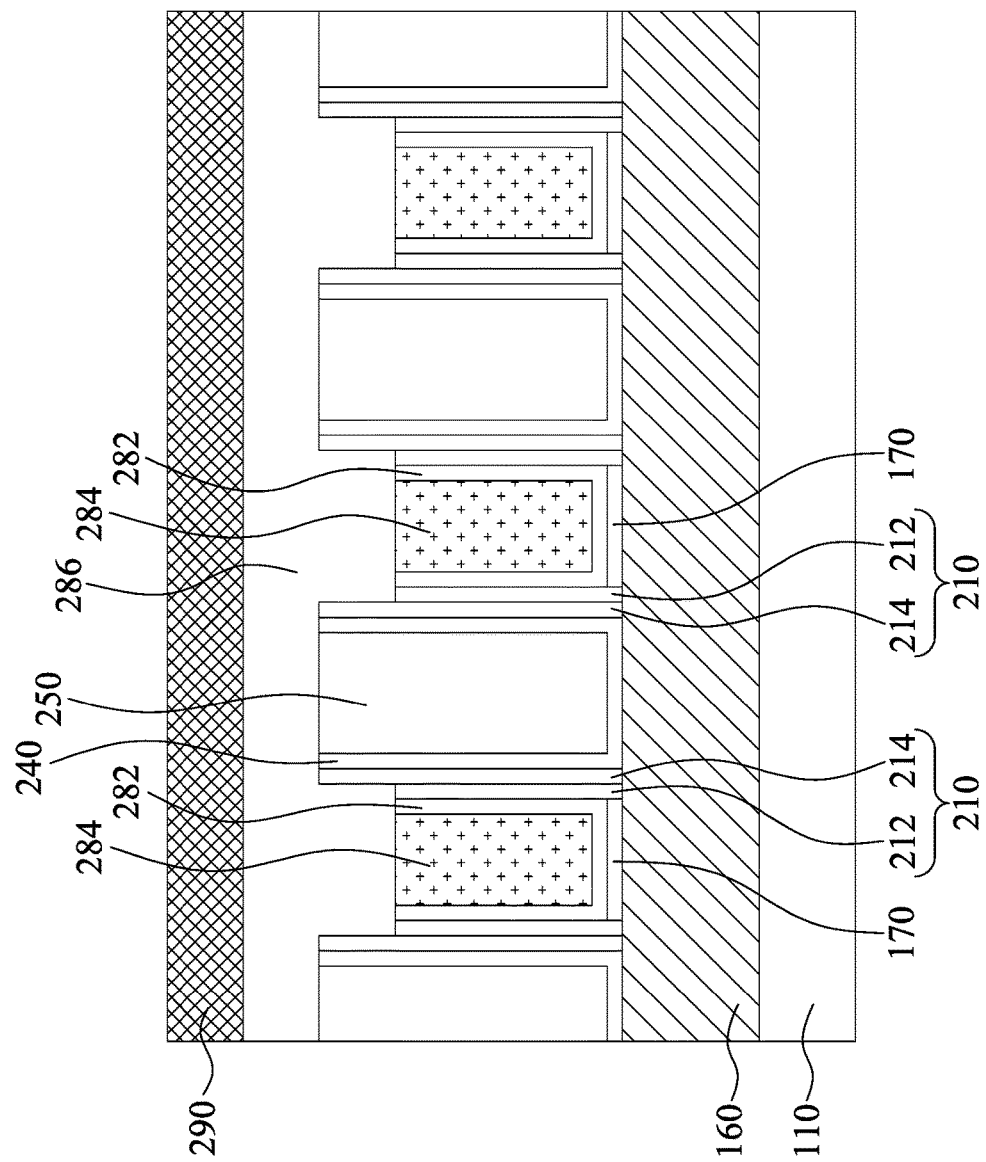

Reference is made to FIG. 19A to FIG. 19D. FIG. 19B is a cross-sectional view along section B-B in FIG. 19A. FIG. 19C is a cross-sectional view along section C-C in FIG. 19A. FIG. 19D is a cross-sectional view along section D-D in FIG. 19A. A first isolation dielectric 290 is filled in the trench T3 and formed over the hard mask 286. Specifically, the first isolation dielectric 290 surrounds the hard mask 286, the metal gate electrode layer 284, the work function metal layer 282, and the interlayer dielectric 170. In some embodiment, the first isolation dielectric 290 is in contact with a top surface of the dielectric fin layer 151. In some embodiment, the first isolation dielectric 290 may be a single layer or multiple layers.

In some embodiments, the first isolation dielectric 290 may include SiOx, SiON, $Si_3N_4$, SiOCN, SiC, SiGe, metals, or combinations thereof. In some embodiments, the first isolation dielectric 290 may include air-gap. In some embodiments, the first isolation dielectric 290 is made of fluoride-doped silicate glass (FSG), or other low-K dielectric materials. In some embodiments, the first isolation dielectric 290 may be formed using a high-density-plasma (HDP) chemical vapor deposition (CVD) process, using silane ($SiH_4$) and oxygen ($O_2$) as reacting precursors. In some other embodiments, the first isolation dielectric 290 may be formed using a sub-atmospheric CVD (SACVD) process or high aspect-ratio process (HARP), wherein process gases may comprise tetraethylorthosilicate (TEOS) and ozone ($O_3$). In yet other embodiments, the first isolation dielectric 290 may be formed using a spin-on-dielectric (SOD) process, such as hydrogen silsesquioxane (HSQ) or methyl silsesquioxane (MSQ). Other processes and materials may be used. In some embodiments, the first isolation dielectric 290 can have a multi-layer structure, for example, a thermal oxide liner layer with silicon nitride formed over the liner. Thereafter, a thermal annealing may be optionally performed to the first isolation dielectric 290.

Figure 20A:
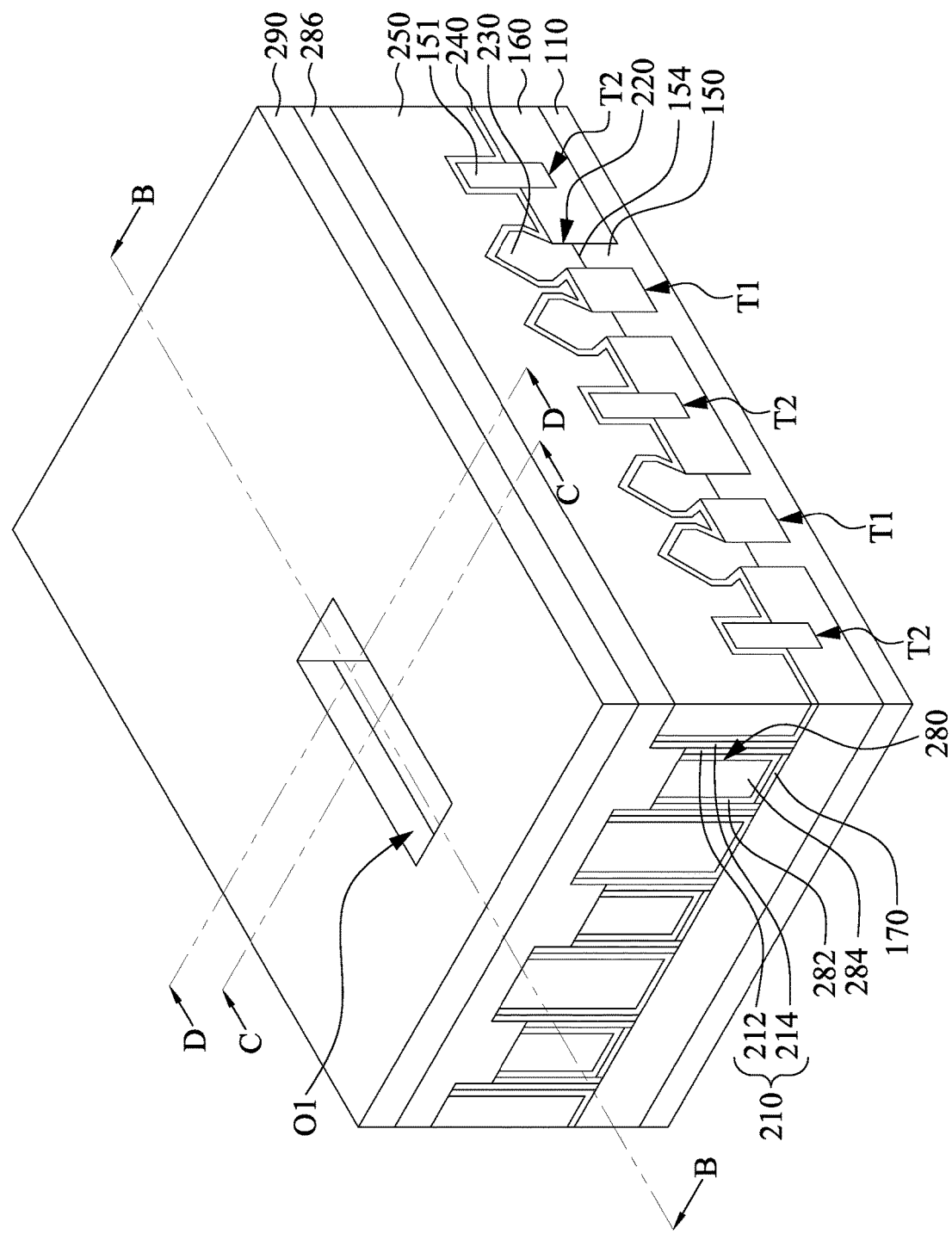
Figure 20B:
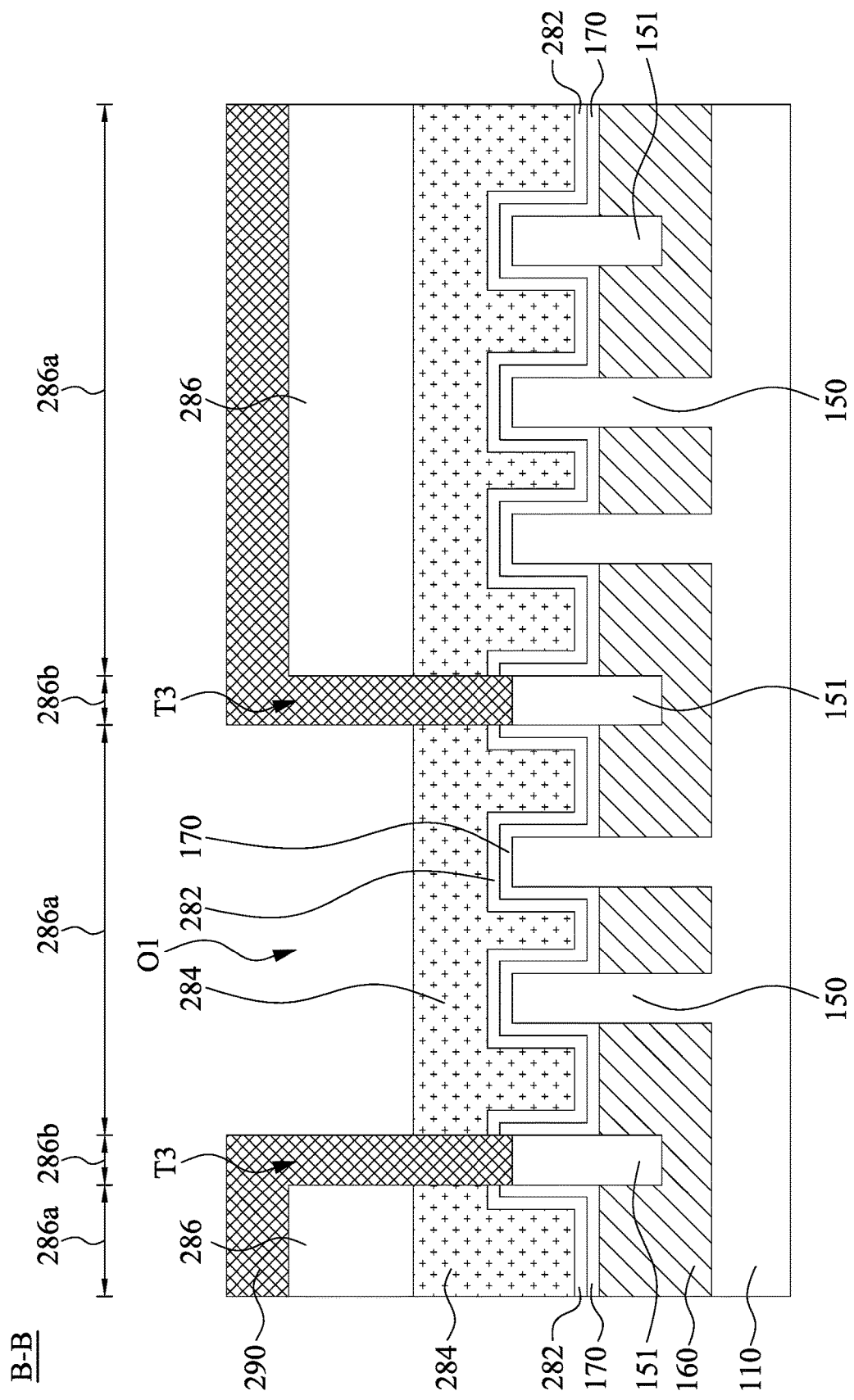
Figure 20C:
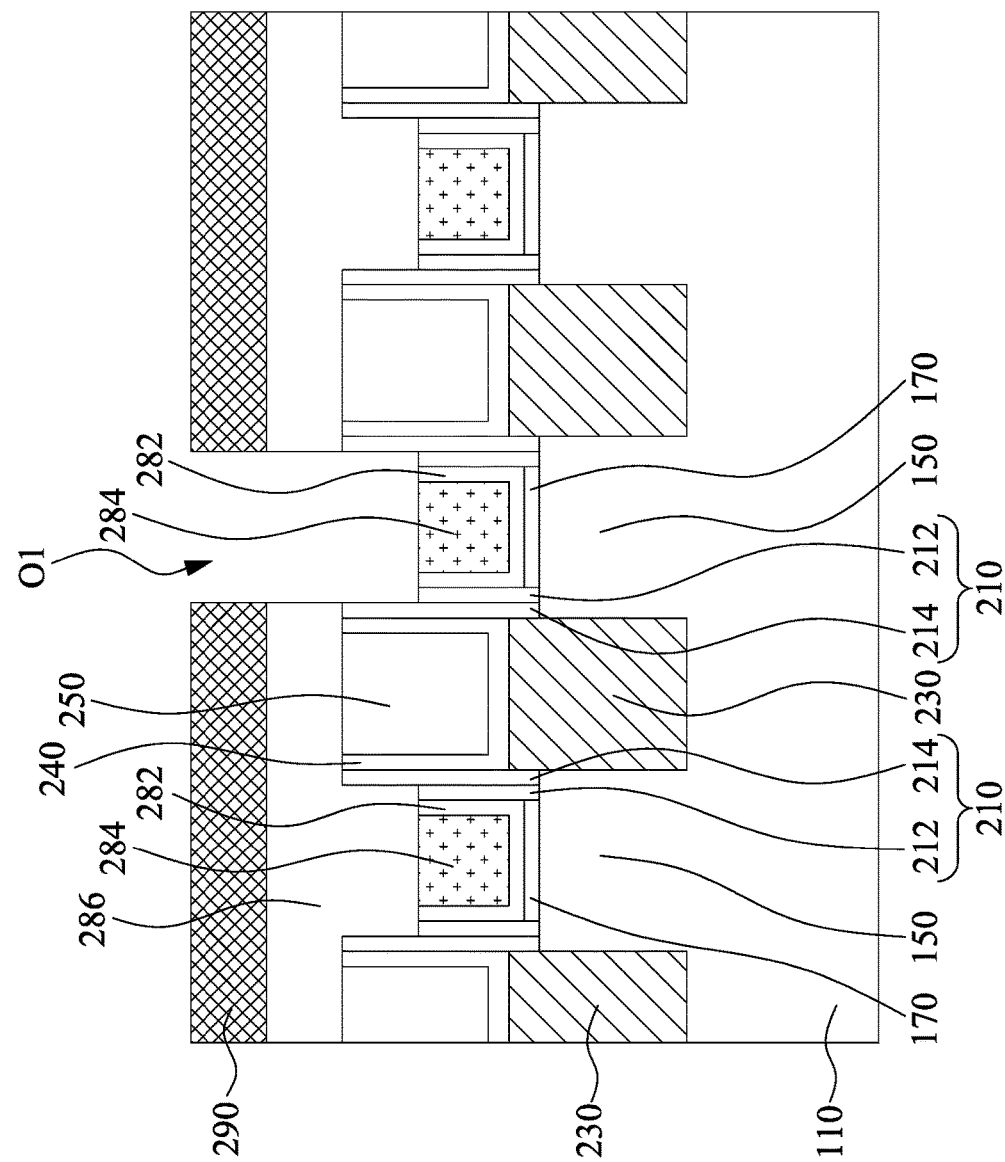
Figure 20D:
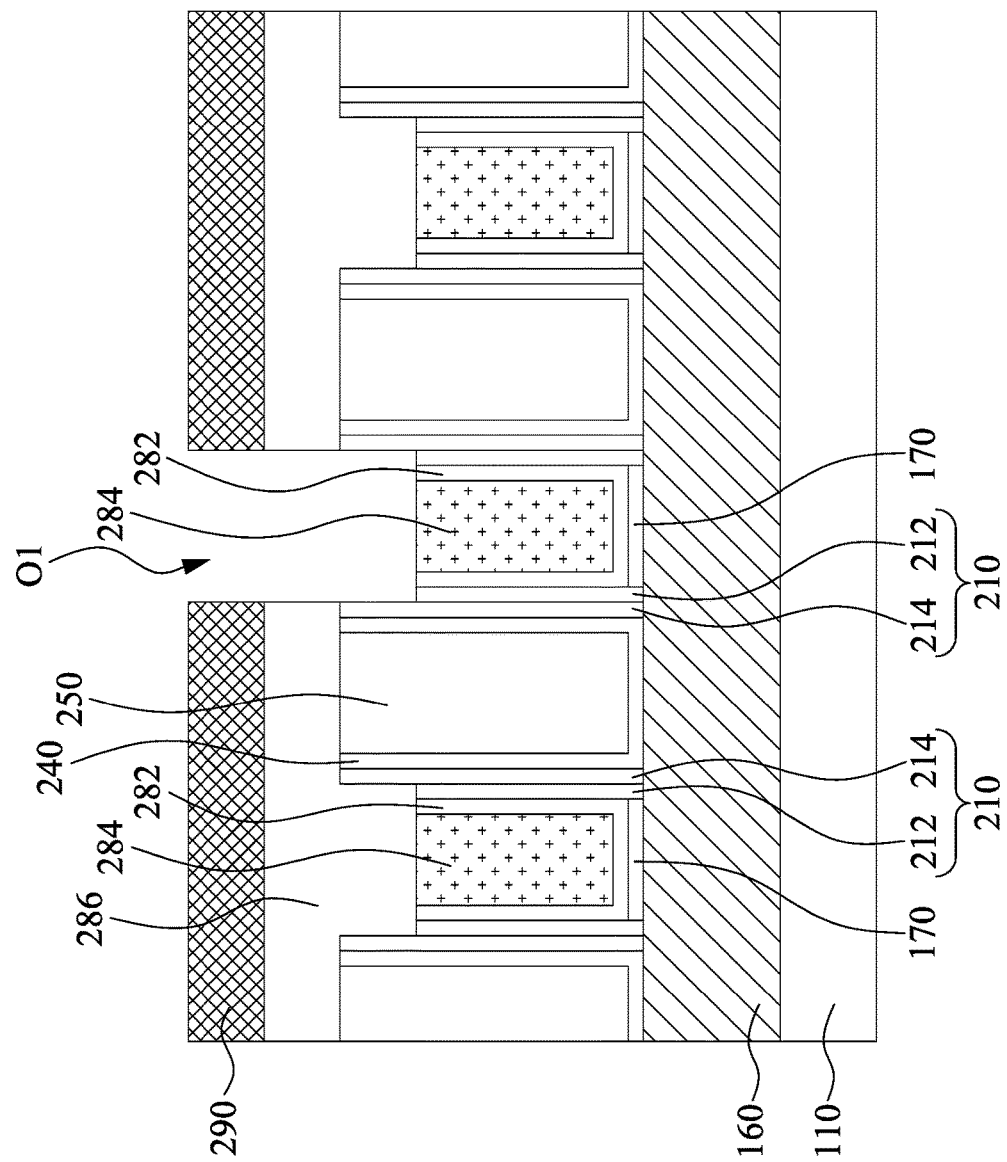

Reference is made to FIG. 20A to FIG. 20D. FIG. 20B is a cross-sectional view along section B-B in FIG. 20A. FIG. 20C is a cross-sectional view along section C-C in FIG. 20A. FIG. 20D is a cross-sectional view along section D-D in FIG. 20A. The hard mask 286 and the first isolation dielectric 290 between the trenches T3 are removed to from an opening O1. In some embodiments, the opening O1 may be included in the recess 181 as shown in FIG. 14. The hard mask 286 and the first isolation dielectric 290 are removed in one or many etch operations including wet etch and dry etch. The etching process may stop at the metal gate electrode layer 284.

Figure 21A:
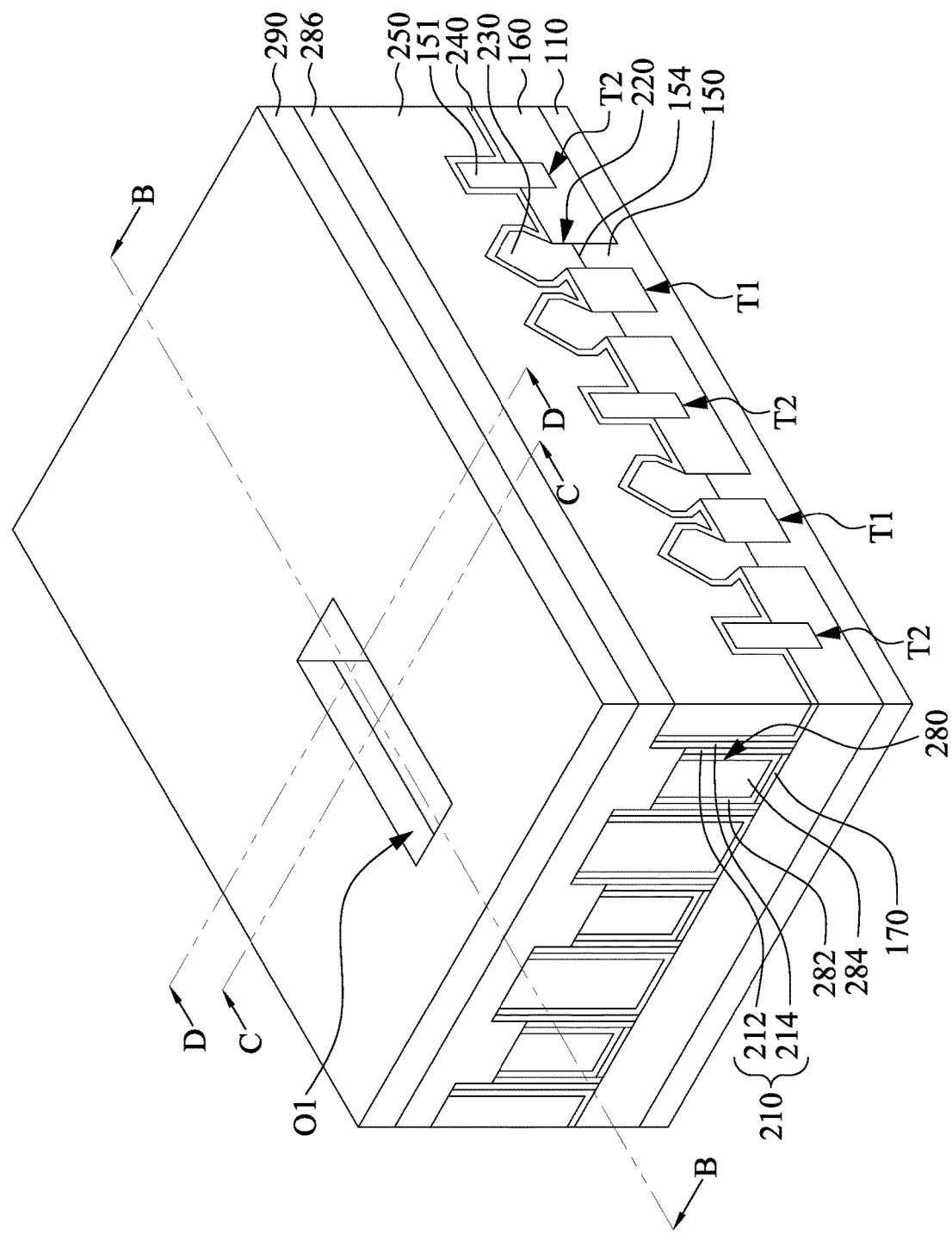
Figure 21B:
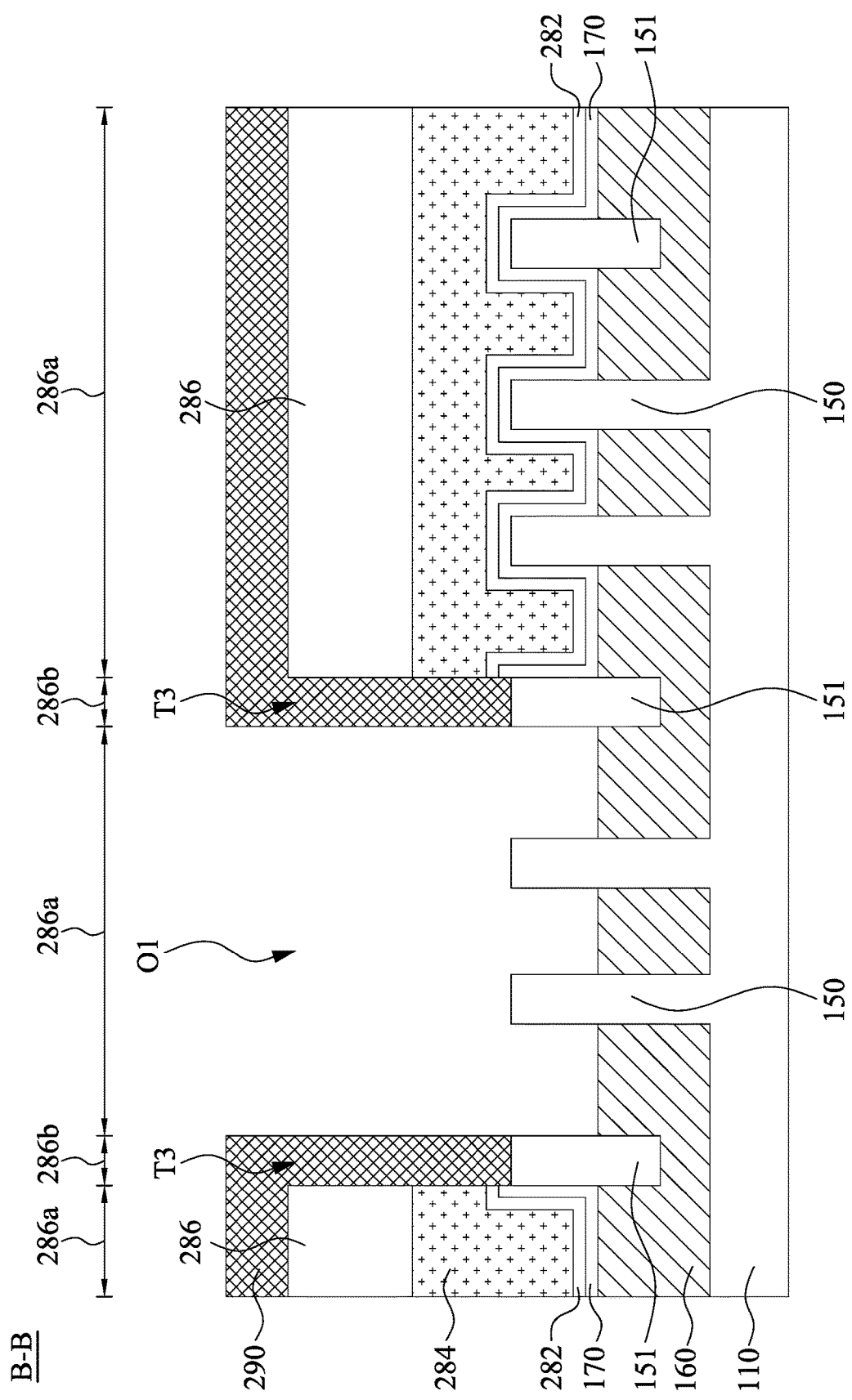
Figure 21C:
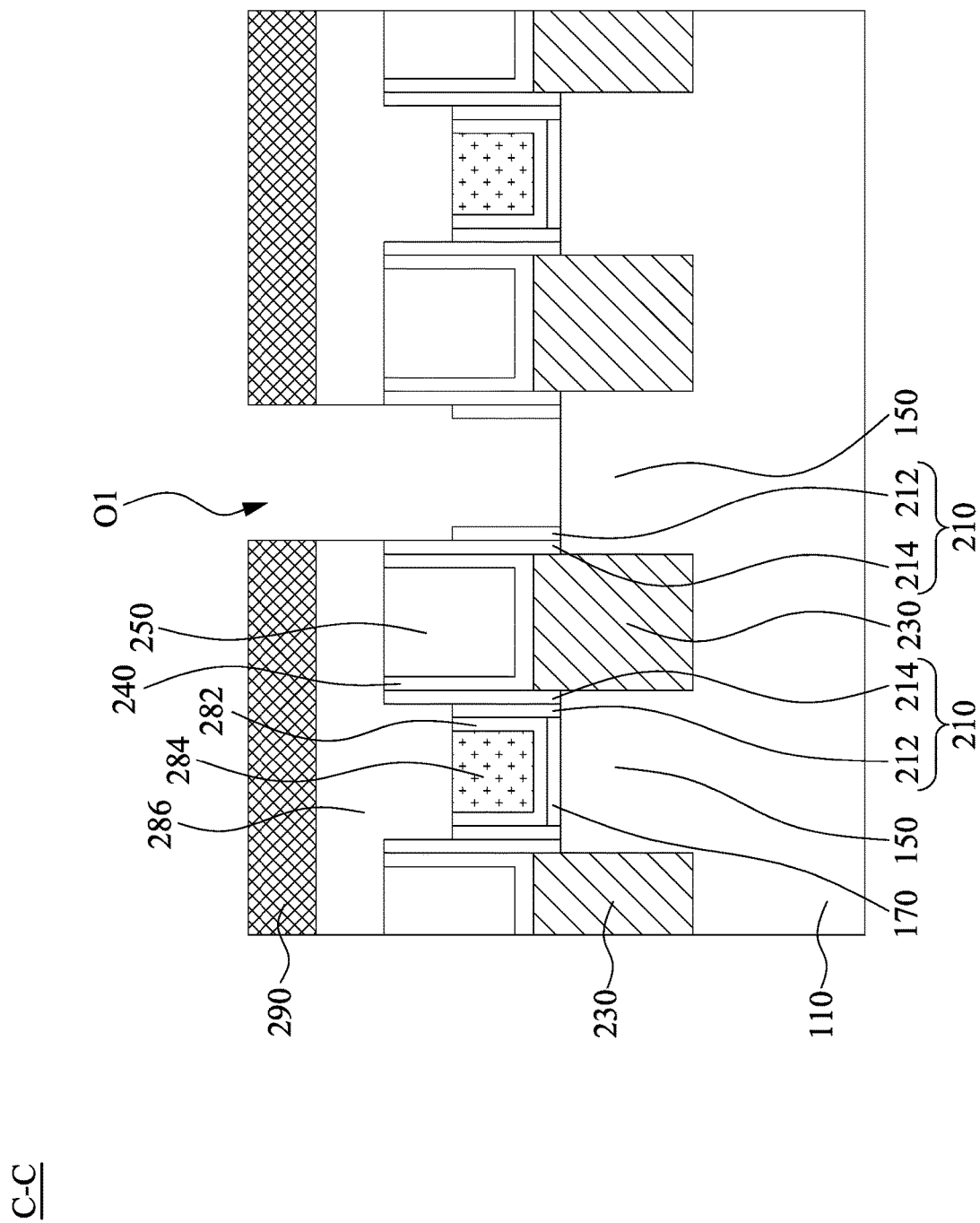
Figure 21D:
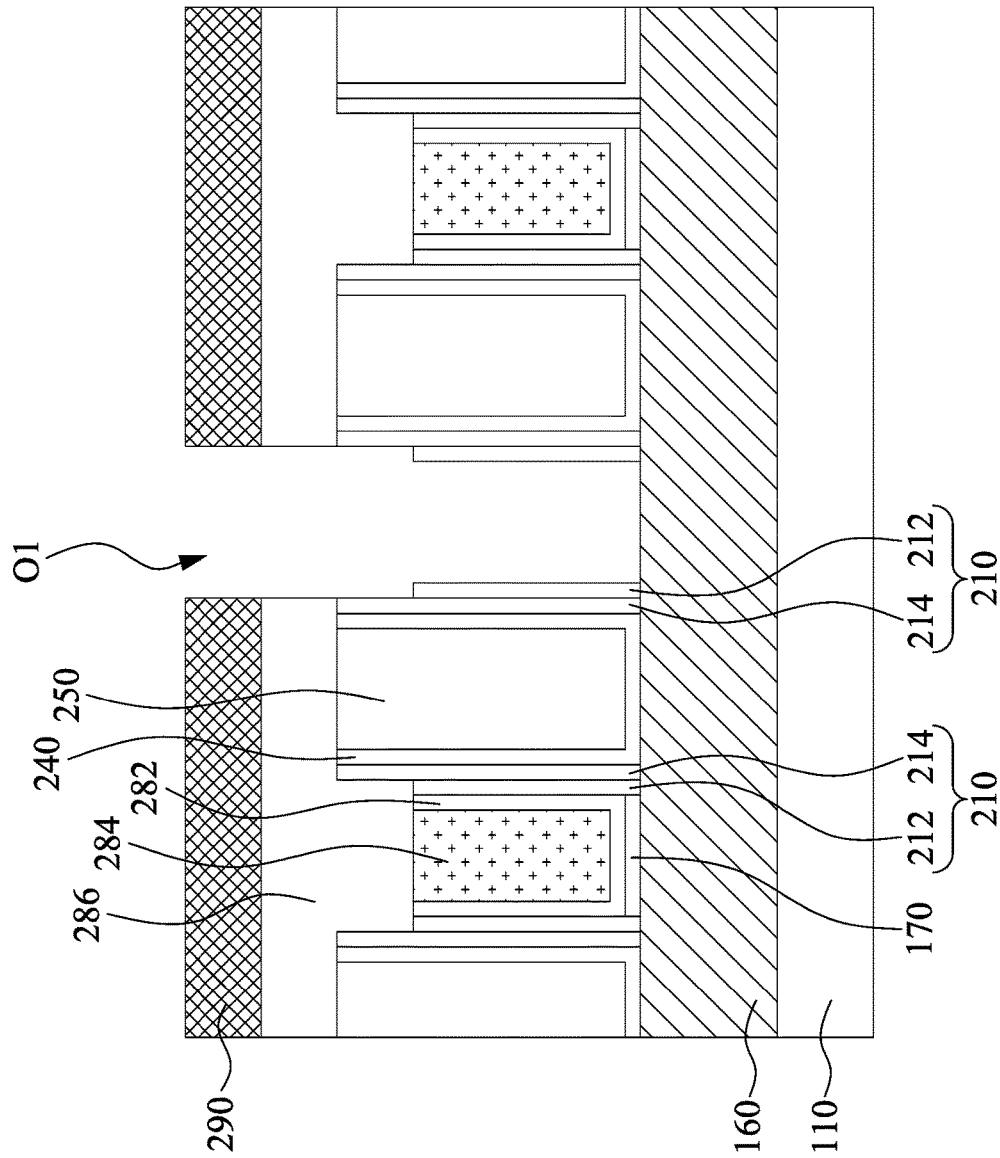

Reference is made to FIG. 21A to FIG. 21D. FIG. 21B is a cross-sectional view along section B-B in FIG. 21A. FIG. 21C is a cross-sectional view along section C-C in FIG. 21A. FIG. 21D is a cross-sectional view along section D-D in FIG. 21A. In some embodiments, for example, one or more etching processes including wet etch and dry etch are performed to remove the metal gate electrode layer 284, work function metal layer 282, and the interlayer dielectric 170 in the opening O1. After the metal gate electrode layer 284, work function metal layer 282, and the interlayer dielectric 170 in the opening O1 are removed, portions of the semiconductor fins 150 and the isolation layer 160 are exposed at a bottom of the opening O1.

Figure 22A:
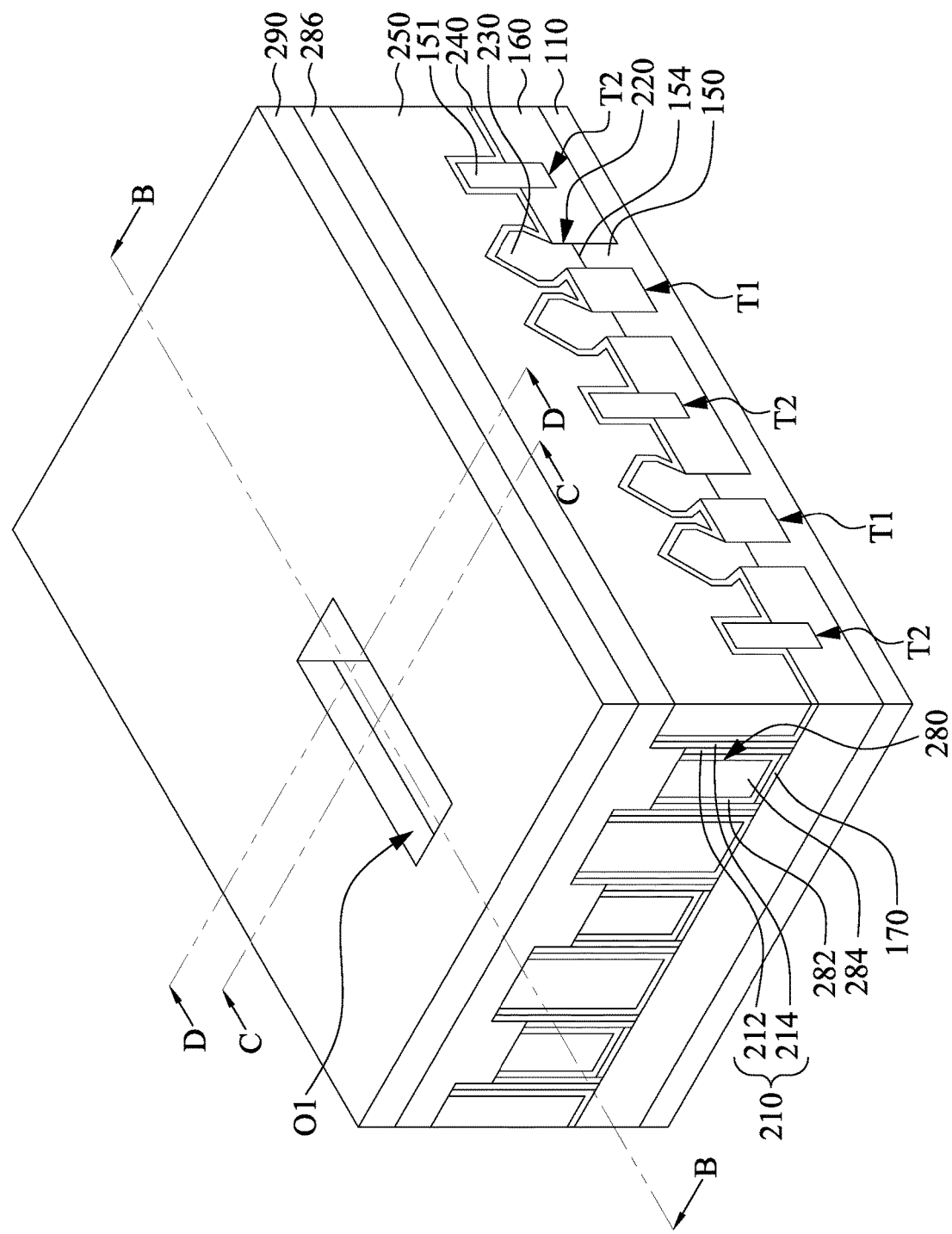
Figure 22B:
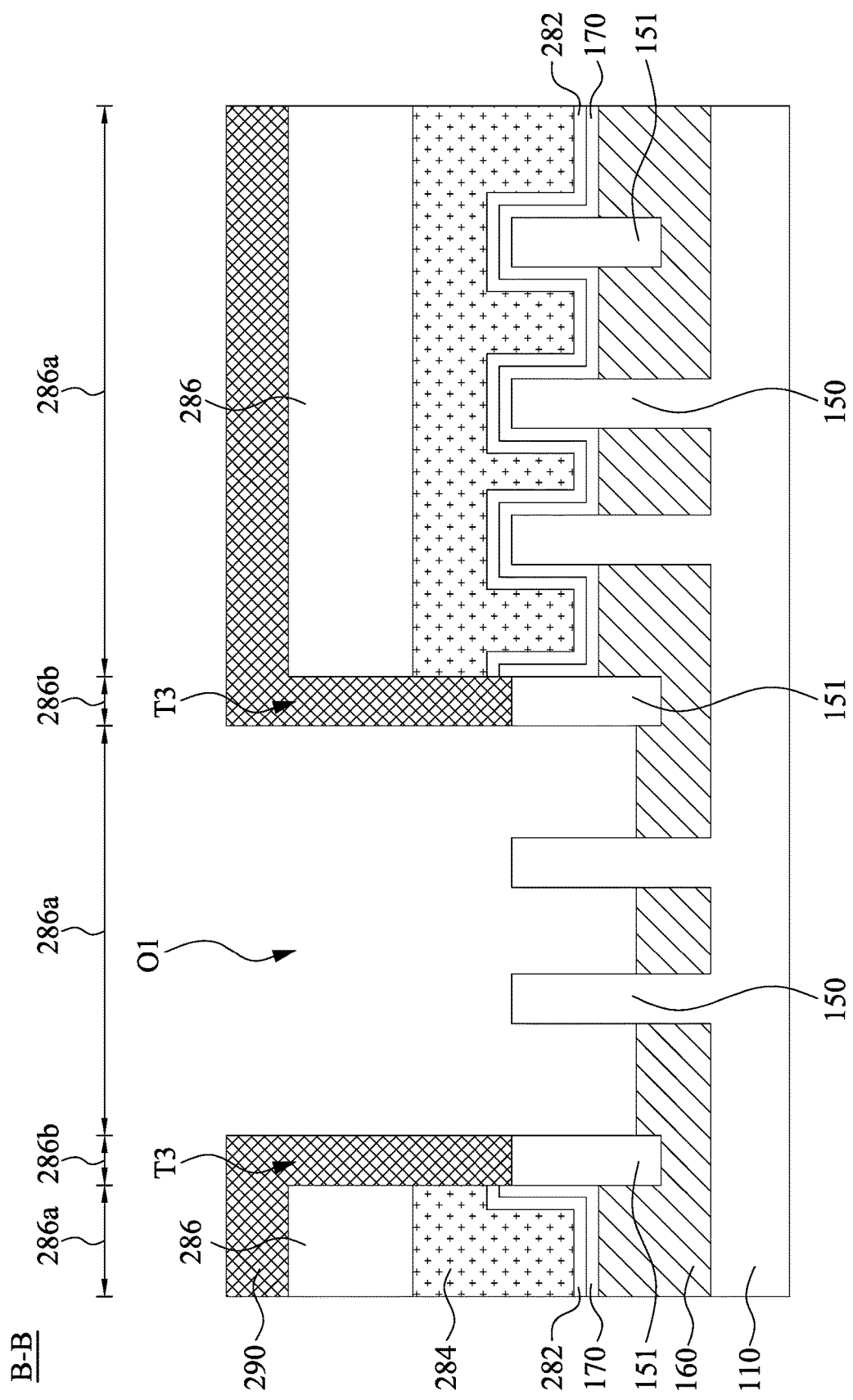
Figure 22C:
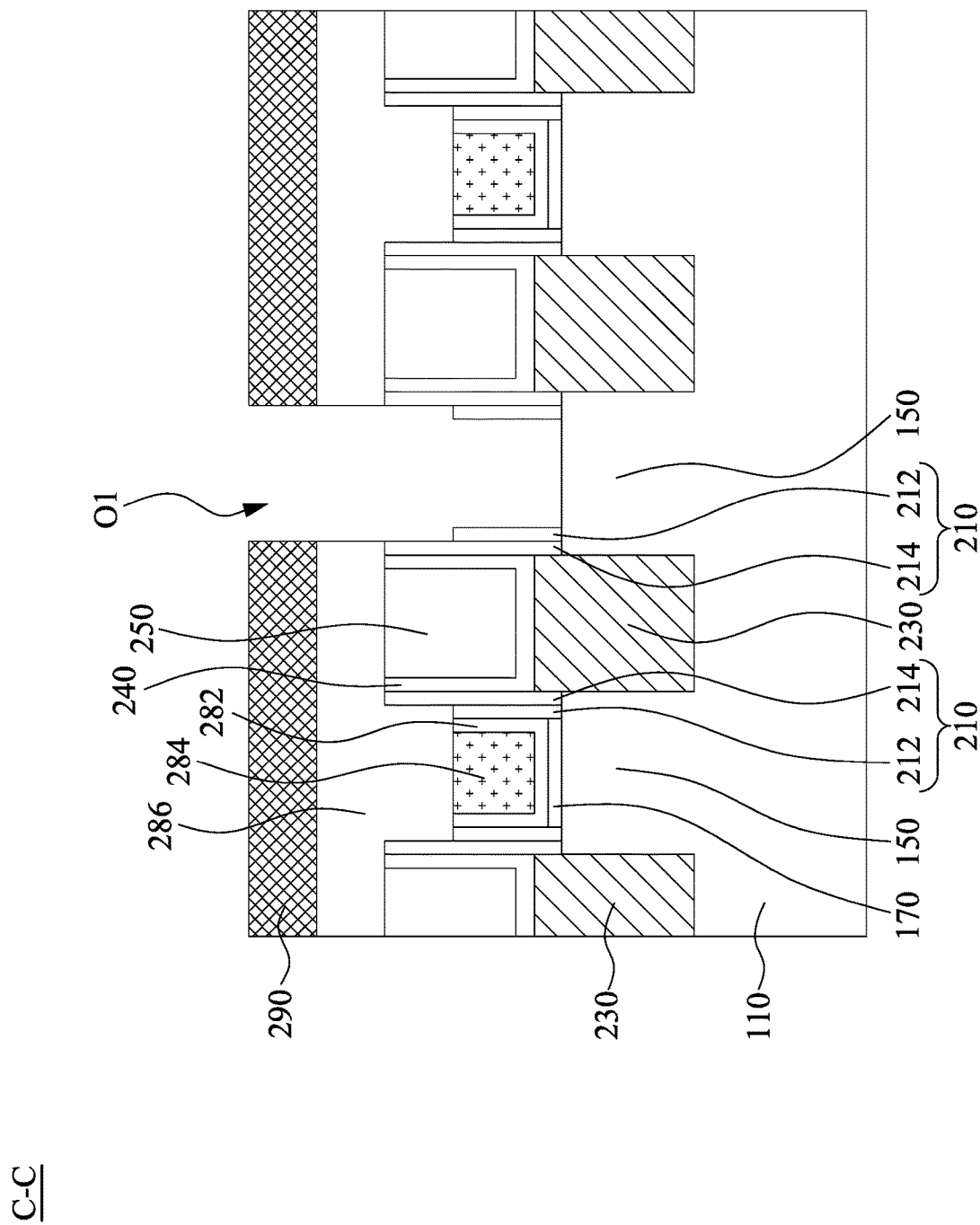
Figure 22D:
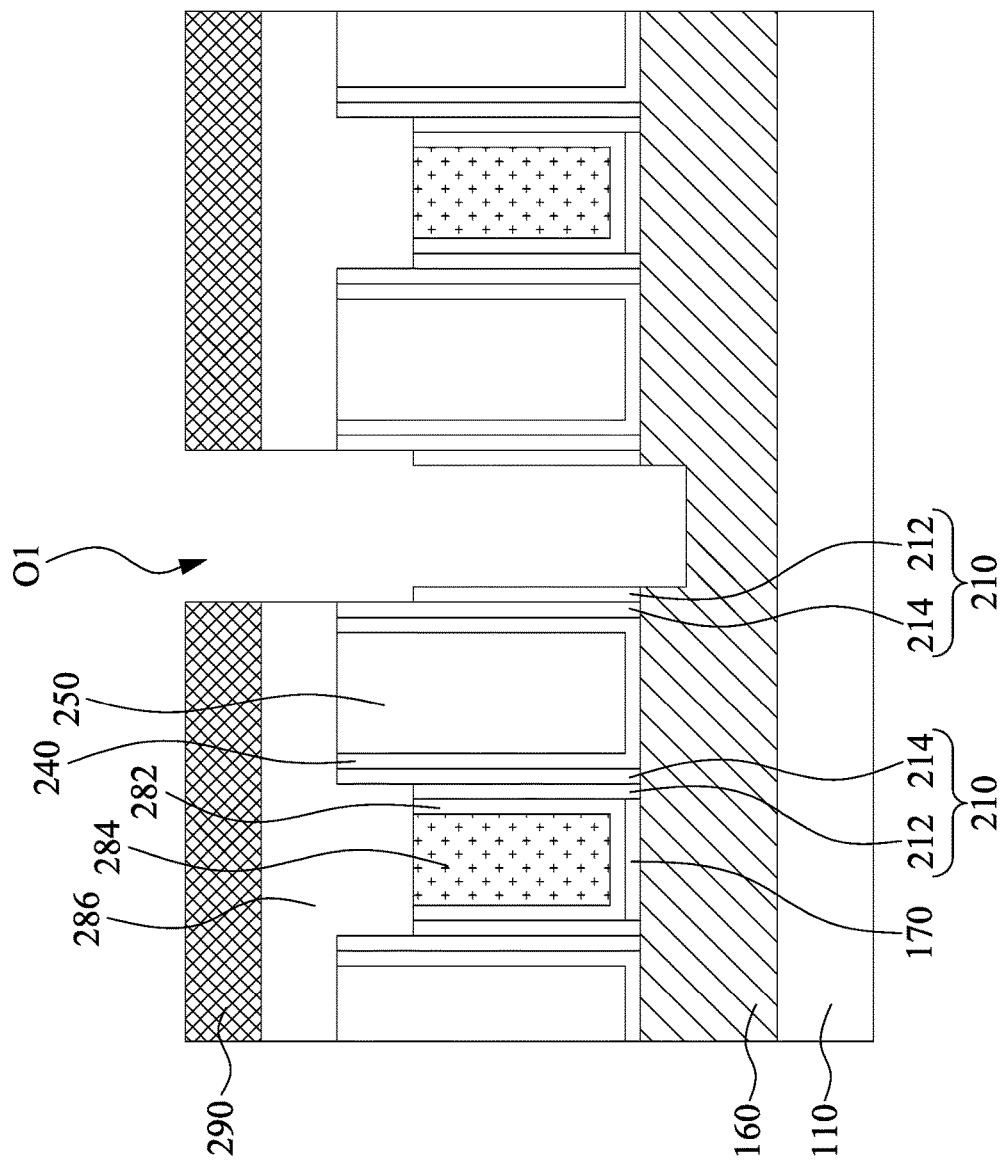

Reference is made to FIG. 22A to FIG. 22D. FIG. 22B is a cross-sectional view along section B-B in FIG. 22A. FIG. 22C is a cross-sectional view along section C-C in FIG. 22A. FIG. 22D is a cross-sectional view along section D-D in FIG. 22A. As shown in FIG. 22A to FIG. 22D, the isolation layer 160 in the opening O1 is further recessed, for example, through an etching operation, wherein diluted HF, SiCoNi (including HF and $NH_3$), or the like, may be used as the etchant. That is, after recessing the isolation layer 160, a top surface of the isolation layer 160 in the opening O1 is lower than that outside the opening O1. Hence, the isolation layer 160 in the opening O1 recess toward the substrate 110 relative to the isolation layer 160 outside the opening O1.

Figure 23A:
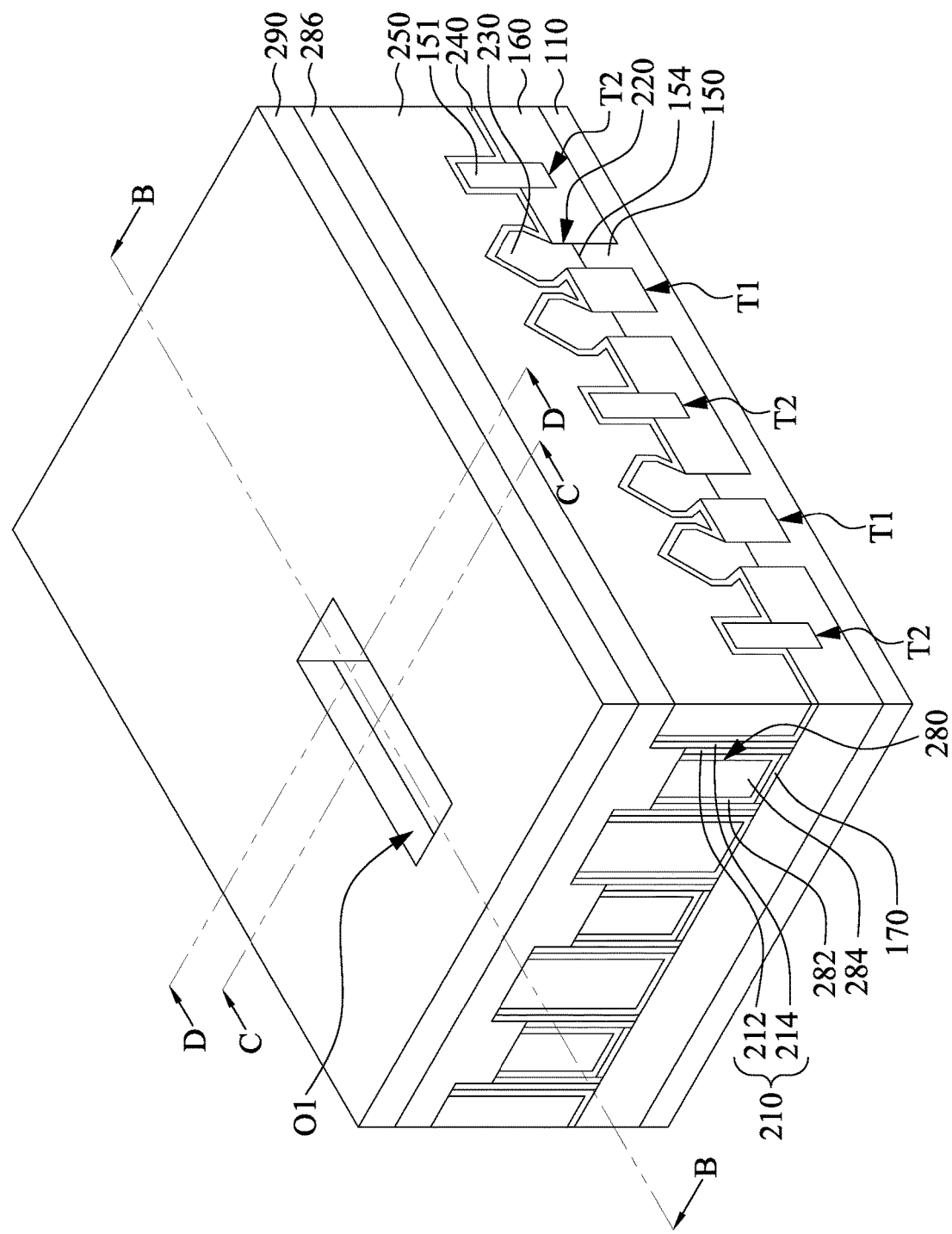
Figure 23B:
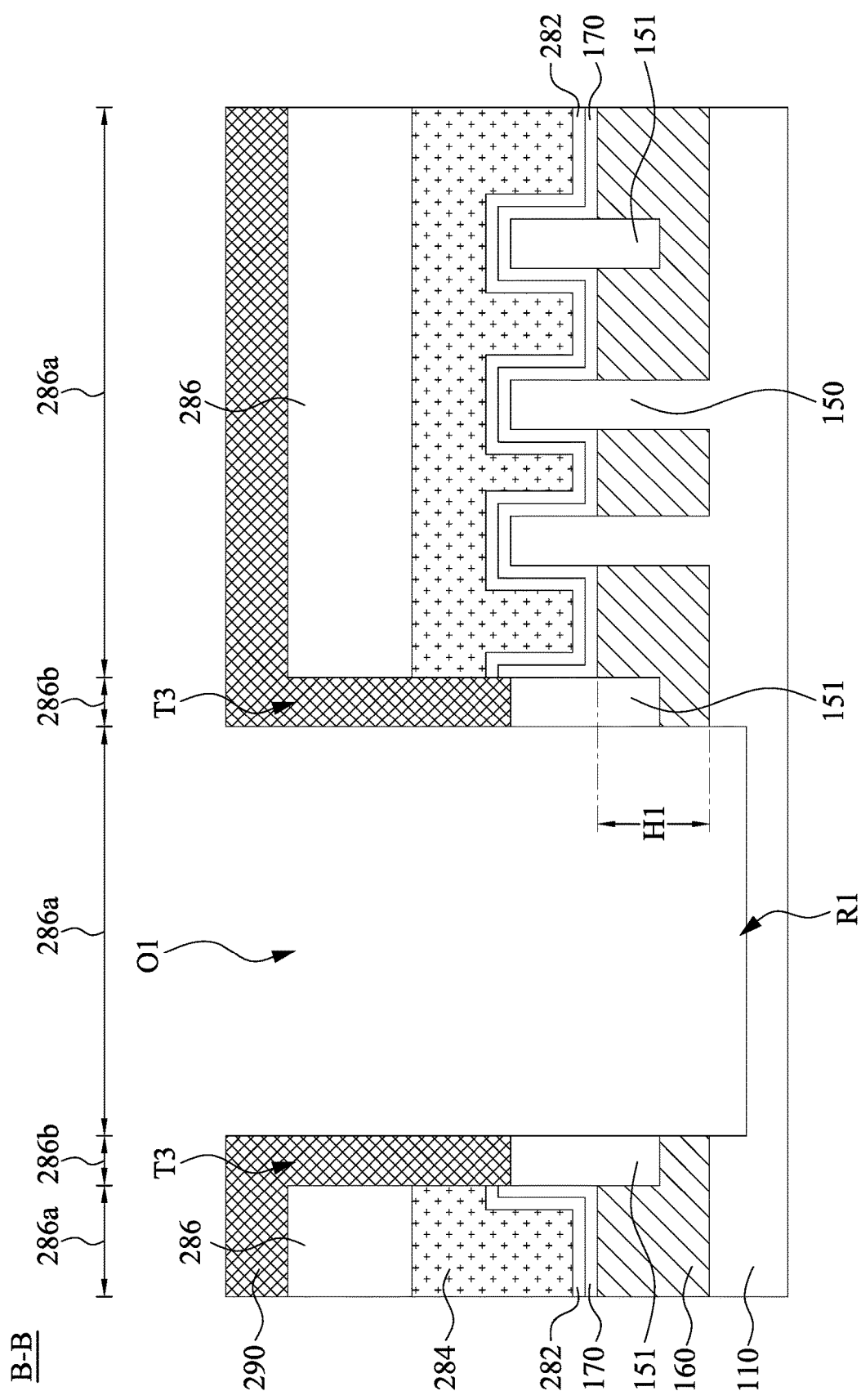
Figure 23C:
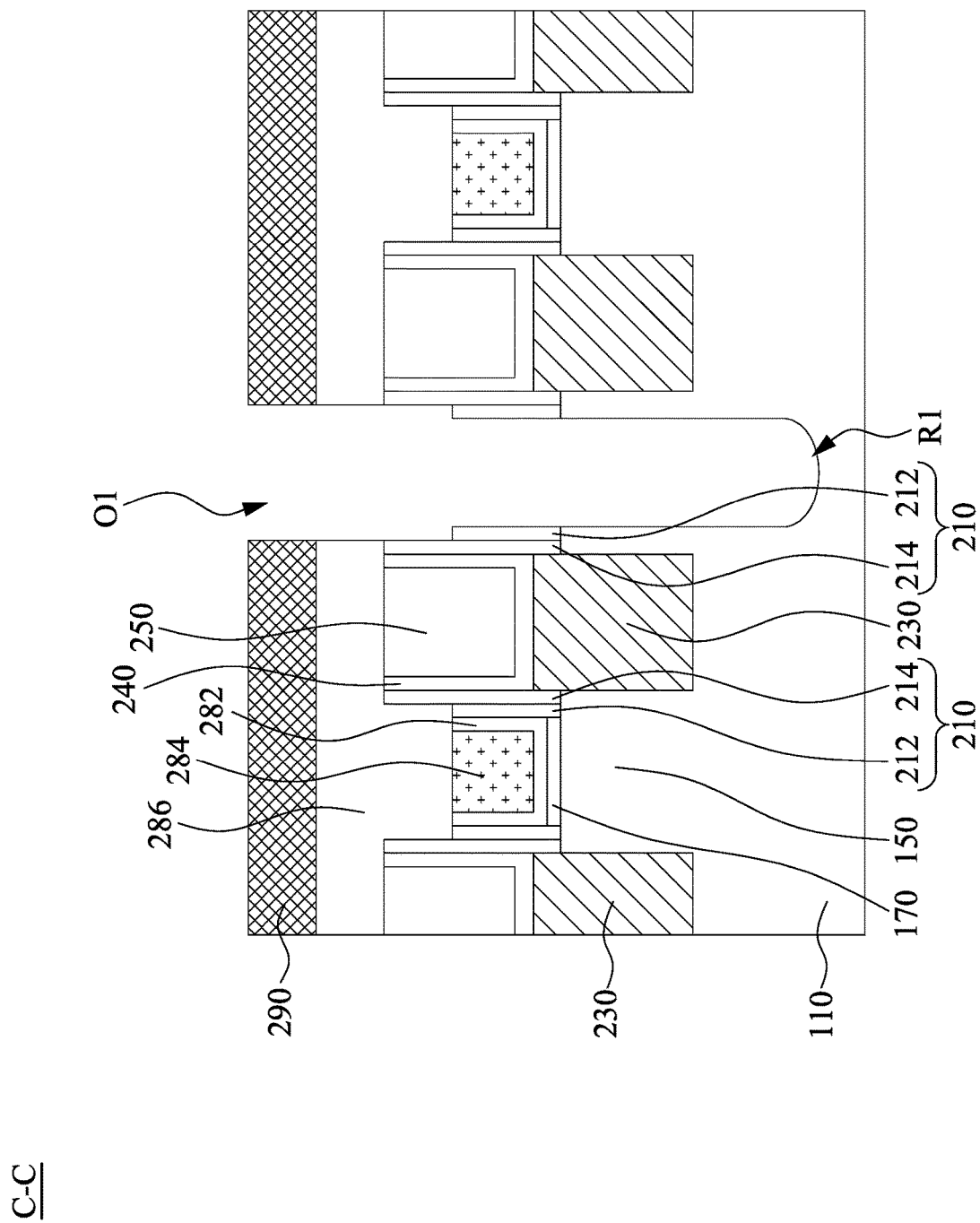
Figure 23D:
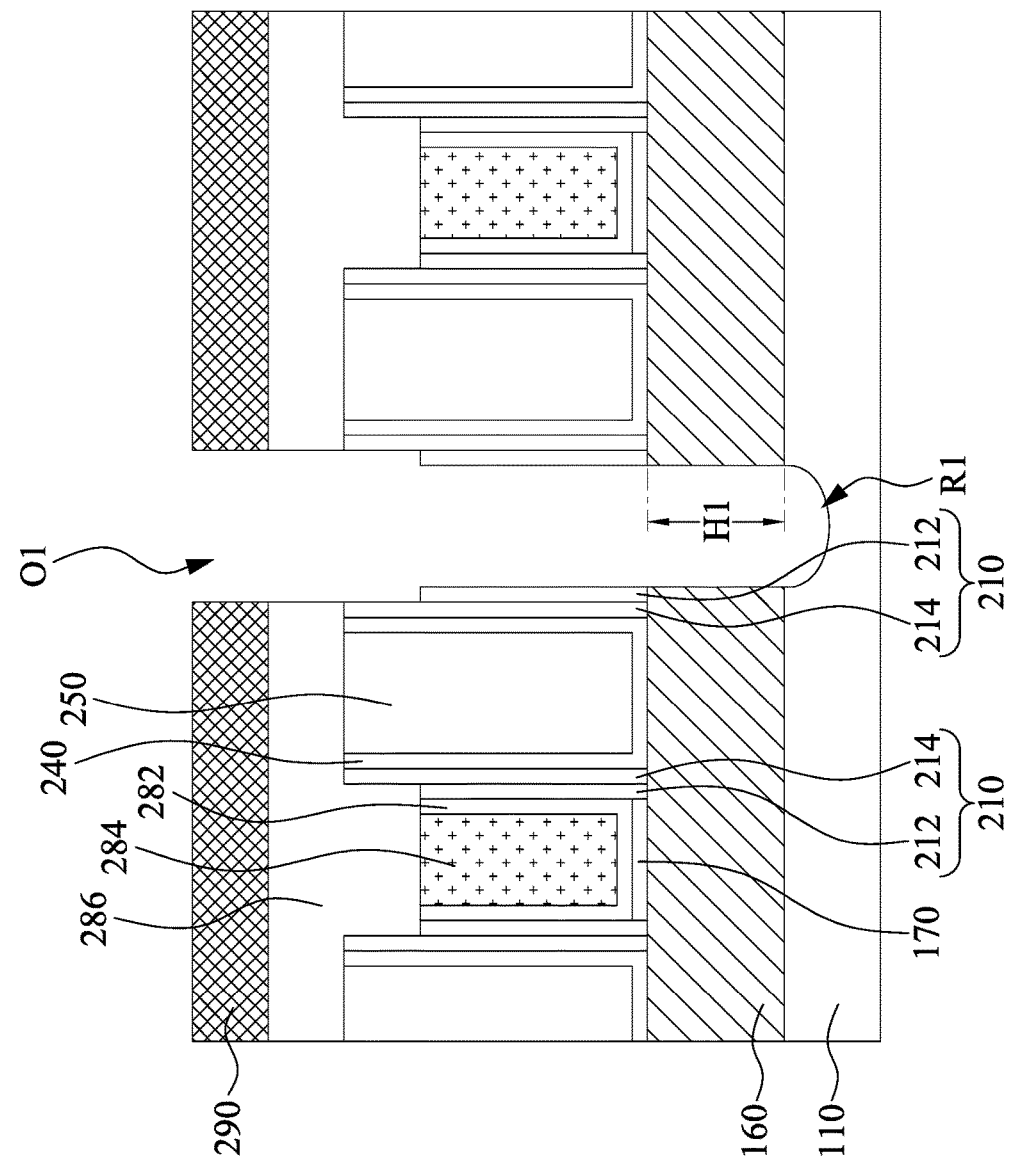

Reference is made to FIG. 23A to FIG. 23D. FIG. 23B is a cross-sectional view along section B-B in FIG. 23A. FIG. 23C is a cross-sectional view along section C-C in FIG. 23A. FIG. 23D is a cross-sectional view along section D-D in FIG. 23A. As shown in FIG. 23A to FIG. 23D, the semiconductor fins 150, the isolation layer 160, and a portion of the substrate 110 in the opening O1 are removed. The semiconductor fins 150, the isolation layer 160, and a portion of the substrate 110 in the opening O1 (or below the gate trench) are removed in one or many etch operations including dry etch. The etching process may stop when a top surface of the substrate 110 in the opening O1 is slightly lower than a bottom surface of the dielectric fin layer 151 and lower than a bottom surface of the isolation layer 160 outside the opening O1.

That is, a top surface of the substrate 110 in the opening O1 is lower than that outside the opening O1. Hence, the substrate 110 in the opening O1 recess away from the dielectric fin layer 151 relative to the substrate 110 outside the opening O1 and formed a recess R1. In other words, a bottom of the recess R1 is lower than a bottom of the isolation layer 160. In some embodiments, a large process window with low EPI/MG/HG damage risk since weak etching recipes may be applied for the removal of the semiconductor fins 150.

As shown in FIG. 23A to FIG. 23D, the isolation layer 160 that outside the opening O1 has a height H1 relative to the substrate 110. In some embodiments, the isolation layer 160 which can be referred to as the STI structure is remained in the opening O1, and the remained STI structure in the opening O1 may have a height H2 relative to the substrate 110. In some embodiments, the height H2 of the remained structure in the opening O1 is less than 50% of the height H1 of the isolation layer 160 that outside the opening O1.

Figure 24A:
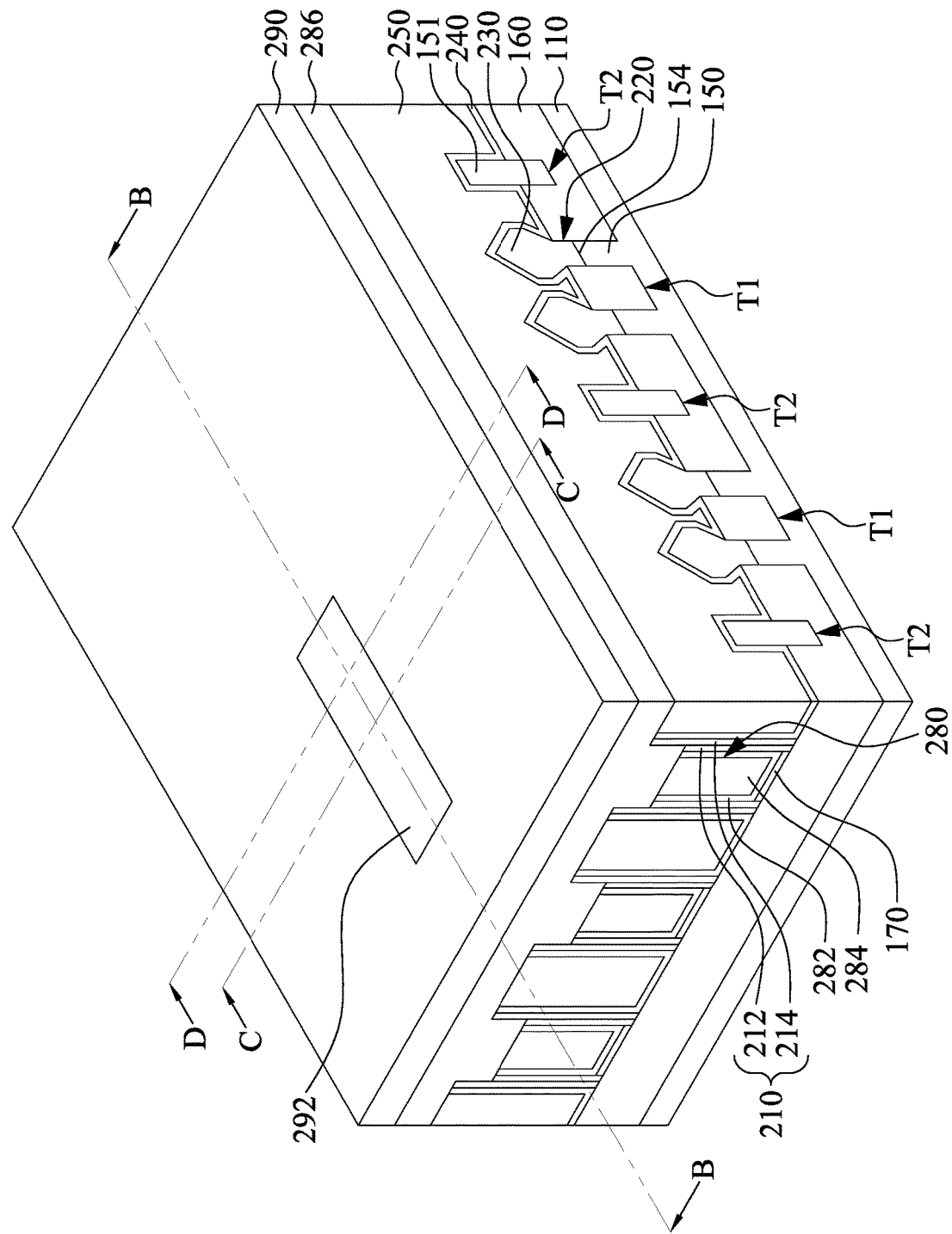
Figure 24B:
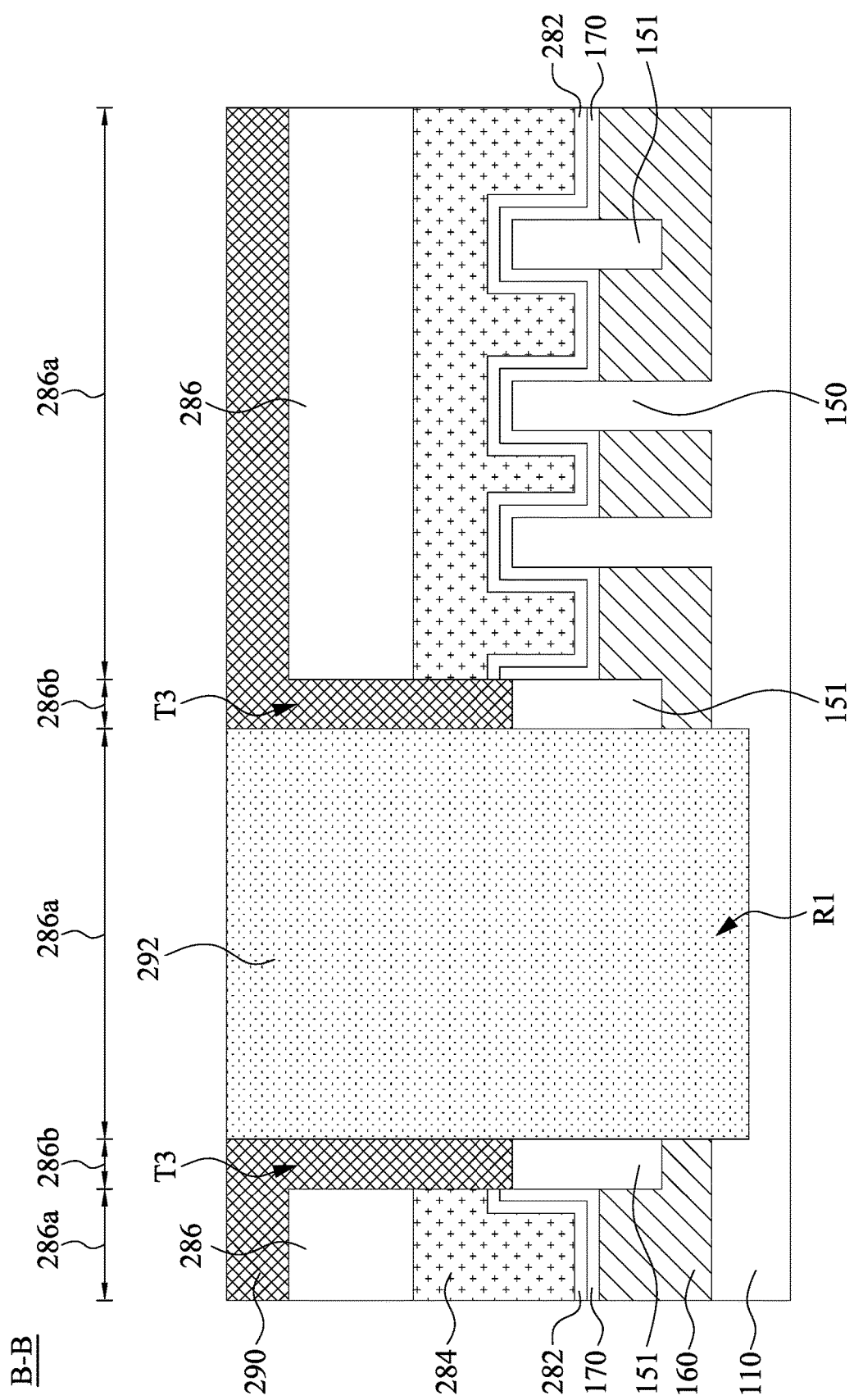
Figure 24C:
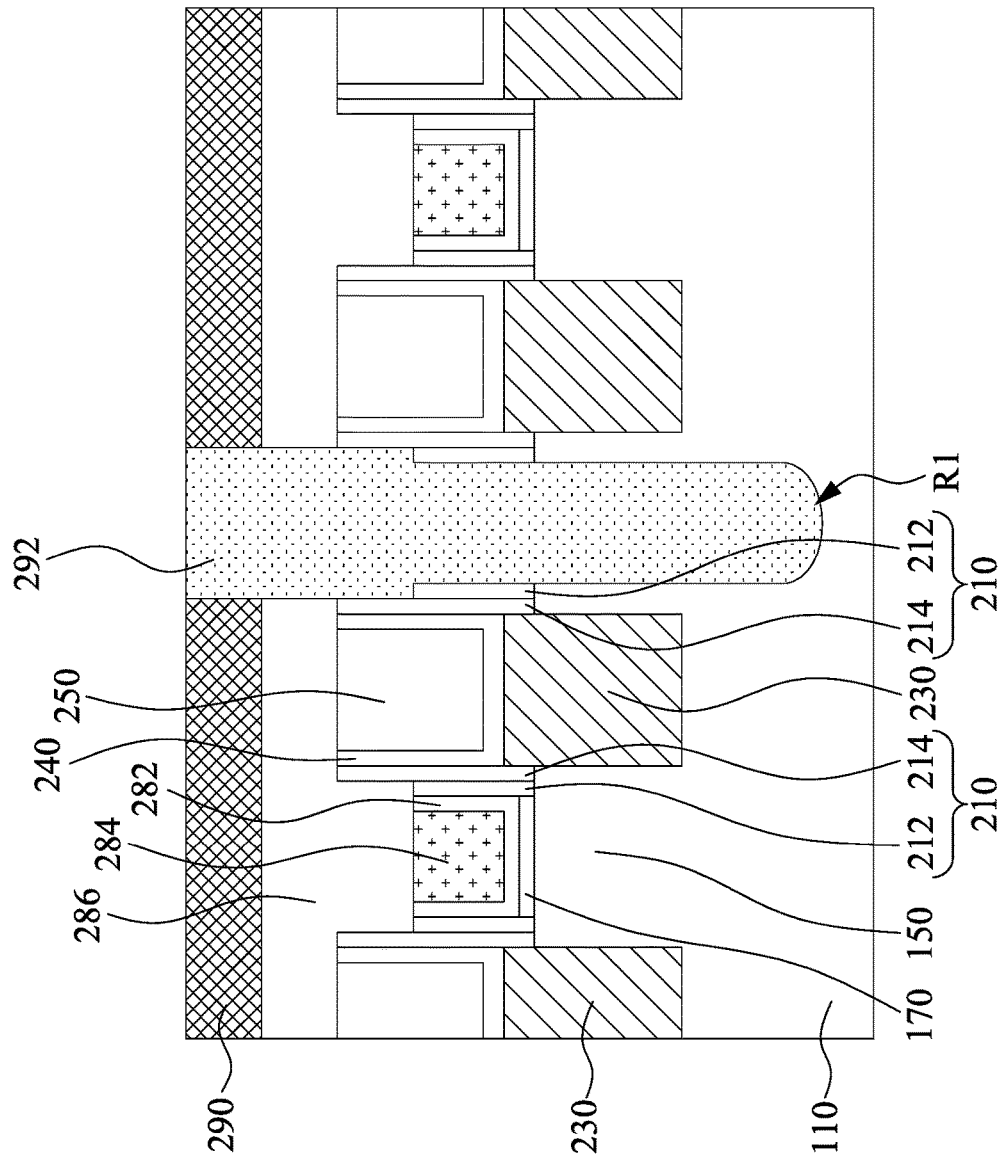
Figure 24D:
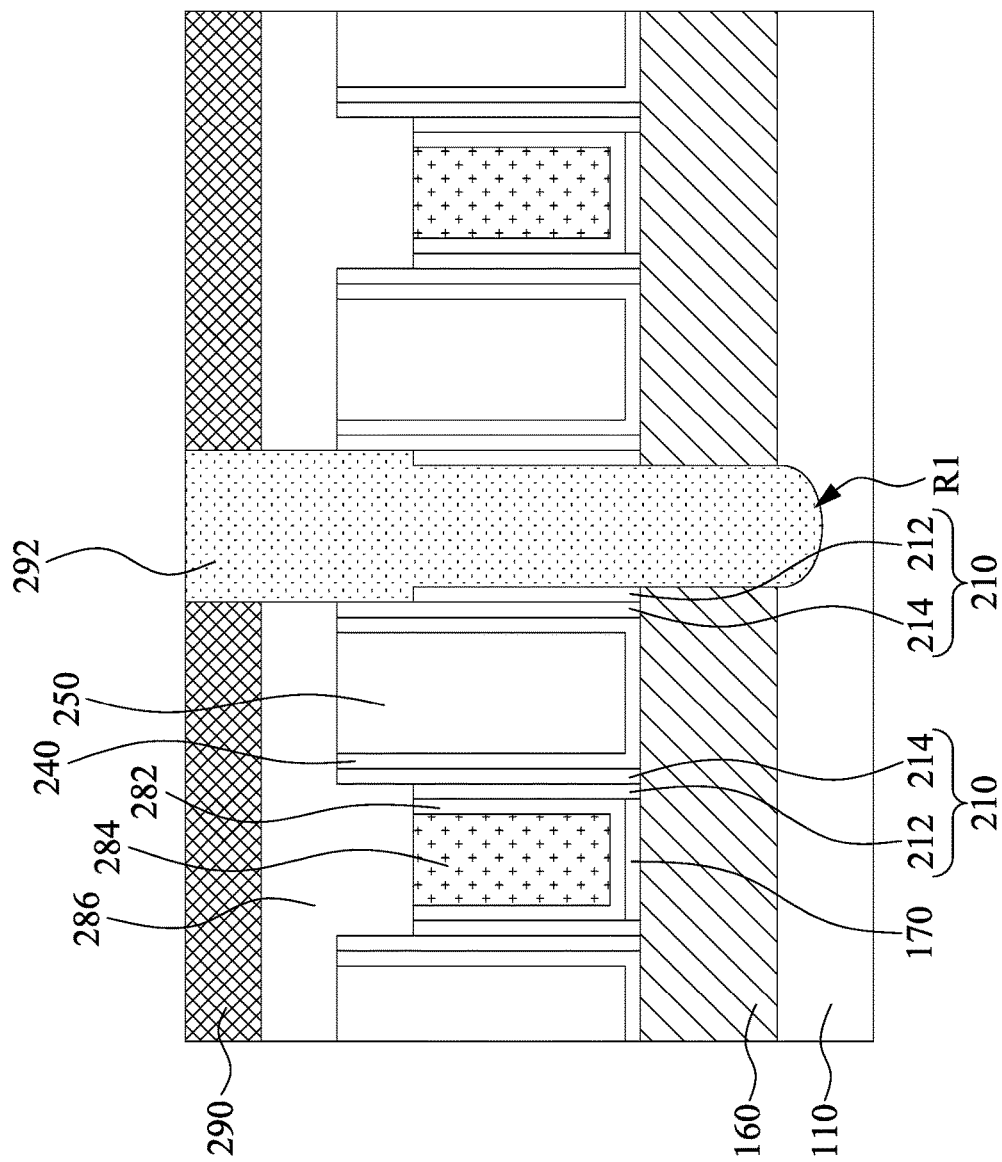

Reference is made to FIG. 24A to FIG. 24D. FIG. 24B is a cross-sectional view along section B-B in FIG. 24A. FIG. 24C is a cross-sectional view along section C-C in FIG. 24A. FIG. 24D is a cross-sectional view along section D-D in FIG. 24A. A second isolation dielectric 292 is filled in the opening O1 to form a dielectric plug with the first isolation dielectric 290. The dielectric plug is between and separated from the epitaxial source/drain structures 230 and runs through the semiconductor fin 150 from above the semiconductor fin 150 to the substrate 110. That is, the dielectric plug is formed between two active devices as an isolator. The dielectric plug provides a large epi-damage process window and has better isolation/reliability robustness. In addition, the dielectric plug provides that the semiconductor device find an undercut defect therein more easily. In some embodiments, the second isolation dielectric 292 is vertically above a top surface of the hard mask 286. In some embodiments, the second isolation dielectric 292 is embedded in the recess R1 and in contact with the substrate 110. In some embodiments, the opening O1 is free of the isolation layer 160 therein.

In some embodiments, the second isolation dielectric 292 is in contact with sidewalls of the gate spacers 212 and 214, and the first isolation dielectric 290 is in contact with a top surface of the gate spacer 214 and in contact with side surfaces of the metal gate electrode layer 284, the work function metal layer 282, and the interlayer dielectric 170. In some embodiments, the second isolation dielectric 292 is in contact with sidewalls of the dielectric fin layer 151 and sidewalls of the isolation layer 160 that underlies the dielectric fin layer 151. A bottom of the second isolation dielectric 292 is lower than a top surface of the isolation layer 160 and is further lower than a bottom of the dielectric fin layer 151.

In addition, a bottom of the second isolation dielectric 292 is lower than a top surface of the substrate 110 outside the opening O1 and in contact with a top surface of the substrate 110 within the opening O1. That is, the substrate 110 has a first portion under the first and second isolation dielectric 290 and 292 and has a second portion adjacent to the isolation dielectric and under the isolation layer 160, and a top surface of the first portion of the substrate 110 is lower than a top surface of the second portion of the substrate 110.

Furthermore, the second isolation dielectric 292 is in contact with and surrounded by the first isolation dielectric 290. In some embodiments, an uppermost surface of the isolation layer 160 is free from coverage of the first and second isolation dielectrics 290 and 292. In some embodiments, an end of the second isolation dielectric 292 is in a semi-elliptical-like shape. In some embodiment, the second isolation dielectric 292 may be a single layer or multiple layers.

In some embodiments, the second isolation dielectric 292 may include SiOx, SiON, $Si_3N_4$, SiOCN, SiC, SiGe, metals, or combinations thereof. In some embodiments, the second isolation dielectric 292 may include air-gap. In some embodiments, the second isolation dielectric 292 is made of fluoride-doped silicate glass (FSG), or other low-K dielectric materials. In some embodiments, the second isolation dielectric 292 may be formed using a high-density-plasma (HDP) chemical vapor deposition (CVD) process, using silane ($SiH_4$) and oxygen ($O_2$) as reacting precursors. In some other embodiments, the second isolation dielectric 292 may be formed using a sub-atmospheric CVD (SACVD) process or high aspect-ratio process (HARP), wherein process gases may comprise tetraethylorthosilicate (TEOS) and ozone ($O_3$). In yet other embodiments, the second isolation dielectric 292 may be formed using a spin-on-dielectric (SOD) process, such as hydrogen silsesquioxane (HSQ) or methyl silsesquioxane (MSQ). Other processes and materials may be used. In some embodiments, the second isolation dielectric 292 can have a multi-layer structure, for example, a thermal oxide liner layer with silicon nitride formed over the liner. Thereafter, a thermal annealing may be optionally performed to the second isolation dielectric 292.

Figure 25A:
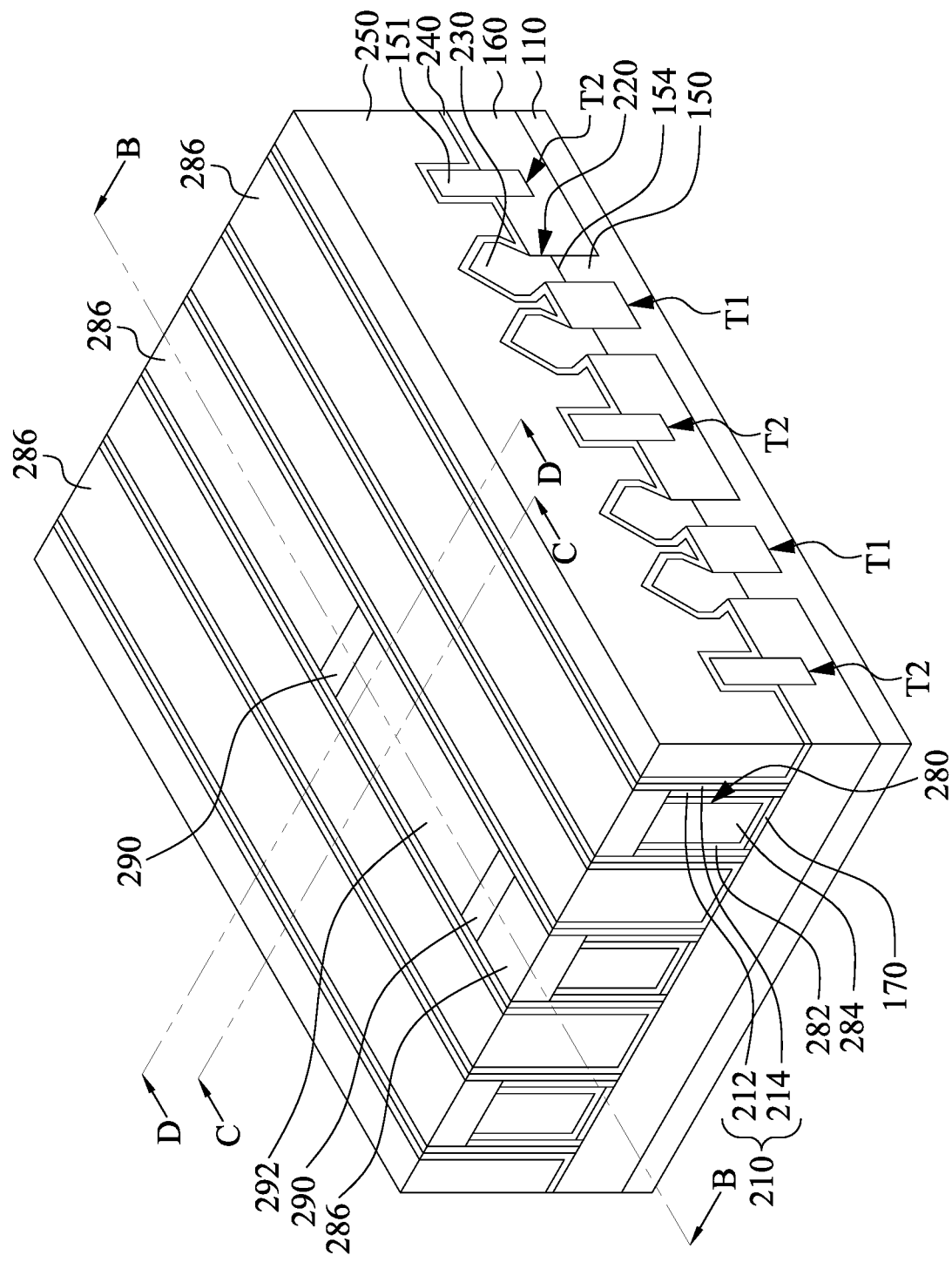
Figure 25B:
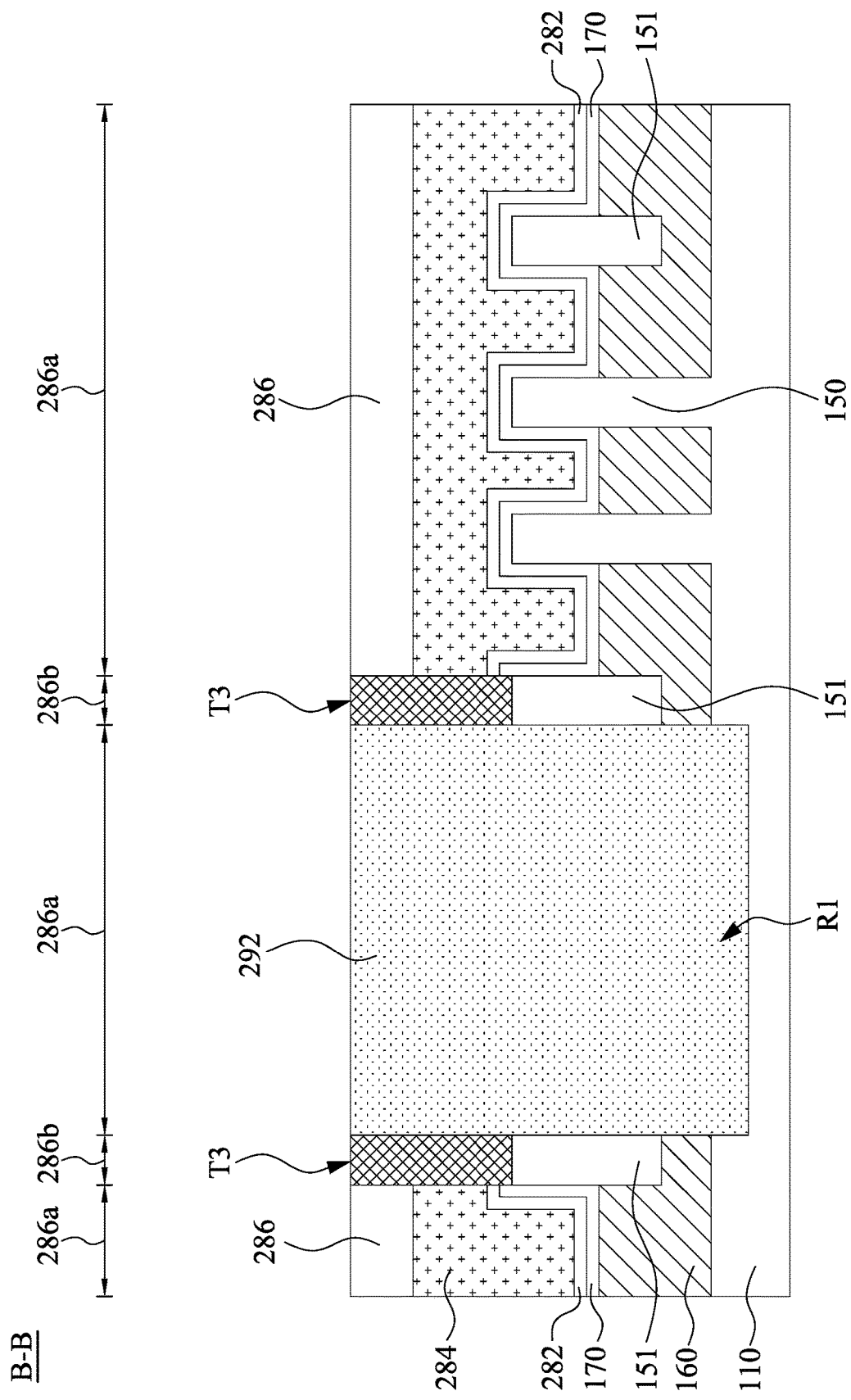
Figure 25C:
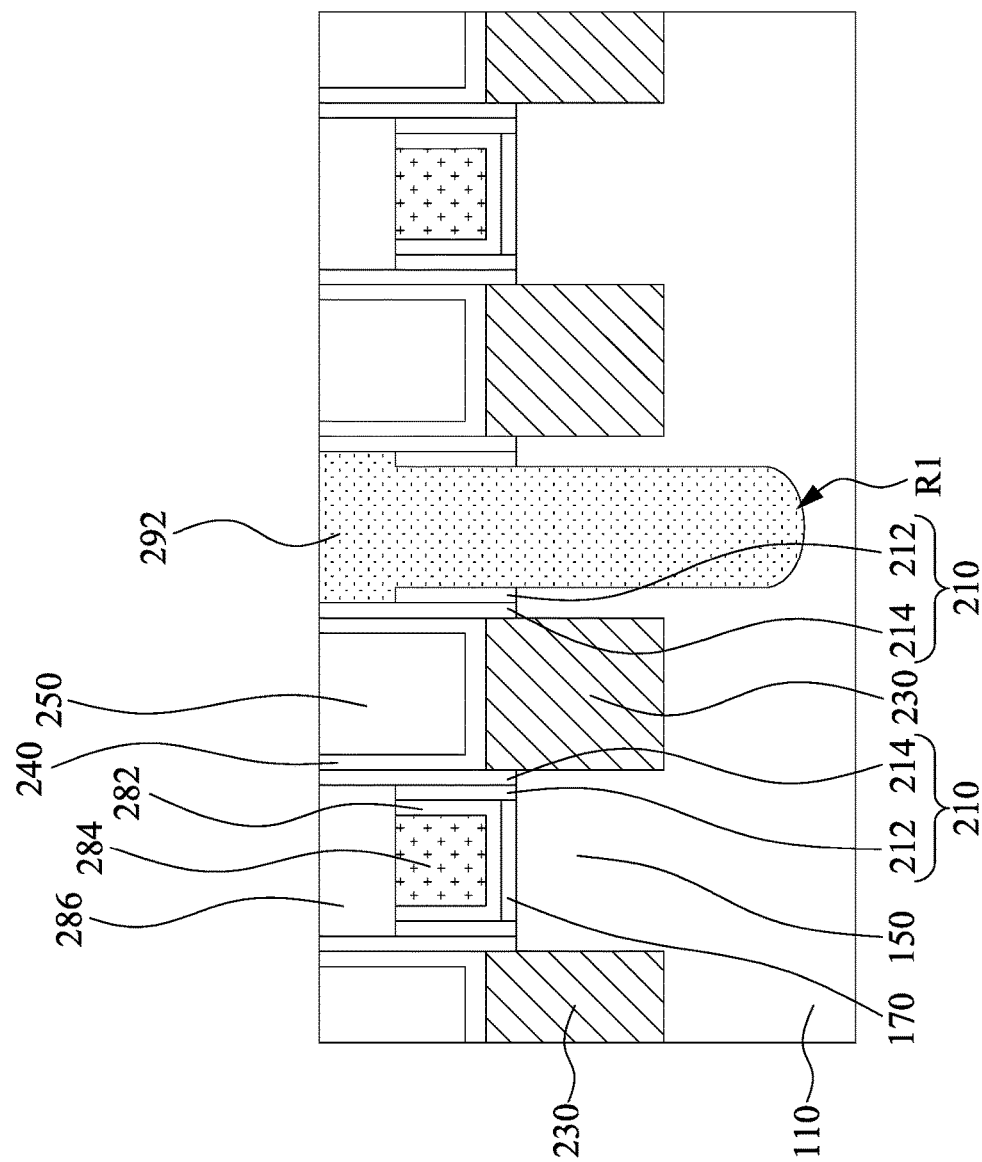
Figure 25D:
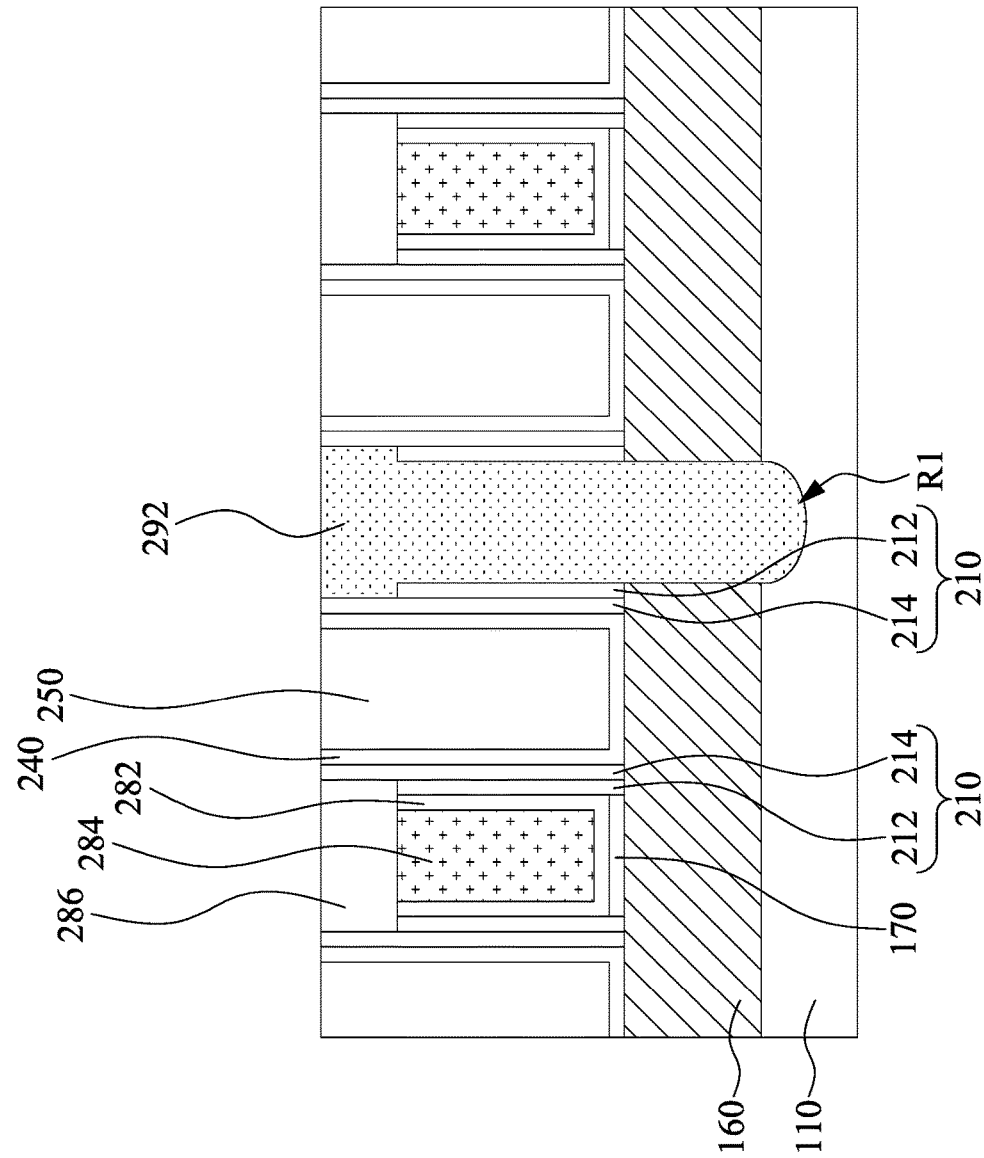

Reference is made to FIG. 25A to FIG. 25D. FIG. 25B is a cross-sectional view along section B-B in FIG. 25A. FIG. 25C is a cross-sectional view along section C-C in FIG. 25A. FIG. 25D is a cross-sectional view along section D-D in FIG. 25A. A polishing process, for example, CMP is performed, and the first and second isolation dielectric 290 and 292 and the hard mask 286 are lowered to level with a top surface of the ILD layer 250. As shown in FIG. 25A to FIG. 25D, the gate stack having the hard mask 286 has a top surface substantially level with a top surface of the first and second isolation dielectrics 290 and 292. That is, a top surface of the hard mask 286 is substantially level with a top surface of the first and second isolation dielectric 290 and 292.

Figure 26A:
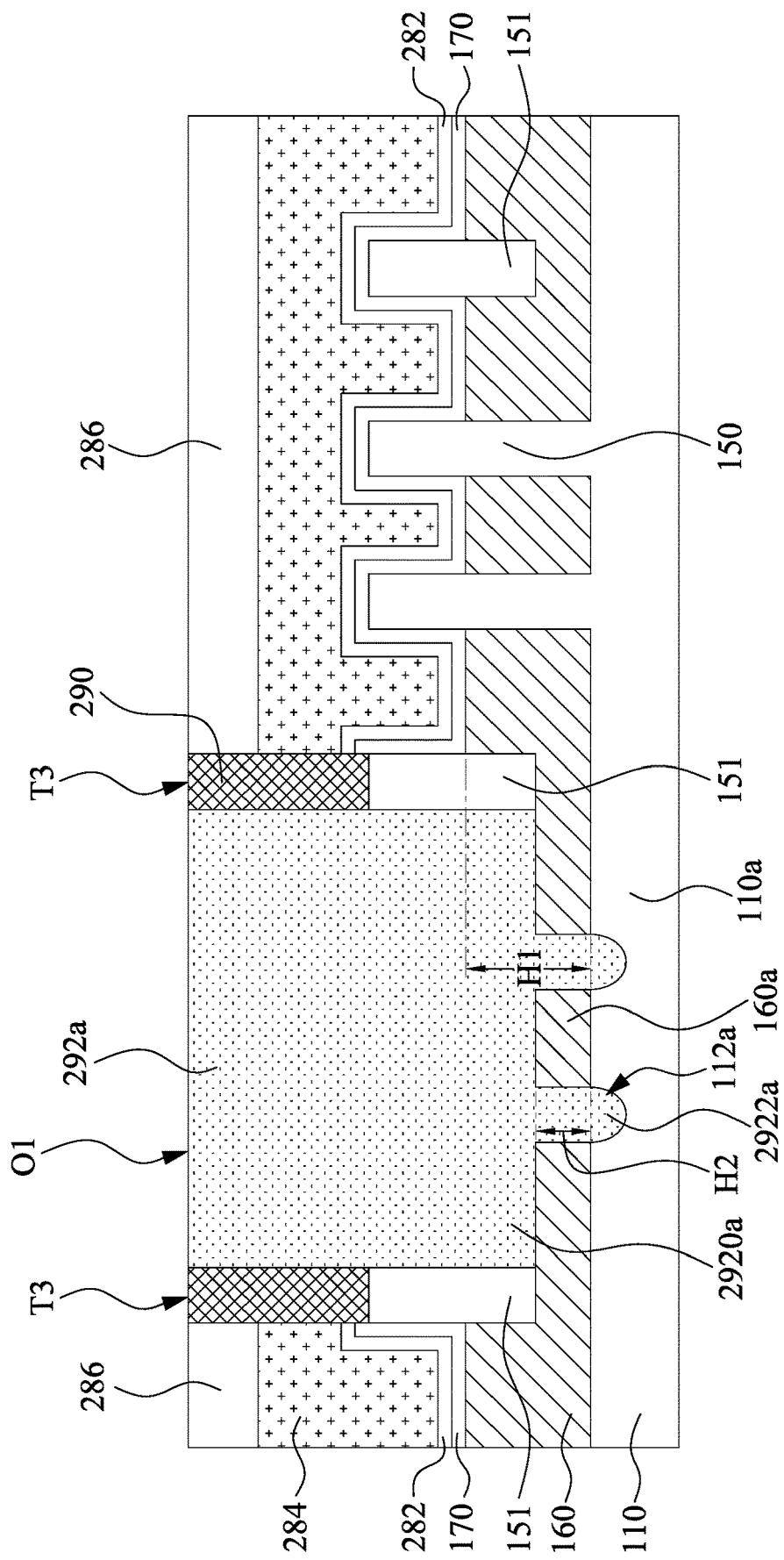
FIG. 26A to FIG. 26C are cross-sectional views of a semiconductor device in accordance with some embodiments of the present disclosure.
Figure 26B:
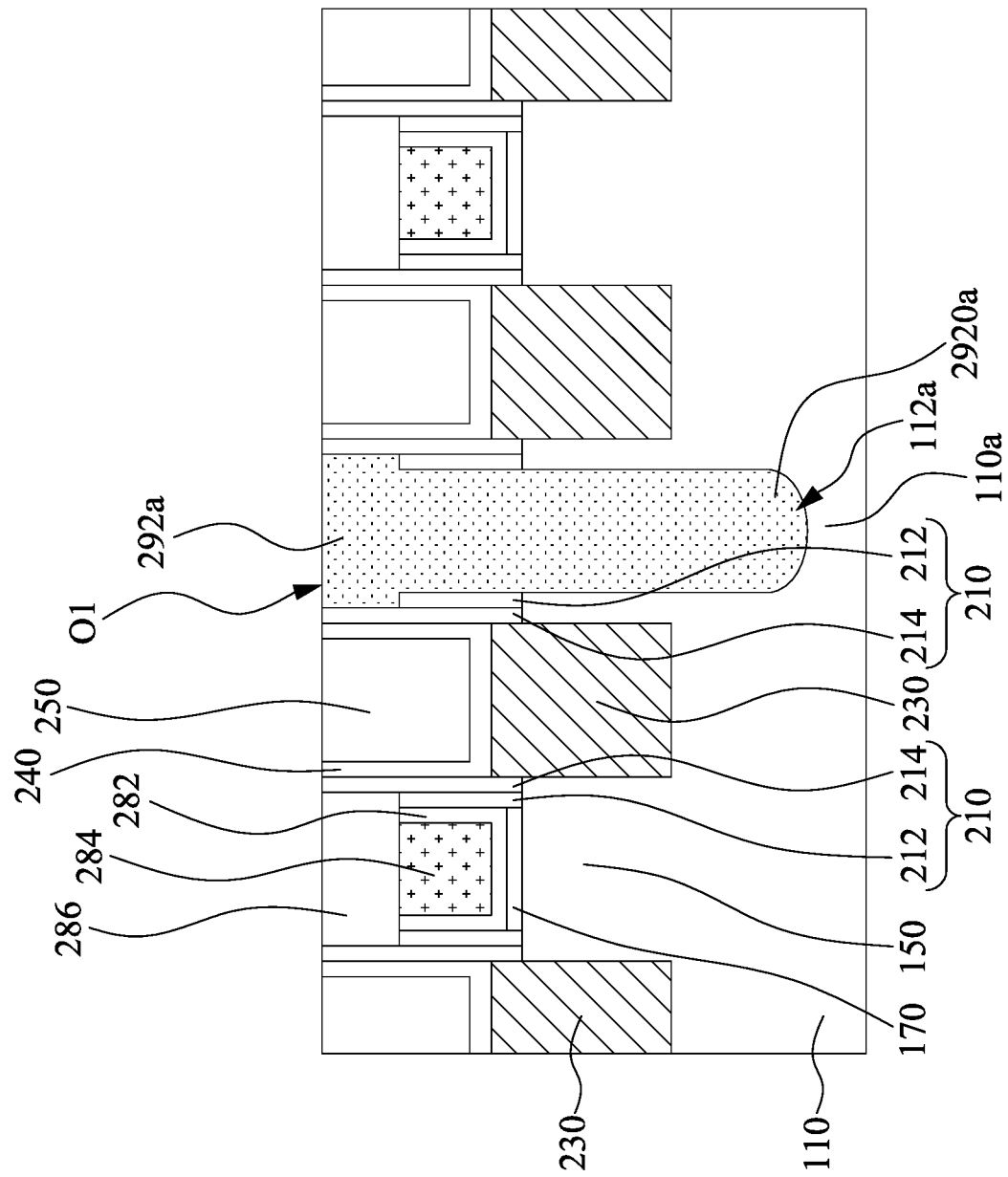
Figure 26C:
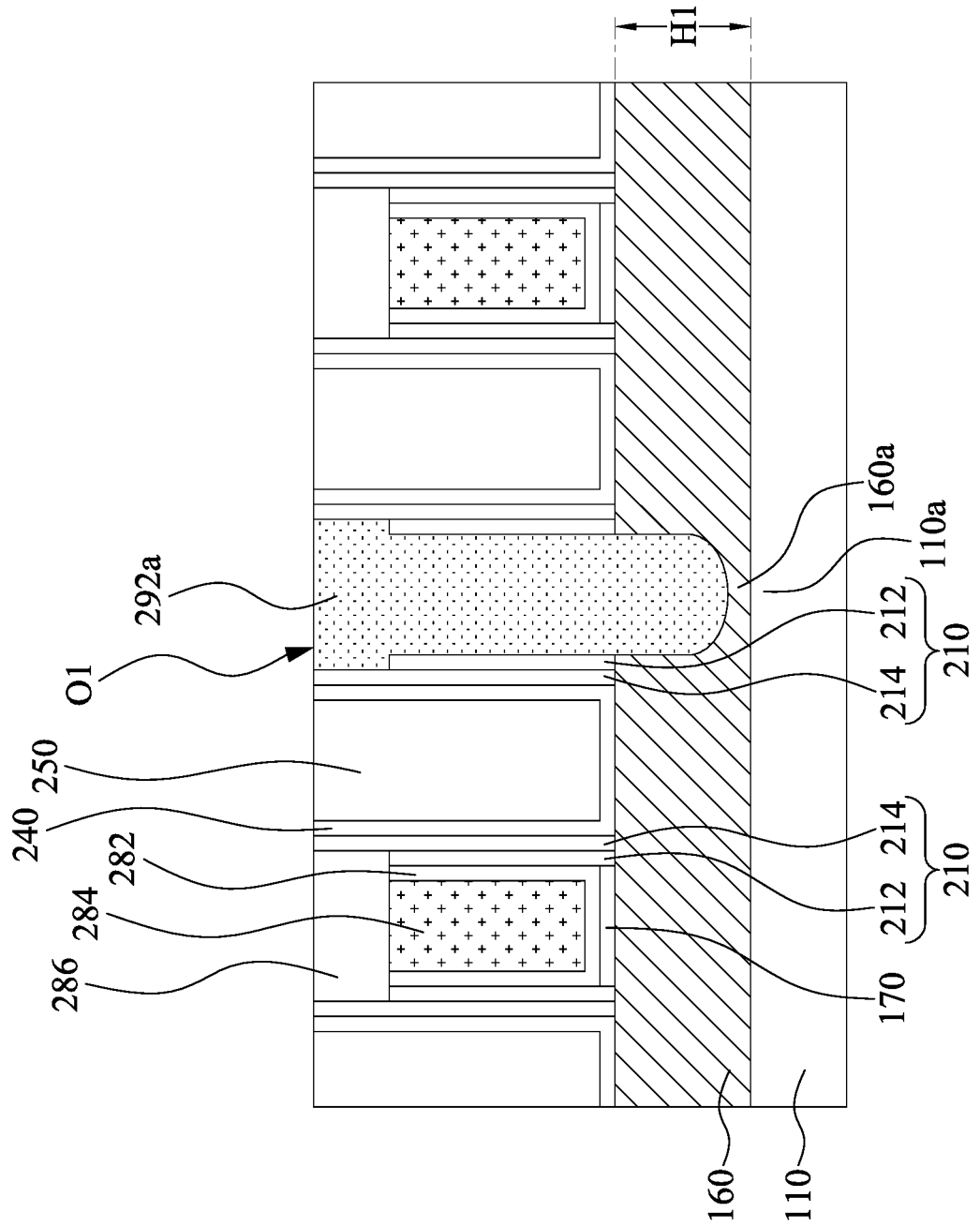

Reference is made to FIG. 26A to FIG. 26C. FIG. 26A to FIG. 26C are cross-sectional views of another semiconductor device in accordance with some embodiments of the present disclosure. It is understood that the cross-sectional views shown in FIG. 26A to FIG. 26C may correspond to the sections B-B, C-C, and D-D shown in FIG. 25A respectively. For the sake of simplicity, the dielectric fin layers 151, the first isolation dielectric 290, and the features outside the opening O1, such as the hard mask 286, the metal gate electrode layer 284, the work function metal layer 282, the gate dielectric layer 170, the semiconductor fins 150, the epitaxial source/drain structures 230, the gate spacers 210, and the ILD layer 250 are designated by the same reference numerals of the corresponding features in FIG. 25B to FIG. 25D, with a difference in that the second isolation dielectric 292a, the isolation layer 160a, and the substrate 110a within the opening O1 are replaced the second isolation dielectric 292, the isolation layer 160, and the substrate 110 within the opening O1 shown in FIG. 25B to FIG. 25D respectively.

In FIG. 26A to FIG. 26C, the isolation layer 160a which can be referred to as the STI structure is remained in the opening O1. A top surface of the remained STI is lower than a top surface of the isolation layer 160 that is outside of the opening O1. Specifically, the isolation layer 160 that outside the opening O1 has a height H1 relative to the substrate 110, and the remained STI structure in the opening O1 has a height H2 relative to the substrate 110a. For example, the height H2 of the remained structure in the opening O1 is less than 50% of the height H1 of the isolation layer 160 that outside the opening O1.

As shown in FIG. 26A to FIG. 26C, a bottom of the second isolation dielectric 292a has a first portion 2920a and a second portion 2922a. The first portion 2920a is in contact with the isolation layer 160a and is spaced apart from the substrate 110a by the isolation layer 160a as shown in FIG. 26A and FIG. 26C. The second portion 2922a protrudes from the first portion 2920a and extends into the substrate 110a through the isolation layer 160a. That is, the substrate 110a has holes 112a substantially corresponding to original positions of the semiconductor fins 150 thereon shown in FIG. 25B to FIG. 25D respectively that embed the second portions 2922a therein. In some embodiments, there is no isolation layer 160a remained in the opening O1.

Figure 27A:
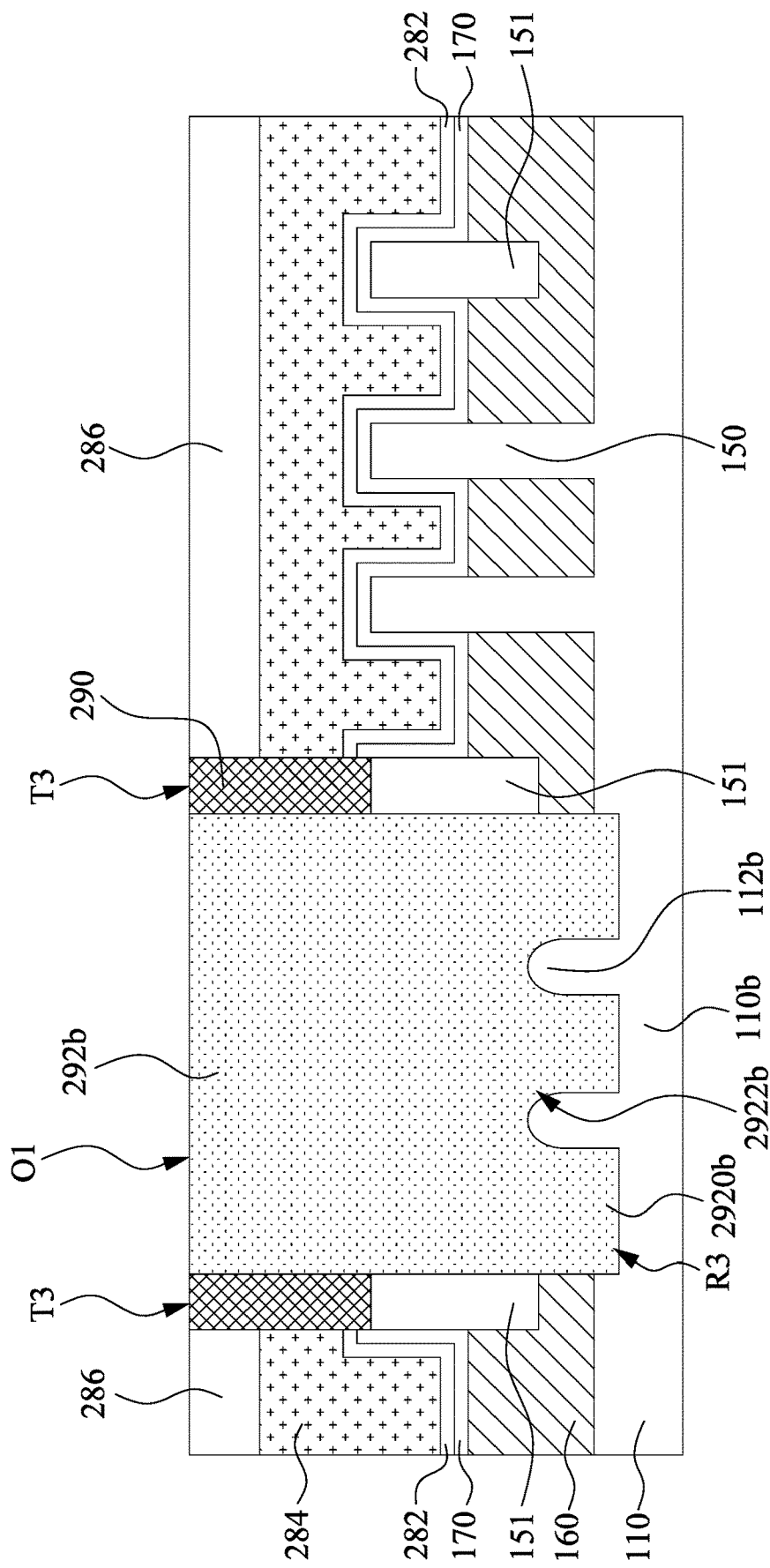
Figure 27B:
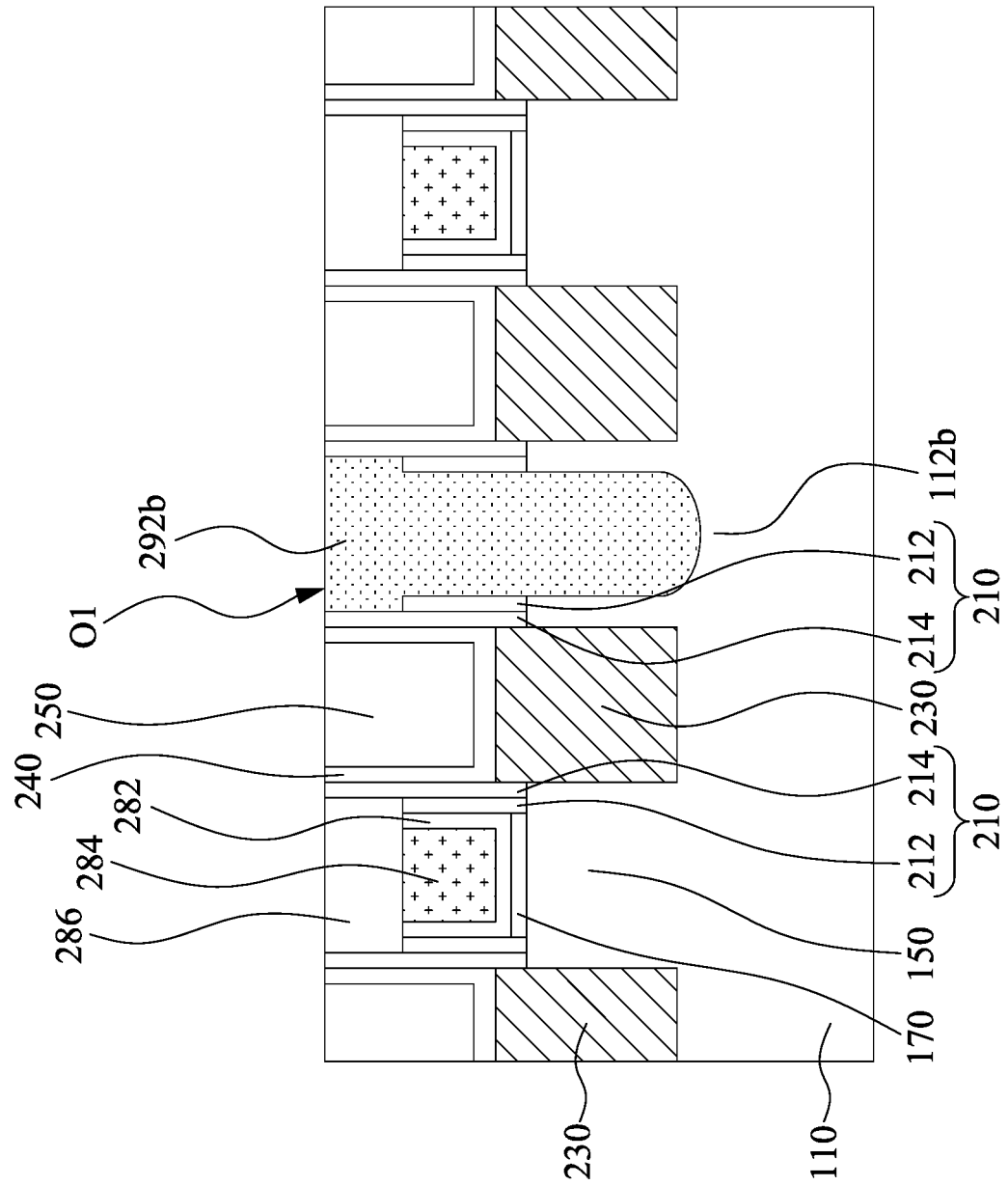

Reference is made to FIG. 27A to FIG. 27C. FIG. 27A to FIG. 27C are cross-sectional views of another semiconductor device in accordance with some embodiments of the present disclosure. It is understood that the cross-sectional views shown in FIG. 27A to FIG. 27C may correspond to the sections B-B, C-C, and D-D shown in FIG. 25A respectively. For the sake of simplicity, the dielectric fin layers 151, the first isolation dielectric 290, and the features outside the opening O1, such as the hard mask 286, the metal gate electrode layer 284, the work function metal layer 282, gate dielectric layer 170, the isolation layer 160, the semiconductor fins 150, the epitaxial source/drain structures 230, the gate spacers 210, and the ILD layer 250 are designated by the same reference numerals of the corresponding features in FIG. 25B to FIG. 25D, with a difference in that the second isolation dielectric 292b and the substrate 110b within the opening O1 are replaced the second isolation dielectric 292 and the substrate 110 within the opening O1 shown in FIG. 25B to FIG. 25D respectively.

In FIG. 27A to FIG. 27C, a bottom of the second isolation dielectric 292a has a base portion 2920b and at least one recessing portion 2922b. The substrate 110b within the opening O1 has a recess R3. The recess R3 is recessed away from the dielectric fin layer 151. In some embodiments, there is no isolation layer 160 remained in the opening O1, but the present disclosure is not limited thereto. The base portion 2920b is embedded in the recess R3 and in contact with the substrate 110b. In some embodiments, the base portion 2920b is lower than bottoms of the semiconductor fins 150 and the dielectric fin layer 151. In the other words, the base portion 2920b is lower than a top surface of the substrate 110b outside the opening O1 and has a flat surface.

In some embodiments, the recessing portion 2922b is recessed away from the substrate 110b based on the base portion 2920b. The substrate 110b is embedded in the recessing portion 2922b. That is, the substrate 110b has protrusions 112b substantially corresponding to original positions of the semiconductor fins 150 thereon shown in FIG. 25B to FIG. 25D respectively, and the protrusions 112b are embedded in the recessing portions 2922b. The interface between the recessing portion 2922b and the substrate 110b within the opening O1 is higher than a top surface of the substrate 110b outside the opening O1.

Figure 28A:
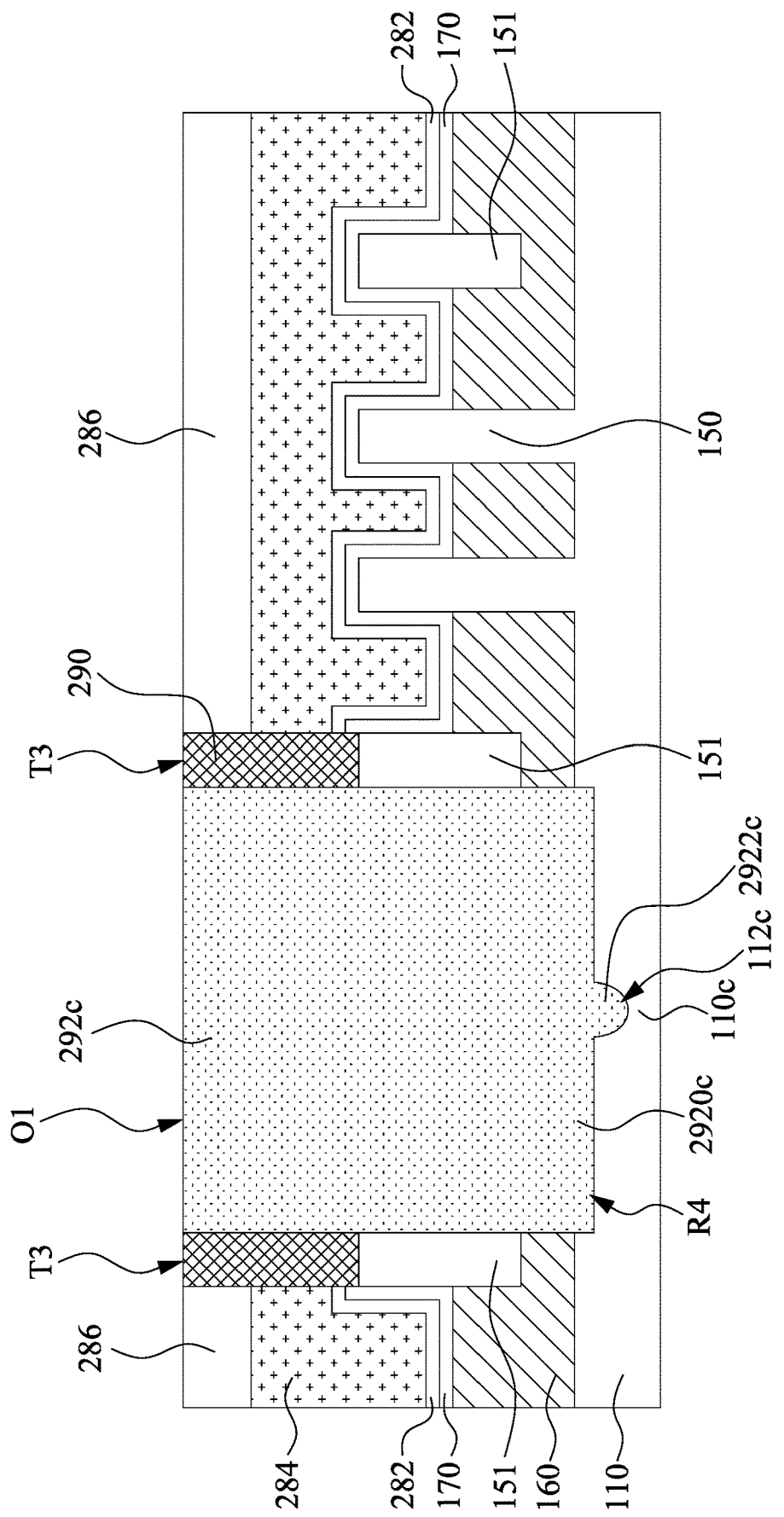
FIG. 28A to FIG. 28C are cross-sectional views of a semiconductor device in accordance with some embodiments of the present disclosure.
Figure 28B:
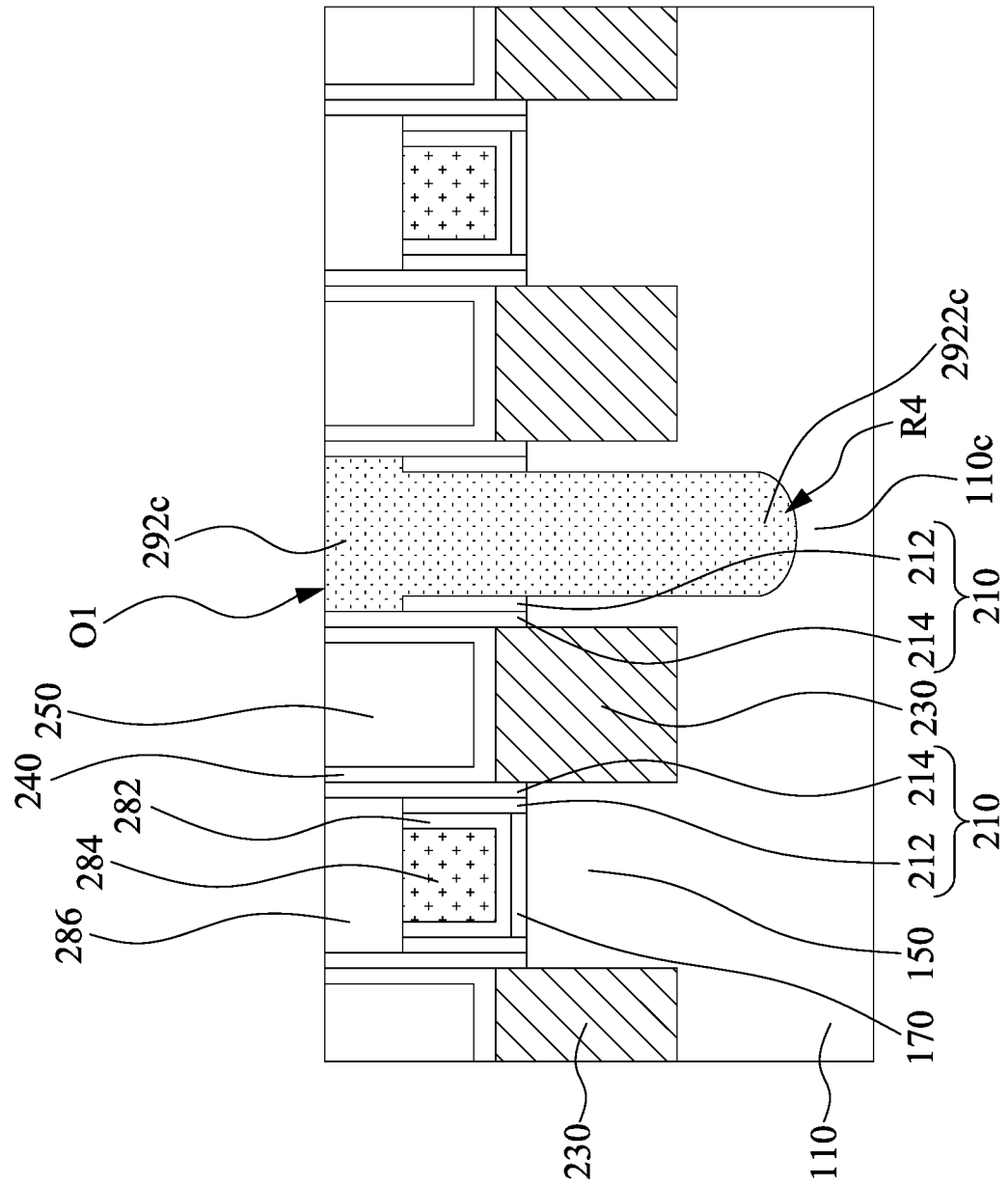
Figure 28C:
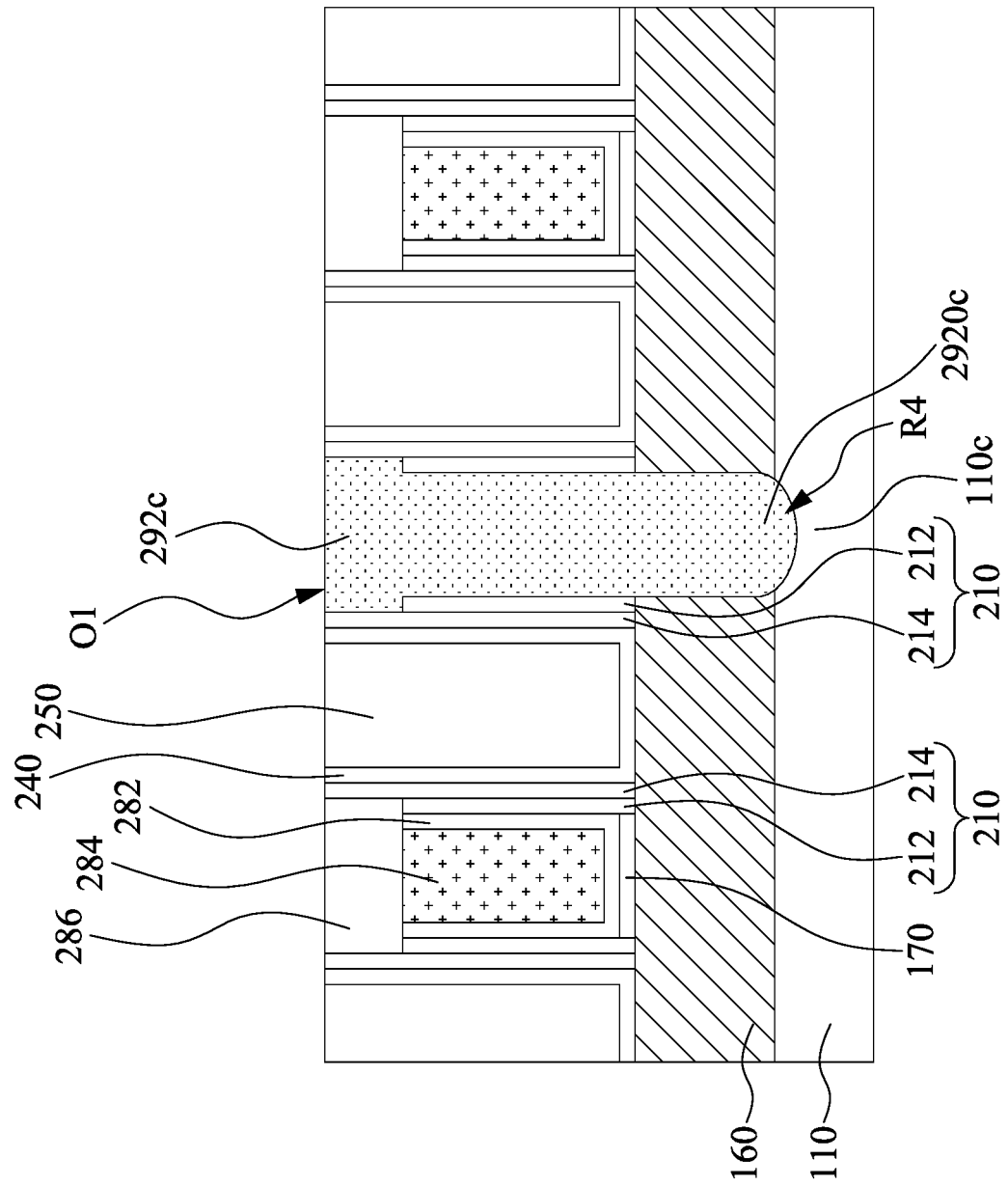

Reference is made to FIG. 28A to FIG. 28C. FIG. 28A to FIG. 28C are cross-sectional views of another semiconductor device in accordance with some embodiments of the present disclosure. It is understood that the cross-sectional views shown in FIG. 28A to FIG. 28C may correspond to the sections B-B, C-C, and D-D shown in FIG. 25A respectively. For the sake of simplicity, the dielectric fin layers 151, the first isolation dielectric 290, and the features outside the opening O1, such as the hard mask 286, the metal gate electrode layer 284, the work function metal layer 282, the gate dielectric layer 170, the semiconductor fins 150, the epitaxial source/drain structures 230, the gate spacers 210, and the ILD layer 250 are designated by the same reference numerals of the corresponding features in FIG. 25B to FIG. 25D, with a difference in that the second isolation dielectric 292c, the isolation layer 160c, and the substrate 110c within the opening O1 are replaced the second isolation dielectric 292, the isolation layer 160, and the substrate 110 within the opening O1 shown in FIG. 25B to FIG. 25D respectively.

In FIG. 28A to FIG. 28C, a bottom of the second isolation dielectric 292c has a base portion 2920c and a protruding portion 2922c. The substrate 110c within the opening O1 has a recess R4. The recess R4 is recessed away from the dielectric fin layer 151. The base portion 2920c is embedded in the recess R4 and in contact with the substrate 110c. The opening O1 is free of the isolation layer 160 therein. In some embodiments, the base portion 2920c is lower than a bottom of the dielectric fin layer 151. In the other words, the base portion 2920c is lower than a top surface of the substrate 110c outside the opening O1. The protruding portion 2922c protrudes from the base portion 2920c and extends into the substrate 110c. That is, the substrate 110c has a holes 112c substantially corresponding to a position between original positions of the semiconductor fins 150 shown in FIG. 25B to FIG. 25D, and the hole 112c of the substrate 110c embed the protruding portion 2922c of the second isolation dielectric 292c therein.

In some embodiments, the isolation layer 160c which can be referred to as the STI structure is remained in the opening O1, and a top surface of the remained STI is lower than a top surface of the isolation layer 160 that is outside of the opening O1, but the present disclosure is not limited thereto.

Figure 29A:
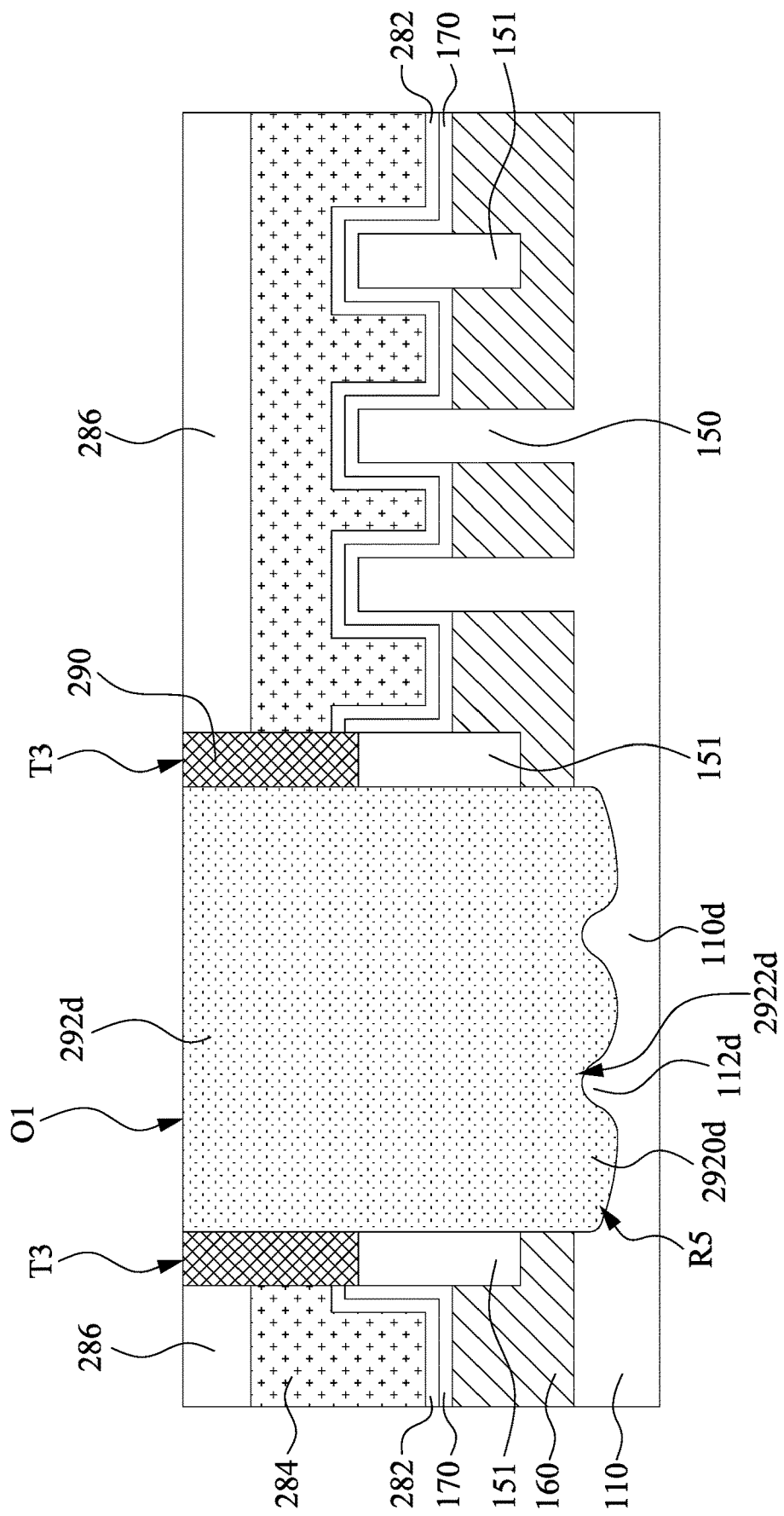
FIG. 29A to FIG. 29C are cross-sectional views of a semiconductor device in accordance with some embodiments of the present disclosure.
Figure 29B:
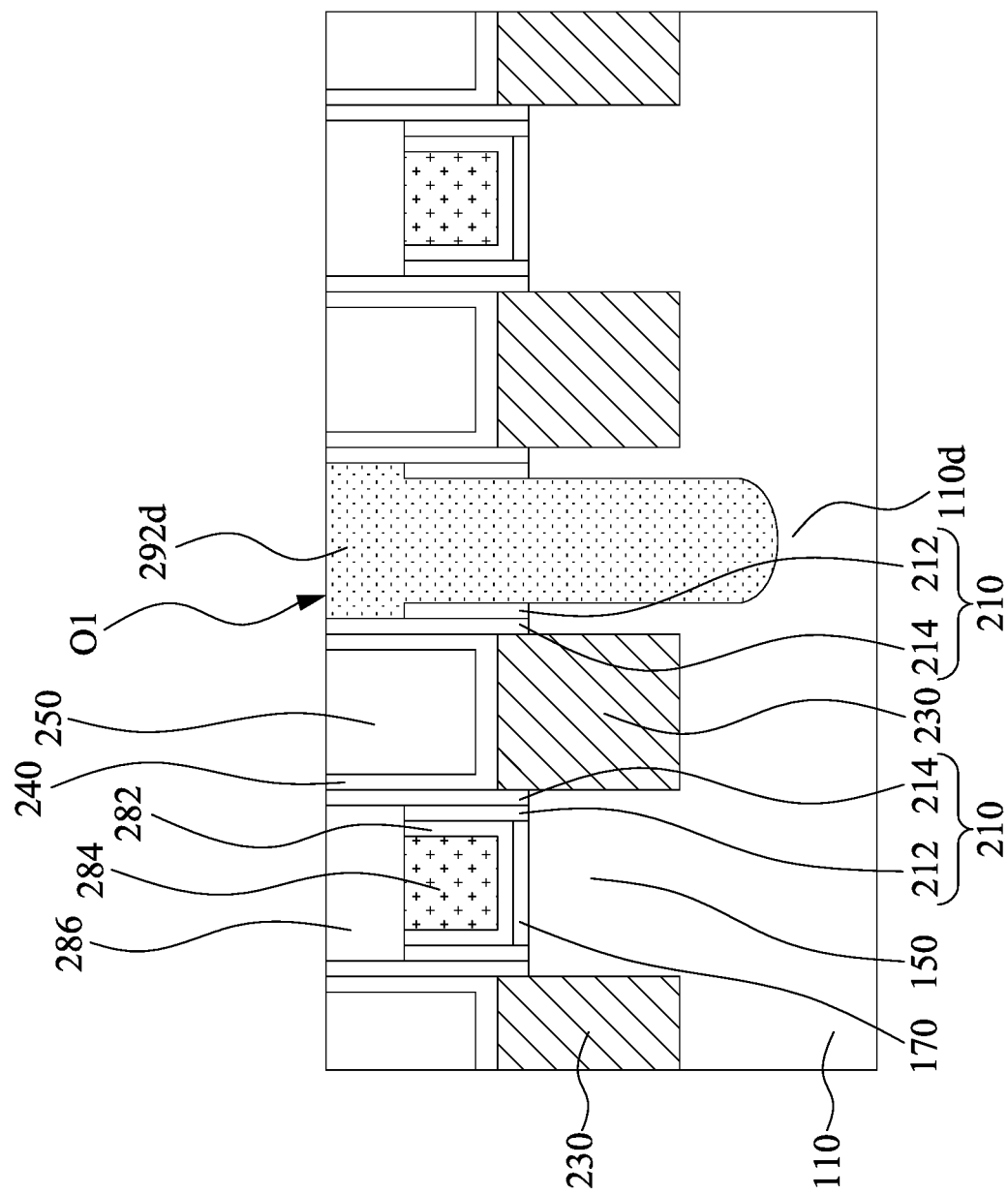
Figure 29C:
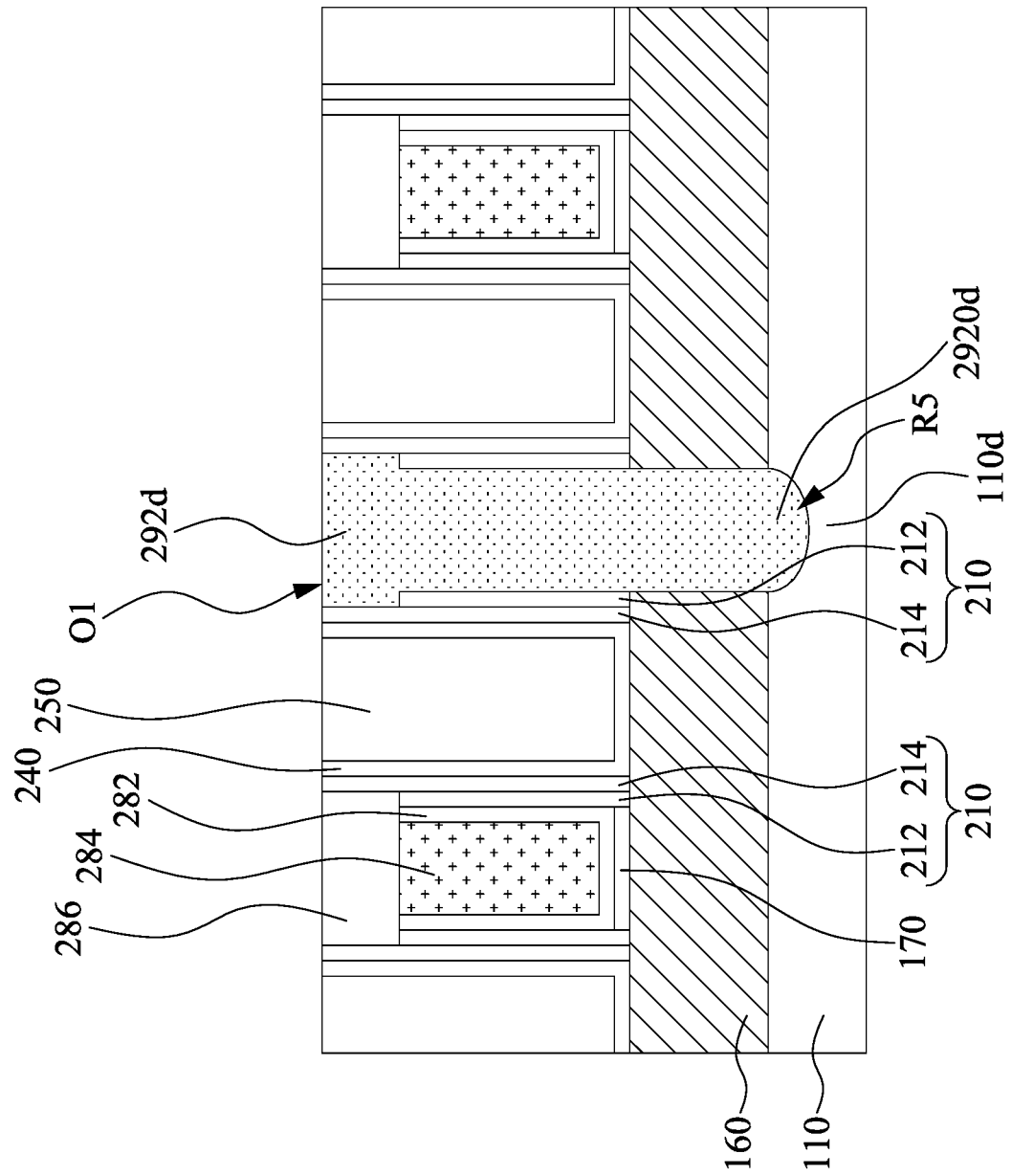

Reference is made to FIG. 29A to FIG. 29C. FIG. 29A to FIG. 29C are cross-sectional views of another semiconductor device in accordance with some embodiments of the present disclosure. It is understood that the cross-sectional views shown in FIG. 29A to FIG. 29C may correspond to the sections B-B, C-C, and D-D shown in FIG. 25A respectively. For the sake of simplicity, the dielectric fin layers 151, the first isolation dielectric 290, and the features outside the opening O1, such as the hard mask 286, the metal gate electrode layer 284, the work function metal layer 282, the gate dielectric layer 170, the isolation layer 160, the semiconductor fins 150, the epitaxial source/drain structures 230, the gate spacers 210, and the ILD layer 250 are designated by the same reference numerals of the corresponding features in FIG. 25B to FIG. 25D, with a difference in that the second isolation dielectric 292d and the substrate 110d within the opening O1 are replaced the second isolation dielectric 292 and the substrate 110 within the opening O1 shown in FIG. 25B to FIG. 25D respectively.

In FIG. 29A to FIG. 29C, a bottom of the second isolation dielectric 292a has a base portion 2920d and at least one recessing portion 2922d. The substrate 110d within the opening O1 has a recess R5. The recess R5 is recessed away from the dielectric fin layer 151. There is no isolation layer 160 remained in the opening O1, but the present disclosure is not limited thereto. The base portion 2920d is embedded in the recess R5 and in contact with the substrate 110d. In some embodiments, the base portion 2920d is lower than a bottom of the dielectric fin layer 151. In the other words, the base portion 2920d is lower than a top surface of the substrate 110d outside the opening O1 and has a rounded surface, such as a smiling profile.

In some embodiments, the recessing portion 2922d is recessed away from the substrate 110d based on the base portion 2920d. The substrate 110d is embedded in the recessing portion 2922d. That is, the substrate 110d has protrusions 112d substantially corresponding to original positions of the semiconductor fins 150 thereon shown in FIG. 25B to FIG. 25D respectively, and the protrusions 112d are embedded in the recessing portions 2922b. The interface between the recessing portion 2922d and the substrate 110d within the opening O1 is lower than a top surface of the substrate 110d outside the opening O1.

In some embodiments, the isolation layer 160 which can be referred to as the STI structure is remained in the opening O1, and a top surface of the remained STI is lower than a top surface of the isolation layer 160 that is outside of the opening O1, but the present disclosure is not limited thereto.

Figure 30A:
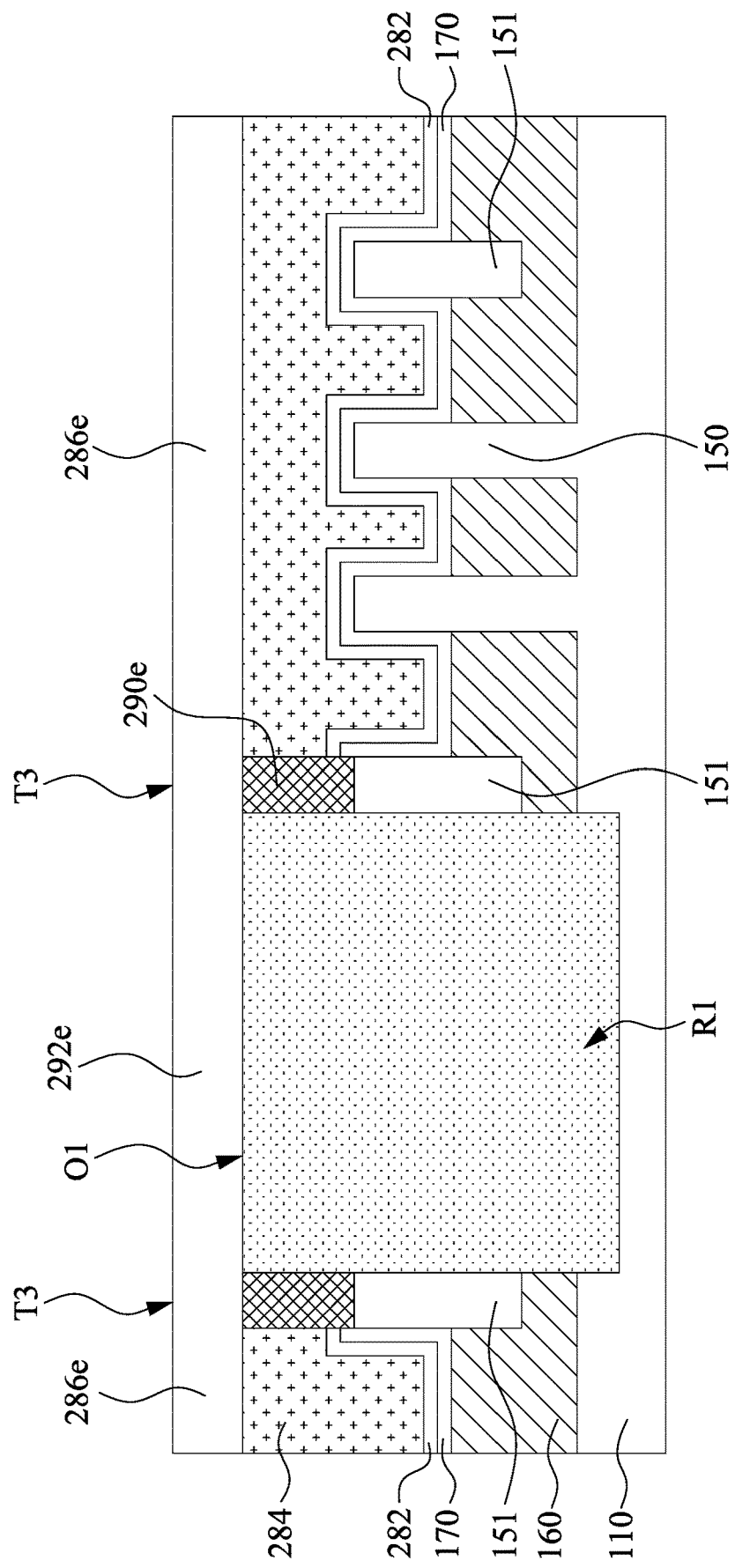
FIG. 30A to FIG. 30C are cross-sectional views of a semiconductor device in accordance with some embodiments of the present disclosure.
Figure 30B:
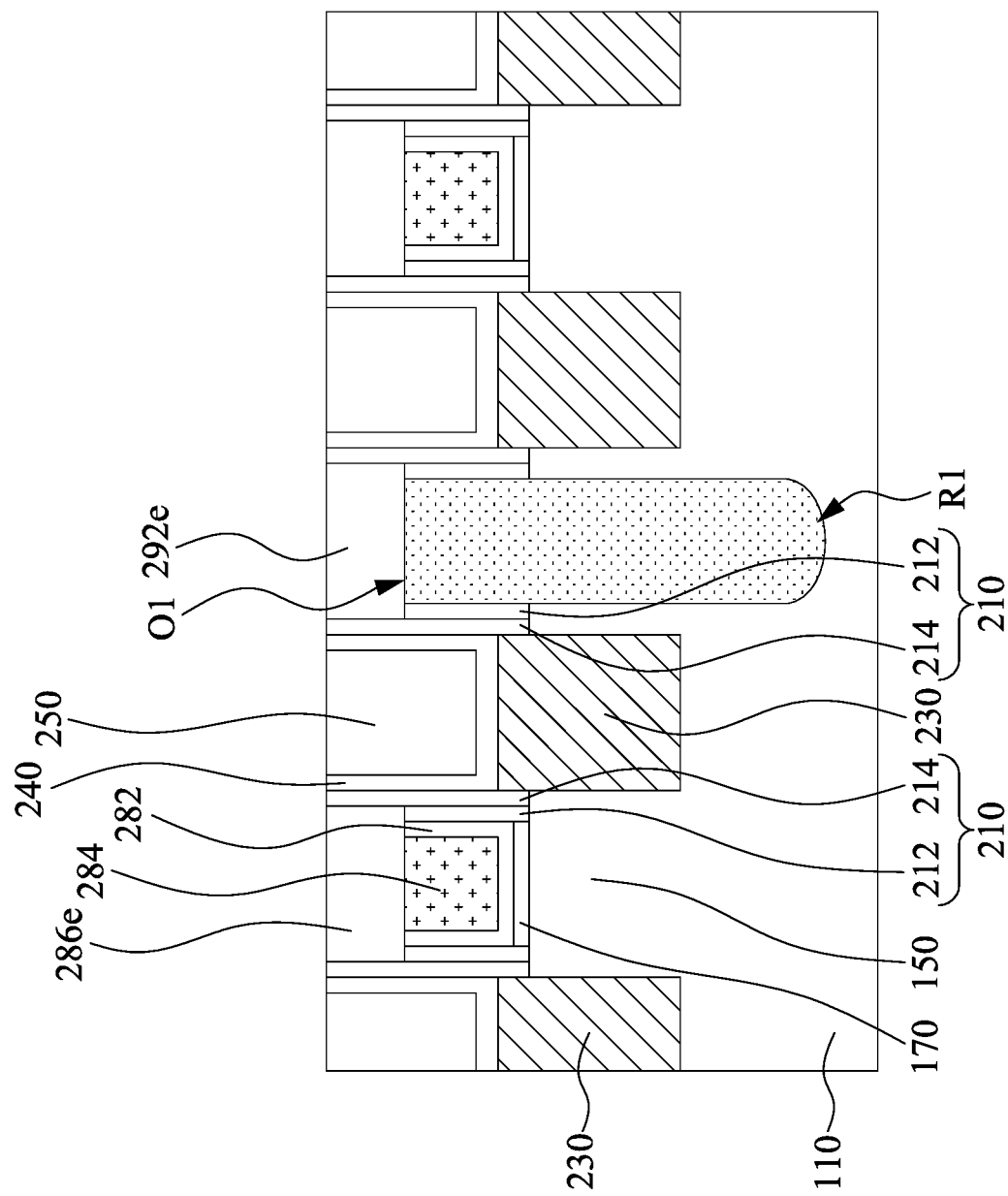
Figure 30C:
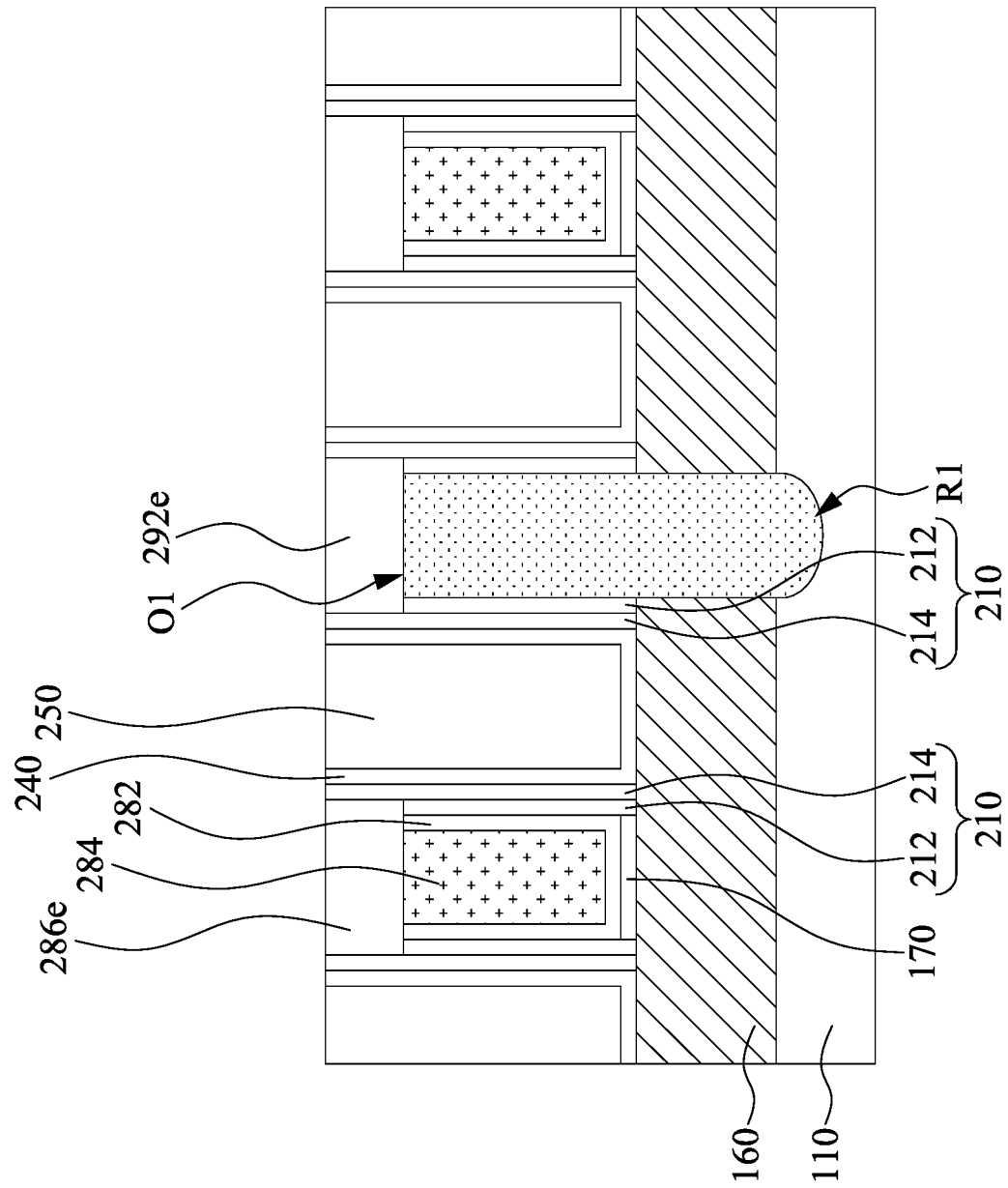

Reference is made to FIG. 30A to FIG. 30C. FIG. 30A to FIG. 30C are cross-sectional views of another semiconductor device in accordance with some embodiments of the present disclosure. It is understood that the cross-sectional views shown in FIG. 30A to FIG. 30C may correspond to the sections B-B, C-C, and D-D shown in FIG. 25A respectively. For the sake of simplicity, the dielectric fin layers 151, and the features outside the opening O1, such as the metal gate electrode layer 284, the work function metal layer 282, the gate dielectric layer 170, the semiconductor fins 150, the isolation layer 160, the substrate 110, the epitaxial source/drain structures 230, the gate spacers 210, and the ILD layer 250 are designated by the same reference numerals of the corresponding features in FIG. 25B to FIG. 25D, with a difference in that the first and second isolation dielectric 290e and 292e and the hard mask 286e within the opening O1 are replaced the first and second isolation dielectric 290 and 292 and the hard mask 286 within the opening O1 shown in FIG. 25B to FIG. 25D respectively.

In FIG. 30A to FIG. 30C, top surfaces of the first and second isolation dielectric 290e and 292e are flush with a top surface of the metal gate electrode layer 284. The hard mask 286e is blanketed on the first and second isolation dielectric 290e and 292e and the metal gate electrode layer 284. That is, an interface between the hard mask 286e and the first and second isolation dielectric 290e and 292e is substantially at the same level as an interface between the hard mask 286e and the metal gate electrode layer 284.

Figure 31A:
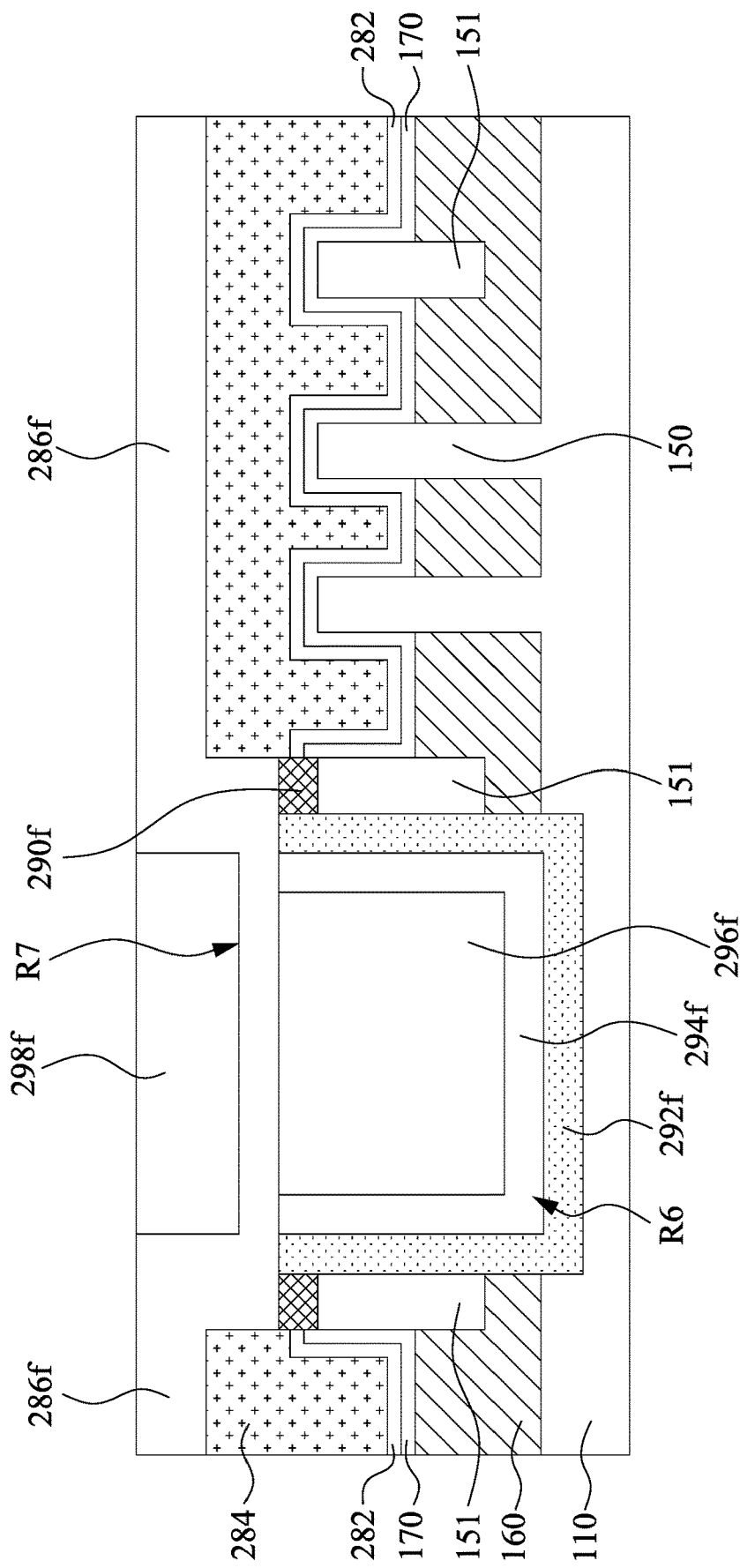
FIG. 31A to FIG. 31C are cross-sectional views of a semiconductor device in accordance with some embodiments of the present disclosure.
Figure 31B:
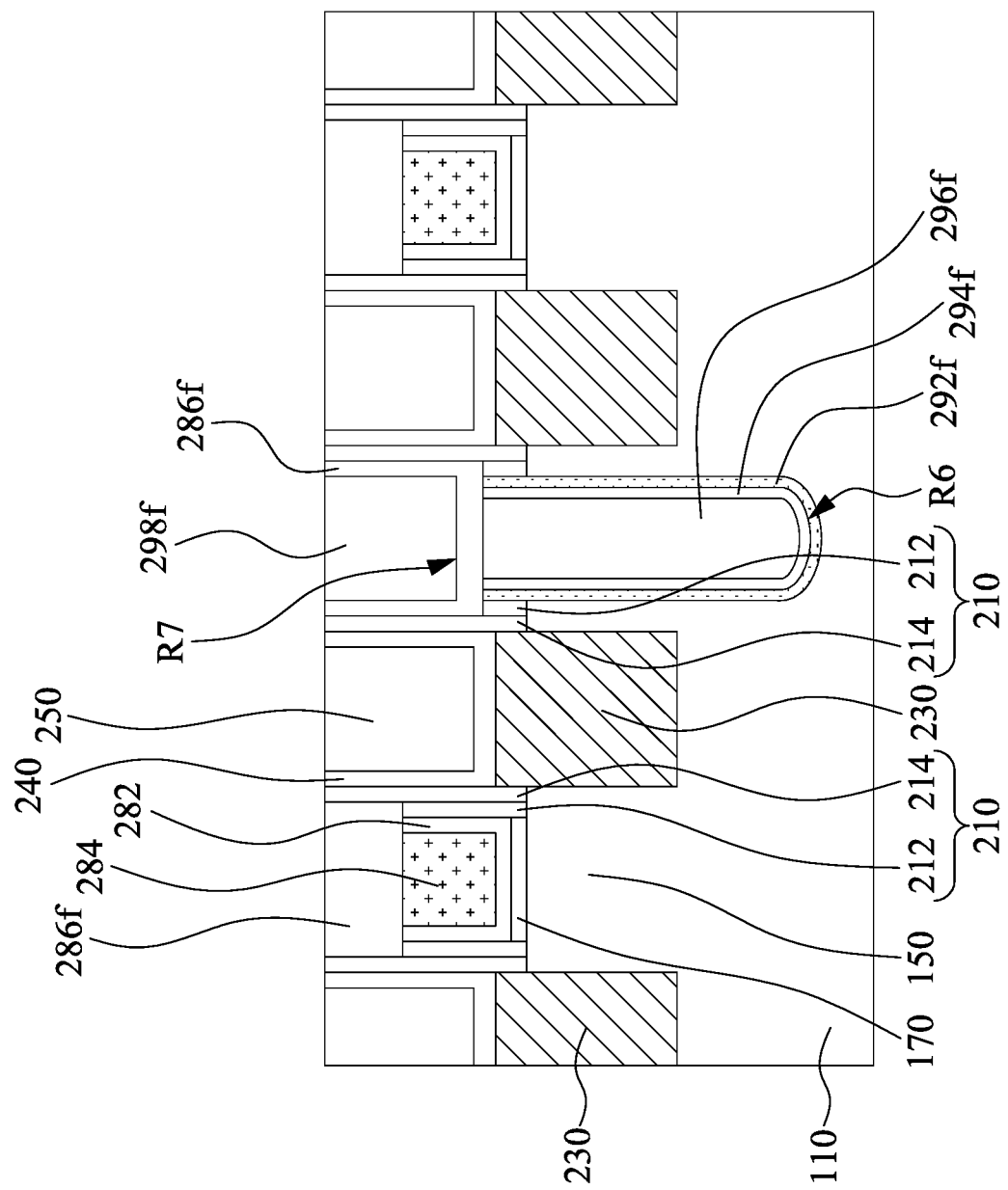
Figure 31C:
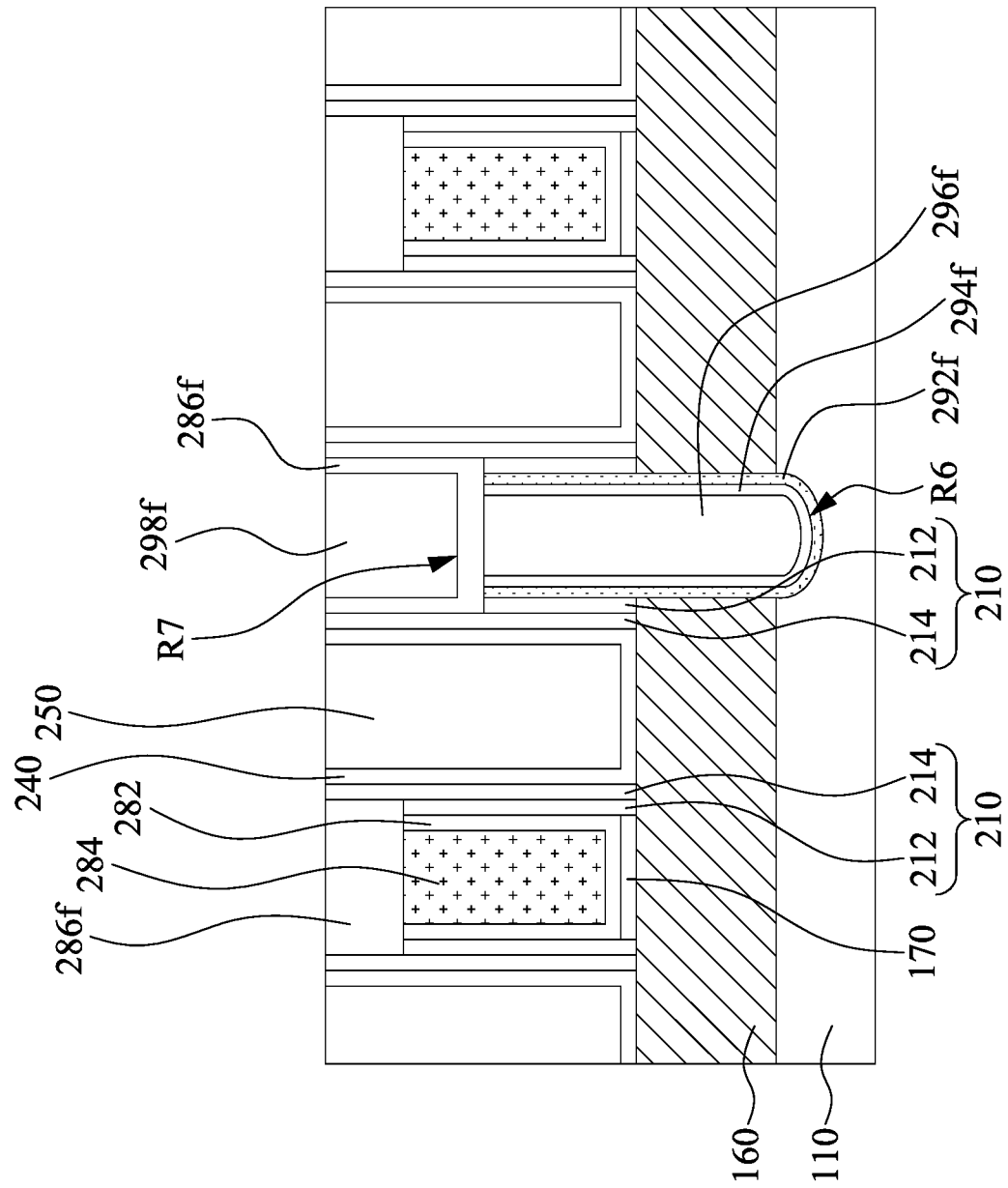

Reference is made to FIG. 31A to FIG. 31C. FIG. 31A to FIG. 31C are cross-sectional views of another semiconductor device in accordance with some embodiments of the present disclosure. It is understood that the cross-sectional views shown in FIG. 31A to FIG. 31C may correspond to the sections B-B, C-C, and D-D shown in FIG. 25A respectively. For the sake of simplicity, the dielectric fin layers 151, and the features outside the opening O1, such as the metal gate electrode layer 284, the work function metal layer 282, the gate dielectric layer 170, the semiconductor fins 150, the isolation layer 160, the substrate 110, the epitaxial source/drain structures 230, the gate spacers 210, and the ILD layer 250 are designated by the same reference numerals of the corresponding features in FIG. 25B to FIG. 25D, with a difference in that the first and second isolation dielectric 290f and 292f and the hard mask 286f within the opening O1 are replaced the first and second isolation dielectric 290 and 292 and the hard mask 286 within the opening O1 shown in FIG. 25B to FIG. 25D respectively.

In FIG. 31A to FIG. 31C, the second isolation dielectric 292f is conformally formed on side walls of the dielectric fin layer 151 and the top surface of the substrate 110. In addition, other isolation dielectric, such as third and fourth isolation dielectrics 294f and 296f may also be used and embedded in a recess R6 of the second isolation dielectric 292f as shown in FIG. 31A to FIG. 31C. Specifically, the third isolation dielectrics 294f is conformed formed in the recess R6 and wrapped around the fourth isolation dielectrics 296f. In some embodiments, the third isolation electrics 294f is in contact with a bottom surface of the fourth isolation dielectrics 296f and exposes a top surface of the fourth isolation dielectrics 296f. Specifically, top surfaces of the first, second, third, and fourth isolation dielectrics 290f, 292f, 294f and 296f are flush with each other and lower than the top surface of the metal gate electrode layer 284.

As shown in FIG. 31A to FIG. 31C, the hard mask 286f is blanked on the metal gate electrode layer 284 and the first, second, third, and fourth isolation dielectrics 290f, 292f, 294f and 296f. The hard mask 286f has a recess R7 vertically above the recess R6 of the second isolation dielectric 292f, and a layer 298f is embedded in the recess R7 and vertically aligned with the fourth isolation dielectric 296f. In some embodiments, materials in the opening O1 may be homogeneous/continuous or heterogeneous/non-continuous. In some embodiments, the third and fourth isolation dielectrics 294f and 296f and the layer 298f each may include SiOx, SiON, Si$_3$N$_4$, SiOCN, SiC, SiGe, metals, or combinations thereof. In some embodiments, the third and fourth isolation dielectrics 294f and 296f and the layer 298f each may include air-gap.

Figure 32A:
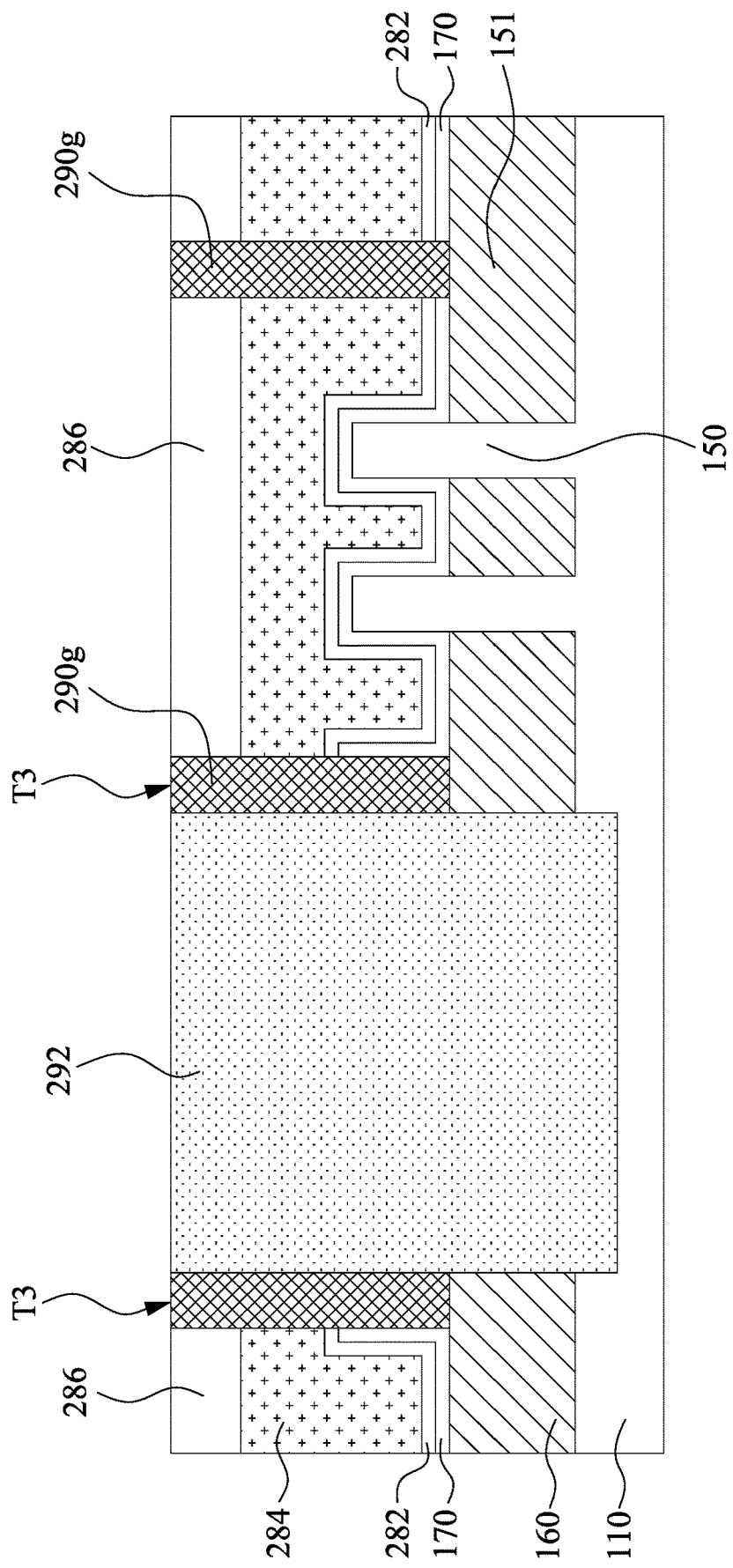
FIG. 32A to FIG. 32C are cross-sectional views of other semiconductor devices respectively in accordance with some embodiments of the present disclosure.
Figure 32B:
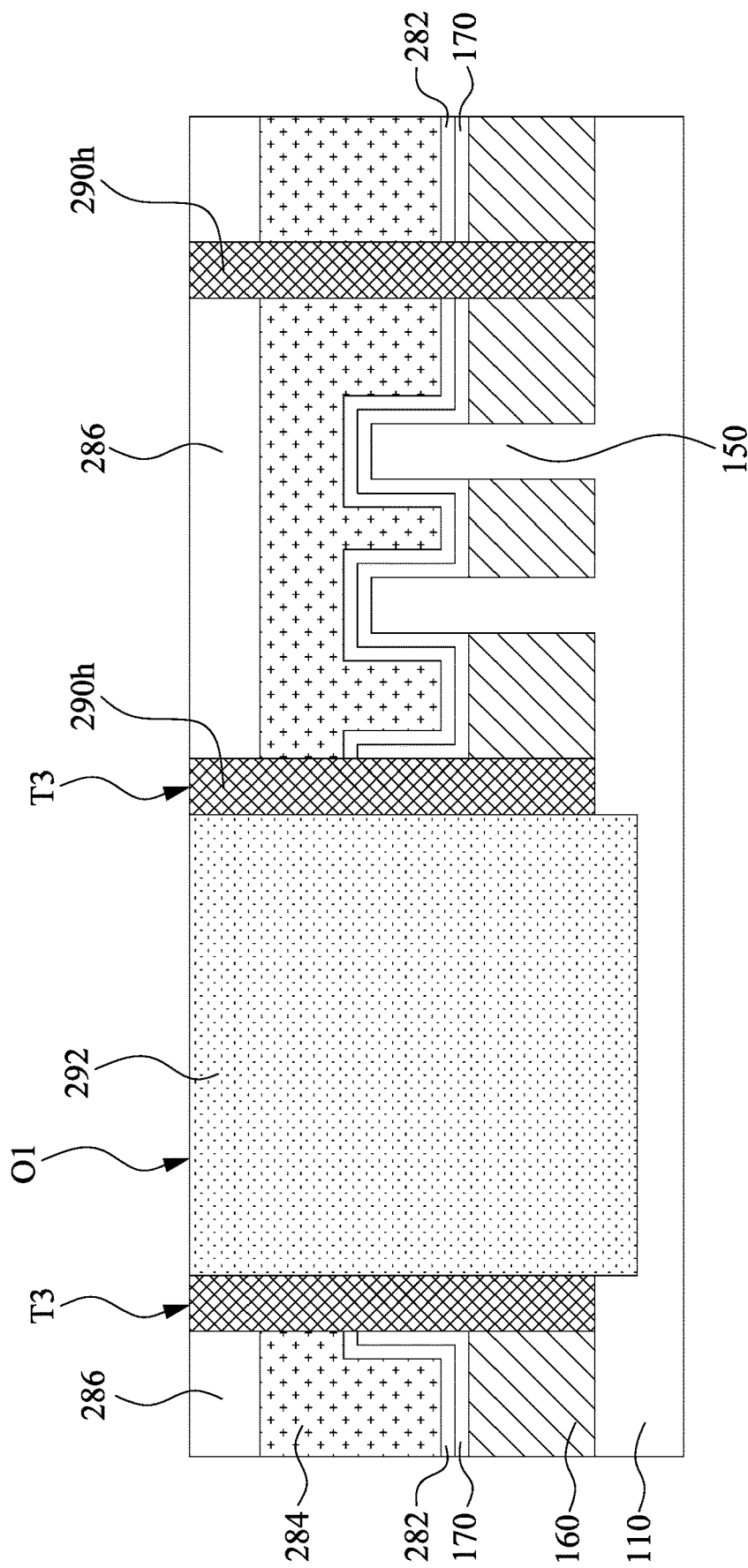
Figure 32C:
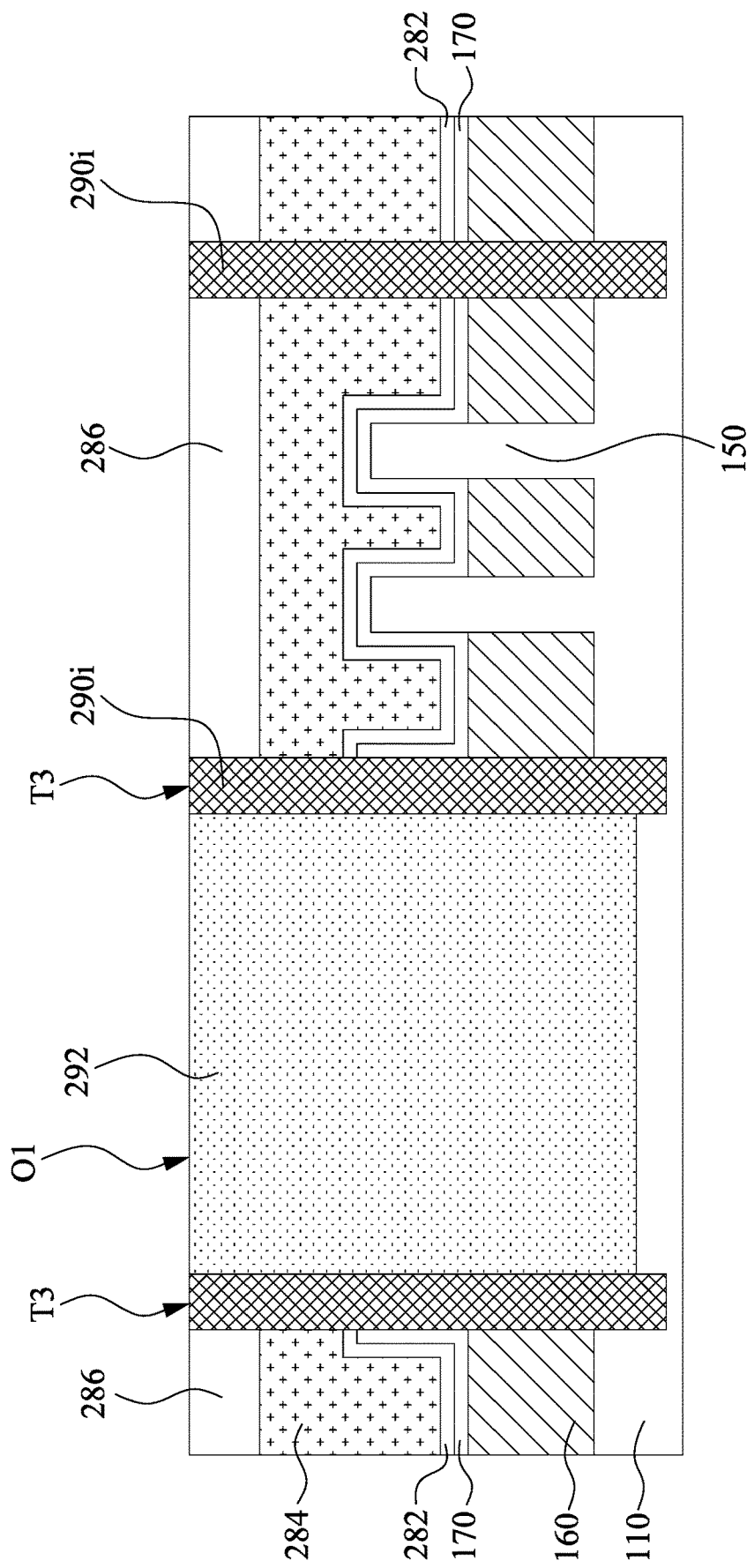

Reference is made to FIG. 32A to FIG. 32C. FIG. 32A to FIG. 32C are cross-sectional views of other semiconductor devices respectively in accordance with some embodiments of the present disclosure. It is understood that the cross-sectional views shown in FIG. 32A to FIG. 32C each may correspond to the sections B-B shown in FIG. 25A. For the sake of simplicity, the features outside the opening O1, such as the second isolation dielectric 292, the hard mask 286, the metal gate electrode layer 284, the work function metal layer 282, the gate dielectric layer 170, the semiconductor fins 150, the epitaxial source/drain structures 230, the gate spacers 210, and the ILD layer 250 are designated by the same reference numerals of the corresponding features in FIG. 25B to FIG. 25D. It is note that, the difference between the present embodiment, i.e. FIG. 32A to FIG. 32C, and the embodiment in FIG. 25A to FIG. 25D is in that the dielectric fin layer 151 shown in FIG. 25B to FIG. 25D are omitted, and the first isolation dielectrics 290g, 290h, and 290i are replaced the first isolation dielectric 290 shown in FIG. 25A to FIG. 25D respectively.

For example, In FIG. 32A, the isolation layer 160 extends to underlay a bottom surface of the first isolation dielectric 290g. On the other words, the first isolation dielectric 290g stops and lands on the isolation layer 160. In FIG. 32B, the first isolation dielectric 290h stops and lands on the substrate 110, in which an interface between the first isolation dielectric 290h and the substrate 110 is in a portion higher than an interface between the second isolation dielectric 292 and the substrate 110. In FIG. 32C, the first isolation dielectric 290i extends into the substrate 110 and is embedded in the substrate 110. As shown in FIG. 32C, an interface between the first isolation dielectric 290g and the substrate 110 is in a portion lower than an interface between the second isolation dielectric 292 and the substrate 110.

Figure 33A:
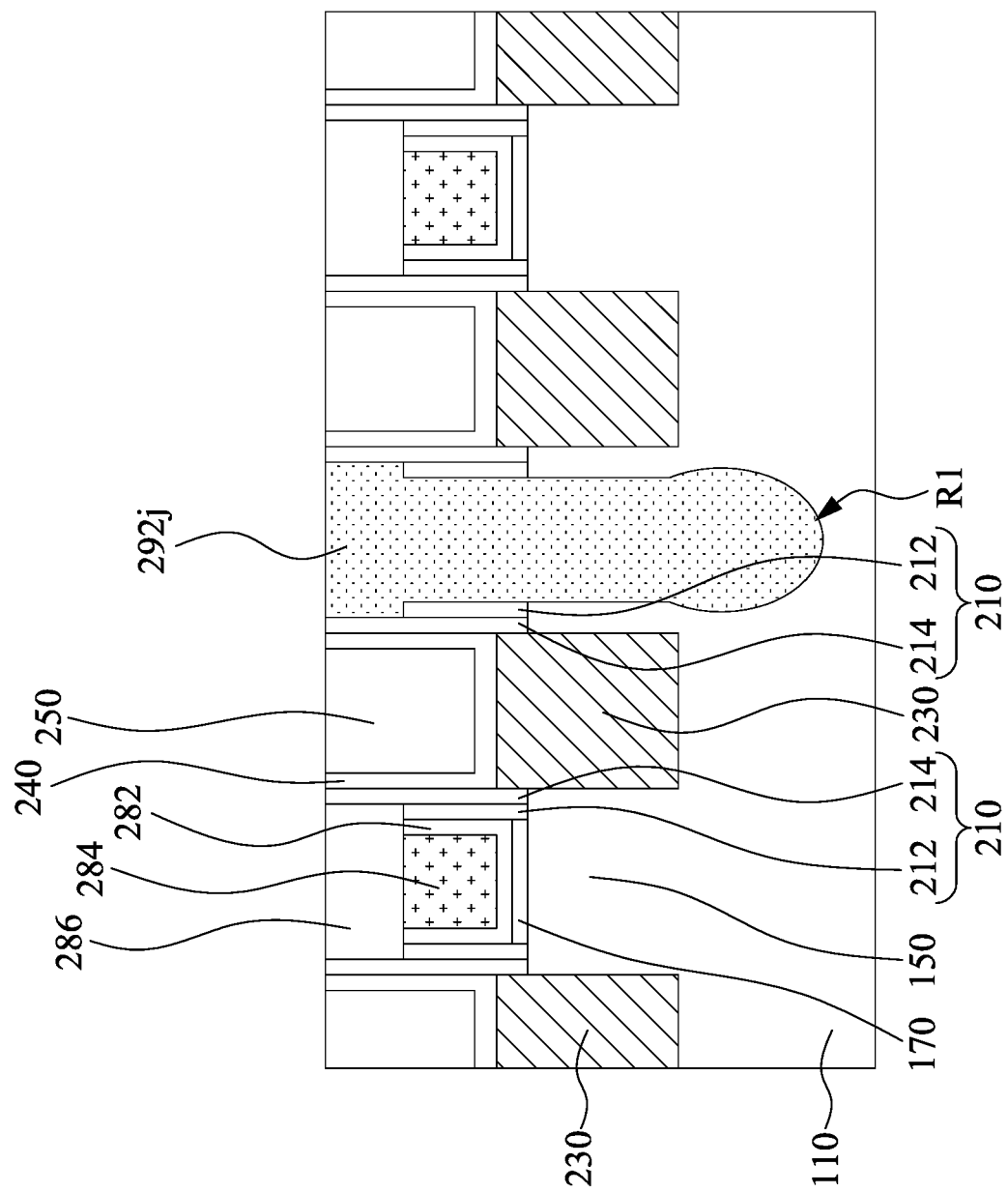
FIG. 33A to FIG. 33C are cross-sectional views of other semiconductor devices respectively in accordance with some embodiments of the present disclosure.
Figure 33B:
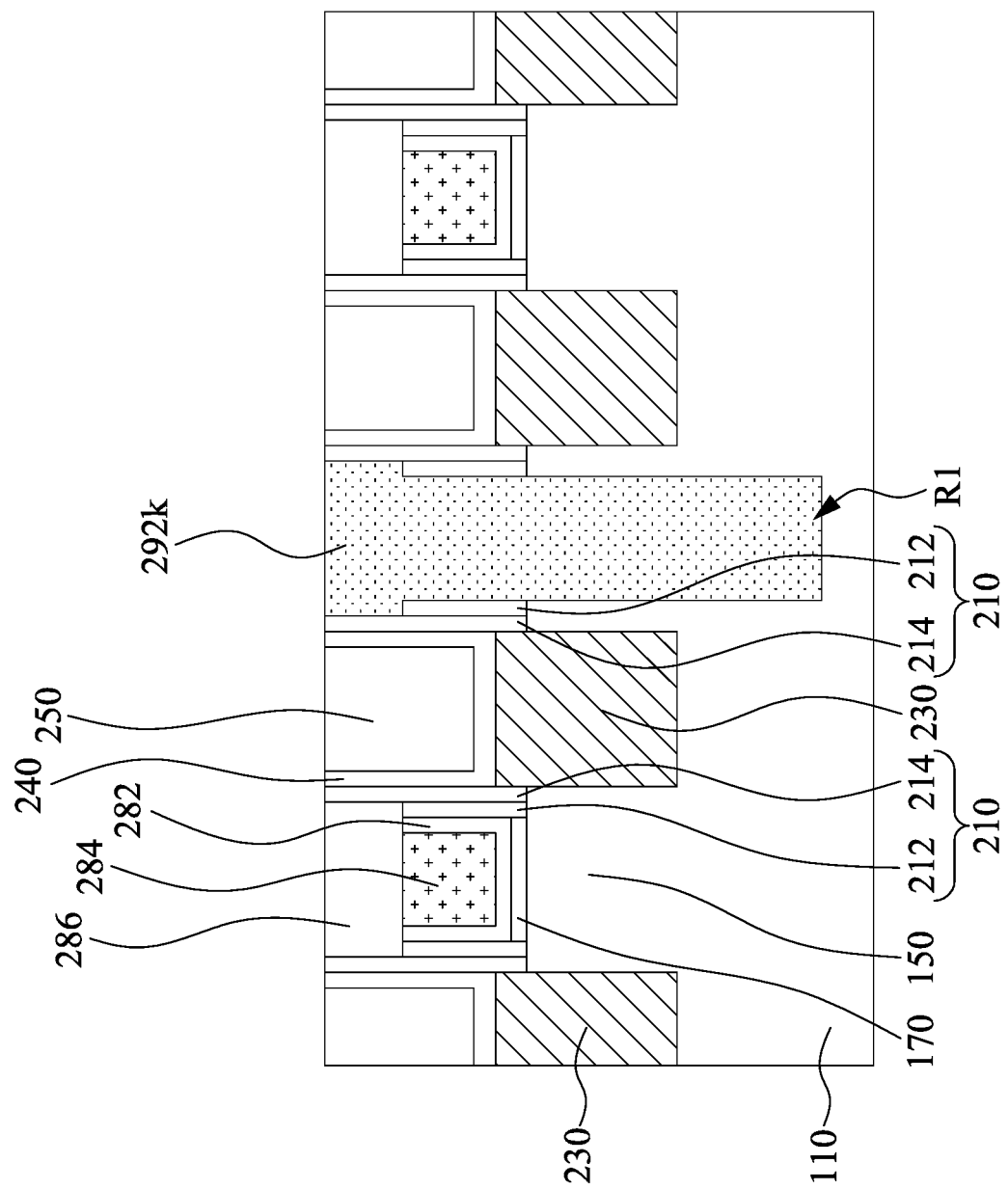
Figure 33C:
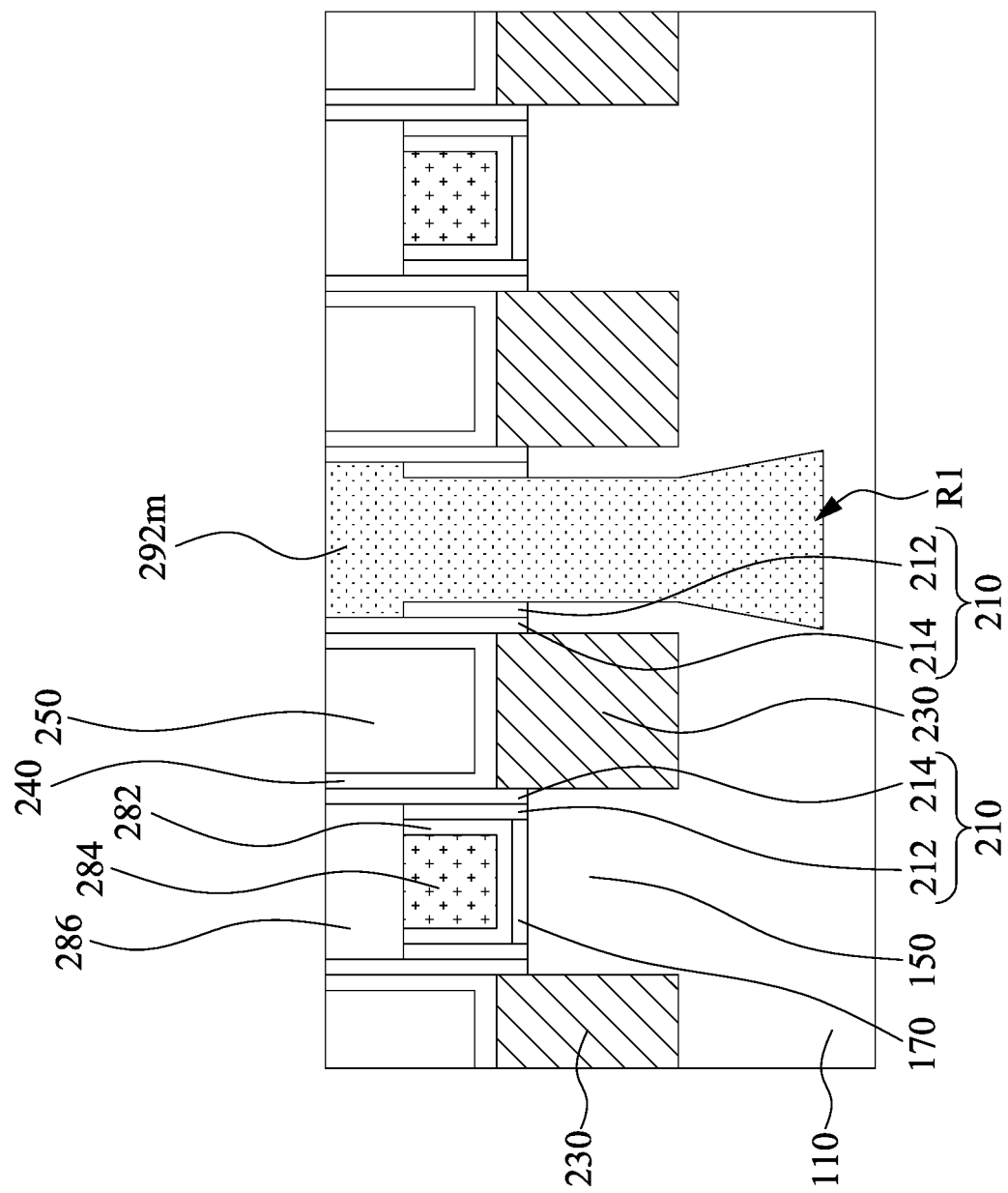

Reference is made to FIG. 33A to FIG. 33C. FIG. 33A to FIG. 33C are cross-sectional views of other semiconductor devices respectively in accordance with some embodiments of the present disclosure. It is understood that the cross-sectional views shown in FIG. 33A to FIG. 33C each may correspond to the sections C-C shown in FIG. 25A. For the sake of simplicity, the features outside the opening O1, such as the first isolation dielectric 290, the hard mask 286, the metal gate electrode layer 284, the work function metal layer 282, the gate dielectric layer 170, the semiconductor fins 150, the epitaxial source/drain structures 230, the gate spacers 210, and the ILD layer 250 are designated by the same reference numerals of the corresponding features in FIG. 25B to FIG. 25D.

It is note that, the difference between the present embodiment, i.e. FIG. 33A to FIG. 33C, and the embodiment in FIG. 25A to FIG. 25D is in that the second isolation dielectrics 292j, 292k, and 292m are replaced the second isolation dielectric 292 shown in FIG. 25B to FIG. 25D respectively. For example, In FIG. 33A, an end of the second isolation dielectric 292j is in a diamond-like shape. In FIG. 33B, an end of the second isolation dielectric 292k is in a rectangle-like shape. In FIG. 33C, an end of the second isolation dielectric 292m is in a trapezoid-like shape.

Figure 34:
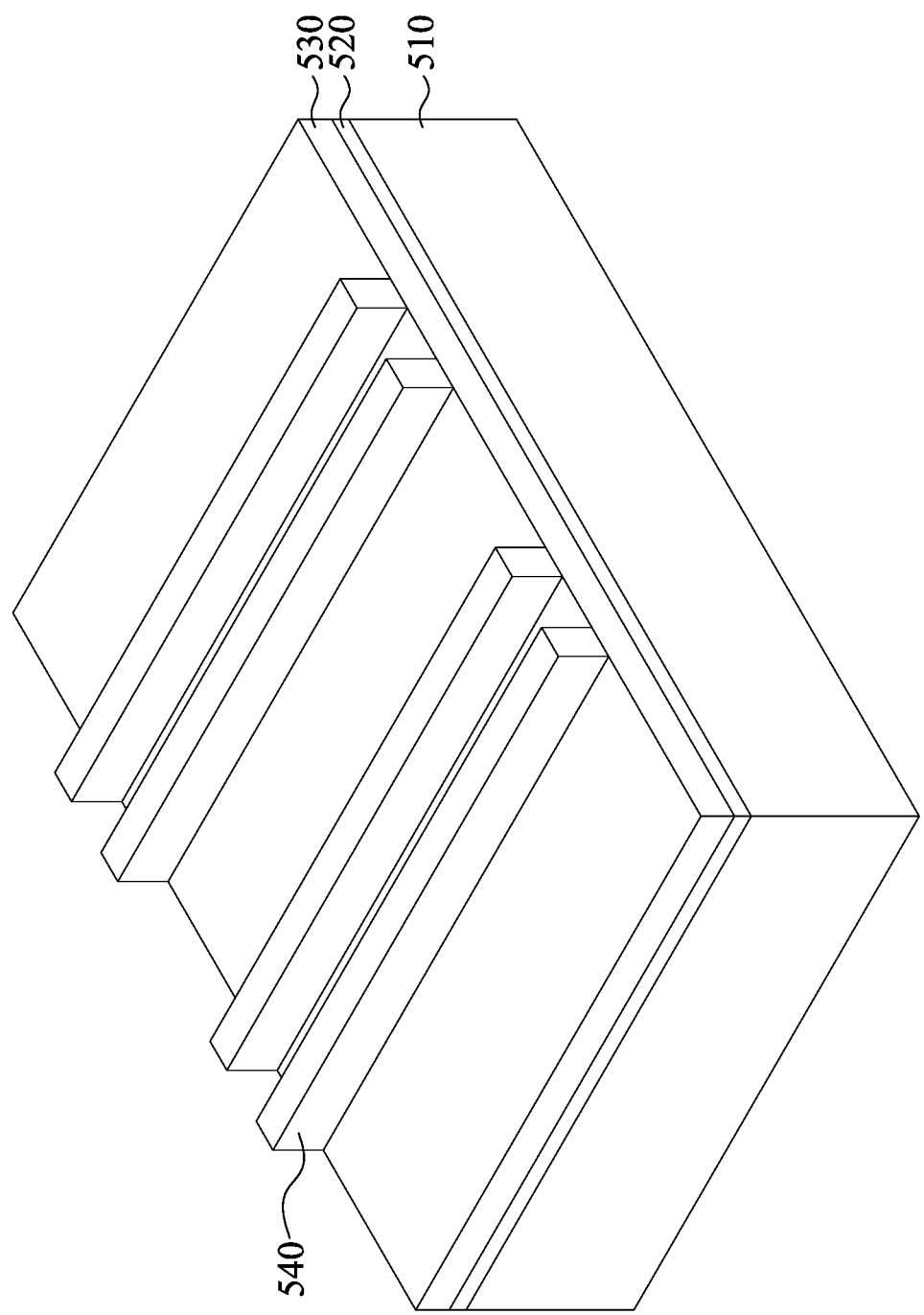
FIG. 34 to FIG. 54D illustrate a method for manufacturing a semiconductor device at various stages in accordance with some embodiments of the present disclosure.

FIG. 34 to FIG. 54D illustrate a method for manufacturing a semiconductor device at various stages in accordance with some embodiments of the present disclosure. Reference is made to FIG. 34. A substrate 510 is illustrated, and it may be a semiconductor substrate, such as a bulk semiconductor, a semiconductor-on-insulator (SOI) substrate, or the like. The substrate 510 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

A pad layer 120 and a mask layer 530 are formed on the substrate 510. The pad layer 520 may be a thin film comprising silicon oxide formed using, for example, a thermal oxidation process. The pad layer 520 may act as an adhesion layer between the substrate 510 and mask layer 530. The pad layer 520 may also act as an etch stop layer for etching the mask layer 530. In some embodiments, the mask layer 530 is formed of silicon nitride, for example, using low-pressure chemical vapor deposition (LPCVD) or plasma enhanced chemical vapor deposition (PECVD). The mask layer 530 is used as a hard mask during subsequent photolithography processes. A photo-sensitive layer 540 is formed on the mask layer 530 and is then patterned, forming openings in the photo-sensitive layer 540, so that some regions of the mask layer 530 are exposed.

Figure 35:
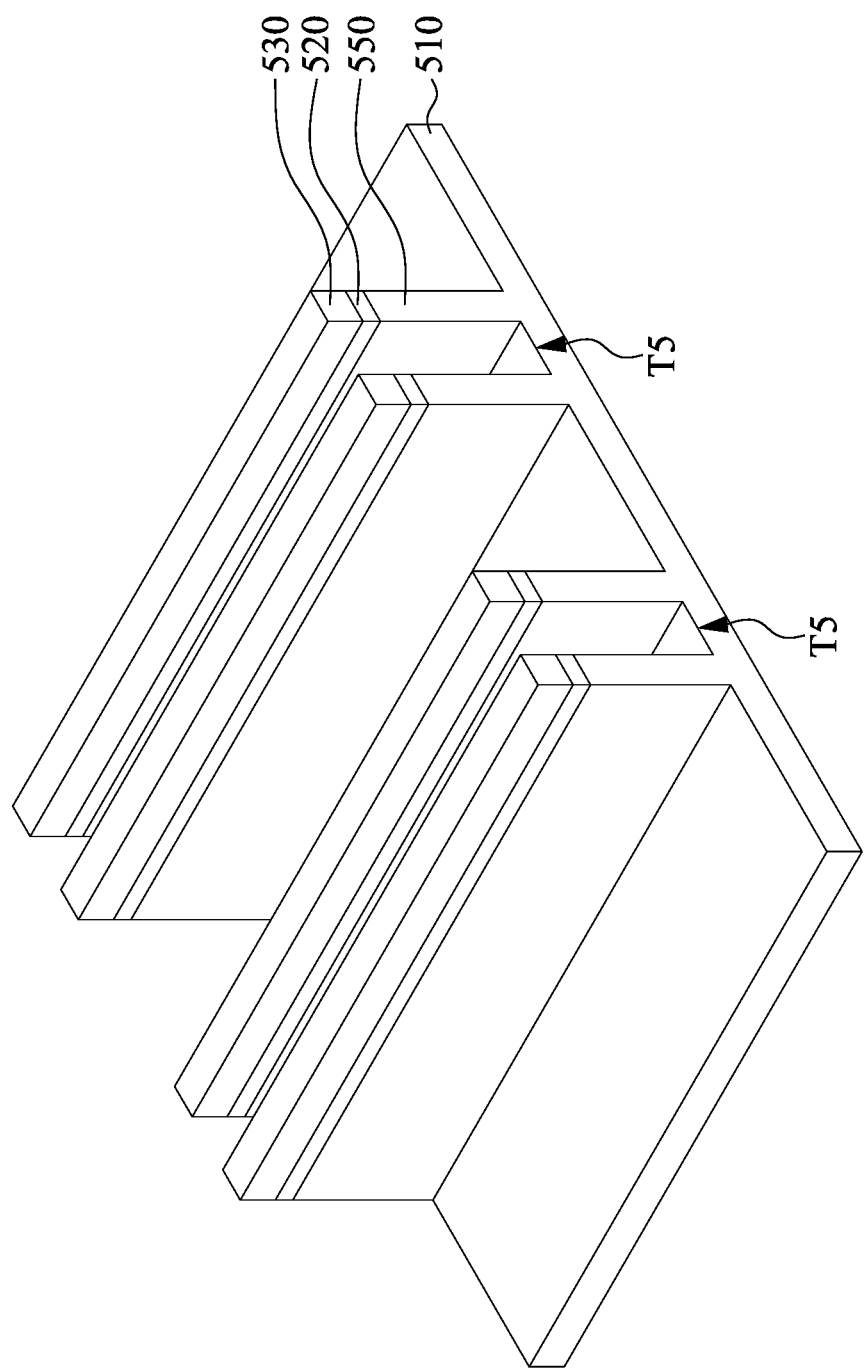

Reference is made to FIG. 35. The mask layer 530 and pad layer 520 are etched through the photo-sensitive layer 540, exposing underlying substrate 510. The exposed substrate 510 is then etched, forming trenches T5. A portion of the substrate 510 between neighboring trenches T5 can be referred to as a semiconductor fin 550. Trenches T5 may be trench strips that are substantially parallel to each other. Similarly, the semiconductor fins are substantially parallel to each other. After etching the substrate 510, the photo-sensitive layer 540 is removed. Next, a cleaning step may be performed to remove a native oxide of the semiconductor substrate 510. The cleaning may be performed using diluted hydrofluoric (HF) acid, for example.

Figure 36:
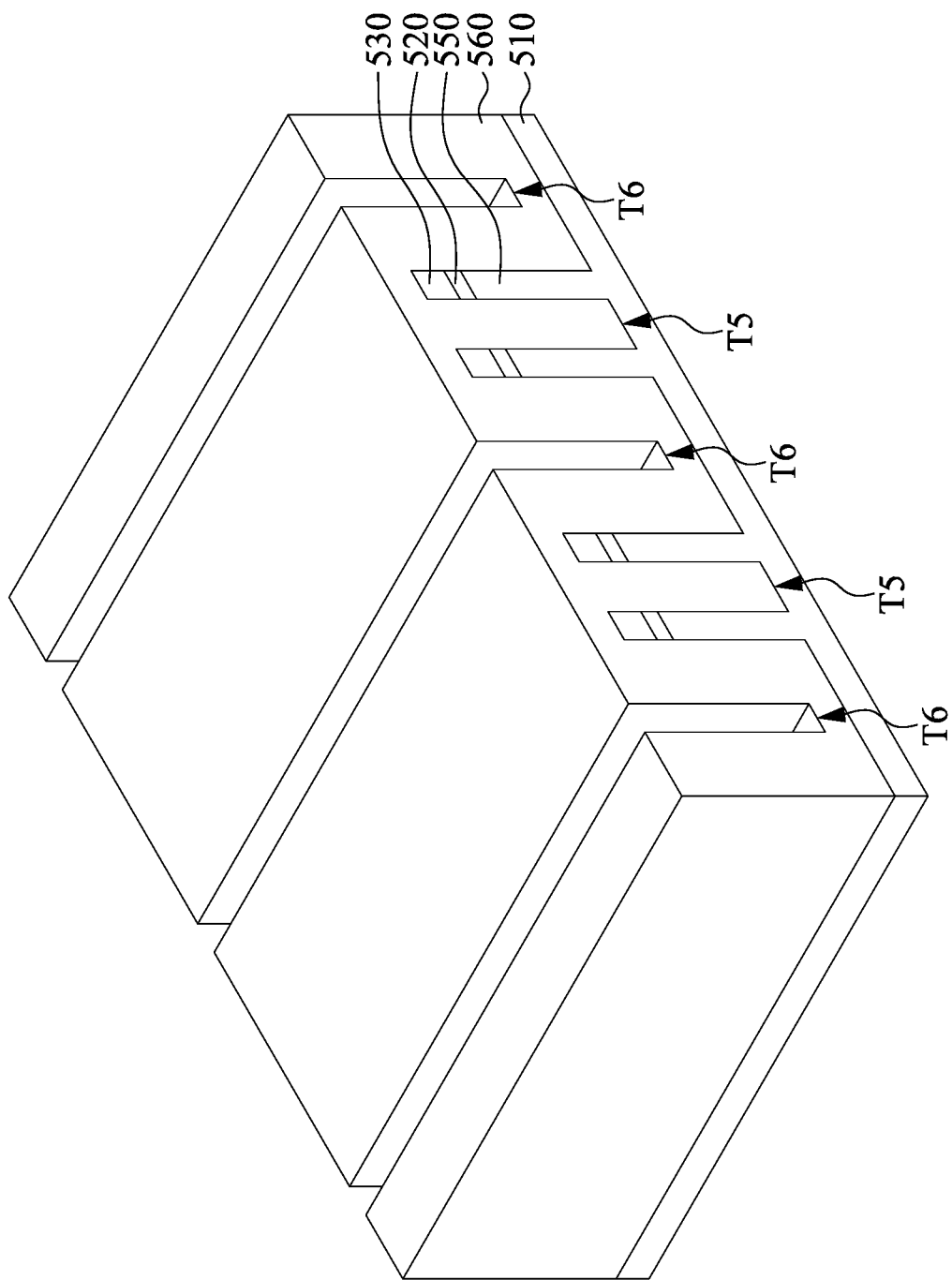

Reference is made to FIG. 36. After photo-sensitive layer 540 is removed, an isolation layer 560 is formed over the substrate 510. In some embodiments, the isolation layer 560 is formed to conformally cover the semiconductor fins 550 by suitable deposition process, such as atomic layer deposition (ALD). Thus, plural trenches T6 are formed in the isolation layer 560 and between the semiconductor fins 550. For example, some trenches T6 are formed between the fins 550.

In some embodiments, if two adjacent fins are too close, the isolation layer 560 may be filled in the space between the fins. For example, in FIG. 36, since the semiconductor fins 550 are close enough, the isolation layer 560 is filled in the space between the adjacent semiconductor fins 550. That is, no trench is formed between the semiconductor fins 550.

In some embodiments, the isolation layer 560 in the trenches T1 can be referred to as a shallow trench isolation (STI) structure. In some embodiments, the isolation layer 160 is made of silicon oxide, silicon nitride, silicon oxynitride, fluoride-doped silicate glass (FSG), or other low-K dielectric materials. In some embodiments, the isolation layer 560 may be formed using a high-density-plasma (HDP) chemical vapor deposition (CVD) process, using silane ($SiH_4$) and oxygen ($O_2$) as reacting precursors. In some other embodiments, the isolation layer 560 may be formed using a sub-atmospheric CVD (SACVD) process or high aspect-ratio process (HARP), wherein process gases may comprise tetraethylorthosilicate (TEOS) and ozone ($O_3$). In yet other embodiments, the isolation layer 560 may be formed using a spin-on-dielectric (SOD) process, such as hydrogen silsesquioxane (HSQ) or methyl silsesquioxane (MSQ). Other processes and materials may be used. In some embodiments, the isolation layer 560 can have a multi-layer structure, for example, a thermal oxide liner layer with silicon nitride formed over the liner. Thereafter, a thermal annealing may be optionally performed to the isolation layer 560.

Figure 37:
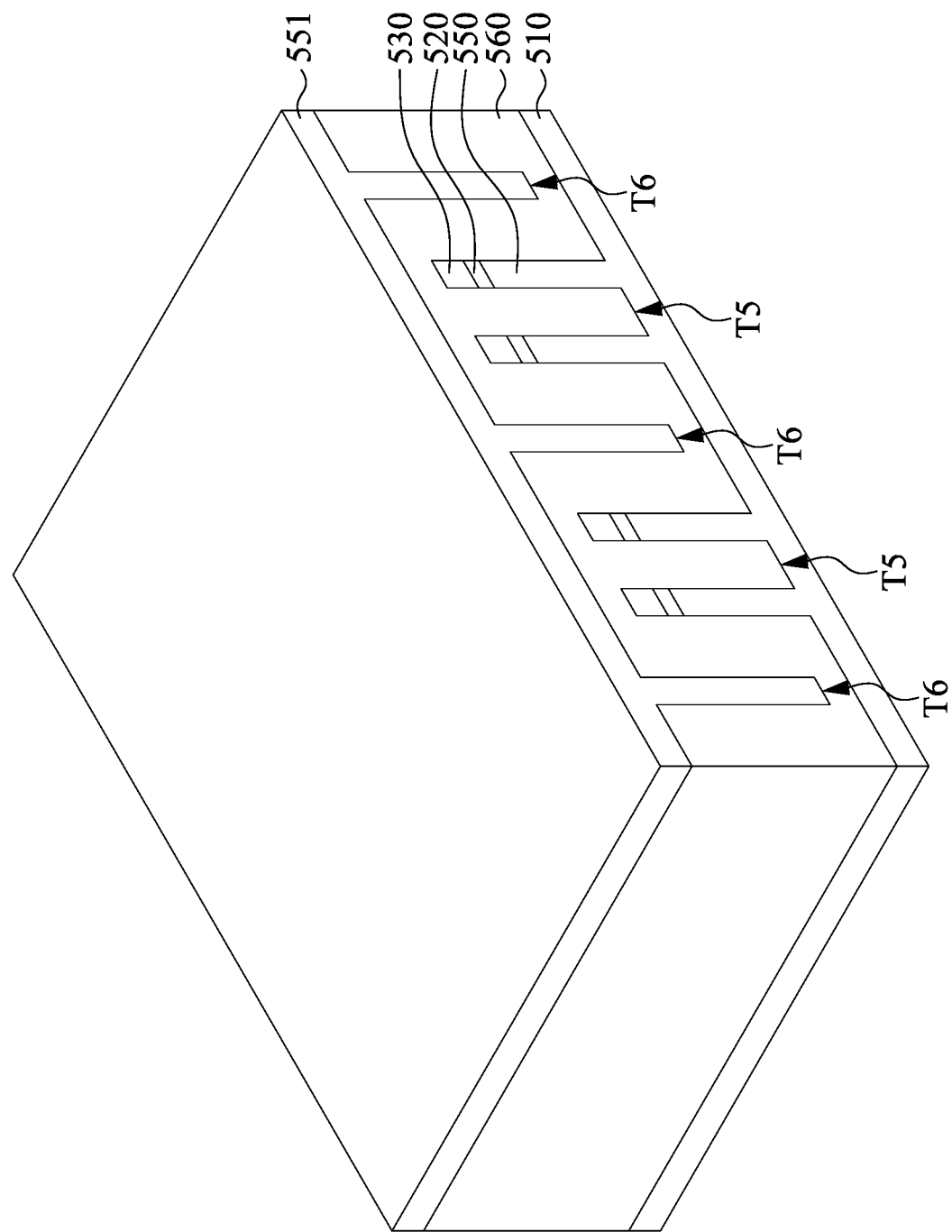

Reference is made to FIG. 37. A dielectric fin layer 551 is formed over the substrate 510 and covers the isolation layer 560. The dielectric fin layer 551 is filled in the trenches T6 in the isolation layer 560. In some embodiments, the dielectric fin layer 551 may include metal oxides, such as $HfO_2$, $ZrO_2$, $HfAlO_x$, $HfSiO_x$ and the like and may be formed by methods utilized to form such a layer, such as CVD, plasma enhanced CVD, sputter, and other methods known in the art. In some embodiments, the dielectric fin layer 551 may be made from other high-k materials other than metal dielectric materials.

Figure 38:
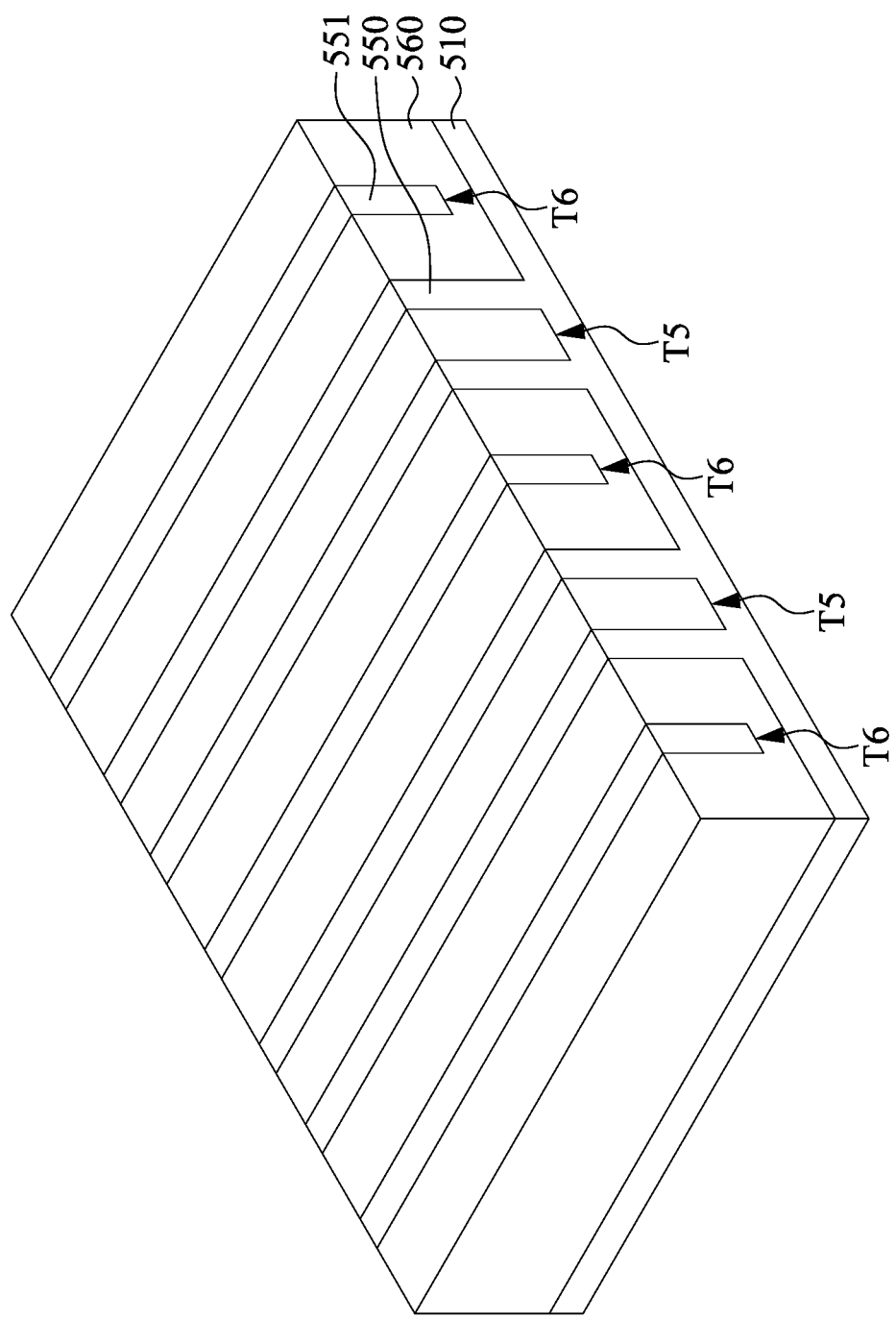

Reference is made to FIG. 38. A planarization process such as chemical mechanical polish (CMP) is performed to remove the excessive isolation layer 560 and dielectric fin layer 551 until the semiconductor fins 550 are exposed and the remained dielectric fin layer 551 covers the isolation layer 560 underneath, and may also refer to as an insulating fin. In some embodiments, the insulating fin is on the substrate 110 and parallel to the semiconductor fin 550.

Specifically, the CMP process is then performed to remove the excess isolation layer 560 outside the trenches T5, and the resulting structure is shown in FIG. 37. In some embodiments, the planarization process may also remove the mask layer 530 and the pad layer 520 such that top surfaces of the semiconductor fins 550 are exposed. In some other embodiments, the planarization process stops when the mask layer 530 is exposed. In such embodiments, the mask layer 530 may act as the CMP stop layer in the planarization. If the mask layer 530 and the pad layer 520 are not removed by the planarization process, the mask layer 530, if formed of silicon nitride, may be remove by a wet process using hot $H_3PO_4$, and the pad layer 520, if formed of silicon oxide, may be removed using diluted HF.

Figure 39:
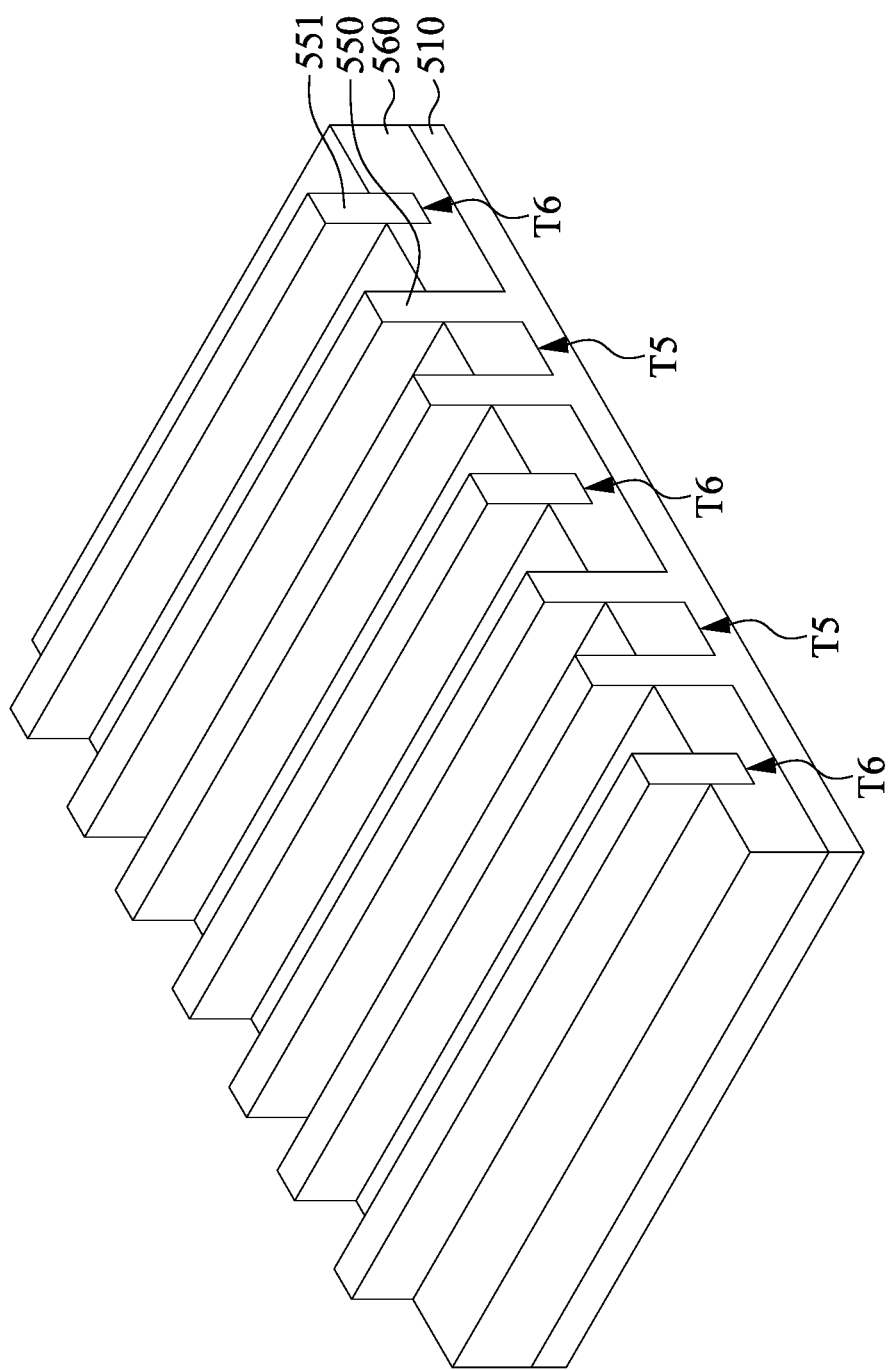

As shown in FIG. 39, the isolation layer 560 is recessed, for example, through an etching operation, wherein diluted HF, SiCoNi (including HF and $NH_3$), or the like, may be used as the etchant. After recessing the isolation layer 560, a portion of the semiconductor fin 550 is higher than a top surface of the isolation layer 560, and hence this portion of the semiconductor fin 550 protrudes above the isolation layer 560.

It is understood that the processes described above are some examples of how semiconductor fins 550 and the STI structure are formed. In other embodiments, an isolation layer 560 can be formed over a top surface of the substrate 510; trenches can be etched through the dielectric layer; homoepitaxial structures can be epitaxially grown in the trenches; and the isolation layer can be recessed such that the homoepitaxial structures protrude from the dielectric layer to form fins. In still other embodiments, heteroepitaxial structures can be used for the fins. For example, at least one of the semiconductor fins 550 can be recessed, and a material different from the recessed semiconductor fin 550 may be epitaxially grown in its place. In even further embodiments, a dielectric layer can be formed over a top surface of the substrate 510; trenches can be etched through the dielectric layer; heteroepitaxial structures can be epitaxially grown in the trenches using a material different from the substrate 510; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior implanting of the fins although in situ and implantation doping may be used together. In some embodiments, at least one of the semiconductor fins 550 may include silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 40:
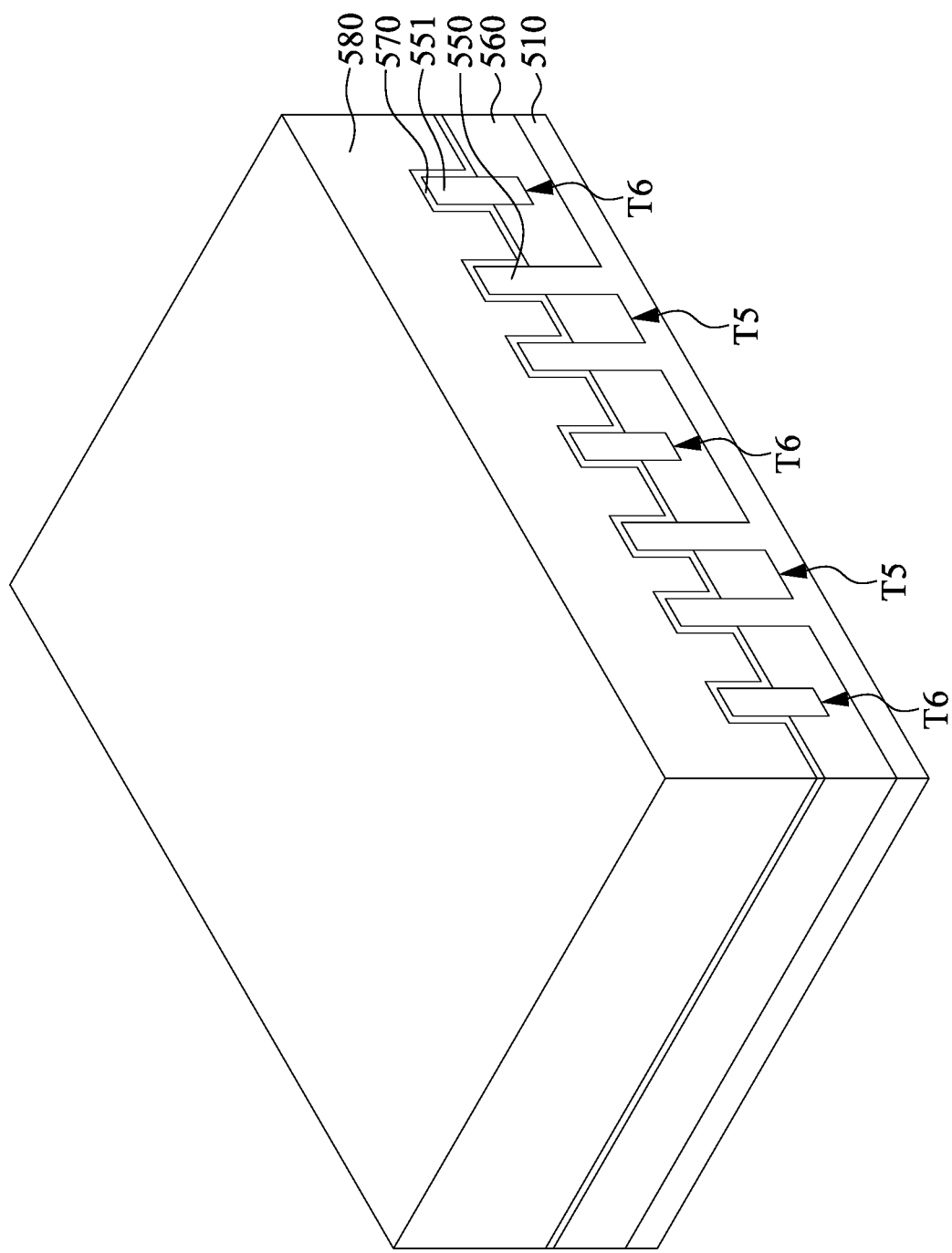

Reference is made to FIG. 40. A gate dielectric layer 570 is blanket formed over the substrate 510 to cover the semiconductor fins 550 and the isolation layer 560. In some embodiments, the gate dielectric layer 570 is made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HMO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layer 570 is an oxide layer. The gate dielectric layer 570 may be formed by a deposition processes, such as chemical vapor deposition (CVD), physical vapor deposition (PVD), atomic layer deposition (ALD), plasma enhanced CVD (PECVD) or other suitable techniques.

After the gate dielectric layer 570 is formed, a dummy gate electrode layer 580 is formed over the gate dielectric layer 570. In some embodiments, the dummy gate electrode layer 580 may include polycrystalline-silicon (poly-Si), poly-crystalline silicon-germanium (poly-SiGe), metallic nitrides, metallic silicides, metallic oxides, or metals. In some embodiments, the dummy gate electrode layer 580 includes a metal-containing material such as TiN, TaN, TaC, Co, Ru, Al, combinations thereof, or multi-layers thereof. The dummy gate electrode layer 580 may be deposited by CVD, physical vapor deposition (PVD), sputter deposition, or other techniques suitable for depositing conductive materials.

Figure 41:
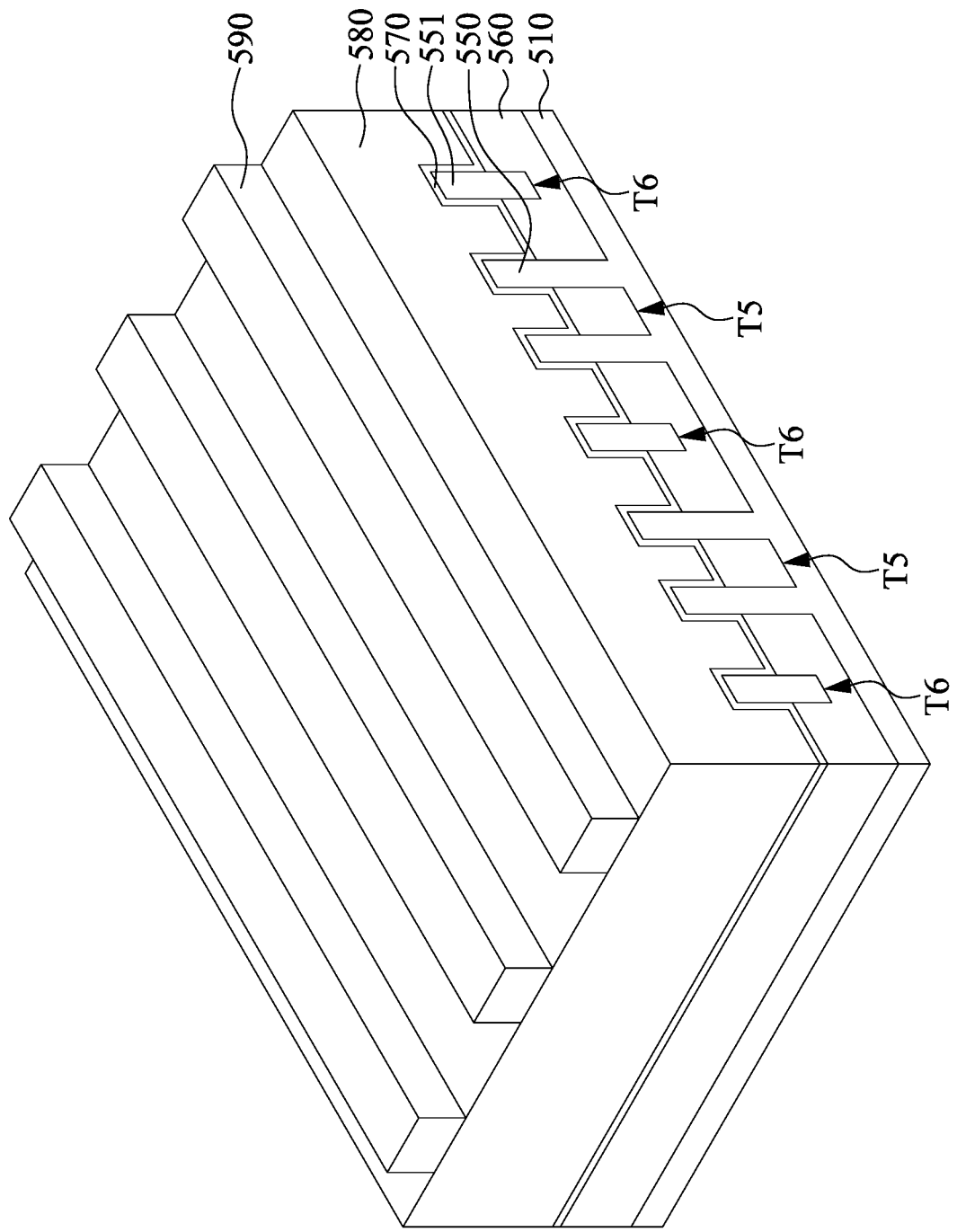

Next, the dummy gate electrode layer 580 and the gate dielectric layer 570 are patterned to form dummy gate structures in accordance with some embodiments. For example, a patterned mask 590 is formed over a portion of the dummy gate electrode layer 580, as shown in FIG. 41. The mask 590 may be a hard mask for protecting the underlying dummy gate electrode layer 580 and the gate dielectric layer 570 against subsequent etching process. The patterned mask 590 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 42:
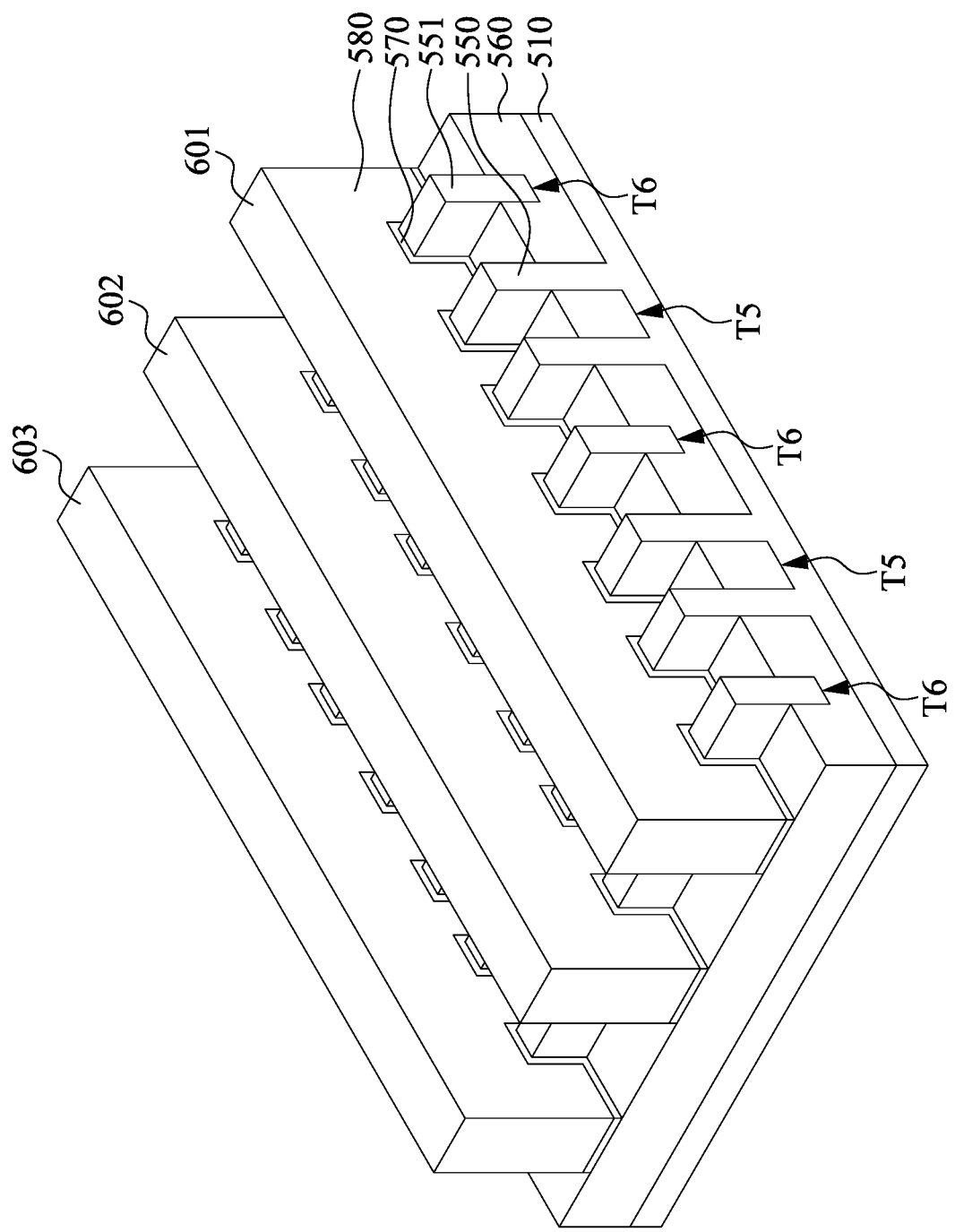

An etching process is performed to form dummy gate structures 601, 602, and 603 wrapping the semiconductor fins 550 using the patterned mask 590 as an etching mask, and the patterned mask 590 is removed after the etching. The resulting structure is shown in FIG. 42. Each dummy gate structure includes a gate dielectric layer 570 and a dummy gate electrode layer 580 over the gate dielectric layer 570. The dummy gate structures 601-603 have substantially parallel longitudinal axes that are substantially perpendicular to longitudinal axes of the semiconductor fins 550, as illustrated in FIG. 42. The dummy gate structures 601-603 will be replaced with a replacement gate structure using a "gate-last" or replacement-gate process.

Figure 43:
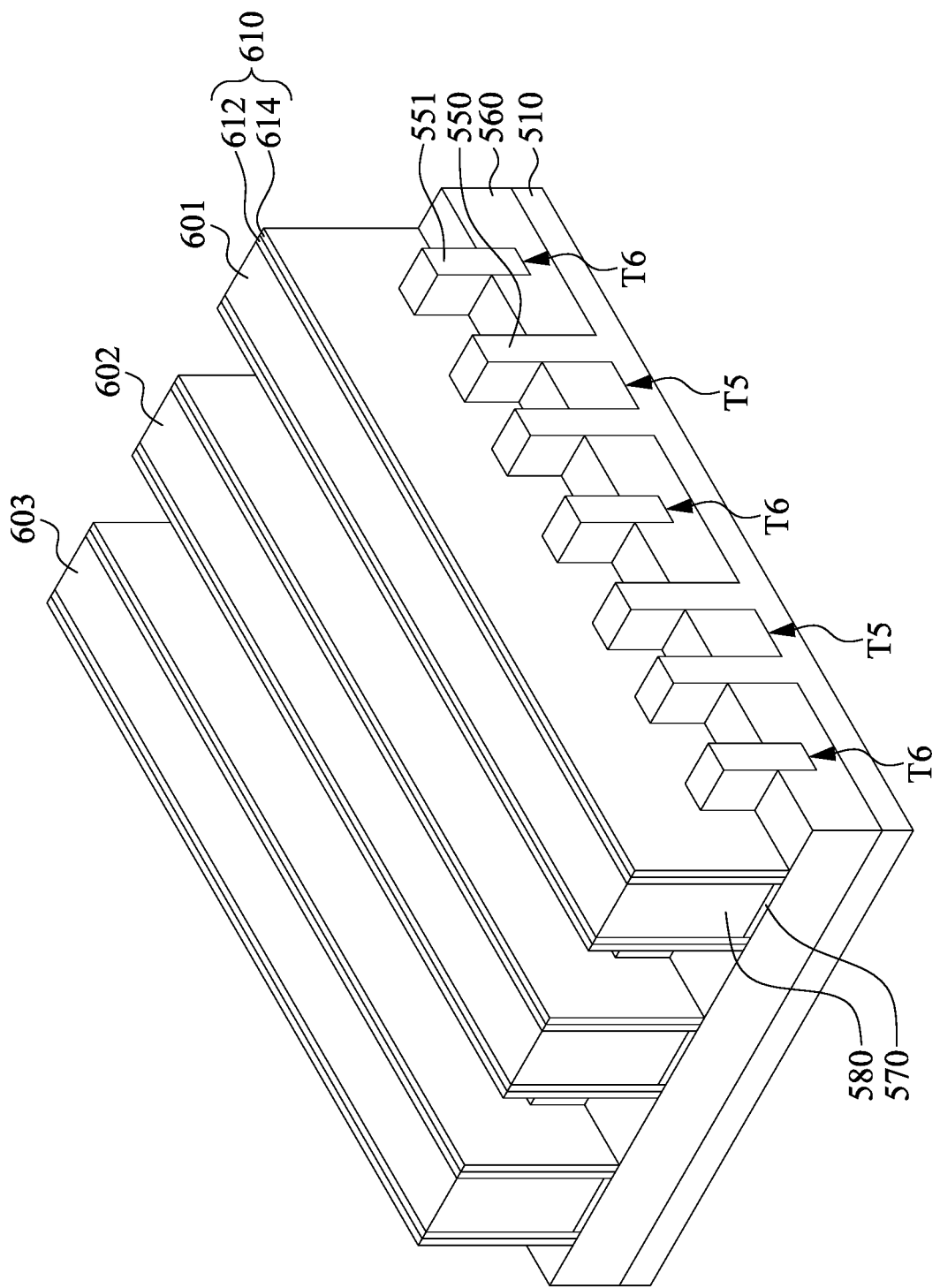

Reference is made to FIG. 43. Gate spacers 610 are formed on opposite sidewalls of the dummy gate structures 601-603. In some embodiments, the gate spacers 610 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials or other suitable dielectric material. The gate spacers 610 may include a single layer or multilayer structure made of different dielectric materials, such as gate spacers 612 and 614. The method of forming the gate spacers 612 and 614 includes blanket forming dielectric layers on the structure shown in FIG. 42 using, for example, CVD, PVD or ALD, and then performing an etching process such as anisotropic etching to remove horizontal portions of the dielectric layer. The remaining portions of the dielectric layer on sidewalls of the dummy gate structures 601-603 can serve as the gate spacers 610. In some embodiments, the gate spacers 610 may be used to offset subsequently formed doped regions, such as source/drain regions. The gate spacers 610 may further be used for designing or modifying the source/drain region profile.

Figure 44:
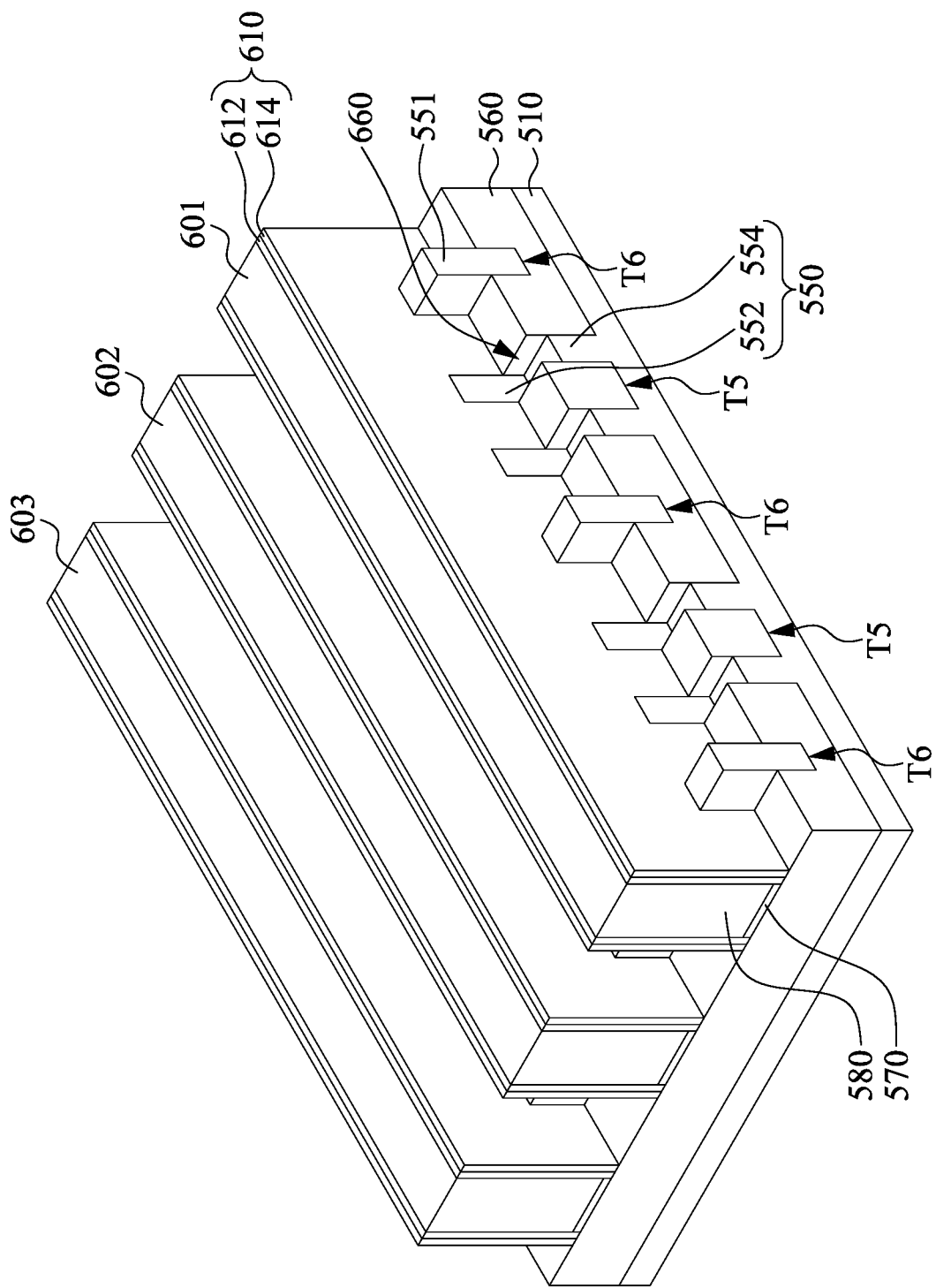

Reference is made to FIG. 44. Portions of the semiconductor fins 550 not covered by the dummy gate structures 601-603 and the gate spacers 610 are respectively partially removed (or partially recessed) to form recesses 620. The remaining semiconductor fin 550 may have a protruding portion 552 and embedded portions 554 after this removal. The embedded portions 554 are embedded in the isolation layer 560, and the embedded portions 554 are exposed by the recesses 620. The protruding portion 552 protrudes from the embedded portions 554 and is located between the recesses 620. The dummy gate structures 601-603 wrap the protruding portions 552, and hence the protruding portions 552 can act as channel regions of transistors. The embedded portions 554 spaced apart from the dummy gate structures 601-603 can act as source/drain regions of transistors.

Formation of the recesses 620 may include a dry etching process, a wet etching process, or combination dry and wet etching processes. This etching process may include reactive ion etch (RIE) using the dummy gate structures 601-603 and gate spacers 610 as masks, or by any other suitable removal process. In some embodiments, the etching process may be performed, for example, under a pressure of about 1 mTorr to 1000 mTorr, a power of about 10 W to 1000 W, a bias voltage of about 20 V to 500 V, at a temperature of about 40° C. to 60° C., using a HBr and/or $Cl_2$ as etch gases. After the etching process, a pre-cleaning process may be performed to clean the recesses 620 with hydrofluoric acid (HF) or other suitable solution in some embodiments.

Figure 45:
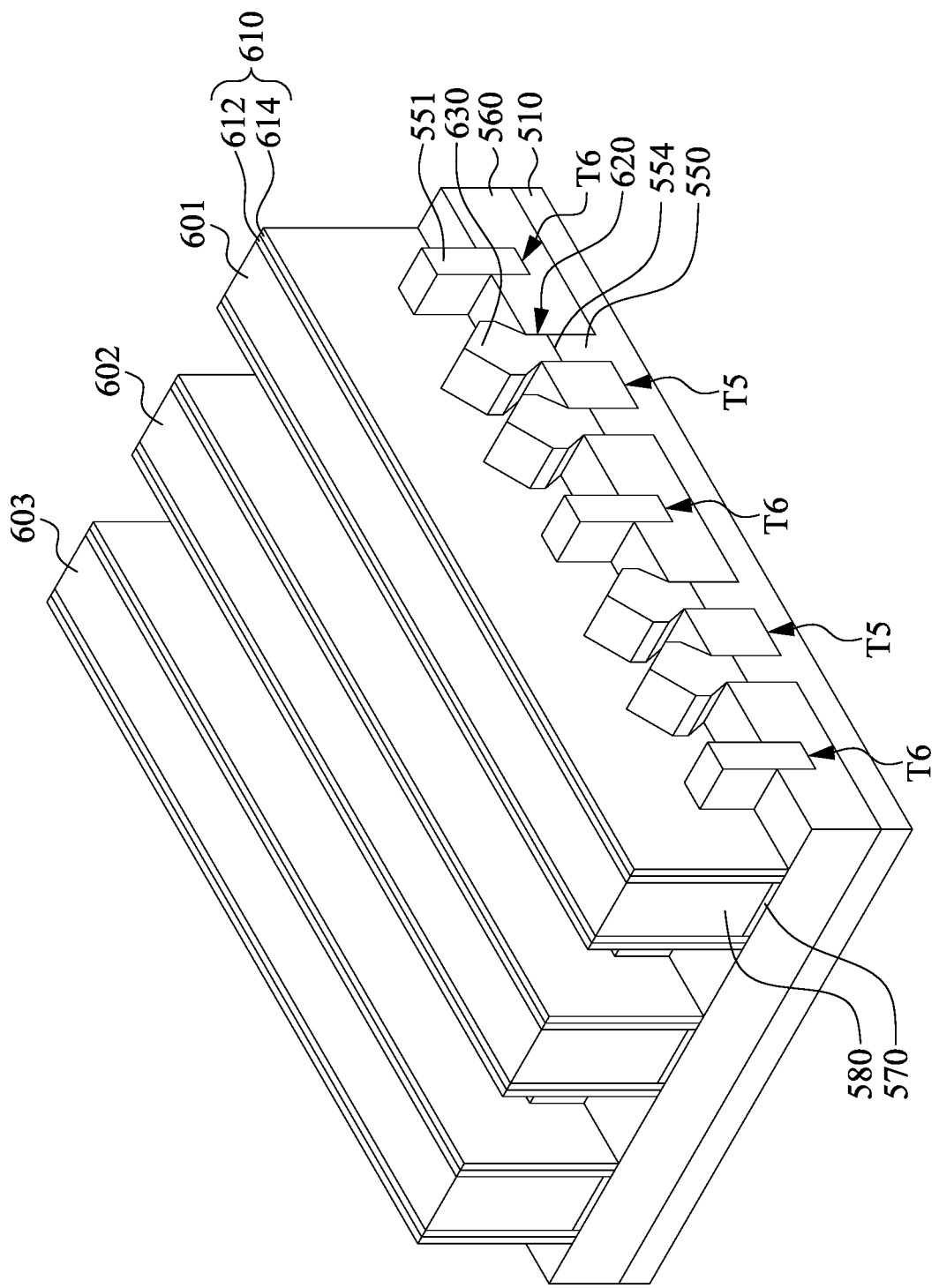

Reference is made to FIG. 45. Epitaxial source/drain structures 630 are respectively formed in the recesses 620. The epitaxial source/drain structures 230 may be formed using one or more epitaxy or epitaxial (epi) processes, such that Si features, SiGe features, silicon phosphate (SiP) features, silicon carbide (SiC) features and/or other suitable features can be formed in a crystalline state on the embedded portions 554 of the semiconductor fins 550. In some embodiments, lattice constants of the epitaxial source/drain structures 630 are different from that of the semiconductor fins 550, so that the channel region between the epitaxial source/drain structures 630 can be strained or stressed by the epitaxial source/drain structures 630 to improve carrier mobility of the semiconductor device and enhance the device performance.

Specifically, the electron mobility increases and the hole mobility decreases when the tensile strain is applied in the channel region, and the electron mobility decreases and the hole mobility increases when the compressive strain is applied in the channel region. Therefore, an n-type transistor with a stressor configured to provide tensile strain in the channel region would be beneficial, and a p-type transistor with a stressor configured to provide compressive strain in the channel region would be beneficial as well. For example, in some embodiments where two source/drain structures 630 are used to form an n-type transistor, the source/drain structures 630 can act as stressors including, for example, SiP, SiC or SiCP, which is able to induce tensile strain to an n-type channel; in some embodiments where two source/drain structures 630 are used to form a p-type transistor, the source/drain structures 630 may include stressors including SiGe, which is able to induce compressive strain to a p-type channel.

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 550 (e.g., silicon, silicon germanium, silicon phosphate, or the like). The epitaxial source/drain structures 630 may be in-situ doped. The doping species include p-type dopants, such as boron or $BF_2$; n-type dopants, such as phosphorus or arsenic; and/or other suitable dopants including combinations thereof. If the epitaxial source/drain structures 630 are not in-situ doped, a second implantation process (i.e., a junction implant process) is performed to dope the epitaxial source/drain structures 630. One or more annealing processes may be performed to activate the epitaxial source/drain structures 630. The annealing processes include rapid thermal annealing (RTA) and/or laser annealing processes.

Figure 46:
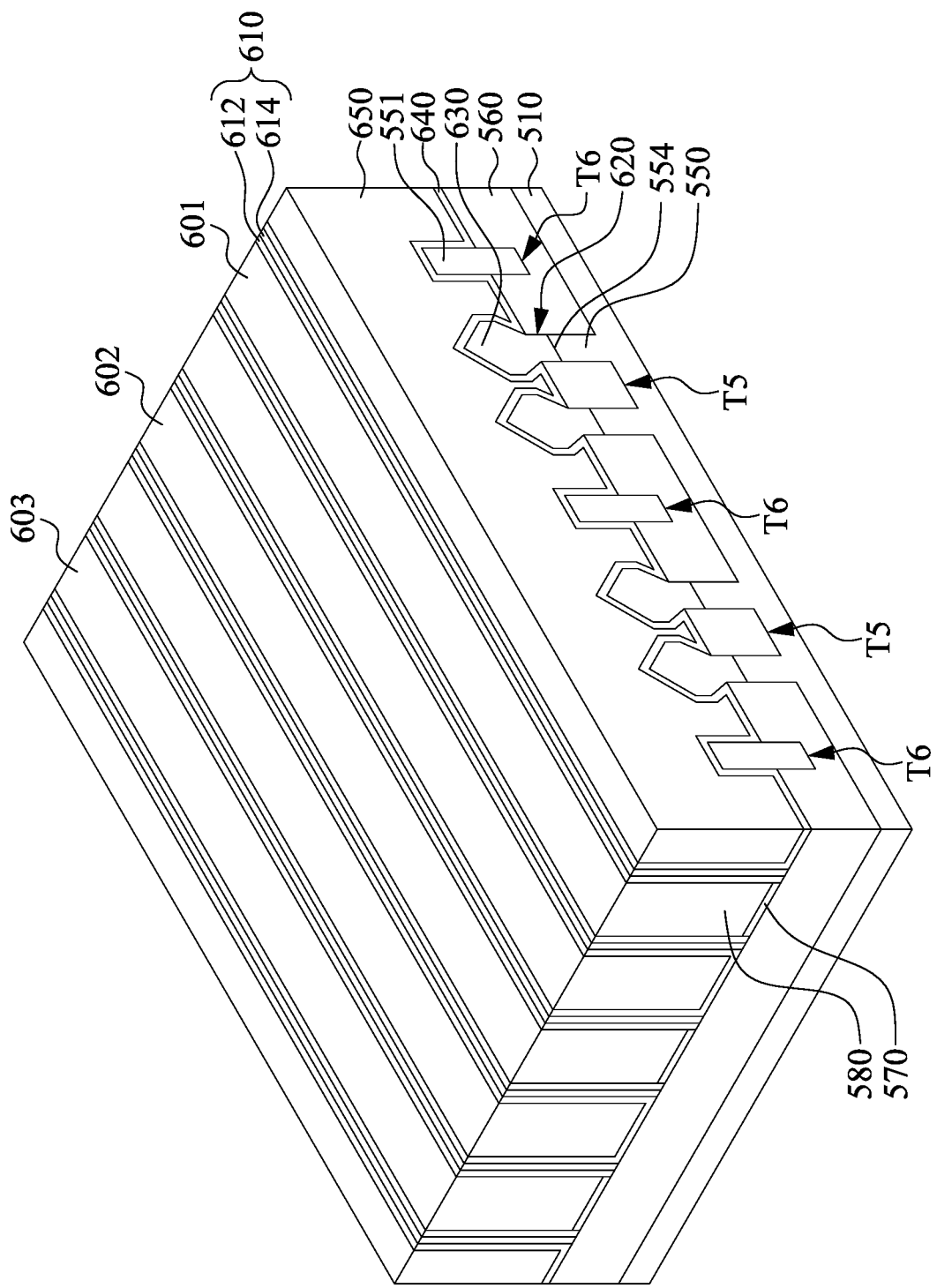

Reference is made to FIG. 46. A contact etch stop layer (CESL) 640 is blanket formed on the structure shown in FIG. 45, and then, an interlayer dielectric (ILD) layer 650 is formed on the CESL 640. Afterwards, a CMP process may be optionally performed to remove excessive material of the ILD layer 650 and the CESL 640 to expose the dummy gate structures 601-603. The CMP process may planarize a top surface of the ILD layer 650 with top surfaces of the dummy gate structures 601-603, gate spacers 610 and the CESL 640 in some embodiments. The CESL 640 includes silicon nitride, silicon oxynitride or other suitable materials. The CESL 640 can be formed using, for example, plasma enhanced CVD, low pressure CVD, ALD or other suitable techniques. The ILD layer 650 may include a material different from the CESL 240. In some embodiments, the ILD layer 250 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 650 may be formed using, for example, CVD, ALD, spin-on-glass (SOG) or other suitable techniques.

Figure 47:
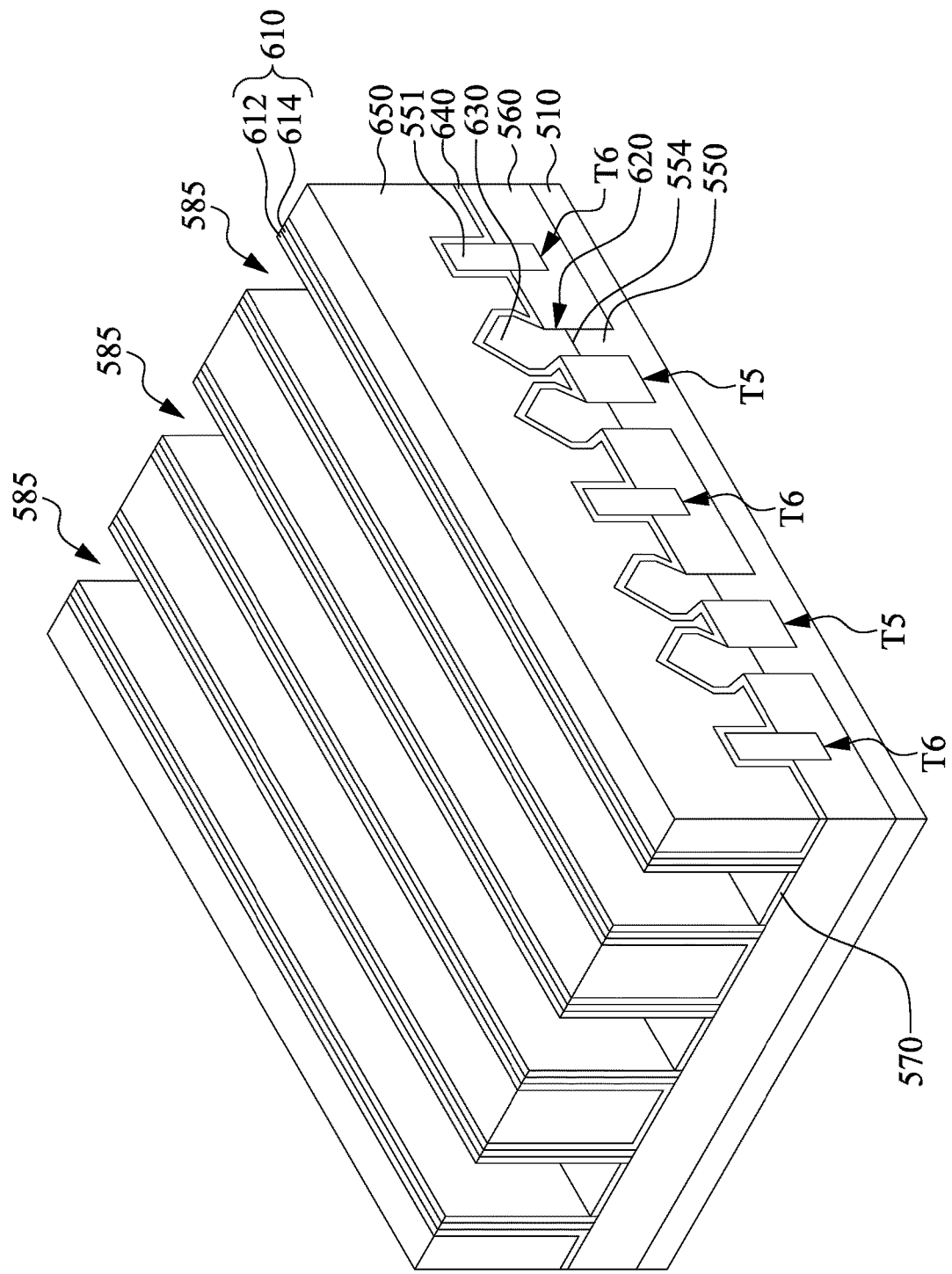

Reference is made to FIG. 47. The dummy gate electrode layers 580 are removed to form recesses 585. In some embodiments, the recess 585 may also refer to as a gate trench. The dummy gate electrode layers 580 are removed in one or many etch operations including wet etch and dry etch. According to various embodiments, a hard mask is patterned over the semiconductor fins 550 to protect the ILD layer 650, the gate spacers 610, and the CESL 640. The dummy gate layer etch may stop at the gate dielectric layer 570. In some embodiments, the gate dielectric layer 570 may be removed along with the dummy gate electrode layer 580. The recess 585 is formed between the gate spacers 610 respectively.

Figure 48:
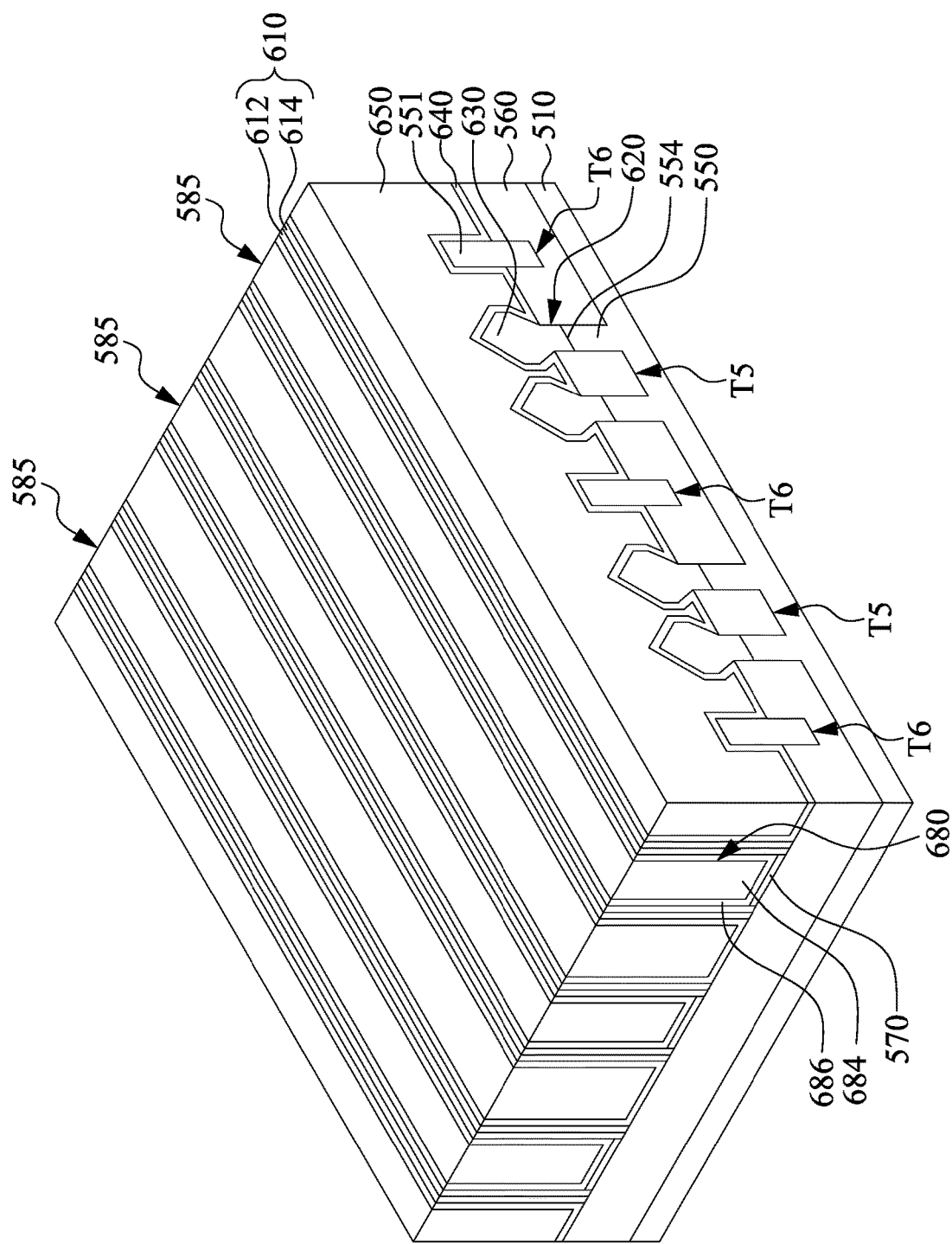

Reference is made to FIG. 48. A metal layer may be formed to fill in the recesses 585. The metal layer overfills the recesses 585, and next a planarization process is performed. As shown in FIG. 48, a work function metal layer 682 is formed in the recess 585 and covers the gate dielectric layer 570 and sidewalls of the gate spacers 610. Subsequently, the metal gate electrode layer 684 is formed in the recesses 585. The work function metal layer 682 may be formed by conformally deposited a work function material layer on the semiconductor substrate. The overfilled work function metal material layer and the metal gate electrode material layer are pulled back by, for example, etching, to form the gate stack 680 in the recesses 585 respectively. The top surface of the metal gate electrode layer 684 is level with the top surface of the ILD layer 650. The gate stack 680 is high-k metal gates. The metal layer may include any metal material suitable for forming metal gate electrode layer 684 or portions thereof, including liner layers, interface layers, seed layers, adhesion layers, barrier layers, etc. In some embodiments, the metal layer may include suitable metals, such as TiN, WN, TaN, or Ru that properly perform in the PMOSFET. In some alternative embodiments, the metal layer may include suitable metals, such as T1, Ag, Al, TiAl, TiAlN, TiAlC, TiAlCN, TaC, TaCN, TaSiN, Mn, or Zr that properly perform in the NMOSFET.

Figure 49A:
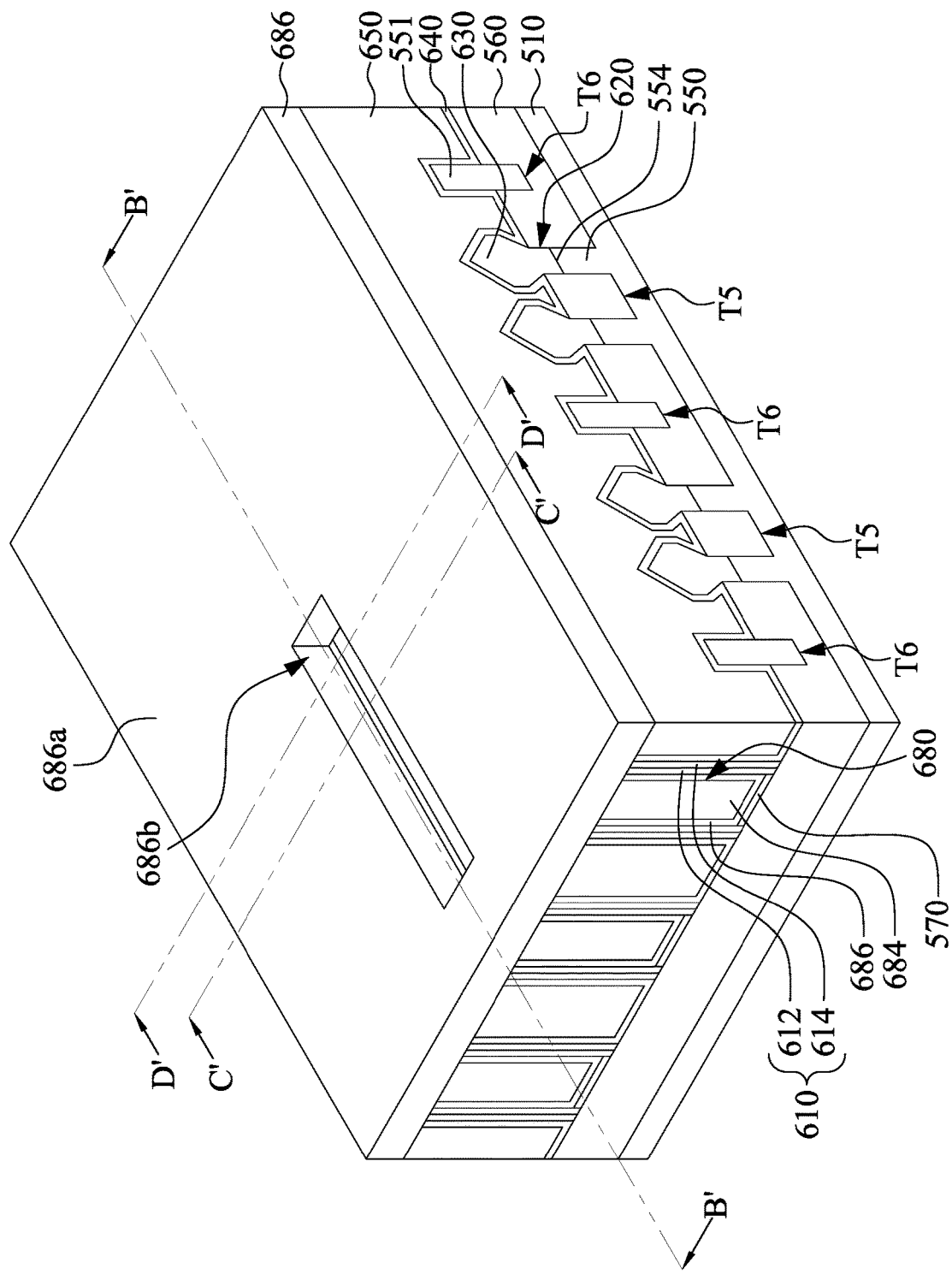
Figure 49B:
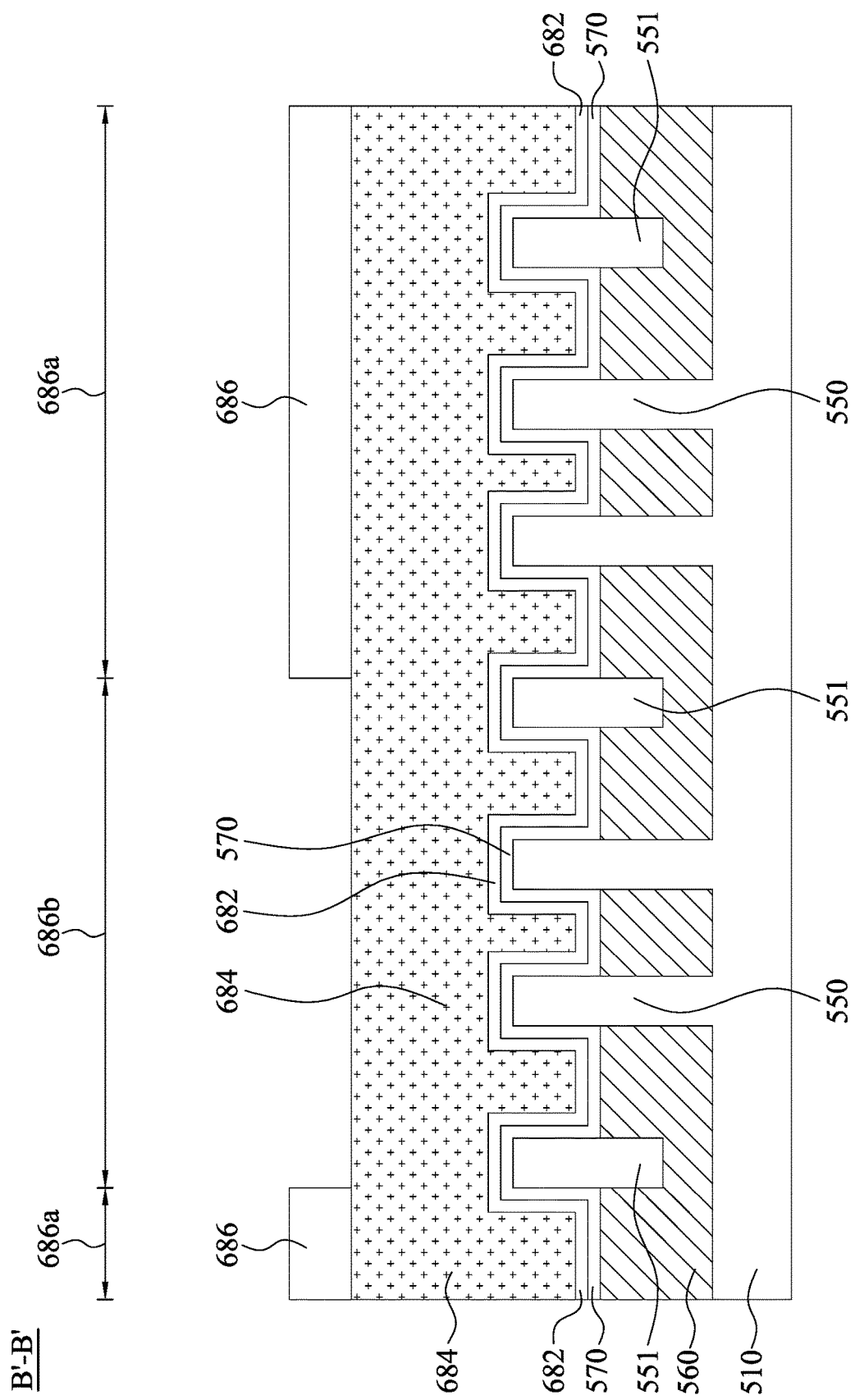
Figure 49C:
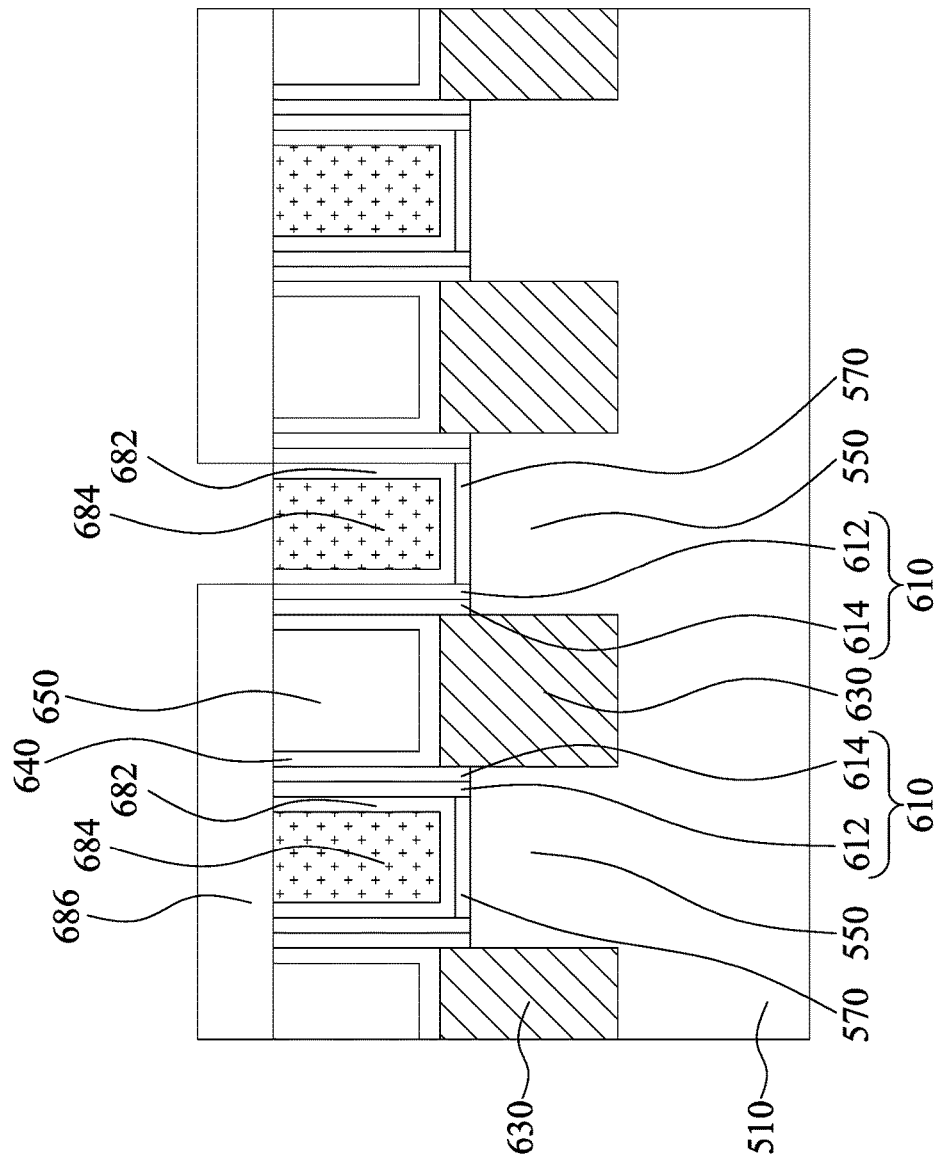
Figure 49D:
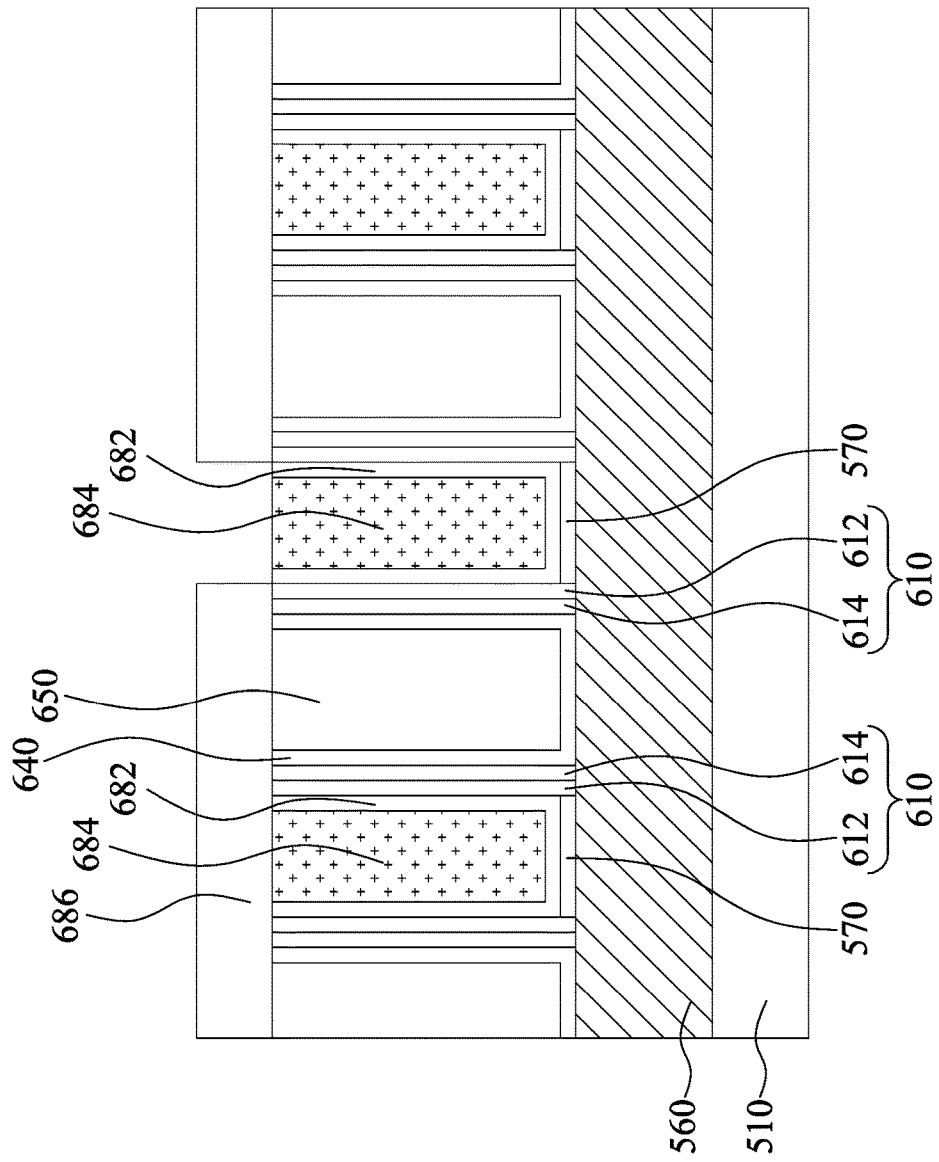

Reference is made to FIG. 49A to FIG. 49D. FIG. 49B is a cross-sectional view along section B-B in FIG. 49A. FIG. 49C is a cross-sectional view along section C-C in FIG. 49A. FIG. 49D is a cross-sectional view along section D-D in FIG. 49A. A patterned mask 686 is formed over the semiconductor fins 510 on the substrate 110. In some embodiments, the patterned mask 686 is formed over the ILD layer 650, the CESL 640, the gate spacers 610, and the dummy gate electrode layer 580 to define a masked region 686a and an unmasked region 686b.

Figure 50A:
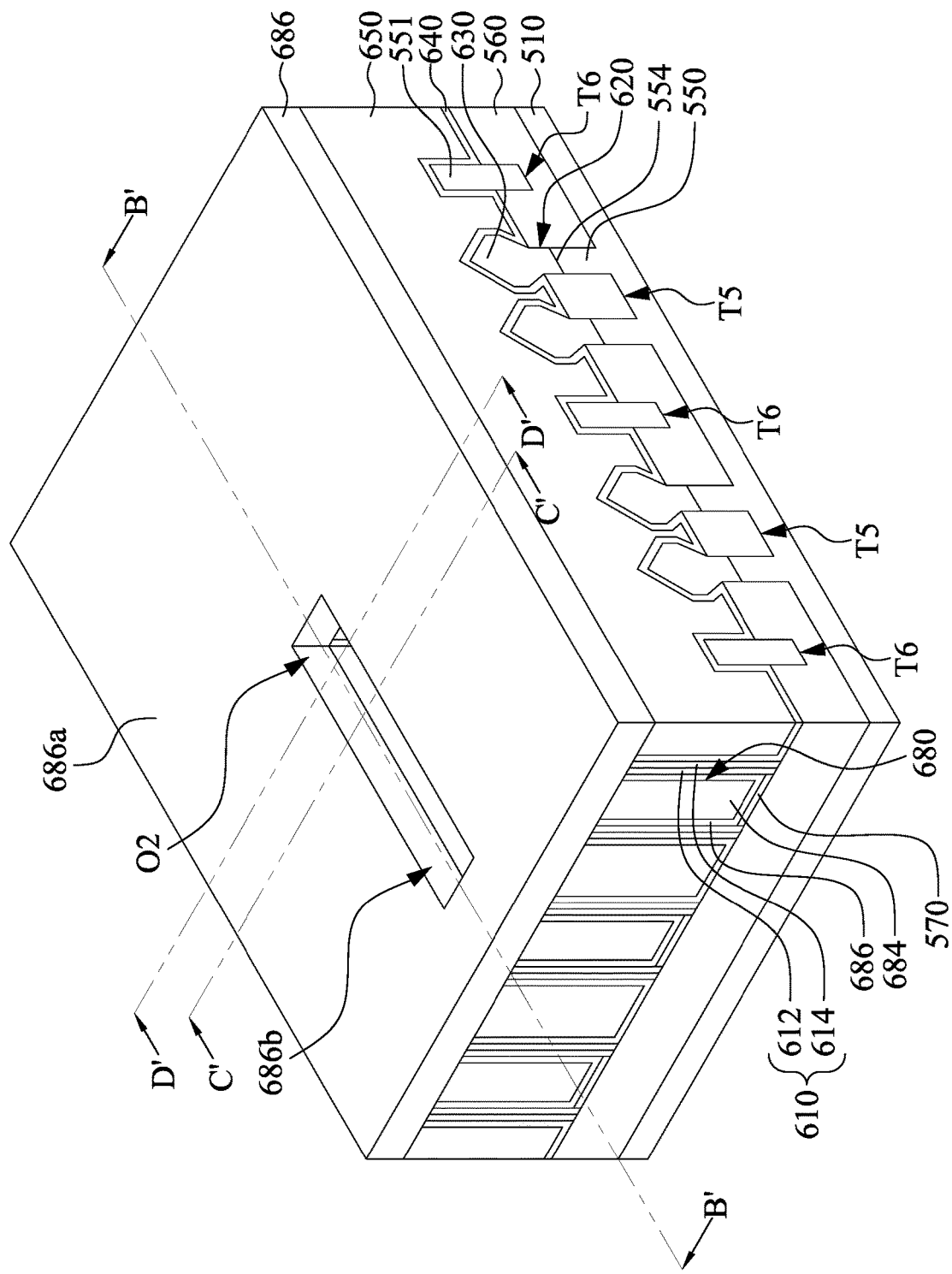
Figure 50B:
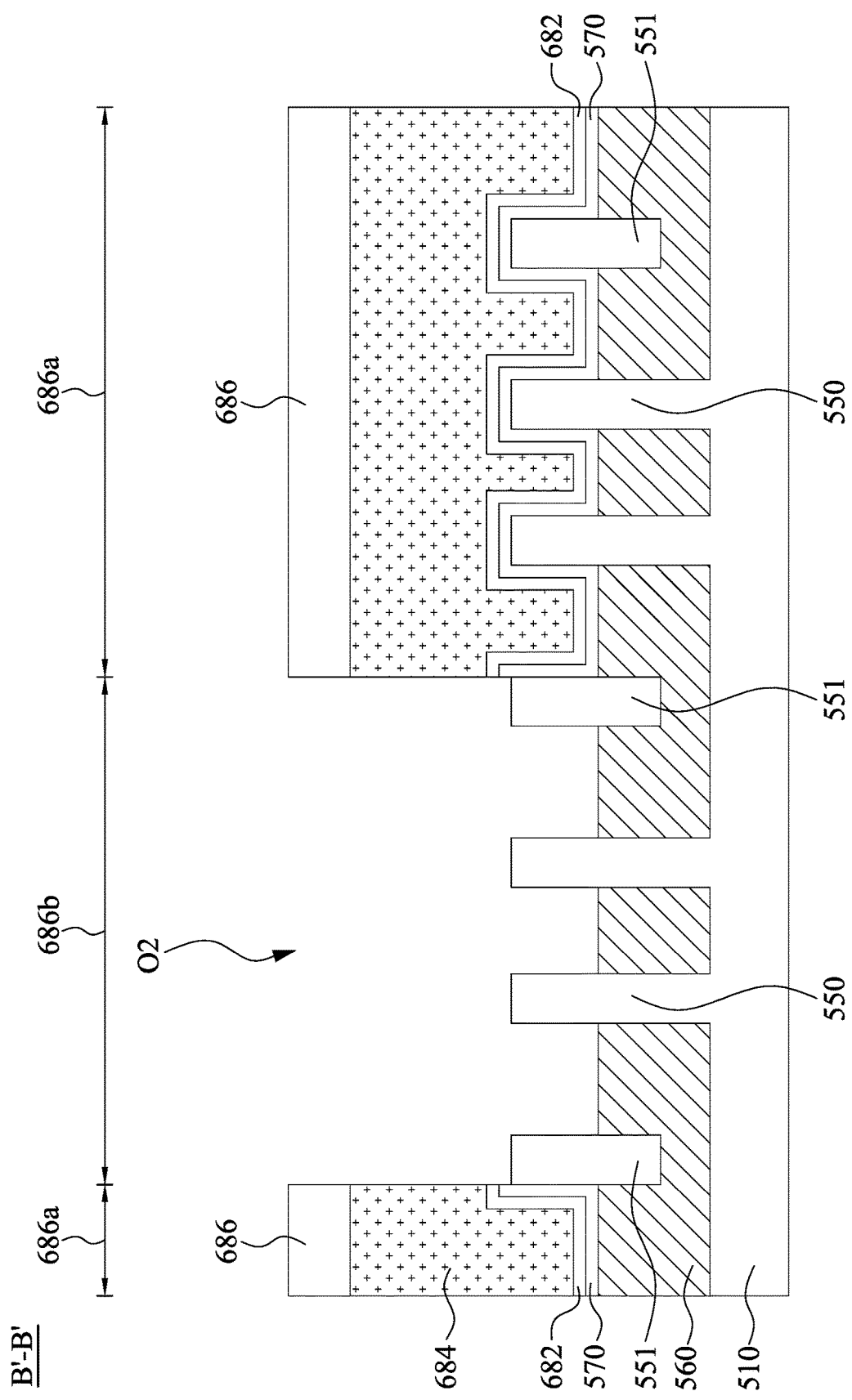
Figure 50C:
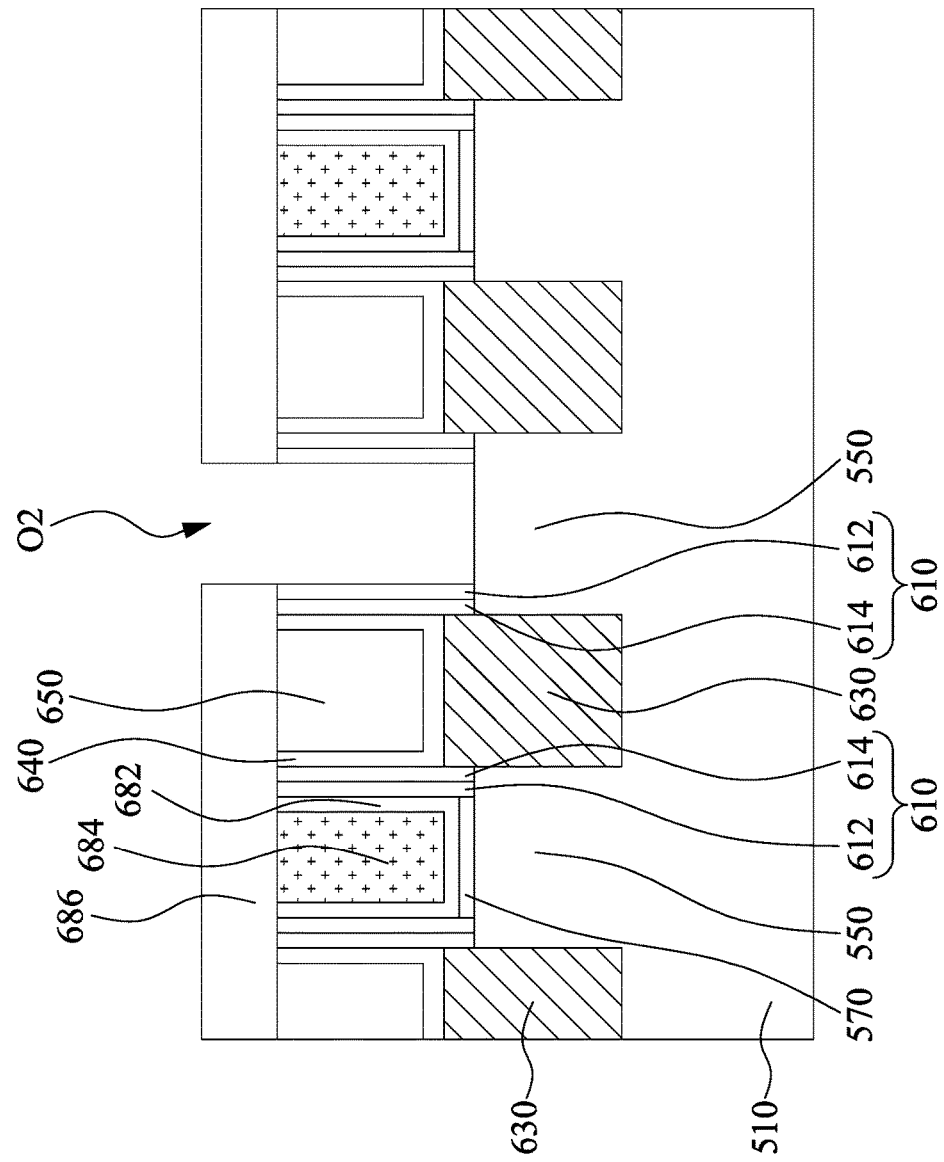
Figure 50D:
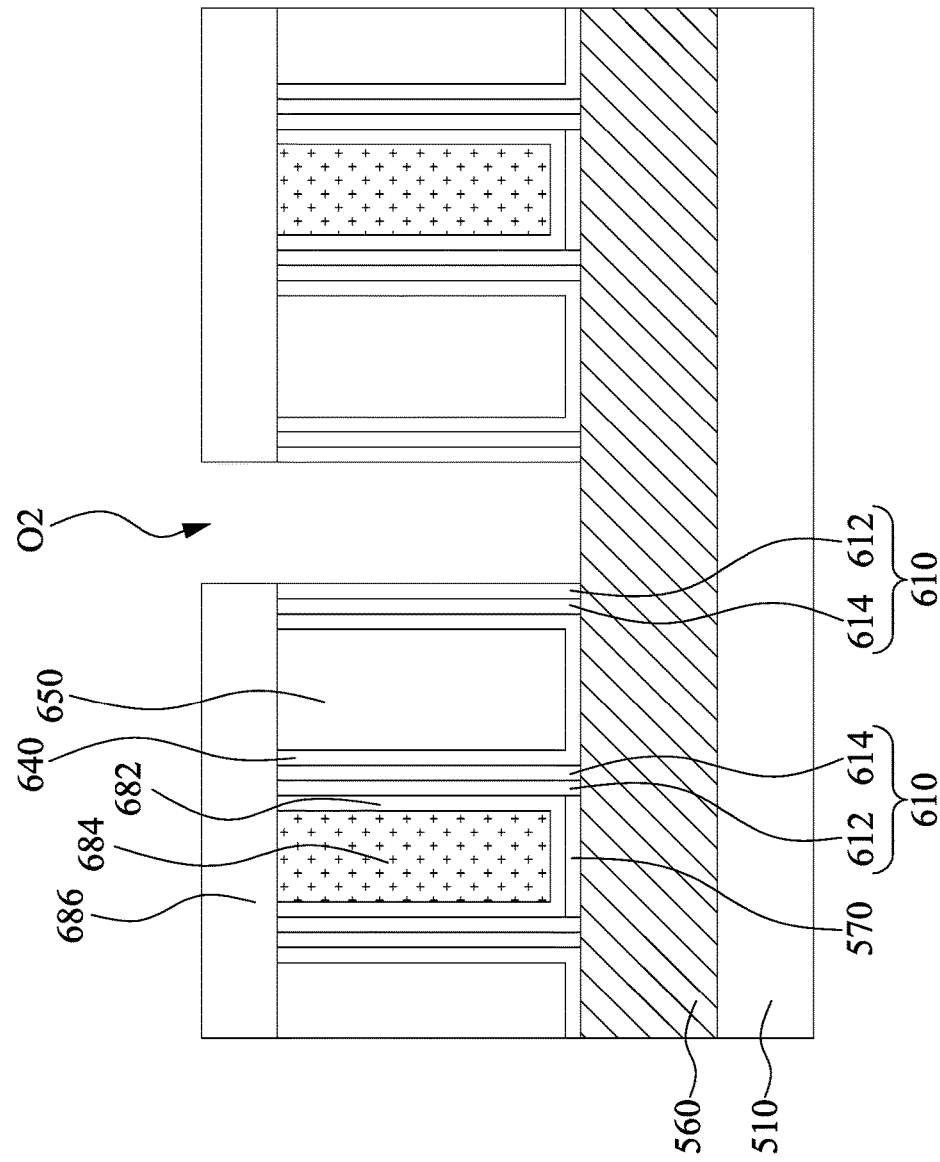

Reference is made to FIG. 50A to FIG. 50D. FIG. 50B is a cross-sectional view along section B-B in FIG. 50A. FIG. 50C is a cross-sectional view along section C-C in FIG. 50A. FIG. 50D is a cross-sectional view along section D-D in FIG. 50A. One or more etching processes are performed using the patterned mask 686 as an etching mask. In some embodiments, for example, one or more etching processes are performed to remove the metal gate electrode layer 684, the work function metal layer 682, and the gate dielectric layer 570 underlying the unmasked region 686b of the patterned mask 686. After the metal gate electrode layer 684, the work function metal layer 682, and the gate dielectric layer 570 underlying the unmasked region 686b of the patterned mask 686 are removed, an opening O2 is formed between the gate spacers 620. In some embodiments, the opening O2 may be included in the recess 585 as shown in FIG. 14. Then, a portion of the semiconductor fin 510 is exposed at a bottom of the opening O2.

Figure 51A:
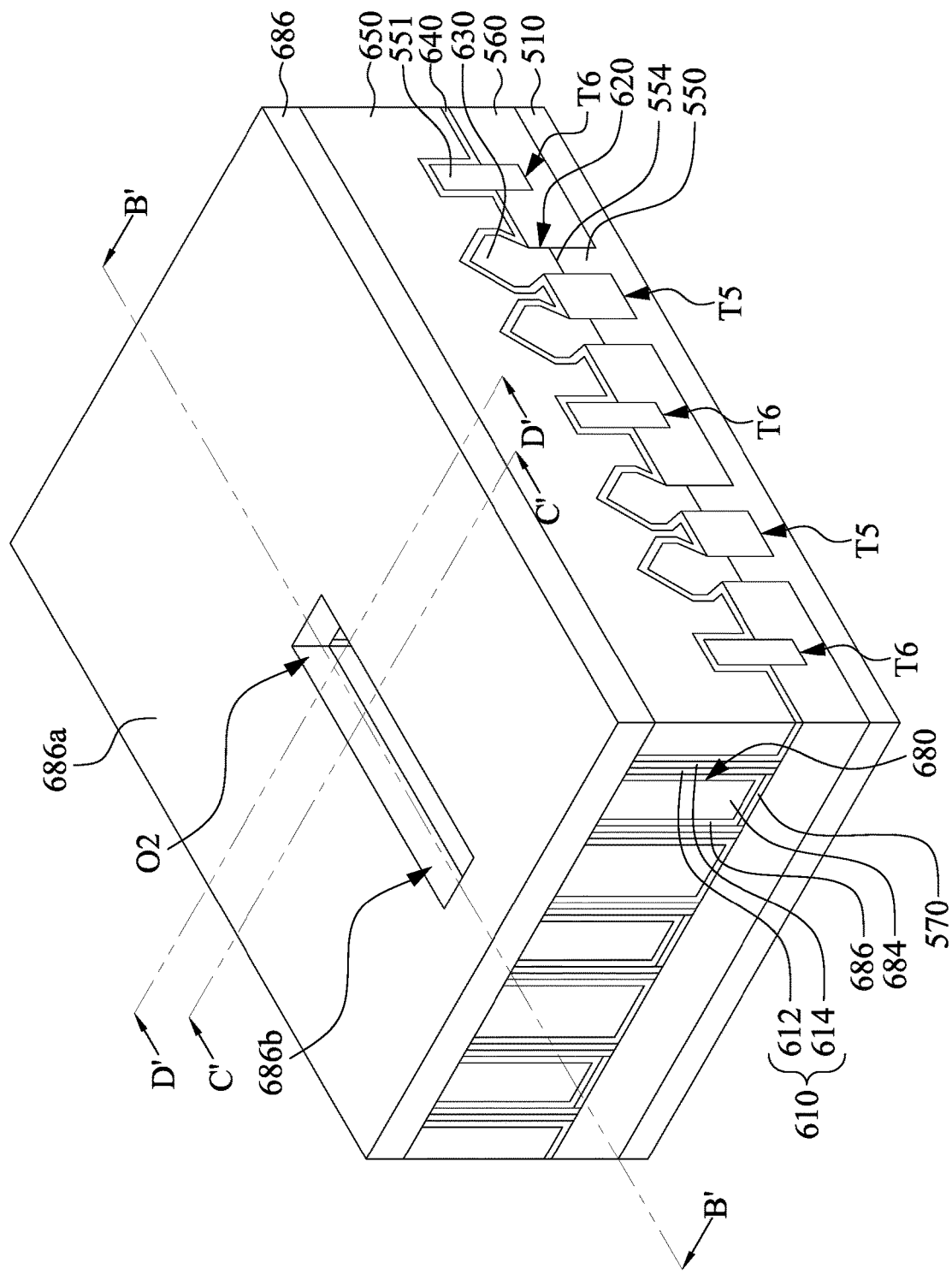
Figure 51B:
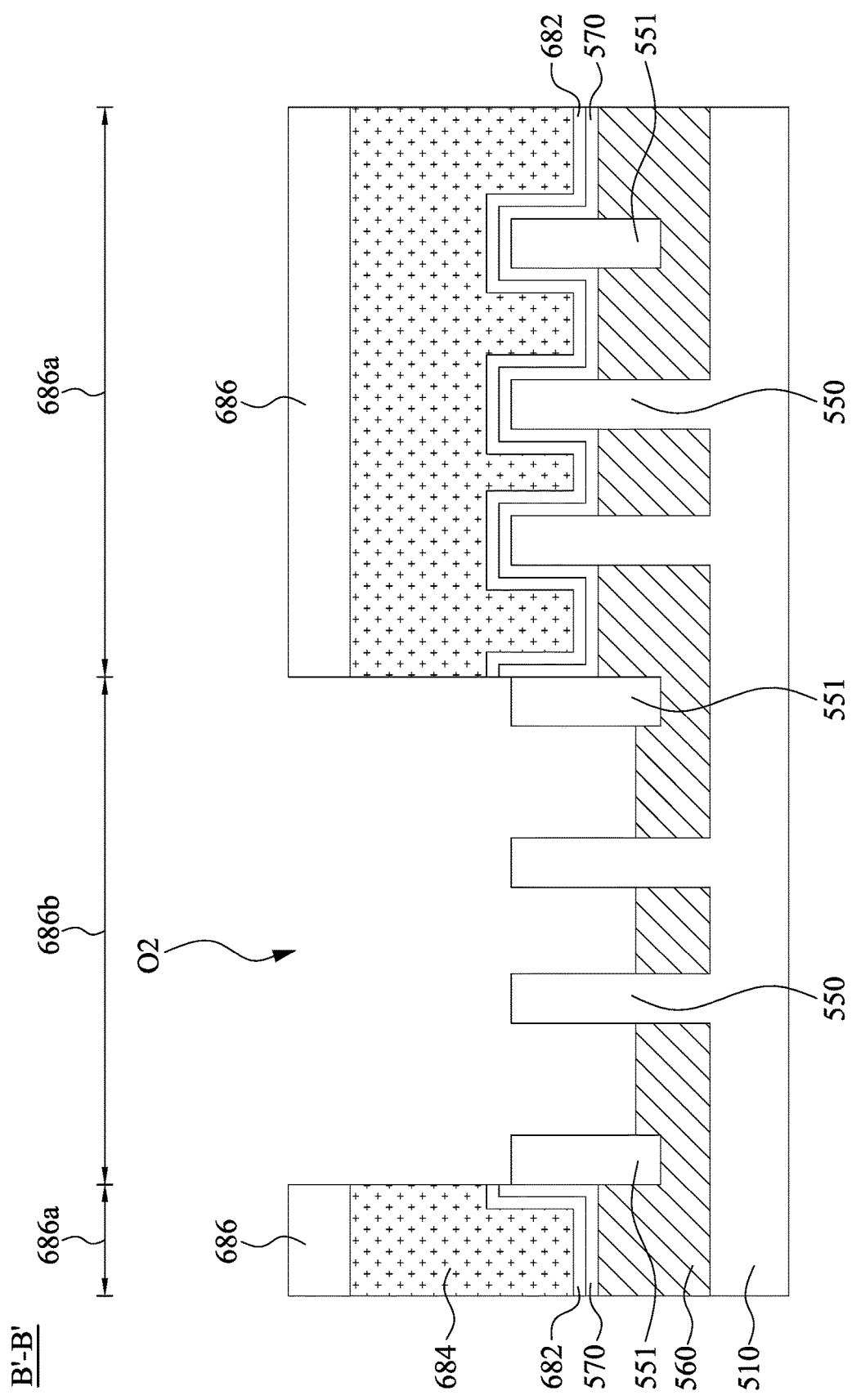
Figure 51C:
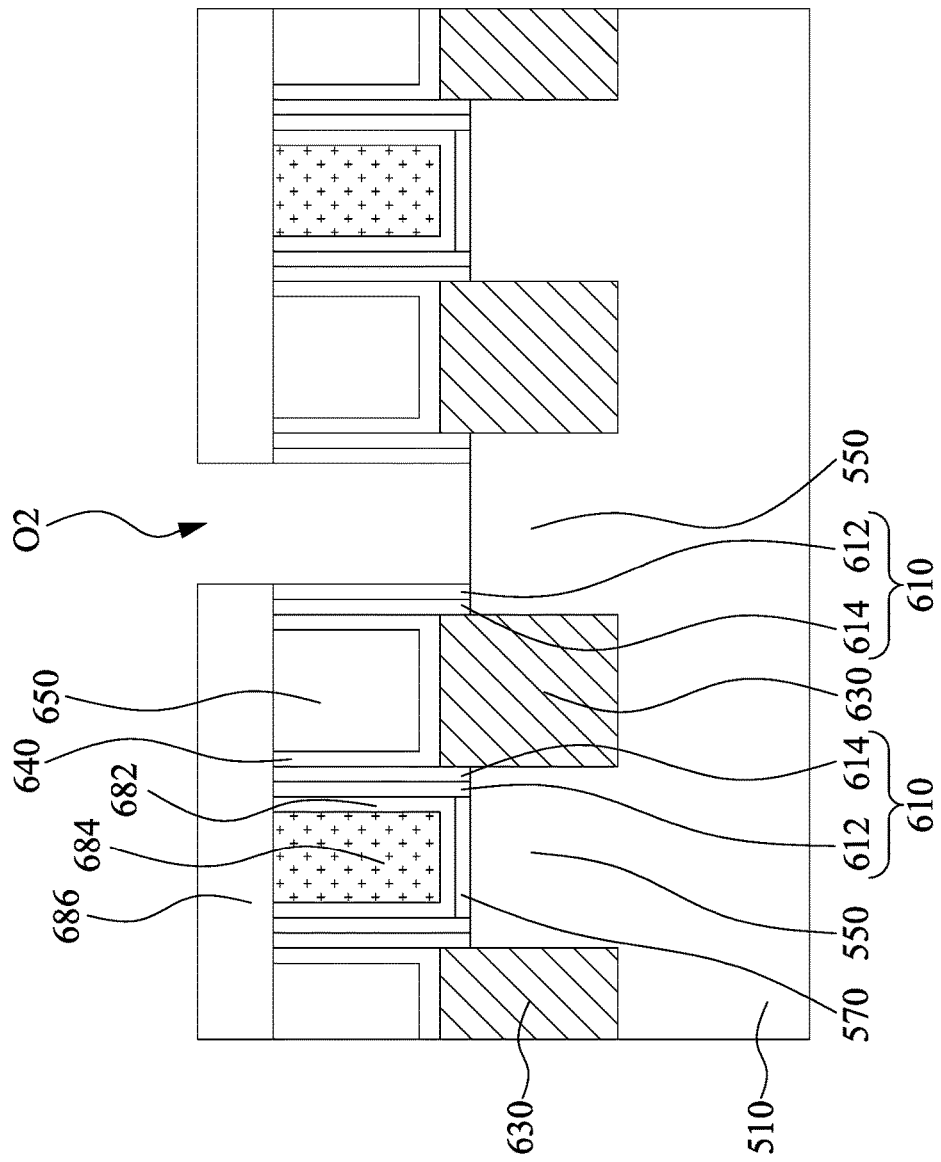
Figure 51D:
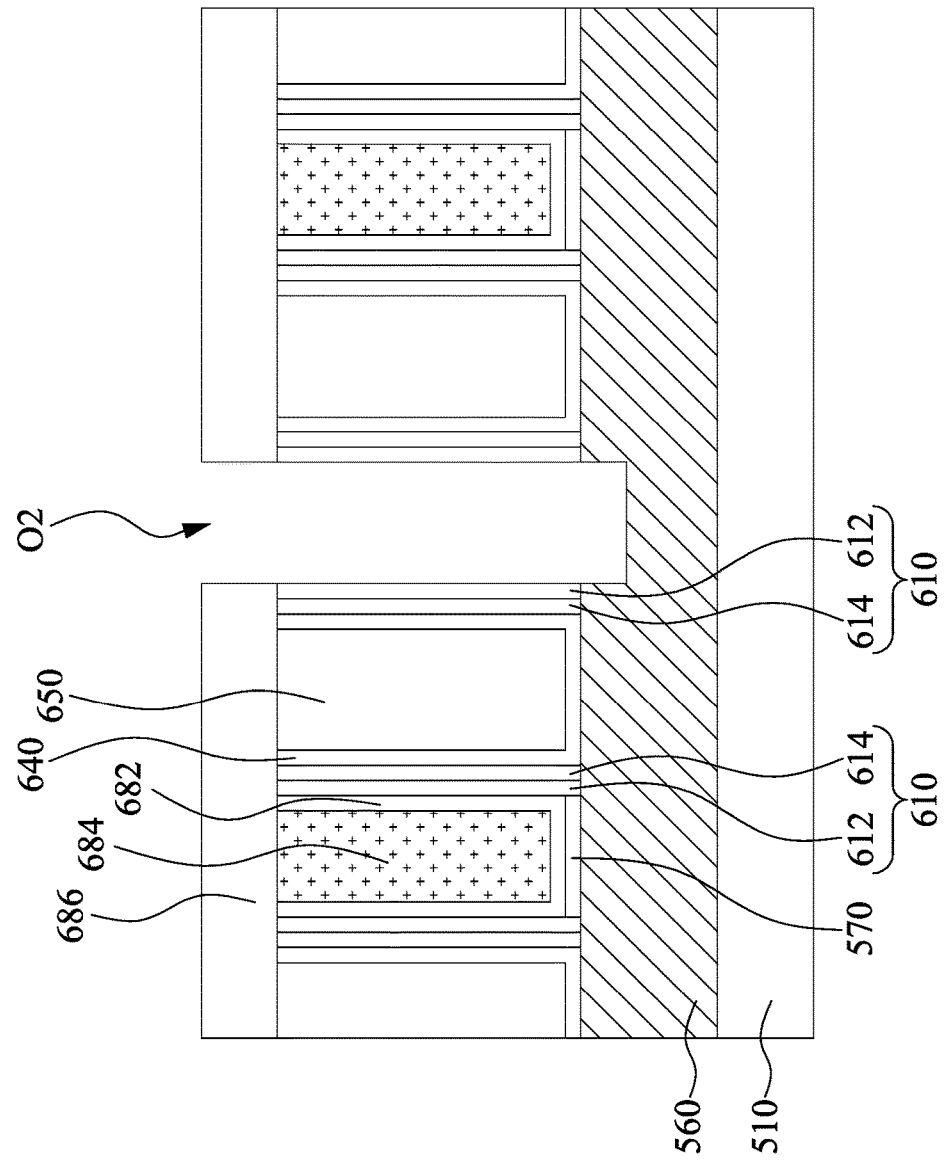

Reference is made to FIG. 51A to FIG. 51D. FIG. 51B is a cross-sectional view along section B-B in FIG. 51A. FIG. 51C is a cross-sectional view along section C-C in FIG. 51A. FIG. 51D is a cross-sectional view along section D-D in FIG. 51A. As shown in FIG. 51A to FIG. 51D, the isolation layer 560 in the opening O2 is further recessed, for example, through an etching operation, wherein diluted HF, SiCoNi (including HF and $NH_3$), or the like, may be used as the etchant. That is, after recessing the isolation layer 560, a top surface of the isolation layer 560 in the opening O2 is lower than that outside the opening O2. Hence, the isolation layer 560 in the opening O2 recess toward the substrate 510 relative to the isolation layer 560 outside the opening O2.

Figure 52A:
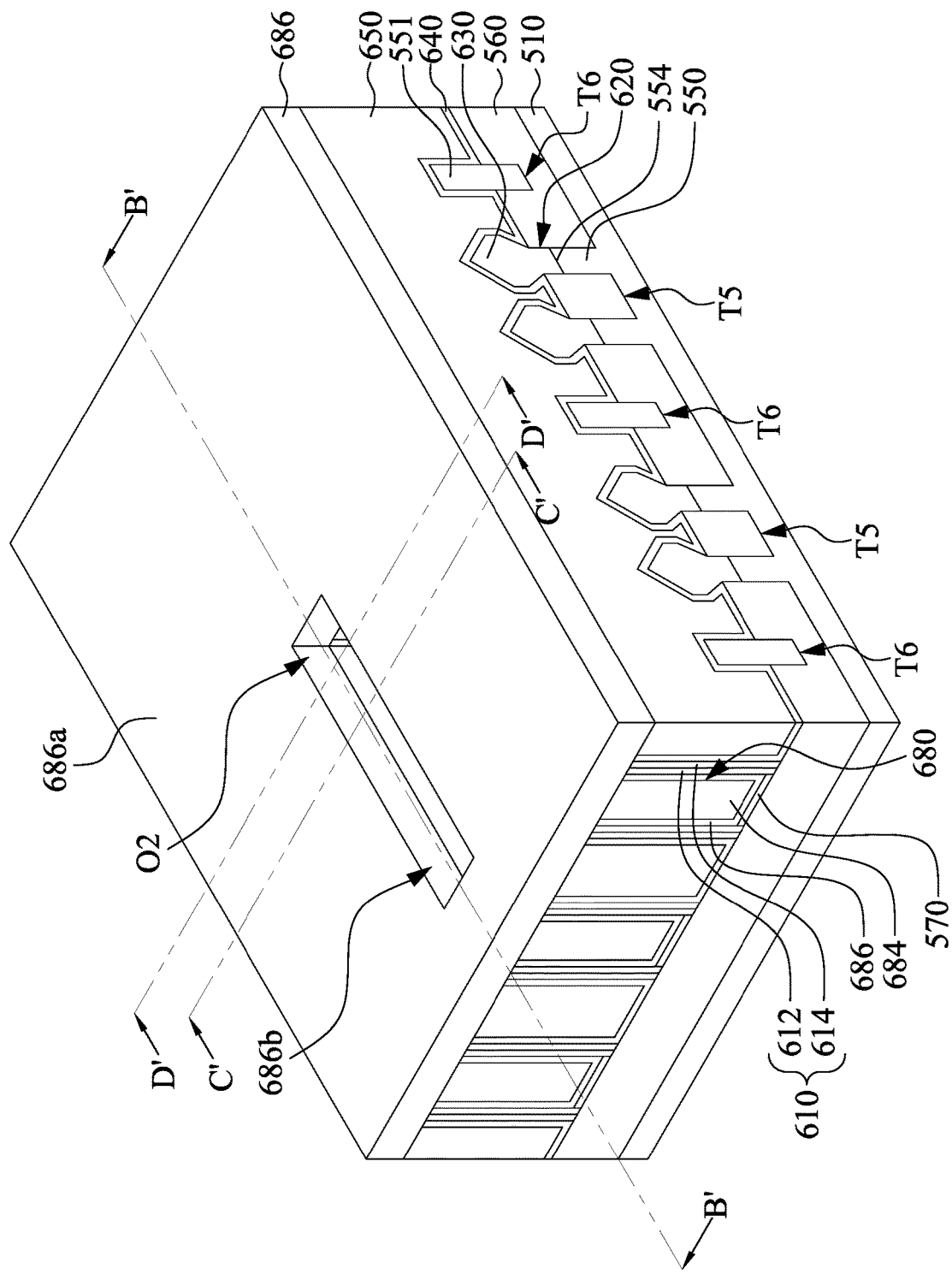
Figure 52B:
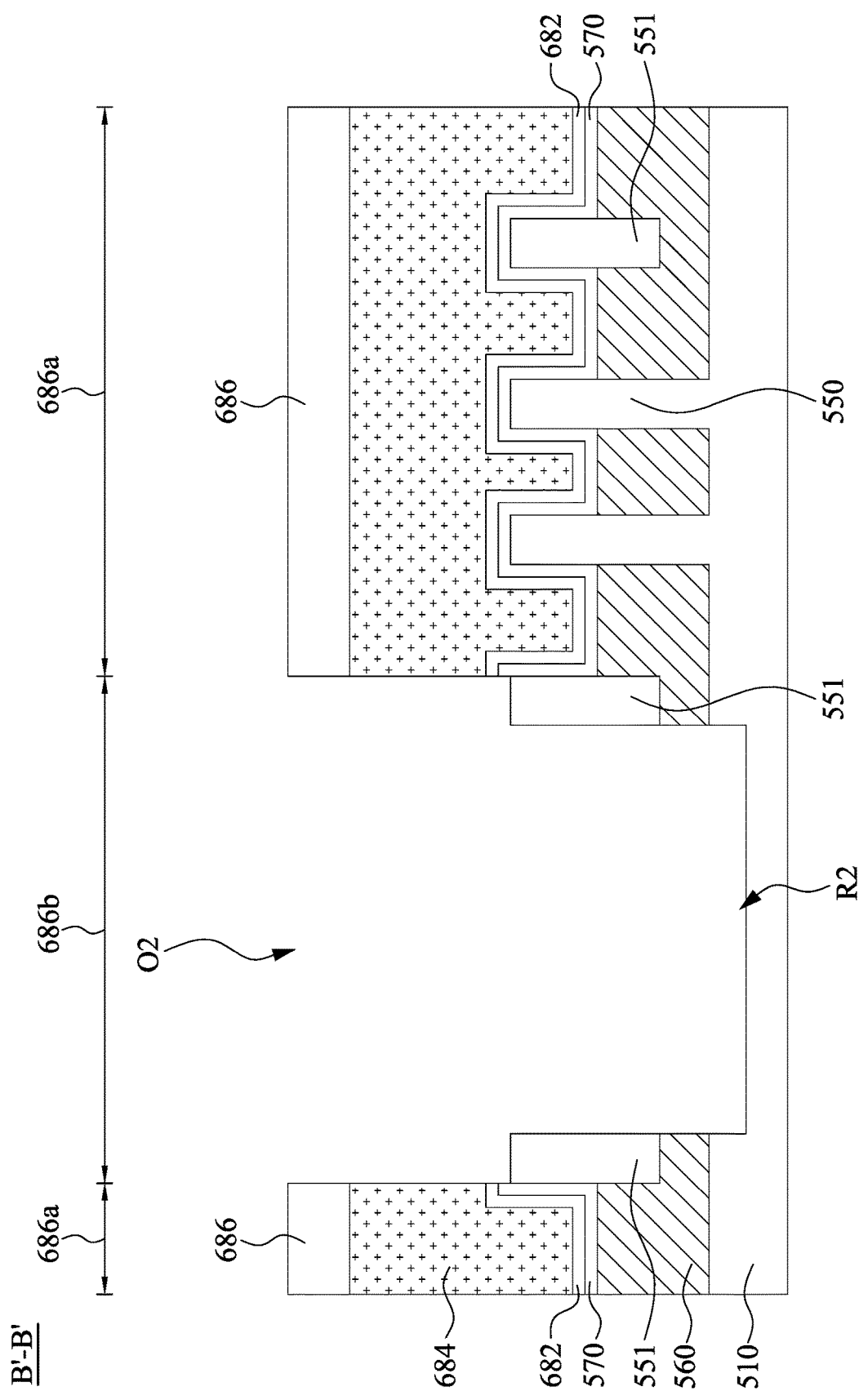
Figure 52C:
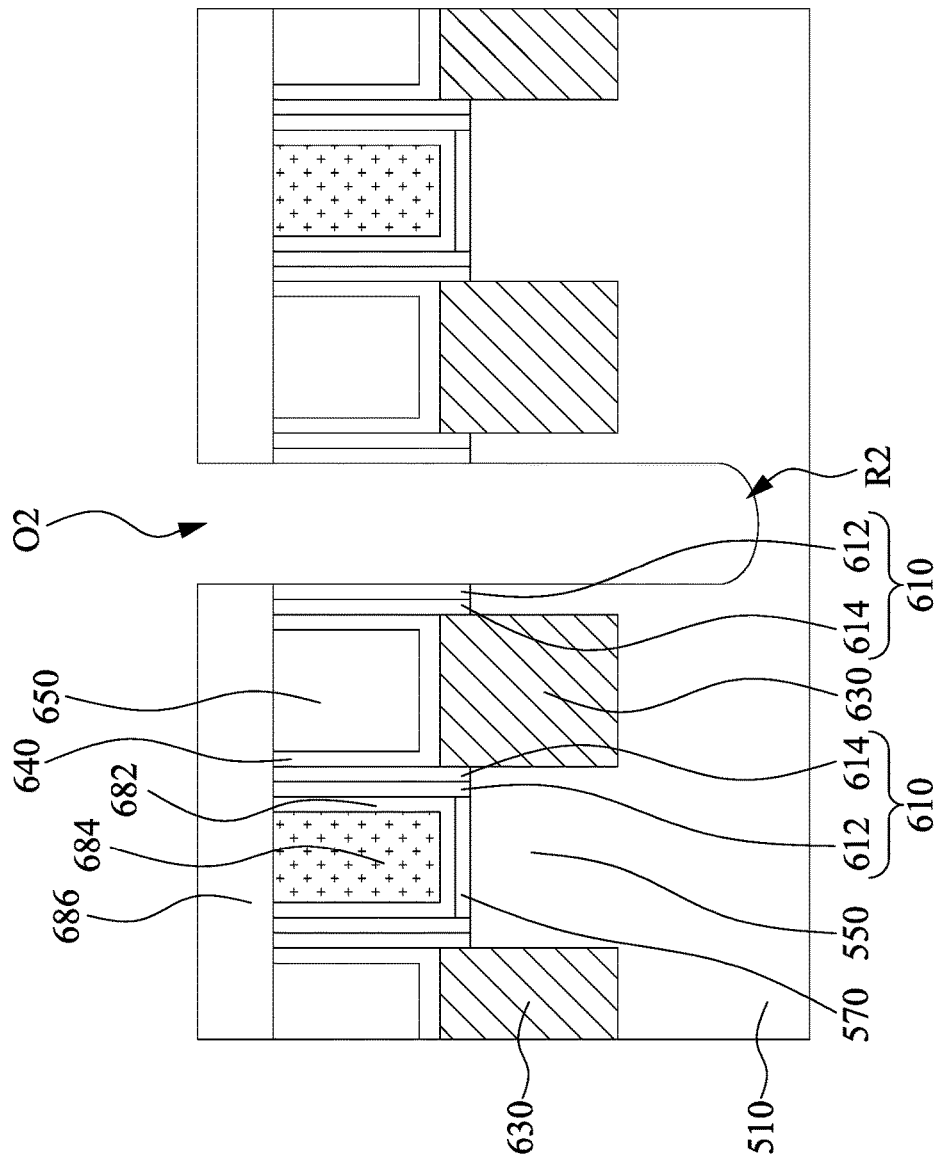

Reference is made to FIG. 52A to FIG. 52D. FIG. 52B is a cross-sectional view along section B-B in FIG. 52A. FIG. 52C is a cross-sectional view along section C-C in FIG. 52A. FIG. 52D is a cross-sectional view along section D-D in FIG. 52A. As shown in FIG. 52A to FIG. 52D, the semiconductor fins 550, the isolation layer 560, and a portion of the substrate 510 in the opening O2 are removed. The semiconductor fins 550, the isolation layer 560, and a portion of the substrate 510 in the opening O2 are removed in one or many etch operations including dry etch. The etching process may stop when a top surface of the substrate 510 in the opening O2 is slightly lower than a bottom surface of the dielectric fin layer 551. That is, a top surface of the substrate 510 in the opening O2 is lower than that outside the opening O2. Hence, the substrate 510 in the opening O2 recess away from the dielectric fin layer 551 relative to the substrate 510 outside the opening O2 and formed a recess R2.

Figure 53A:
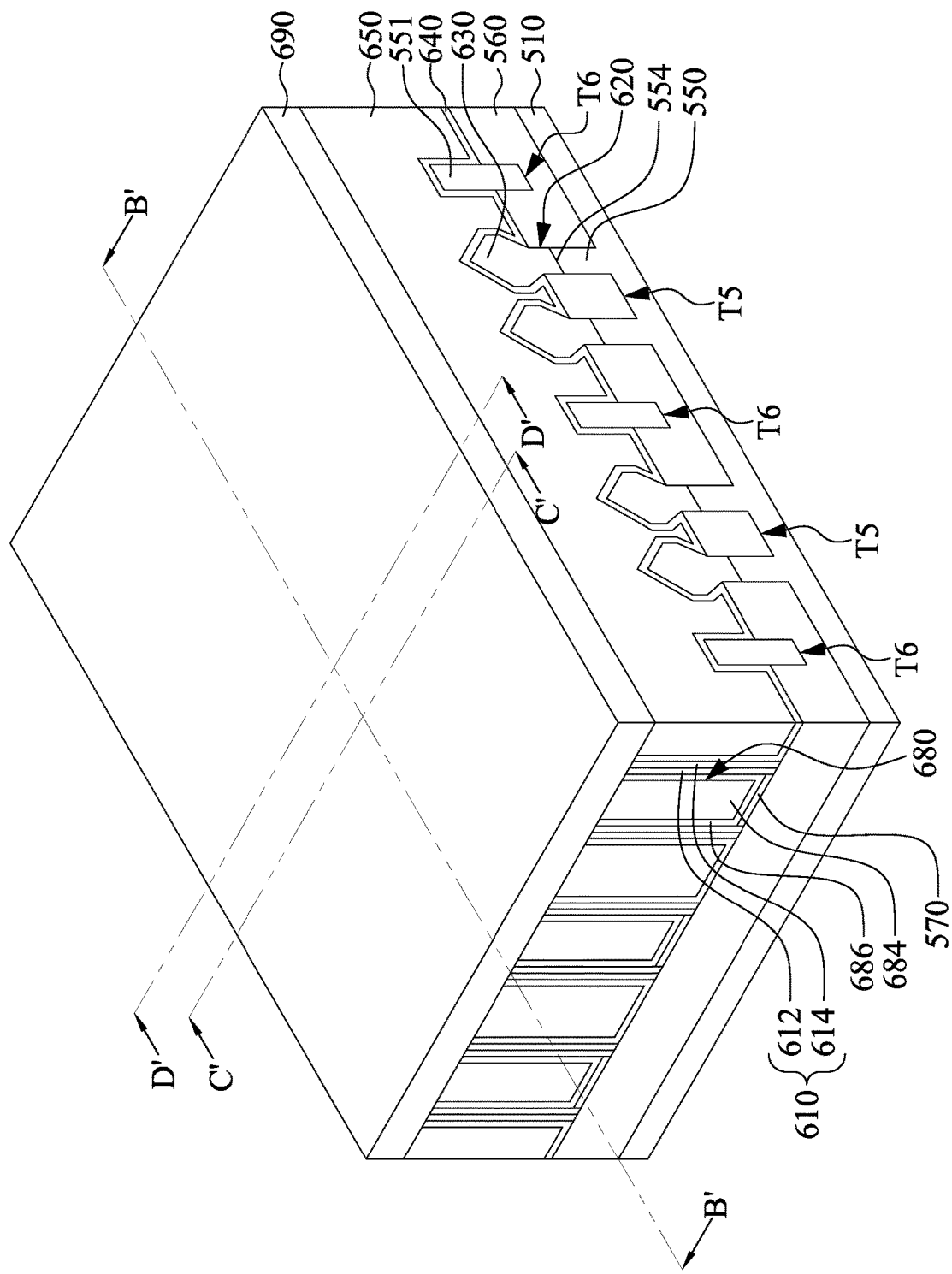
Figure 53B:
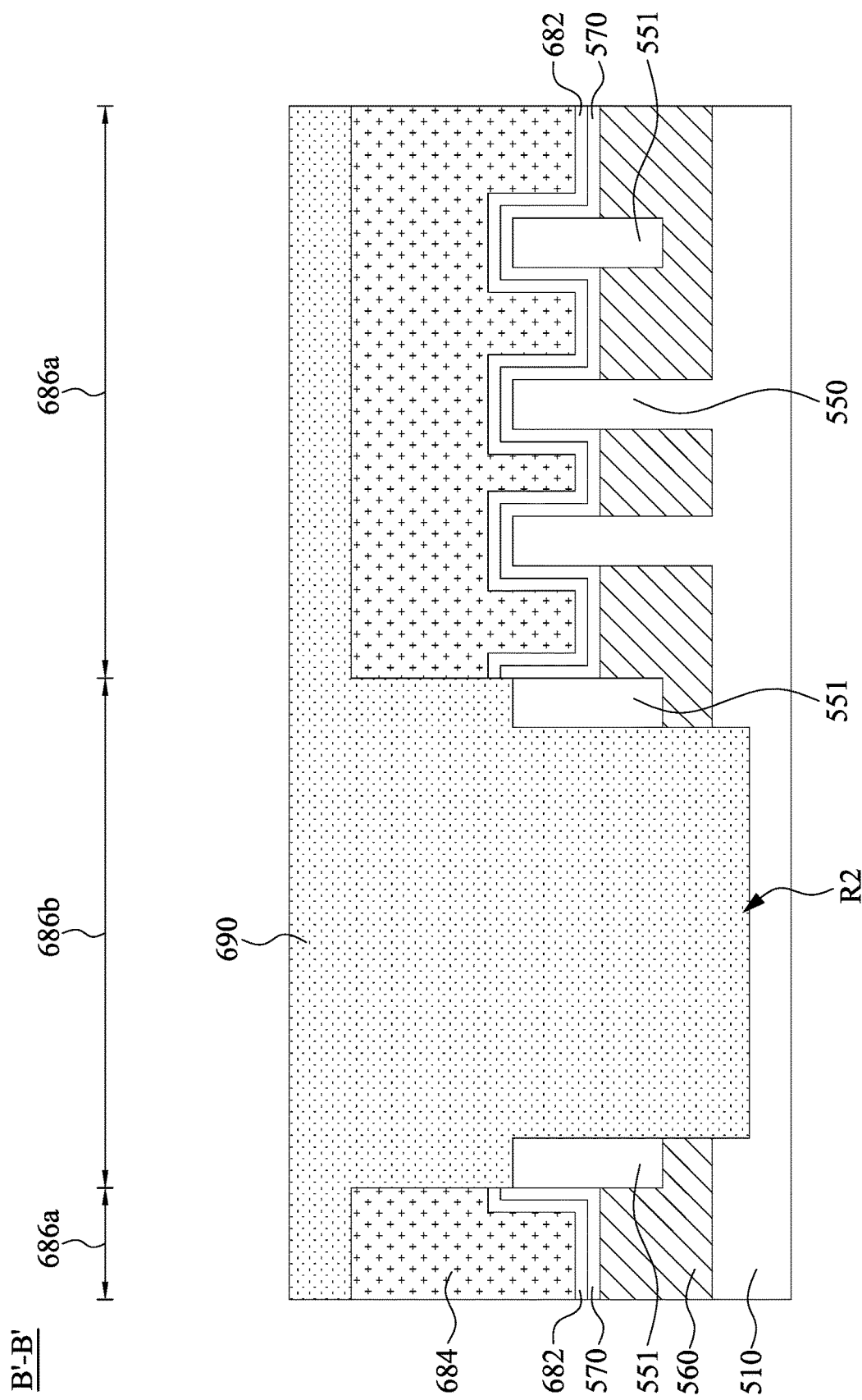
Figure 53C:
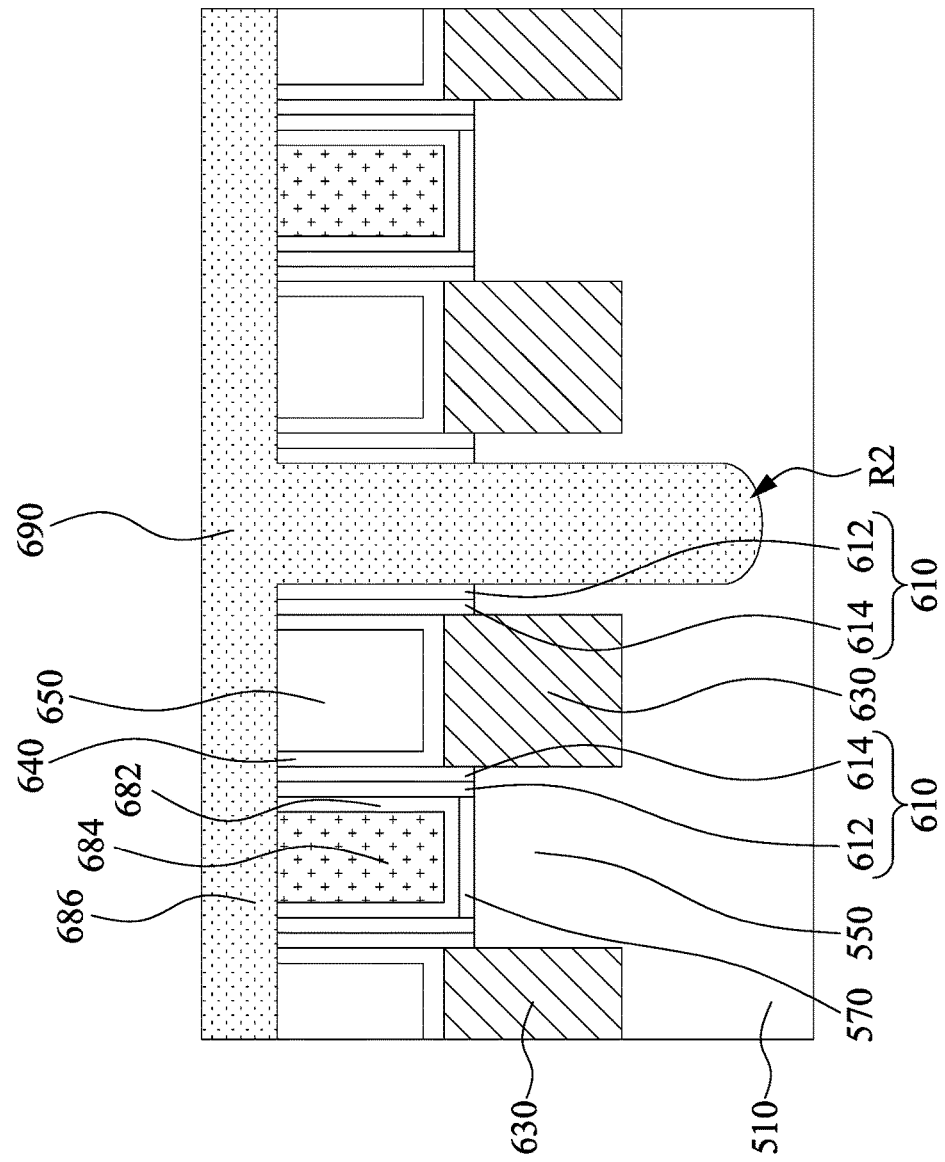
Figure 53D:
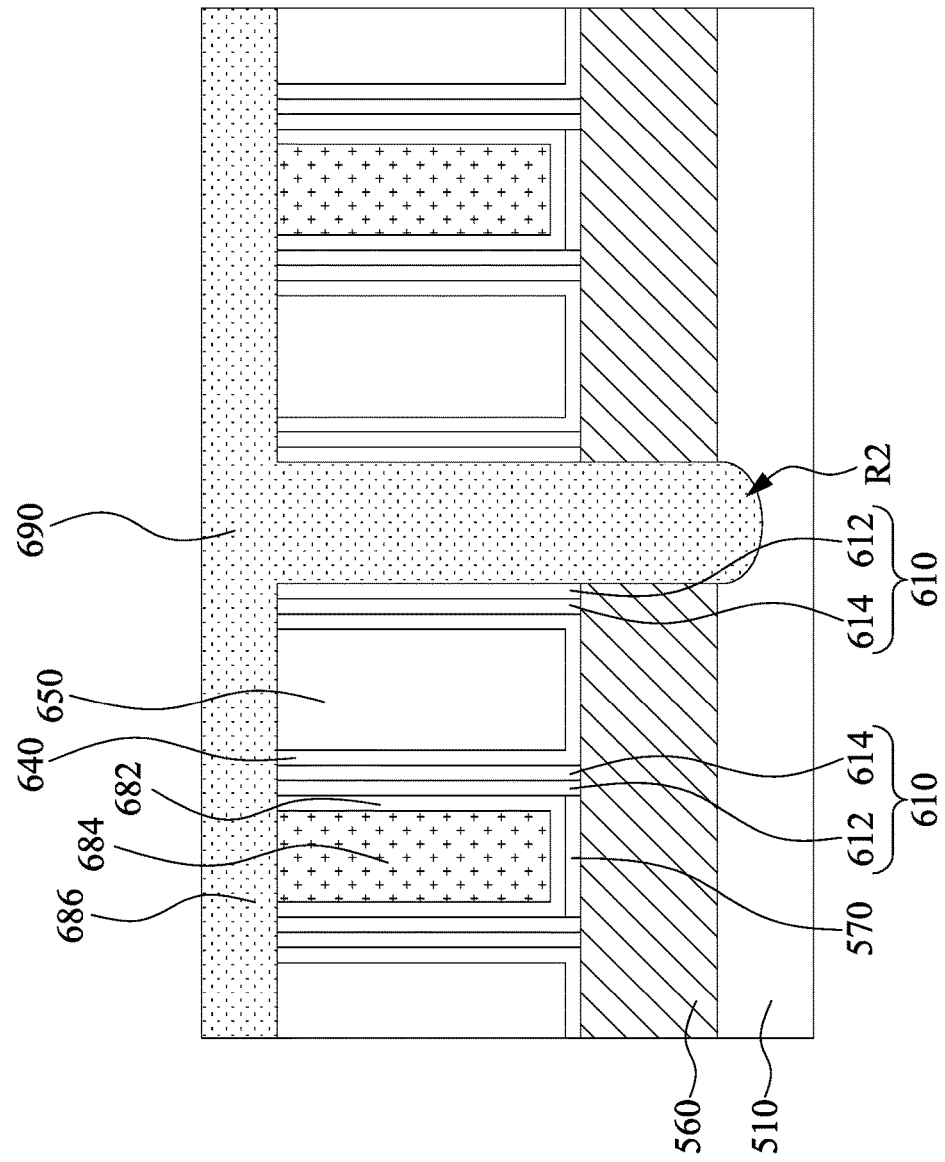

Reference is made to FIG. 53A to FIG. 53D. FIG. 53B is a cross-sectional view along section B-B in FIG. 53A. FIG. 53C is a cross-sectional view along section C-C in FIG. 53A. FIG. 53D is a cross-sectional view along section D-D in FIG. 53A. An isolation dielectric 690 is filled in the opening O2 to form a dielectric plug. The dielectric plug is between and separated from the epitaxial source/drain structures 630 and runs through the semiconductor fin 550 from above the semiconductor fin 550 to the substrate 510. That is, the dielectric plug is formed between two active devices as an isolator. The dielectric plug provides a large epi-damage process window and has better isolation/reliability robustness. In addition, the dielectric plug provides that the semiconductor device find an undercut defect therein more easily. In some embodiments, the isolation dielectric 690 is vertically above a top surface of the metal gate electrode layer 684.

In some embodiments, the isolation dielectric 690 is embedded in the recess R2 and in contact with the substrate 510. In some embodiments, the opening O2 is free of the isolation layer 560 therein. In some embodiments, the isolation dielectric 690 is in contact with sidewalls of the dielectric fin layer 551, and a bottom of the isolation dielectric 690 is lower than a bottom of the dielectric fin layer 551. In the other words, a bottom of the isolation dielectric 690 is lower than a top surface of the substrate 510 outside the opening O2. In some embodiments, the isolation dielectric 690 is in contact with and surrounded by sidewalls of the metal gate electrode layer 684, the work function metal layer 682, and the gate dielectric layer 570.

In some embodiments, the isolation dielectric 690 is made of silicon oxide, silicon nitride, silicon oxynitride, fluoride-doped silicate glass (FSG), or other low-K dielectric materials. In some embodiments, the isolation dielectric 690 may be formed using a high-density-plasma (HDP) chemical vapor deposition (CVD) process, using silane ($SiH_4$) and oxygen ($O_2$) as reacting precursors. In some other embodiments, the isolation dielectric 690 may be formed using a sub-atmospheric CVD (SACVD) process or high aspect-ratio process (HARP), wherein process gases may comprise tetraethylorthosilicate (TEOS) and ozone ($O_3$). In yet other embodiments, the isolation dielectric 690 may be formed using a spin-on-dielectric (SOD) process, such as hydrogen silsesquioxane (HSQ) or methyl silsesquioxane (MSQ). Other processes and materials may be used. In some embodiments, the isolation dielectric 690 can have a multi-layer structure, for example, a thermal oxide liner layer with silicon nitride formed over the liner. Thereafter, a thermal annealing may be optionally performed to the isolation dielectric 690.

Figure 54A:
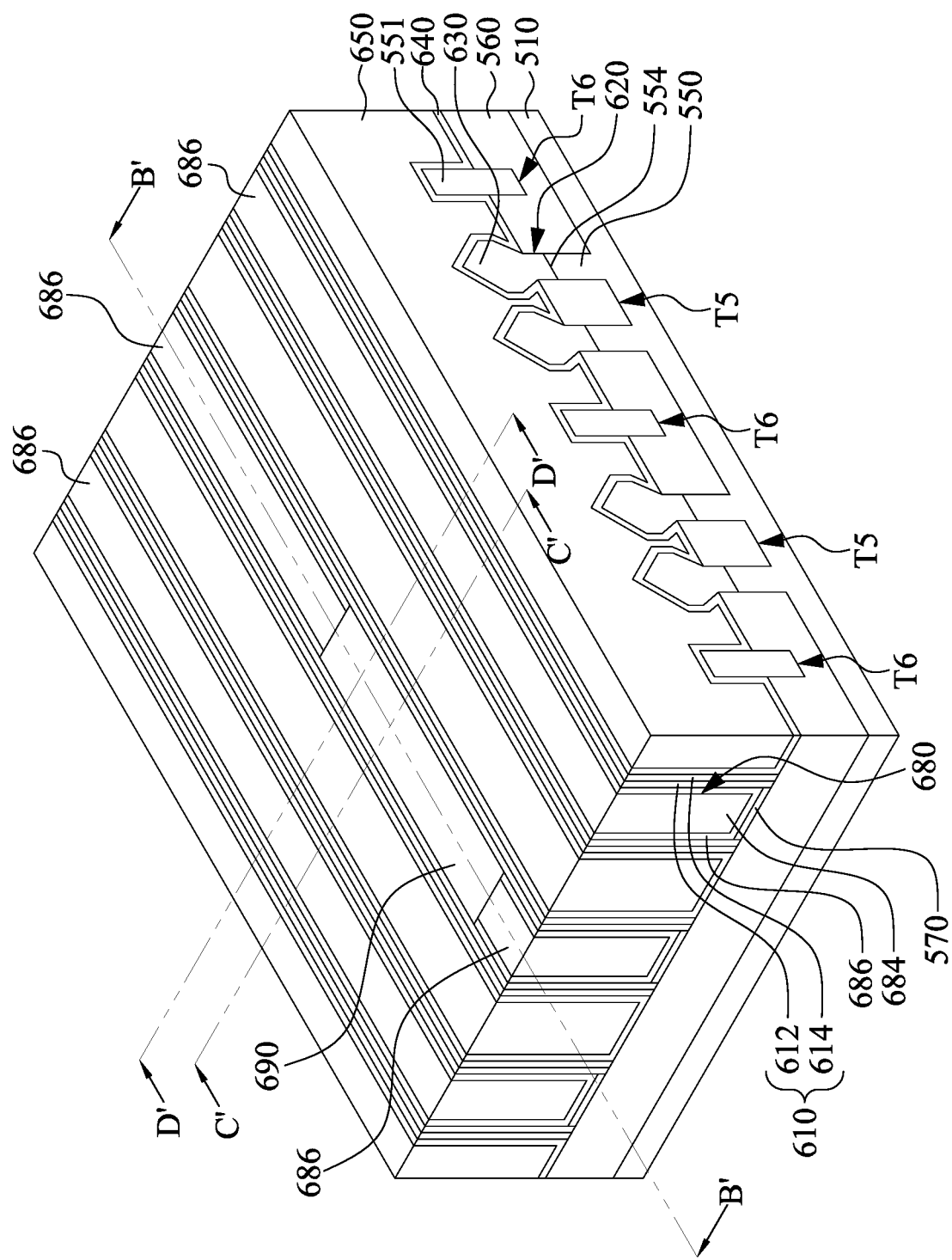
Figure 54B:
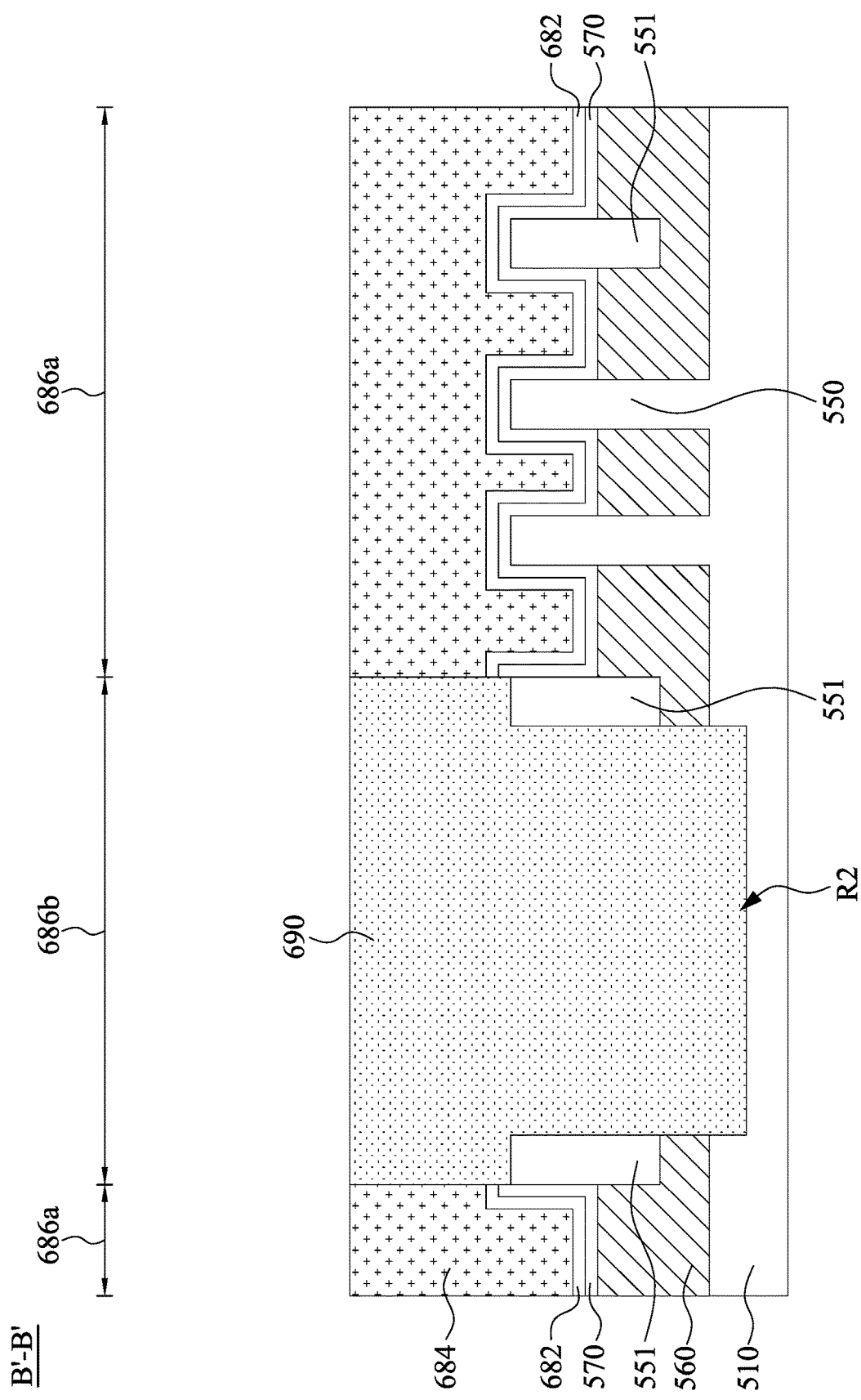
Figure 54C:
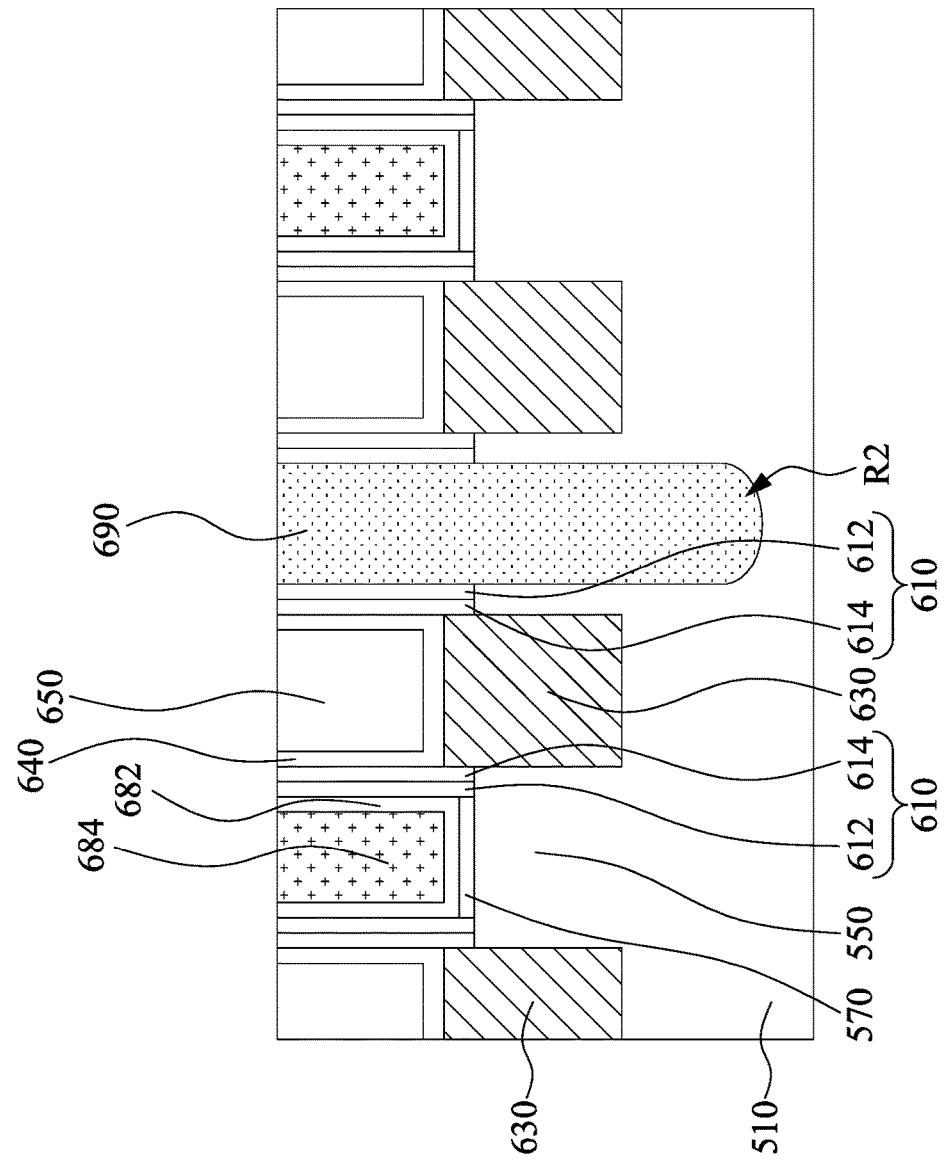
Figure 54D:
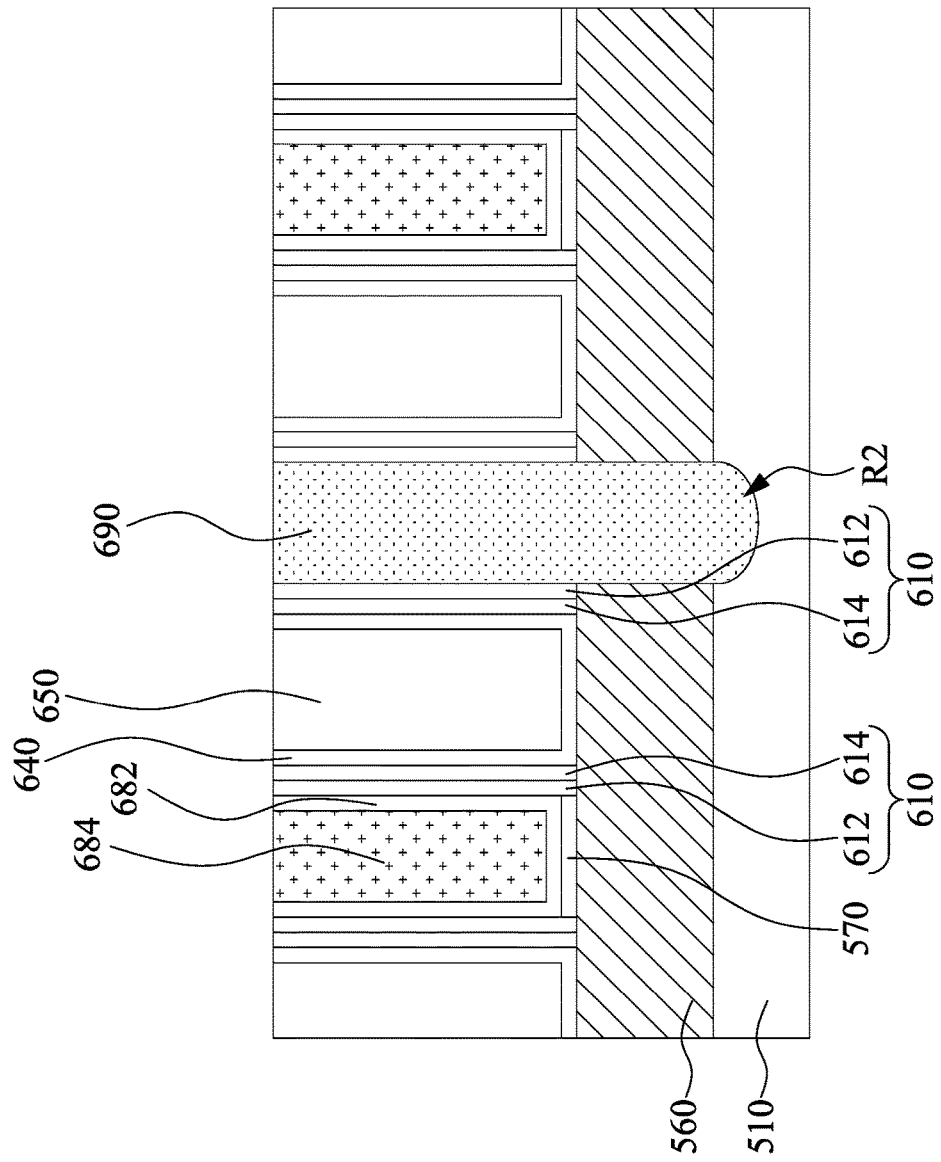

Reference is made to FIG. 54A to FIG. 54D. FIG. 54B is a cross-sectional view along section B-B in FIG. 54A. FIG. 54C is a cross-sectional view along section C-C in FIG. 54A. FIG. 54D is a cross-sectional view along section D-D in FIG. 54A. A polishing process, for example, CMP is performed, and the isolation dielectric 690 is lowered to level with a top surface of the metal gate electrode layer 684.

In some embodiments, a semiconductor device includes a substrate, a shallow trench isolation (STI) structure, a first source/drain, a second source/drain, and an isolation dielectric. The substrate has a semiconductor fin. The STI structure surrounds the semiconductor fin. The first source/drain is embedded in the semiconductor fin. The second source/drain is embedded in the semiconductor fin. The isolation dielectric is between the first and second source/drains and extending into the semiconductor fin. An upper surface of the STI structure is free from coverage of the isolation dielectric.

In some embodiments, a semiconductor device includes a substrate, a shallow trench isolation (STI) structure, a first source/drain, a second source/drain, and an isolation dielectric. The substrate has a semiconductor fin. The STI structure surrounds the semiconductor fin. The first source/drain is embedded in the semiconductor fin. The second source/drain is embedded in the semiconductor fin. The isolation dielectric is between the first and second source/drains, extending into the semiconductor fin, and in contact with a sidewall of the STI structure.

In some embodiments, a method of manufacturing a semiconductor device includes forming a semiconductor fin over a substrate; forming a shallow trench isolation (STI) structure surrounding the semiconductor fin; forming a dummy gate over the semiconductor fin and the STI structure; removing the dummy gate to form a gate trench; removing at least a part of the STI structure through the gate trench; and forming an isolation material dielectric in the gate trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate having a semiconductor fin;
   a shallow trench isolation (STI) structure surrounding the semiconductor fin;
   a first source/drain embedded in the semiconductor fin;
   a second source/drain embedded in the semiconductor fin; and
   an isolation dielectric between the first and second source/drains and extending into the semiconductor fin, wherein an upper surface of the STI structure is free from coverage of the isolation dielectric.

2. The semiconductor device of claim 1, wherein a bottom of the isolation dielectric is lower than a top surface of the STI structure.

3. The semiconductor device of claim 1, wherein the isolation dielectric is in contact with the substrate.

4. The semiconductor device of claim 1, wherein the isolation dielectric runs through the semiconductor fin from above the semiconductor fin to the substrate.

5. The semiconductor device of claim 1, wherein the isolation dielectric is separated from the first and second source/drains.

6. The semiconductor device of claim 1, wherein the substrate has a first portion under the isolation dielectric and a second portion adjacent to the isolation dielectric, and a top surface of the first portion is lower than a top surface of the second portion.

7. The semiconductor device of claim 1, further comprising:
   a first spacer over the semiconductor fin and in contact with the isolation dielectric.

8. The semiconductor device of claim 7, further comprising:
   a second spacer over the semiconductor fin, wherein the isolation dielectric is between the first and second spacers.

9. The semiconductor device of claim 1, further comprising:
   a gate stack over the semiconductor fin and having a top surface substantially level with a top surface of the isolation dielectric.

10. The semiconductor device of claim 1, further comprising:
    an insulating fin on the substrate, parallel to the semiconductor fin, and between the isolation dielectric and the semiconductor fin.

11. The semiconductor device of claim 1, further comprising:
    an insulating fin on the substrate and parallel to the semiconductor fin, wherein the isolation dielectric is in contact with a top surface of the insulating fin.

12. The semiconductor device of claim 1, further comprising:
    an insulating fin on the substrate and parallel to the semiconductor fin, wherein a bottom of the isolation dielectric is lower a bottom of the insulating fin.

13. A semiconductor device, comprising:
    a substrate having a first semiconductor fin;
    a shallow trench isolation (STI) structure surrounding the first semiconductor fin;
    a first source/drain embedded in the first semiconductor fin;
    a second source/drain embedded in the first semiconductor fin; and
    an isolation dielectric between the first and second source/drains, extending into the first semiconductor fin, and in contact with a sidewall of the STI structure.

14. The semiconductor device of claim 13, wherein a bottom of the isolation dielectric is lower than a top surface of the STI structure.

15. The semiconductor device of claim 13, wherein a bottom of the isolation dielectric is lower than a bottom of the first semiconductor fin.

16. The semiconductor device of claim 13, wherein the substrate further has a second semiconductor fin parallel to the first semiconductor fin and in contact with the isolation dielectric.

17. The semiconductor device of claim 13, wherein the substrate further has a second semiconductor fin parallel to the first semiconductor fin, wherein the semiconductor device further comprises a gate stack straddling the second semiconductor fin and in contact with the isolation dielectric.

18. The semiconductor device of claim 17, further comprising:
    a hard mask over the gate stack and having a top surface substantially level with a top surface of the isolation dielectric.

19. A semiconductor device, comprising:
    a substrate;
    a semiconductor fin on the substrate;
    an isolation structure surrounding the semiconductor fin;
    a gate structure straddling the semiconductor fin;
    a dielectric fin partially embedded in the isolation structure, projecting upwardly above the isolation structure, and in contact with a longitudinal end of the gate structure; and
    a dielectric plug partially embedded in the substrate, landing on the dielectric fin, and in contact with the longitudinal end of the gate structure, wherein a bottommost portion of the dielectric plug is lower than a top surface of the substrate.

20. The semiconductor device of claim 19, further comprising:
    a hard mask layer over the gate structure, wherein the dielectric plug is in contact with a longitudinal end of the hard mask.

* * * * *